United States Patent [19]

Carlstedt

[11] Patent Number: 5,437,049
[45] Date of Patent: Jul. 25, 1995

[54] REDUCTION PROCESSOR EMPLOYING AN ACTIVE ASSOCIATIVE MEMORY

[75] Inventor: L. Gunnar Carlstedt, Partille, Sweden

[73] Assignee: Carlstedt Elektronik AB, Goteborg, Sweden

[21] Appl. No.: 314,404

[22] Filed: Sep. 27, 1994

Related U.S. Application Data

[63] Continuation of Ser. No. 739,531, Aug. 2, 1991, abandoned.

[30] Foreign Application Priority Data

Aug. 2, 1990 [SE] Sweden .................. 9002558

[51] Int. Cl.⁶ ................. G06F 9/44; G06F 15/82
[52] U.S. Cl. .................. 395/800; 364/DIG. 1; 364/DIG. 2
[58] Field of Search ............ 364/DIG. 1 MS File, 364/DIG. 2 MS File; 395/325, 650, 375, 475, 800

[56] References Cited

U.S. PATENT DOCUMENTS

| | | | |
|---|---|---|---|
| 3,646,532 | 2/1972 | Berkling | 395/800 |
| 4,447,875 | 5/1984 | Bolton et al. | |
| 4,502,118 | 2/1985 | Hagenmaier, Jr. et al. | 395/200 |
| 4,598,361 | 7/1986 | Logsdon et al. | |
| 4,615,003 | 9/1986 | Logsdon et al. | |
| 4,616,315 | 10/1986 | Logsdon et al. | |
| 4,644,464 | 2/1987 | Logsdon et al. | 395/250 |
| 4,654,780 | 3/1987 | Logsdon et al. | 395/325 |
| 4,709,327 | 11/1987 | Hillis et al. | 395/375 |
| 4,734,848 | 3/1988 | Yamano et al. | 395/650 |
| 4,847,755 | 7/1989 | Morrison et al. | 395/650 |
| 4,992,933 | 2/1991 | Taylor | 395/800 |
| 5,021,942 | 6/1991 | Watson et al. | 395/375 |
| 5,021,945 | 6/1991 | Morrison et al. | 395/375 |
| 5,099,450 | 3/1992 | Berkling | 395/800 |
| 5,175,843 | 12/1992 | Casavant et al. | 395/500 |

OTHER PUBLICATIONS

By M. Ercegovac et al., "Reduction Machines", 1989, Chapter 11, pp. 413-469, U.S.A.

Primary Examiner—Robert B. Harrell
Attorney, Agent, or Firm—Young & Thompson

[57] ABSTRACT

A reduction processor controlled by a program having a structure reduces the structure in a number of reduction steps implementing different kinds of reduction operations. A first order processor of this kind includes an active storage (1, 2) which in turn includes a number of active storage cells, each able to store information which could give rise to a reduction. A communication net communicates the result of each reduction to all cells having connection to the result. The processor includes a control unit in common for all the storage cells. Preferably, at least one of the storage cells, called core cell or structure arithmetic unit, is able to perform all kinds of reductions, and the rest of the cells, called object storage cells, are able to perform only limited number of reductions. Further, several reduction processors could be connected to each other by a network and thereby form a higher order reduction processor.

53 Claims, 35 Drawing Sheets

SIMPLE VALUE OR MACHINE IDENTIFIER

RESULT

ONE LEVEL STRUCTURE

GOAL

TWO LEVEL STRUCTURE

TWO LEVEL STRUCTURE

THREE LEVEL STRUCTURE

IN PIPELINE MODE

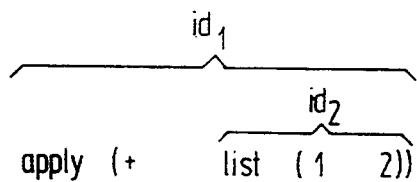
FIG. 8A
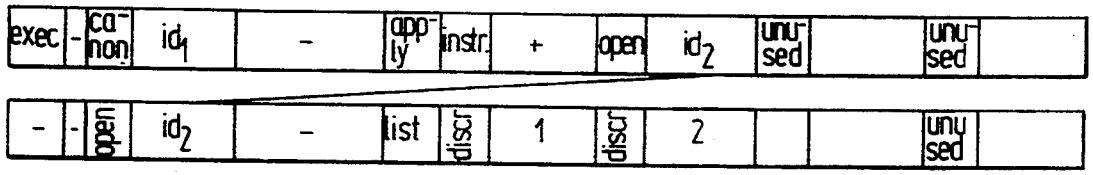
FIG. 8B
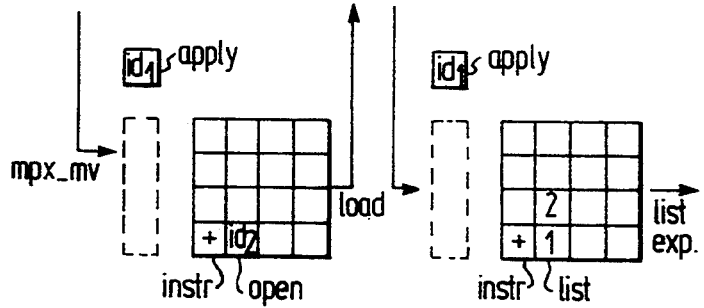
FIG. 8C  FIG. 8D
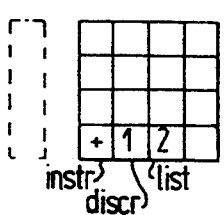 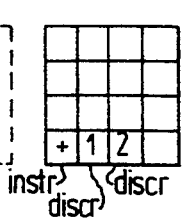 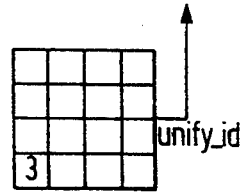
FIG. 8E  FIG. 8F  FIG. 8G

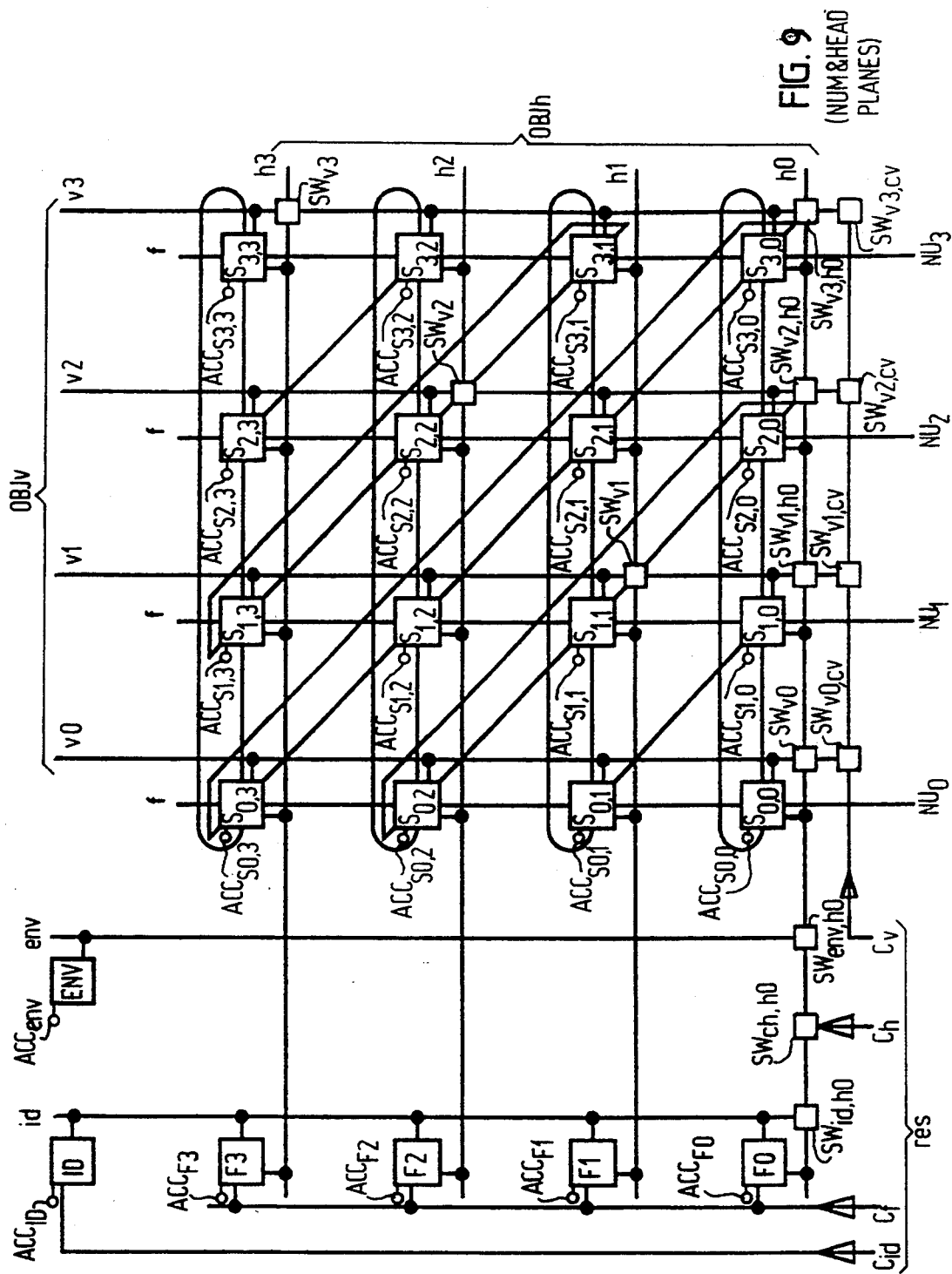
FIG. 9 (NUM&HEAD PLANES)

GENERIC REGISTER CELL (NUM & HEAD PLANES)

INITIALIZATION BY
mpx_mv

SUPPLYING THE
IDENTIFIER

LOADING VALUES INTO A
REGISTER COLUMN

SUPPLYING THE
unify_id IDENTIFIER (map f (e1 e2 e3 e4))

((map f e1)(map f e2)
(map f e3)(map f e4))

((f e1)(f e2)(f e3)
(map f e4))

(f e1) RELOADED

TRANSPOSE

EXPAND_list

| ORDINARY BINARY REPR. | DECIMAL REPR. OF BIN. REPR. | | s,sh | se seh | c ch | e eh | e eh | m, md | mh | val h |
|---|---|---|---|---|---|---|---|---|---|---|
| 0000000 | 0 | -> | 0 | 0,1 | 0,1 | 0, | 9 | 000,1001 | 0,000 | -2 | -1024 |
| 0000001 | 1 | -> | 0 | 0,1 | 0,1 | 0, | 9 | 000,1001 | 1,001 | -1.5 | -768 |
| 0000010 | 2 | -> | 0 | 0,1 | 0,1 | 1, | 8 | 001,1000 | 0,000 | -2 | -512 |
| 0000011 | 3 | -> | 0 | 0,1 | 0,1 | 1, | 8 | 001,1000 | 1,001 | -1.5 | -384 |
| 0000100 | 4 | -> | 0 | 0,1 | 0,1 | 2, | 7 | 010,0111 | 0,000 | -2 | -256 |
| 0000101 | 5 | -> | 0 | 0,1 | 0,1 | 2, | 7 | 010,0111 | 1,001 | -1.5 | -192 |
| 0000110 | 6 | -> | 0 | 0,1 | 0,1 | 3, | 6 | 011,0110 | 0,000 | -2 | -128 |
| 0000111 | 7 | -> | 0 | 0,1 | 0,1 | 3, | 6 | 011,0110 | 1,001 | -1.5 | -96 |
| 0001000 | 8 | -> | 0 | 0,1 | 0,1 | 4, | 5 | 100,0101 | 0,000 | -2 | -64 |
| 0001001 | 9 | -> | 0 | 0,1 | 0,1 | 4, | 5 | 100,0101 | 1,001 | -1.5 | -48 |
| 0001010 | 10 | -> | 0 | 0,1 | 0,1 | 5, | 4 | 101,0100 | 0,000 | -2 | -32 |
| 0001011 | 11 | -> | 0 | 0,1 | 0,1 | 5, | 4 | 101,0100 | 1,001 | -1.5 | -24 |
| 0001100 | 12 | -> | 0 | 0,1 | 0,1 | 6, | 3 | 110,0011 | 0,000 | -2 | -16 |
| 0001101 | 13 | -> | 0 | 0,1 | 0,1 | 6, | 3 | 110,0011 | 1,001 | -1.5 | -12 |
| 0001110 | 14 | -> | 0 | 0,1 | 0,1 | 7, | 2 | 111,0010 | 0,000 | -2 | -8 |
| 0001111 | 15 | -> | 0 | 0,1 | 0,1 | 7, | 2 | 111,0010 | 1,001 | -1.5 | -6 |
| 0010000 | 16 | -> | 0 | 0,1 | 1,0 | 0, | 1 | 000,0001 | 0,000 | -2 | -4 |
| 0010001 | 17 | -> | 0 | 0,1 | 1,0 | 0, | 1 | 000,0001 | 1,001 | -1.875 | -3.75 |
| 0010010 | 18 | -> | 0 | 0,1 | 1,0 | 0, | 1 | 000,0001 | 2,010 | -1.75 | -3.5 |
| 0010011 | 19 | -> | 0 | 0,1 | 1,0 | 0, | 1 | 000,0001 | 3,011 | -1.625 | -3.25 |
| 0010100 | 20 | -> | 0 | 0,1 | 1,0 | 0, | 1 | 000,0001 | 4,100 | -1.5 | -3 |
| 0010101 | 21 | -> | 0 | 0,1 | 1,0 | 0, | 1 | 000,0001 | 5,101 | -1.375 | -2.75 |
| 0010110 | 22 | -> | 0 | 0,1 | 1,0 | 0, | 1 | 000,0001 | 6,110 | -1.25 | -2.5 |
| 0010111 | 23 | -> | 0 | 0,1 | 1,0 | 0, | 1 | 000,0001 | 7,111 | -1.125 | -2.25 |
| 0011000 | 24 | -> | 0 | 0,1 | 1,0 | 1, | 0 | 001,0000 | 0,000 | -2 | -2 |
| 0011001 | 25 | -> | 0 | 0,1 | 1,0 | 1, | 0 | 001,0000 | 1,001 | -1.875 | -1.875 |
| 0011010 | 26 | -> | 0 | 0,1 | 1,0 | 1, | 0 | 001,0000 | 2,010 | -1.75 | -1.75 |
| 0011011 | 27 | -> | 0 | 0,1 | 1,0 | 1, | 0 | 001,0000 | 3,011 | -1.625 | -1.625 |
| 0011100 | 28 | -> | 0 | 0,1 | 1,0 | 1, | 0 | 001,0000 | 4,100 | -1.5 | -1.5 |
| 0011101 | 29 | -> | 0 | 0,1 | 1,0 | 1, | 0 | 001,0000 | 5,101 | -1.375 | -1.375 |
| 0011110 | 30 | -> | 0 | 0,1 | 1,0 | 1, | 0 | 001,0000 | 6,110 | -1.25 | -1.25 |
| 0011111 | 31 | -> | 0 | 0,1 | 1,0 | 1, | 0 | 001,0000 | 7,111 | -1.125 | -1.125 |
| 0100000 | 32 | -> | 0 | 1,0 | 0,0 | 0, | -1 | 000,0000 | 0,000 | -2 | -1 |
| 0100001 | 33 | -> | 0 | 1,0 | 0,0 | 0, | -1 | 000,0000 | 1,001 | -1.875 | -.9375 |
| 0100010 | 34 | -> | 0 | 1,0 | 0,0 | 0, | -1 | 000,0000 | 2,010 | -1.75 | -.875 |
| 0100011 | 35 | -> | 0 | 1,0 | 0,0 | 0, | -1 | 000,0000 | 3,011 | -1.625 | -.8125 |
| 0100100 | 36 | -> | 0 | 1,0 | 0,0 | 0, | -1 | 000,0000 | 4,100 | -1.5 | -.75 |
| 0100101 | 37 | -> | 0 | 1,0 | 0,0 | 0, | -1 | 000,0000 | 5,101 | -1.375 | -.6875 |
| 0100110 | 38 | -> | 0 | 1,0 | 0,0 | 0, | -1 | 000,0000 | 6,110 | -1.25 | -.625 |
| 0100111 | 39 | -> | 0 | 1,0 | 0,0 | 0, | -1 | 000,0000 | 7,111 | -1.125 | -.5625 |
| 0101000 | 40 | -> | 0 | 1,0 | 0,0 | 1, | -2 | 001,0000 | 0,000 | -2 | -.5 |
| 0101001 | 41 | -> | 0 | 1,0 | 0,0 | 1, | -2 | 001,0000 | 1,001 | -1.875 | -.46875 |
| 0101010 | 42 | -> | 0 | 1,0 | 0,0 | 1, | -2 | 001,0000 | 2,010 | -1.75 | -.4375 |
| 0101011 | 43 | -> | 0 | 1,0 | 0,0 | 1, | -2 | 001,0000 | 3,011 | -1.625 | -.40625 |
| 0101100 | 44 | -> | 0 | 1,0 | 0,0 | 1, | -2 | 001,0000 | 4,100 | -1.5 | -.375 |
| 0101101 | 45 | -> | 0 | 1,0 | 0,0 | 1, | -2 | 001,0000 | 5,101 | -1.375 | -.34375 |
| 0101110 | 46 | -> | 0 | 1,0 | 0,0 | 1, | -2 | 001,0000 | 6,110 | -1.25 | -.3125 |
| 0101111 | 47 | -> | 0 | 1,0 | 0,0 | 1, | -2 | 001,0000 | 7,111 | -1.125 | -.28125 |
| 0110000 | 48 | -> | 0 | 1,0 | 1,1 | 0, | -3 | 000,0000 | 0,000 | -2 | -.25 |
| 0110001 | 49 | -> | 0 | 1,0 | 1,1 | 0, | -3 | 000,0000 | 1,001 | -1.5 | -.1875 |
| 0110010 | 50 | -> | 0 | 1,0 | 1,1 | 1, | -4 | 001,0000 | 0,000 | -2 | -.125 |
| 0110011 | 51 | -> | 0 | 1,0 | 1,1 | 1, | -4 | 001,0000 | 1,001 | -1.5 | -0.09375 |
| 0110100 | 52 | -> | 0 | 1,0 | 1,1 | 2, | -5 | 010,0000 | 0,000 | -2 | -0.0625 |
| 0110101 | 53 | -> | 0 | 1,0 | 1,1 | 2, | -5 | 010,0000 | 1,001 | -1.5 | -0.046875 |
| 0110110 | 54 | -> | 0 | 1,0 | 1,1 | 3, | -6 | 011,0000 | 0,000 | -2 | -0.03125 |
| 0110111 | 55 | -> | 0 | 1,0 | 1,1 | 3, | -6 | 011,0000 | 1,001 | -1.5 | -0.0234375 |
| 0111000 | 56 | -> | 0 | 1,0 | 1,1 | 4, | -7 | 100,0000 | 0,000 | -2 | -0.015625 |
| 0111001 | 57 | -> | 0 | 1,0 | 1,1 | 4, | -7 | 100,0000 | 1,001 | -1.5 | -0.0117188 |
| 0111010 | 58 | -> | 0 | 1,0 | 1,1 | 5, | -8 | 101,0000 | 0,000 | -2 | -0.0078125 |
| 0111011 | 59 | -> | 0 | 1,0 | 1,1 | 5, | -8 | 101,0000 | 1,001 | -1.5 | -0.00585938 |
| 0111100 | 60 | -> | 0 | 1,0 | 1,1 | 6, | -9 | 110,0000 | 0,000 | -2 | -0.00390625 |
| 0111101 | 61 | -> | 0 | 1,0 | 1,1 | 6, | -9 | 110,0000 | 1,001 | -1.5 | -0.00292969 |
| 0111110 | 62 | -> | 0 | 1,0 | 1,1 | 7,-10 | | 111,0000 | 0,000 | -2 | -0.00195312 |
| 0111111 | 63 | -> | 0 | 1,0 | 1,1 | 7,-10 | | 111,0000 | 1,001 | -1.5 | -0.00146484 |

FIG. 27A

| BINARY REPR. | DECIMAL REPR. OF BIN. REPR. | | s,sh | se (seh) | c (ch) | e eh | e, (eh) | m, (md) | mh | valh |
|---|---|---|---|---|---|---|---|---|---|---|
| 1000000 | 64 | -> | 1 | 0,0 | 0,1 | 0,-10 | 000,0000 | 0,000 | 1 | 0 |
| 1000001 | 65 | -> | 1 | 0,0 | 0,1 | 0,-10 | 000,0000 | 1,001 | 1.5 | 0.00146484 |
| 1000010 | 66 | -> | 1 | 0,0 | 0,1 | 1, -9 | 001,0000 | 0,000 | 1 | 0.00195312 |
| 1000011 | 67 | -> | 1 | 0,0 | 0,1 | 1, -9 | 001,0000 | 1,001 | 1.5 | 0.00292969 |
| 1000100 | 68 | -> | 1 | 0,0 | 0,1 | 2, -8 | 010,0000 | 0,000 | 1 | 0.00390625 |
| 1000101 | 69 | -> | 1 | 0,0 | 0,1 | 2, -8 | 010,0000 | 1,001 | 1.5 | 0.00585938 |
| 1000110 | 70 | -> | 1 | 0,0 | 0,1 | 3, -7 | 011,0000 | 0,000 | 1 | 0.0078125 |
| 1000111 | 71 | -> | 1 | 0,0 | 0,1 | 3, -7 | 011,0000 | 1,001 | 1.5 | 0.0117188 |
| 1001000 | 72 | -> | 1 | 0,0 | 0,1 | 4, -6 | 100,0000 | 0,000 | 1 | 0.015625 |
| 1001001 | 73 | -> | 1 | 0,0 | 0,1 | 4, -6 | 100,0000 | 1,001 | 1.5 | 0.0234375 |
| 1001010 | 74 | -> | 1 | 0,0 | 0,1 | 5, -5 | 101,0000 | 0,000 | 1 | 0.03125 |
| 1001011 | 75 | -> | 1 | 0,0 | 0,1 | 5, -5 | 101,0000 | 1,001 | 1.5 | 0.046875 |
| 1001100 | 76 | -> | 1 | 0,0 | 0,1 | 6, -4 | 110,0000 | 0,000 | 1 | 0.0625 |
| 1001101 | 77 | -> | 1 | 0,0 | 0,1 | 6, -4 | 110,0000 | 1,001 | 1.5 | 0.09375 |
| 1001110 | 78 | -> | 1 | 0,0 | 0,1 | 7, -3 | 111,0000 | 0,000 | 1 | .125 |
| 1001111 | 79 | -> | 1 | 0,0 | 0,1 | 7, -3 | 111,0000 | 1,001 | 1.5 | .1875 |
| 1010000 | 80 | -> | 1 | 0,0 | 1,0 | 0, -2 | 000,0000 | 0,000 | 1 | .25 |
| 1010001 | 81 | -> | 1 | 0,0 | 1,0 | 0, -2 | 000,0000 | 1,001 | 1.125 | .28125 |
| 1010010 | 82 | -> | 1 | 0,0 | 1,0 | 0, -2 | 000,0000 | 2,010 | 1.25 | .3125 |
| 1010011 | 83 | -> | 1 | 0,0 | 1,0 | 0, -2 | 000,0000 | 3,011 | 1.375 | .34375 |
| 1010100 | 84 | -> | 1 | 0,0 | 1,0 | 0, -2 | 000,0000 | 4,100 | 1.5 | .375 |
| 1010101 | 85 | -> | 1 | 0,0 | 1,0 | 0, -2 | 000,0000 | 5,101 | 1.625 | .40625 |
| 1010110 | 86 | -> | 1 | 0,0 | 1,0 | 0, -2 | 000,0000 | 6,110 | 1.75 | .4375 |
| 1010111 | 87 | -> | 1 | 0,0 | 1,0 | 0, -2 | 000,0000 | 7,111 | 1.875 | .46875 |
| 1011000 | 88 | -> | 1 | 0,0 | 1,0 | 1, -1 | 001,0000 | 0,000 | 1 | .5 |
| 1011001 | 89 | -> | 1 | 0,0 | 1,0 | 1, -1 | 001,0000 | 1,001 | 1.125 | .5625 |
| 1011010 | 90 | -> | 1 | 0,0 | 1,0 | 1, -1 | 001,0000 | 2,010 | 1.25 | .625 |
| 1011011 | 91 | -> | 1 | 0,0 | 1,0 | 1, -1 | 001,0000 | 3,011 | 1.375 | .6875 |
| 1011100 | 92 | -> | 1 | 0,0 | 1,0 | 1, -1 | 001,0000 | 4,100 | 1.5 | .75 |
| 1011101 | 93 | -> | 1 | 0,0 | 1,0 | 1, -1 | 001,0000 | 5,101 | 1.625 | .8125 |
| 1011110 | 94 | -> | 1 | 0,0 | 1,0 | 1, -1 | 001,0000 | 6,110 | 1.75 | .875 |
| 1011111 | 95 | -> | 1 | 0,0 | 1,0 | 1, -1 | 001,0000 | 7,111 | 1.875 | .9375 |
| 1100000 | 96 | -> | 1 | 1,1 | 0,0 | 0, 0 | 000,0000 | 0,000 | 1 | 1 |
| 1100001 | 97 | -> | 1 | 1,1 | 0,0 | 0, 0 | 000,0000 | 1,001 | 1.125 | 1.125 |
| 1100010 | 98 | -> | 1 | 1,1 | 0,0 | 0, 0 | 000,0000 | 2,010 | 1.25 | 1.25 |
| 1100011 | 99 | -> | 1 | 1,1 | 0,0 | 0, 0 | 000,0000 | 3,011 | 1.375 | 1.375 |
| 1100100 | 100 | -> | 1 | 1,1 | 0,0 | 0, 0 | 000,0000 | 4,100 | 1.5 | 1.5 |
| 1100101 | 101 | -> | 1 | 1,1 | 0,0 | 0, 0 | 000,0000 | 5,101 | 1.625 | 1.625 |
| 1100110 | 102 | -> | 1 | 1,1 | 0,0 | 0, 0 | 000,0000 | 6,110 | 1.75 | 1.75 |
| 1100111 | 103 | -> | 1 | 1,1 | 0,0 | 0, 0 | 000,0000 | 7,111 | 1.875 | 1.875 |
| 1101000 | 104 | -> | 1 | 1,1 | 0,0 | 1, 1 | 001,0001 | 0,000 | 1 | 2 |
| 1101001 | 105 | -> | 1 | 1,1 | 0,0 | 1, 1 | 001,0001 | 1,001 | 1.125 | 2.25 |
| 1101010 | 106 | -> | 1 | 1,1 | 0,0 | 1, 1 | 001,0001 | 2,010 | 1.25 | 2.5 |
| 1101011 | 107 | -> | 1 | 1,1 | 0,0 | 1, 1 | 001,0001 | 3,011 | 1.375 | 2.75 |
| 1101100 | 108 | -> | 1 | 1,1 | 0,0 | 1, 1 | 001,0001 | 4,100 | 1.5 | 3 |
| 1101101 | 109 | -> | 1 | 1,1 | 0,0 | 1, 1 | 001,0001 | 5,101 | 1.625 | 3.25 |
| 1101110 | 110 | -> | 1 | 1,1 | 0,0 | 1, 1 | 001,0001 | 6,110 | 1.75 | 3.5 |
| 1101111 | 111 | -> | 1 | 1,1 | 0,0 | 1, 1 | 001,0001 | 7,111 | 1.875 | 3.75 |
| 1110000 | 112 | -> | 1 | 1,1 | 1,1 | 0, 2 | 000,0010 | 0,000 | 1 | 4 |
| 1110001 | 113 | -> | 1 | 1,1 | 1,1 | 0, 2 | 000,0010 | 1,001 | 1.5 | 6 |
| 1110010 | 114 | -> | 1 | 1,1 | 1,1 | 1, 3 | 001,0011 | 0,000 | 1 | 8 |
| 1110011 | 115 | -> | 1 | 1,1 | 1,1 | 1, 3 | 001,0011 | 1,001 | 1.5 | 12 |
| 1110100 | 116 | -> | 1 | 1,1 | 1,1 | 2, 4 | 010,0100 | 0,000 | 1 | 16 |
| 1110101 | 117 | -> | 1 | 1,1 | 1,1 | 2, 4 | 010,0100 | 1,001 | 1.5 | 24 |
| 1110110 | 118 | -> | 1 | 1,1 | 1,1 | 3, 5 | 011,0101 | 0,000 | 1 | 32 |
| 1110111 | 119 | -> | 1 | 1,1 | 1,1 | 3, 5 | 011,0101 | 1,001 | 1.5 | 48 |
| 1111000 | 120 | -> | 1 | 1,1 | 1,1 | 4, 6 | 100,0110 | 0,000 | 1 | 64 |
| 1111001 | 121 | -> | 1 | 1,1 | 1,1 | 4, 6 | 100,0110 | 1,001 | 1.5 | 96 |
| 1111010 | 122 | -> | 1 | 1,1 | 1,1 | 5, 7 | 101,0111 | 0,000 | 1 | 128 |
| 1111011 | 123 | -> | 1 | 1,1 | 1,1 | 5, 7 | 101,0111 | 1,001 | 1.5 | 192 |
| 1111100 | 124 | -> | 1 | 1,1 | 1,1 | 6, 8 | 110,1000 | 0,000 | 1 | 256 |
| 1111101 | 125 | -> | 1 | 1,1 | 1,1 | 6, 8 | 110,1000 | 1,001 | 1.5 | 384 |
| 1111110 | 126 | -> | 1 | 1,1 | 1,1 | 7, 9 | 111,1001 | 0,000 | 1 | 512 |
| 1111111 | 127 | -> | 1 | 1,1 | 1,1 | 7, 9 | 111,1001 | 1,001 | 1.5 | 768 |

FIG. 27B

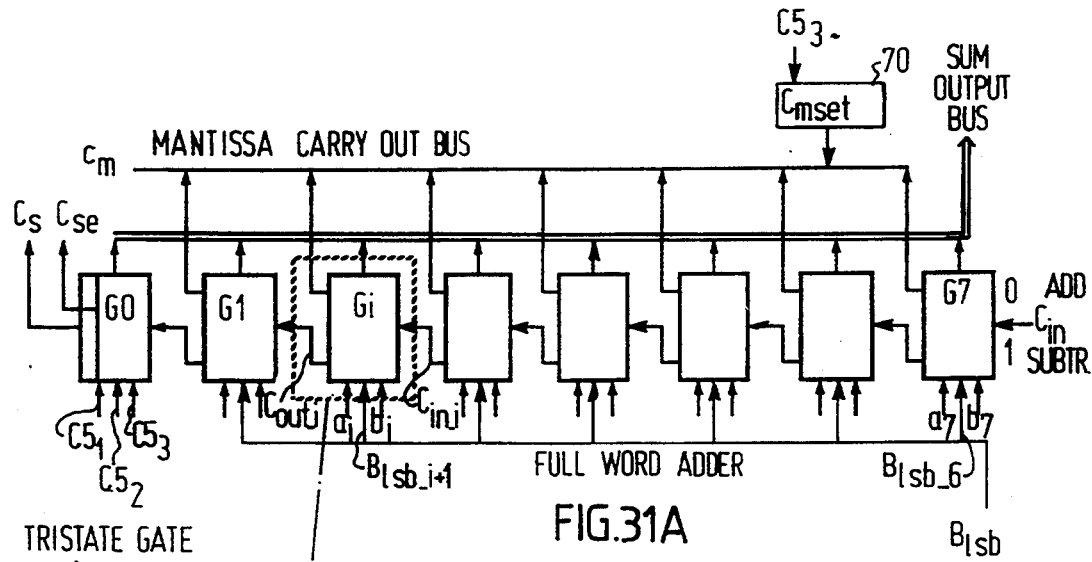
FIG.31A THE ADDER GRP UNIT
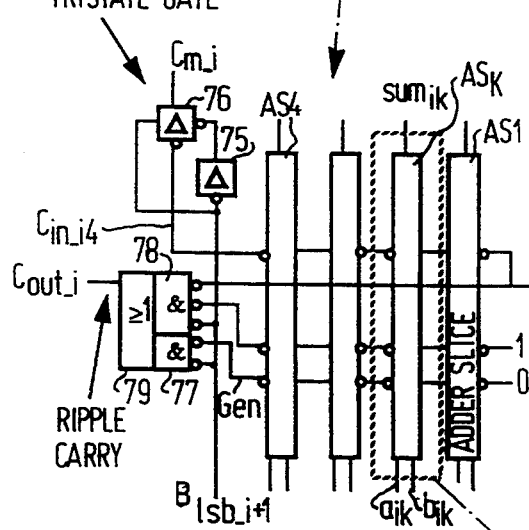
FIG.31B PRECISION SLICE i
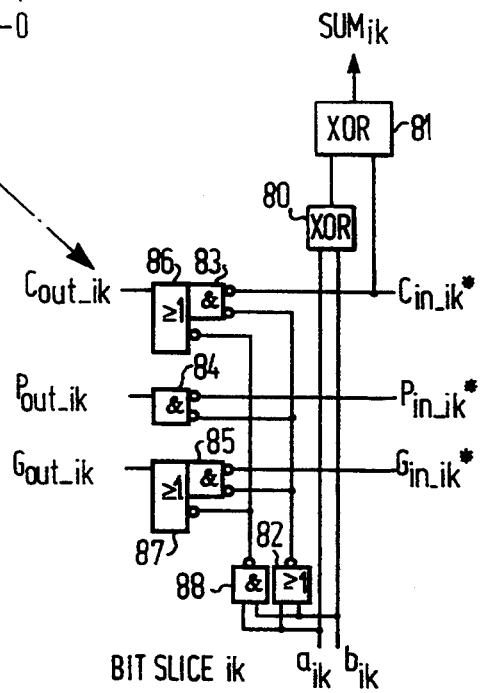
FIG.31C BIT SLICE ik APPROPRIATE DIVISIONS INTO REGIONS OF A SQUARE FIELD SECOND ORDER PROCESSOR INCLUDING 256 FOPs:
256 SIZE 0 REGIONS
64 SIZE 1 REGIONS
16 SIZE 2 REGIONS
4 SIZE 3 REGIONS
1 SIZE 4 REGION

REDUCTION PROCESSOR EMPLOYING AN ACTIVE ASSOCIATIVE MEMORY

RELATED APPLICATION(S)

This application is a continuation of application Ser. No. 07/739,531, filed Aug. 2, 1991, now abandoned.

This invention is directed to a reduction processor.

BACKGROUND OF THE INVENTION

The computer was invented during the 1940's. Since then it has been developed with a revolutionary speed. In spite of this, current days computers have almost the same architecture as the first ones.

Most improvements have been made in the hardware. The introduction of VLSI and the enhancement in lithography has made it possible to build one chip computers that only five years ago were called super computers. The dimensions have shrunk exponentially and the line width is now less than 1 micrometer. The clock rate as well as the number of active transistors have increased many orders of magnitude. Physical limitations will probably limit the line width to 0.2 micrometer.

During the same time the computer architects have not improved in the use of silicon. On the contrary, most computers have been using more than the optimal amount of silicon in order to be faster.

Both these facts will stop the evolution of the speed of single processors in the next five years. Parallel processors are introduced resulting in an increased hardware cost because of rising complexity and, for most types of programs, a prohibitive increase of programming costs.

Seen in relation to each other, the hardware costs have shrunk but the programming costs of new systems have grown considerably and will soon be at a prohibitive level.

A computer is a complicated assembly of different units in software and hardware. Different paradigms and stages in the evolution have created standards—ad hoc and established—that are spread out into the system. Because of this nonuniformity there is a great number of interfaces.

All these interfaces and paradigms of different quality and style have made it hard for a user or a programmer to use the machine—it requires a lot of knowledge—and because of the complexity a programmer might introduce hidden errors.

However, recently so-called reduction processors are developing. A reduction processor executes a program having a certain structure including arithmetic expressions and this structure is reduced in a number of reduction steps. Thus, the program is not executed in a given sequence as in other kinds of computers.

There have been some difficulties in developing reduction processors above a limited size.

The Development of Programming Languages

The development of the first electronic computer started the development of several programming languages suited for this type of computer, such as FORTRAN, COBOL, Algol, BASIC, Pascal. These languages have been called imperative languages, below also called conventional languages, mainly because of the fact that they normally give programs that consist of a sequence of commands or instructions to be executed sequentially by a conventional computer, i.e. a computer designed according to the principles developed by John von Neumann. An increasing discomfort with these languages led to the development of another series of languages: LISP, ISWIM, Scheme (a dialect of LISP), ML, Hope, SASL, and so on. The driving force behind the development of these languages was conceptual simplicity; no particular machine influenced the design. It took some time before functional languages began to receive attention—one reason was that functional programs were slow to execute. Later developments have shown that the execution speed, in some cases, can be close to or the same as for conventional (imperative) language programs executed by conventional computers, even though these functional programs are not aimed at being executed by this type of computer.

The Software Crisis

What initiated the massive effort to develop functional languages was an increasing discomfort with imperative type languages. One started to talk about the software crisis around 1970. Programs became increasingly complex and often contained a lot of errors, were difficult to read, difficult to understand and specially hard to modify. One of the reasons is that the expectations that high-level imperative languages would simplify programming were set too high - these languages were not at such a high level, or abstraction level, as it may have seemed. The imperative languages are still adapted to the early computer concepts, the von Neumann kind of computer, and the level of programming is still fairly close to the machine level. Functional programming languages have several properties alleviating some of the disadvantages of the more conventional programming languages.

For additional information and understanding we refer to the textbook "Functional Programming Using Standard ML", Ake Wikström, Prentice Hall 1987.

In order to fully understand the objectives and advantages of the invention it is essential to understand what comprises a functional approach in computing. Specially in comparison with the historically more prevalent imperative approach.

The expression "functional approach" is meant to mean that programs are written in a functional language and stored and executed on a computer comprising hardware specially suited for these languages. Equivalently, the expression "imperative approach" is meant to mean that programs are written in an imperative language and stored and executed on a computer comprising hardware suited for imperative languages.

However, it is possible to store and execute programs written in a functional language on a conventional computer. The opposite is also possible—programs written in an imperative language can be executed on a computer suited for executing programs written in functional languages.

Properties of Functional Languages

A program written in a functional language can be seen as a set of definitions of properties of objects and as computation rules. The definitions are the declarative part and the computation rules, or reduction or rewrite rules, are the operational part that the computer uses during execution. Functional languages provide a higher-level interface to the computer which makes it possible for the programmer to abstract away from hardware-related details of the computer. As a positive side-effect functional programs are often shorter and easier to understand than conventional imperative programs. One of the main disadvantages with functional languages is that functional programs have to be translated to a conventional language in order to be executed on a conventional computer. This has been done with compilers or interpretating programs. It is clear that some of the benefits of the functional approach have been held back by the fact that no dedicated hardware has existed for the task of storing and executing functional programs in an effective manner.

OBJECTS OF THE INVENTION

The main object of the invention is to provide a processor in which most hardware limitations are eliminated.

A further object of the invention is to provide a very fast processor adapted to real-time executions.

Another object of the invention is to provide a processor in which the programming will be the simplest possible and the complexity of the programming will be made in a uniform and simple world.

Still another object of the invention is to provide a processor being adapted to a language used at the same time as machine language, operating system, communication protocol and programming language, i.e. a language which is simple and in which software levels have been brought to a minimum.

Another object of the invention is to provide a processor which is very simple and flexible to use as well for programmers, system administrators, hardware designers and component people.

A further object of the invention is to provide a processor adapted to a declarative programming language having behaviours as semantic objects, thus describing real-time and system properties.

Still a further object of the invention is to provide a processor having a structural arithmetic unit separated from and cooperating with a numeric arithmetic unit.

SUMMARY OF THE INVENTION

To the attainment of the foregoing and other objects, the invention contemplates a reduction processor controlled by a program having a structure and able to reduce said structure in a number of reduction steps including different kinds of reductions, a first order processor of this type including an active storage in turn including a. a number of active storage cells, each having the opportunity to give rise to a performance of a reduction operation, and b. a communication net communicating the result of each reduction to all cells among the storage cells having connection to the result.

The communication net includes preferably a bus arrangement having control lines and data lines, all lines being connected to each of the storage cells, and a control unit in common for all of the storage cells. Each storage cell may be able to include all information necessary to perform a reduction operation.

The reduction information may also include reference to at least one of the other storage cells, the content of the storage cells being linked by the reference(s) in a tree structure. At least one of the storage cells, called core cell, is able to perform all kinds of reductions, and the rest of the cells, called object storage cells, are able to perform only limited parts of some of all kinds of reductions. The object storage cells are included in an associative memory having a first bus arrangement for external control, and a second memory bus arrangement for data including:

several object storage cells for storing a composed information, means in each of the object storage cells for storing at least one mark, the marks indicating at least select state(s) or non select state(s) for the object storage cell, means for making search operations among the object storage cells to set the marks, and a priority decoder to which all object storage cells are coupled and which selects one out of several of the object storage cells.

At least one global bus is provided for making logical operations of the type AND and OR between the storage cells, and means in each storage cell for communicating with the buses and to control the storage cell to take part in an actual logical operation.

Several first order reduction processors could be joined into a square field representing a second order reduction processor, each first order processor in said square field would include a channel going to each neighboring first order reduction processor in the square field.

The second order reduction processor in turn could be divided into logical regions, each having a size of $2^n$ times $2^n$ first order reduction processors, the logical regions being provided at the side of each other in a regular pattern such as to cover the square field of said second order reduction processor.

At least one referable indirect element provided with an address is stored in each region, the indirect element being only referable from storage cells within the region to which it belongs.

The first order processors could be connected to each other in the said second order processor such that each region within the second order processor is displaceable half a region in every direction by internal redefining of the placement of the region within the second order processor.

As an alternative, several of the first order reduction processors could be connected in a hierarchy of networks, each network being a bus or a ring, or several of the first order reduction processors could be connected in a hierarchy of networks, at least two kinds of network being provided, the first kind being a bus, the second kind being a ring and the third kind being a square field.

At least one port is connected to said active storage, and at least one surrounding means is connected to the ports.

A signal sequence provided on a port may be compared with a sequence stored in at least one storage cell, the stored sequence having possible undefined sequence elements, in the active storage means, and the stored sequence may be rewritten into nothing, i.e. something representing contradiction, if the comparison gives a clear difference, or else the stored sequence may be rewritten into a specified sequence being the unification of the signal sequence from the surrounding and the stored sequence from the machine.

A plurality of second order reduction processors, geographically separated from each other could form a third order reduction processor.

An associative adressing limited by region is adopted for second order reduction processors and physical adressing is adopted for third order reduction processors.

Execution by Reduction

A program to be executed can be represented by a directional graph of closures, where each part of a program is represented by a closure. During execution this directional graph of closures is gradually reduced according to the reduction rules of the language used. When there are no executable closures left the execution of the program is finished. A directional graph of closures could be regarded as a tree structure where each node in the tree is a closure and where the topmost node is called the root. Execution by reduction is then normally performed by reducing the tree structure bottom-up, reducing the parts of the tree furthest away from the root and then up towards to the root. This kind of execution is normally called demand driven execution, i.e. the execution of parts of a program depending on the result of the execution of other parts is postponed until the result is available.

DEFINITIONS

Below follows a list on expressions used in this specification and their reserved meanings:

element
: part of something larger in a data structure list
: an ordered sequence of elements, each element could in turn be a list inserted list
: a part of a list, small enough to be stored in its entirety in one cell closure. Makes it possible to represent arbitrary long lists closure
: a hierarchically structured entity which defines a process. All closures have a root which uniquely defines the closure. The reduction work in a reduction machine is made on closures. The whole state of the machine is transformed by the reductions object storage
: memory including storage cells storing objects.

storage cell
: a cell in an object storage. It stores a cell closure, which might refer to other cell closures stored in other storage cells cell closure
: the content in a storage cell storage cell field
: a field in a storage cell closure element
: a data element stored in a storage cell field closure identifier
: a closure cell element uniquely designating a closure canonical closure
: a closure which cannot be further reduced, i.e. a cell closure which does not contain any closure identifiers designating some other cell closure which might be reduced in such a manner that this cell closure has to be further reduced goal
: a closure to be executed, i.e. reduced father
: a closure having at least one closure identifier in a value/designation field son
: a closure linked to another closure through a closure identifier, which is designating the son A son could also be a father. A father could also be a son. A son could have more than one father. A father could have more than one son.

closure net
: a closure and all its fathers closure position
: whether the closure is a root or a node root
: the topmost closure in a closure tree node
: a closure in a closure tree not being a root where
: a storage cell field containing a closure position type
: type code in a cell closure, i.e. a bit pattern representing a property of an object, e.g. an instruction code.

lazy
: an element in a cell closure which indicates if it is executable or a postponed evaluation or inactive identifier
: a special kind of closure element used to denote an object stored in a storage cell environment
: objects may be grouped by giving them the same environment value/des.
: a closure element storing either a simple value, i.e. a direct representation, nothing, or a designation to another closure, i.e. an indirect representation core cell structure arithmetic unit. The core cell is able to perform structure arithmetic involving reducing closures numeric ALU
: numeric arithmetic unit able to perform basic numeric and logic operations. The core cell makes use of the numeric ALU for numeric operations full register
: register extending through all the planes in a core cell core word
: the content of a full register in a core cell limited register
: register in a core cell extending through a limited amount of planes dimensioned to include a closure cell element of value/designation type element word
: the content of a limited register or a part of a full register having the same extension as the limited register num word
: the part of an element word representing a value or a designation tag word
: the part of an element word having the tag indicating the feature of the representation in the num word reduction
: rewriting/restructuring a closure in accordance with the rules of the particular programming language used

The Associative Object Storage

The strategy when deriving the processor according to the invention of the first order was to build an object storage device as several storage cells. Each such cell should contain one cell closure or be a free unused cell. The cells should not be allocated in any particular order but should rather be assumed to be a pool of available resources.

It was deemed to be very important to have no physical address or dependence on the physical position. Such dependencies will sooner or later cause problems as in all conventional RAM type devices.

All cells in the object storage communicate through a memory bus arrangement. This is important in order to decrease the cost. Other arrangements, such as using several ports etc, will increase the area of the object storage. However, the memory bus arrangement can only perform one operation per memory cycle.

The reduction mechanism will have a state consisting of cell closures, each having an identifier, and where the cell closures, linked together by identifiers, form a graph. The graph could be followed by addressing cell closures by their identifiers. Therefore, the memory bus will be used as a shared path for all vertexes of the graph.

Each cell closure also has an environment, which could include an identifier designating the root closure in a tree of closures providing the environment of the closure. In this way the whole structure is accessible from one closure in the tree, through the root, in one operation only. Closures could be grouped together by having the same environment.

All the "addressing" must be made according to content information because there are no physical dependencies, i.e. the memory is associative. A cell closure, i.e. the content in a storage cell, includes several closure elements, storable in storage fields in the storage cell. Each storage element can contain an identifier together with some label information or a representation of a value or an indication that it is unused. In an associative search it is possible to use any closure element or combination of closure elements as a search key, e.g. the cell identifier, the cell environment, the cell type, the values written into the storage cell fields or combinations of them.

The closure elements could include an extra select bit indicating that the closure element has been selected as a target for the access mechanism. Certain search operations set these select bits in the storage cell fields.

This type of access may involve one or several storage cells. One multiple cell operation could be to store an identifier in many selected storage fields belonging to different storage cells.

The Central Control Unit

The basic reduction rules are so many that they could not be included into each storage cell. Therefore, the reduction mechanism is shared by all cell closures. Drive and sense amplifiers are used to make all the object storage cells capable of driving long memory bus wires. The central control unit can adjust the bus signals both in time and in levels. Therefore, all communication is organized on the memory bus arrangement with the central control unit as the controlling device. The central control unit, preferably being a boolean gate array, makes a rather simple decoding of values on external wires and broadcasts most of the control signals to all the storage cells in the object storage across a control bus arrangement. We refer to the text book "Introduction to VLSI Systems", by Carver Mead and Lynn Conway, Addison Wesley Publishing Company, 1980, for further information regarding design of control units.

In order to be able to perform complex access patterns, boolean expressions are solved in each storage cell. This expression is controlled by a broadcasted control word from the central control unit. The control word is normally derived by the central control unit by sensing the information in the storage cell. It is important for most applications of the reduction processor according to the invention that the boolean expressions are solved in the storage cells, because it will be more efficient than reading out information from the memory in an ordinary way and process it.

The boolean expressions are chosen to be as small as possible in order to have the area overhead caused by them as little as possible. Consequently, the access functions are carefully selected.

Thus, the control unit controls the function of the object storage. The memory bus arrangement communicates with all the storage cells. In some cases several storage cells will therefore be ordered to be read out. In order to do so a mechanism is provided for selecting only one at a time of several available candidates. The selection is made by a priority decoder connected to all the storage cells.

The Core Cell

A particular active storage cell, below called the core cell, could preferably be provided cooperating with the object storage, which in turn is to be regarded as an active storage. The core cell is able to perform all kinds of reductions, while the associative object storage contains storage cells able to perform only limited parts of some of the types of reductions. However, the core cell arrangement could be simulated in a part of the object storage—it would be less efficient though.

The core cell is able to store a plurality of levels of an expression. Basic instructions in the expression stored in the core cell should be executed in the core cell. The core cell is adapted for structure arithmetic, i.e. arithmetic for rewriting a structure given by a computer program. The expression of a cell in the unit is of a size that corresponds to a branch of the representation graph that is involved in a rewrite operation.

Numeric/Structure Arithmetic Units

It is to be noted that the core cell is a device only doing the structure arithmetic, i.e. most of the reductions, and that it makes use of a numeric arithmetic unit (numeric ALU) for performing numeric operations. Normally, a processor is provided with an arithmetic logic unit (ALU) performing both numeric and parts of structure operations, and this prior art ALU is not divided into different functional parts for structure and numeric operations in any way. When using a conventional ALU a small program is needed in order to perform equivalent operations to the structure operations performed in the core cell.

BRIEF DESCRIPTION OF THE DRAWINGS

For a more complete understanding of the present invention and for further objects and advantages thereof, reference is now made to the following description taken in conjunction with the accompanying drawings, in which:

FIGS. 6, 7 and 8 show examples of the operation of a core cell, FIG. 9 shows a block diagram of an embodiment of an operating plane in a core cell in the first order reduction processor in FIG. 1, FIGS. 27 and 27B show a data list provided in accordance with FIG. 26, FIG. 31A shows a block diagram of an embodiment of a full word adder in the circuit shown in FIG. 28, FIG. 31B shows a block diagram of a precision slice in the adder in FIG. 31A, FIG. 31C shows a block diagram of a bit slice in the precision slice in FIG. 31B.

DESCRIPTION OF THE PREFERRED EMBODIMENTS

A First Order Reduction Processor

Figure 1:
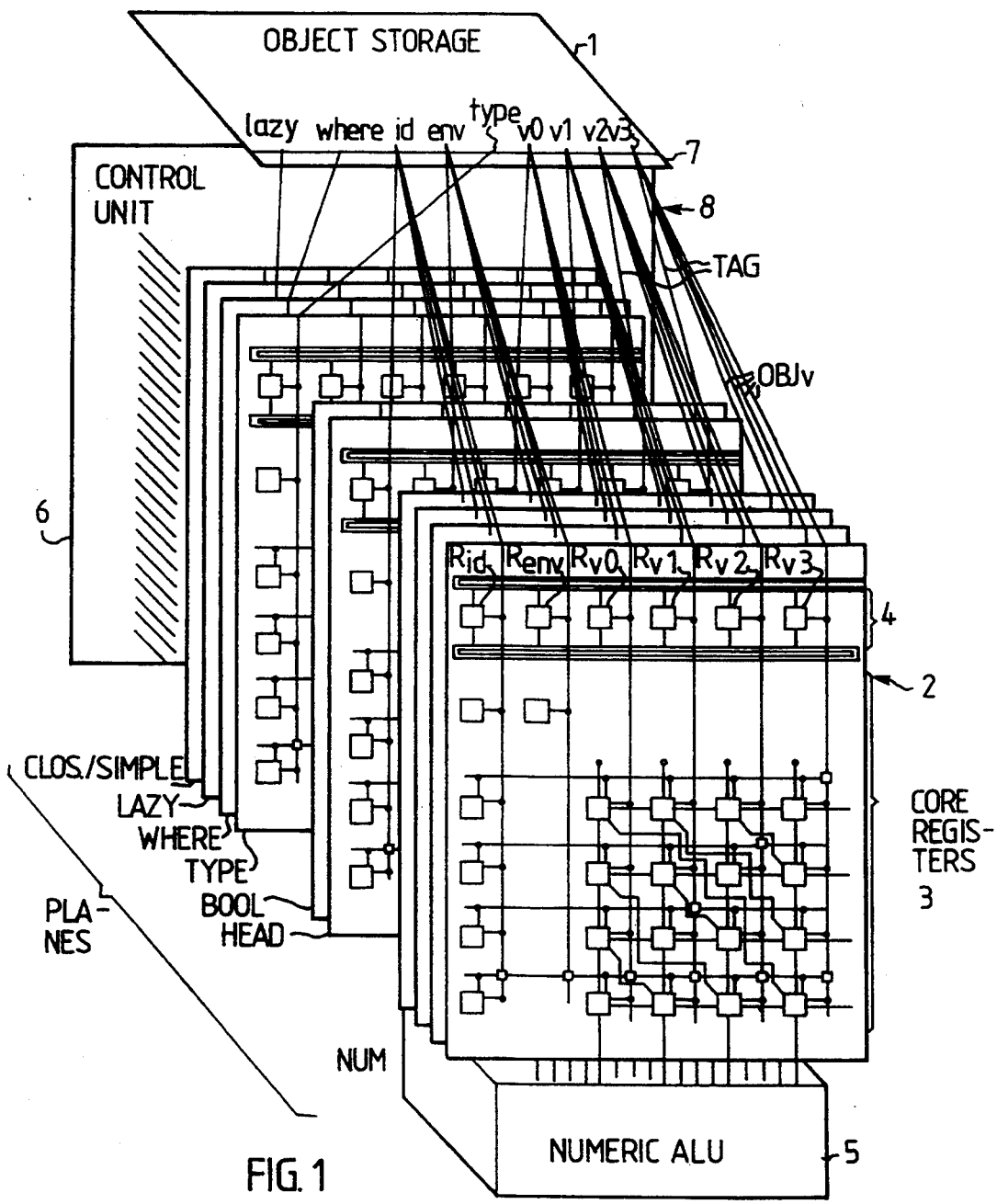
FIG. 1 shows schematically the structure of a first order reduction processor according to the invention.

In FIG. 1 an embodiment of a first order reduction processor, i.e. a simple reduction processor, according to the invention is shown. The first order processor is a reduction processor which could be provided as a part in a more complicated reduction processor as will be described further below. The schematic structure of this reduction processor is apparent from FIG. 1. However, it is to be noted that the design of it could be quite different, for instance the different planes of the core cell could be provided side by side on a chip or they could be provided in parallel layers but not exactly having the same design as schematically shown.

The first order reduction processor in FIG. 1 includes an active, associative memory 1, below called object storage, including memory cells, below called storage cells, each able to store a data object which could include executable parts and also preferably being able to provide limited sets of reducing arithmetics, a structure arithmetic unit 2, below called core cell, including several core registers 3 for performing the structural arithmetic operations, i.e. the structure modifying reductions, and, if the first order reduction processor in FIG. 1 is a part of a two or multi order reduction processor including several first order reduction processors, a processor network data transfer means 4 providing the communication between the multiple processors. The data transfer means 4 includes several registers adapted to temporary hold a storage cell structure, in order to transfer this structure to another first order processor.

It is possible to reserve a field in the object storage for operations which are made in the core cell, i.e. the core cell could be simulated in a part of the object storage. The core cell has several features to exchange and transfer data between its registers in one operation only. Such features will take several operation cycles in an object storage field simulating the core cell.

A numeric arithmetic logic unit (numeric ALU) 5 is connected to the core cell 2, and data from the core cell is transferred to the numeric ALU when numeric operations are to be made. Thus, the structural arithmetic and the numeric arithmetic are made in different, separate units.

The processor does also include a central control unit 6 for controlling the elements in the object storage 1, the core cell 2, and the numeric ALU 5. Further, the processor could be provided with one or several ports for communication with the outside world.

The Central Control Unit

The central control unit 6 is preferably a boolean gate array of quite a complicated configuration. An embodiment of it can not be shown, because the configuration of it is calculated in a computer being provided with all the algorithms regarding the configuration of the control signals in relation to the informative signals. The boolean gate array is provided directly as chip mask patterns from the computer adapted to the configuration of the chip mask patterns for the whole processor according to the invention. Thus, this circuit is impossible to show in detail. Only signals to and from it will be described in connection with embodiments described below.

The Object Storage

Figure 20:
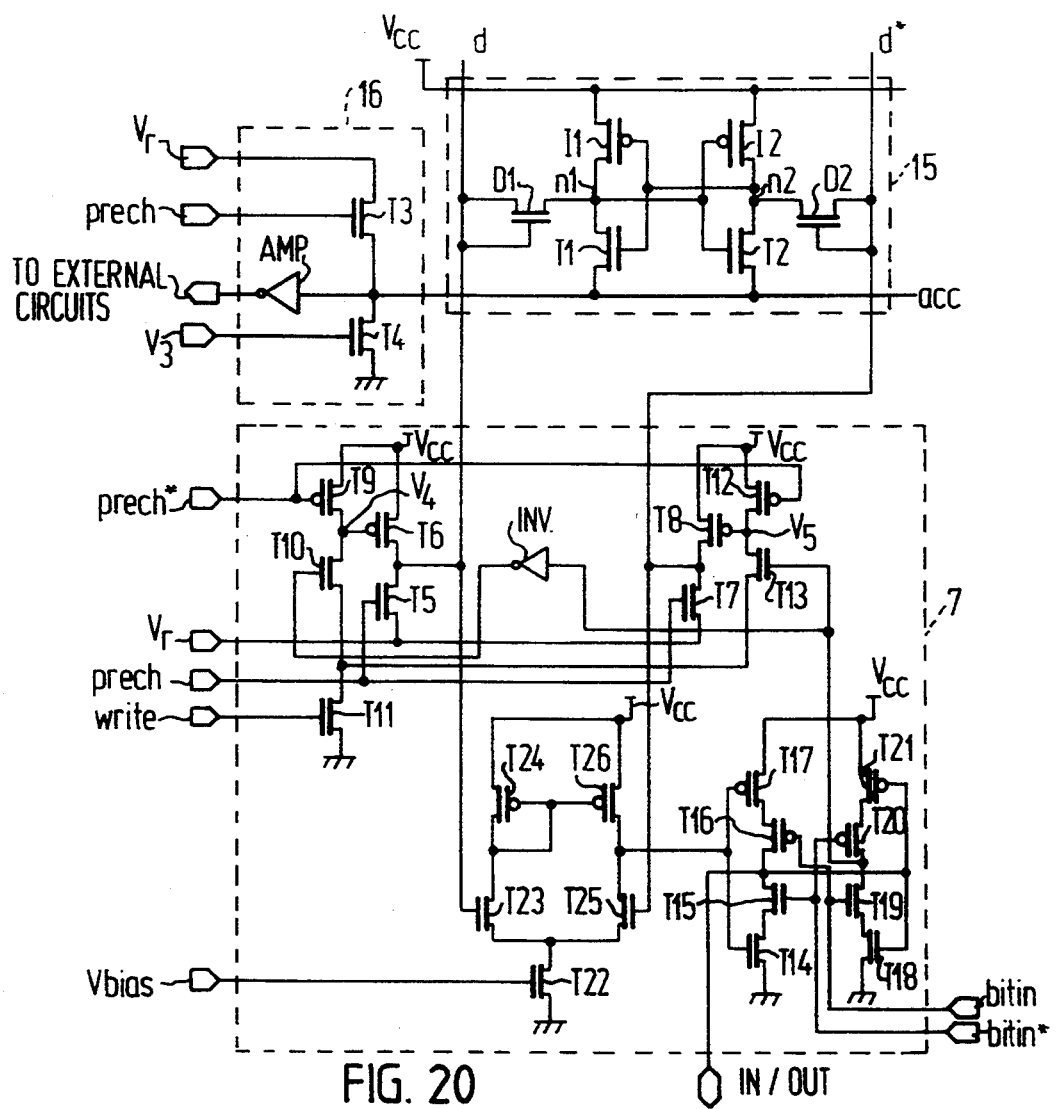
FIG. 20 shows a circuit diagram of a bit cell in a storage cell (shown in FIG. 3) and drive and sense circuits connected to it.

The object storage 1 has substantially more intelligence than an ordinary RAM type memory. It is associative which makes it possible to provide more services than "read" and "write" as provided by an ordinary RAM type memory and as will be explained further below. A bit cell structure particularly suited for the object storage is shown in FIG. 20.

The memory bit cell is able to perform many functions even though it only includes four connections of which three are controllable. It includes very few components. This gives a possibility to make a compact storage device including a huge amount of memory bit cells.

The object storage is divided in storage cells, each including several closure elements. The provided services are on a high level. For instance it is possible to find all occurrences of a particular data element whatever place it has within the individual storage cells and to rewrite the found particular data element globally, i.e. within the whole object storage, to a new value using only one memory instruction. Since the object storage is associative this rewrite operation could be made in two physical memory cycles independent of the number of affected storage cells.

Figure 2:
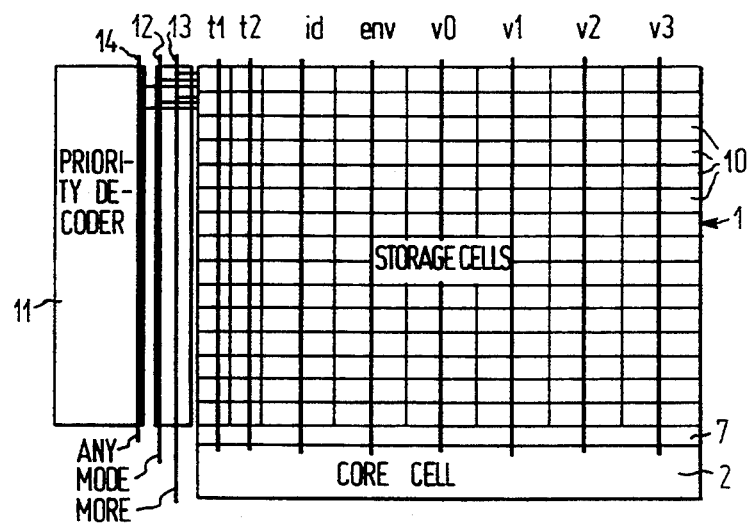
FIG. 2 illustrates schematically the design of an embodiment of a memory in the first order reduction processor in FIG. 1.

With reference to FIG. 2, the associative object storage 1 consist of a storage plane of rows of storage cells 10. Thus, the storage cells are provided as rows in a stack. They are all connected to a vertical memory bus $t_1, t_2, id, env, v_0, v_1, v_2, v_3$ driven by drive and sense amplifiers in a transforming interface 7, as will be further explained in relation to FIG. 20. All storage cells are also connected to a priority decoder 11 selecting one storage cell 10 at a time out of several storage cells to be operated. The object storage is controlled by associative accesses performed during a session of some few cycles. A full object storage access is performed during a session.

The Port

In order to communicate with the outside world the reduction processor could be provided with one or several ports for input/output of data. The port can be seen as a prolongation of the object storage since it contains storage cells similar in function and compatible with the object storage cells. The port performs input-/output-operations through unification.

The Object Storage Cell

A storage cell 10 in the object storage 1 is used both to store a digital content and to take active part in the actual computing. Composed digital information and at least one mark are stored in each storage cell 10. The marks are either CHOSEN or NON CHOSEN. The composed digital information in the storage cells or in parts of them, called closure elements, can be read or written by reading or writing the information being marked CHOSEN. Access may also be provided without having the mark bit involved. The access is then controlled by the result of a logic function on one bit busses a and b connected to the elements as shown in FIG. 3, which shows a storage cell.

Two global one bit busses 12 (MODE) and 13 (MORE) are provided in order to make logical operations between the storage cells 1. These operations could be AND and OR. A third bus 14 (ANY) could be provided connected to the priority decoder. However, the number of busses is not restricted to three but may be only one or several. The separate storage cells can read from the busses 12, 13 and 14 and also take part in the logical operations. The bus 12 (MODE) will have a signal 'true' if a test is going to be made on any of the buses a or b. The bus 12 (MODE) can be read and written to by all the storage cells. The bus 13 (MORE) will have a value 'true' if MORE than one storage cell are chosen. The bus 14 (ANY) will have a signal 'true' (i.e. "1") if ANY of the storage cells request communication.

Figure 3:
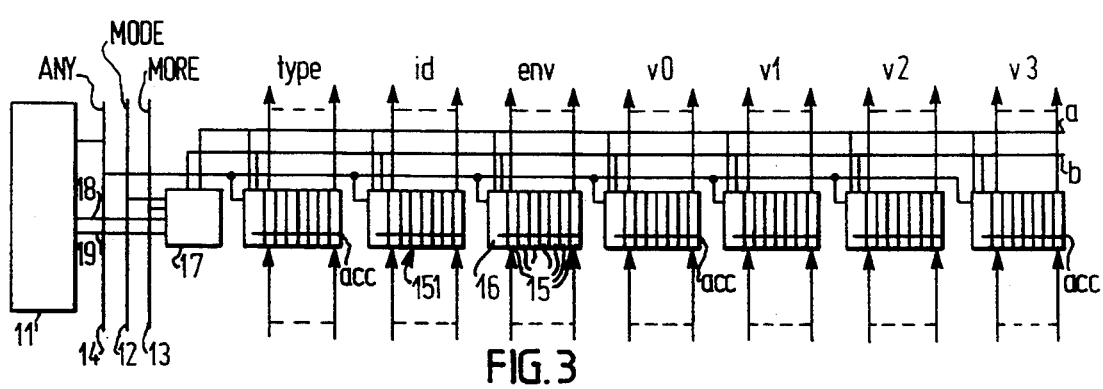
FIG. 3 illustrates schematically an embodiment of a storage cell in the memory shown in FIG. 2.

The storage cell shown in FIG. 3 is divided into several storage cell fields 151. Each storage cell field 151 includes several bit cells 15 and an element head 16. A closure element is stored in the bit cells 15 together with a mark representing CHOSEN or NOT CHOSEN stored in the element head 16. The closure elements could be assigned to mutually different tasks. The word length to be stored in each closure element could for instance be in the order of 38 bits. As an addition to the mark in the head 16 some of the bits in bit cells 15 may also be used as an information regarding the usage of the rest of the information in the element. Thus, so called tag words may be placed in these bits. 6 bits may be used as tag words and 32 bits as normal, stored information in the bit cells 15.

As apparent from FIG. 3, all the closure elements do not have to have the same size. Thus, the closure elements connected to the bus parts t1 and t2, i.e. TYPE, are smaller than the closure elements connected to the rest of the bus parts. The element head 16 of the storage cell fields 151 are connected to local one bit busses a and b of the storage cell. The number of these busses may be chosen in another way. The essential is that there is at least one bus. Logical operations of the kind WIRED AND and WIRED OR among CHOSEN of the closure elements are made using these busses.

Each storage cell has a closure head 17 to which the busses a and b are connected. The closure head 17 is also connected to the priority decoder with at least one bus one bit wide, which in the embodiment shown are two busses 18 and 19, and is also connected to the global busses 12 and 13. The closure head 17 serves as a buffer. The cells can read the result on these busses or take part in the logical operation.

The Object Storage Cell Use

Figure 4A:
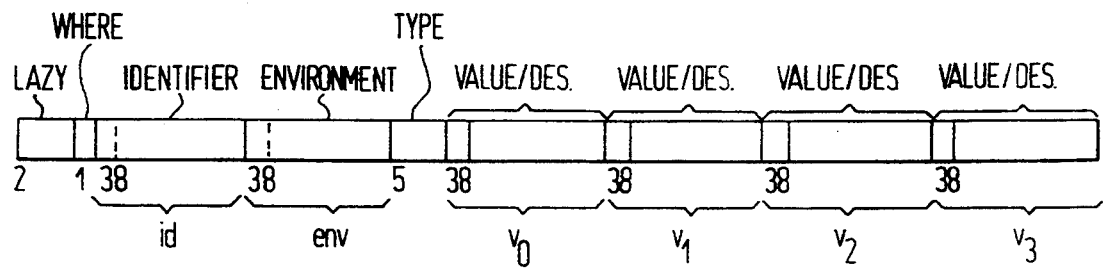
FIG. 4A shows the use of different fields in a storage cell which can store a cell closure.

An embodiment of a storage cell is shown diagramatically in FIG. 4A, and will be used to explain the function of the different storage fields in a storage cell, as used in the processor according to the invention. The fields in the storage cell in FIG. 4A do not have the same order as the fields in the storage cell in FIG. 3, because FIG. 3 shows the hardware and FIG. 4A the use of the cell. As illustrated in FIG. 4A the storage cell can store two kinds of closure elements and includes storage fields particularly adapted to the elements to be stored. These fields have been given the same names in FIG. 4A as the closure elements to be stored in them.

The First Kind of Closure Elements

The first kind of elements describe different states of the storage cell. One element of this kind is LAZY, which denotes whether the cell is idle, in which case the rest of the content of the cell is regarded as passive information, exec, i.e. is in an executable state, or wait, i.e. the evaluation of the cell has been postponed and it is waiting for a result before it can be executed. The field LAZY includes two bits. Another first kind of element is WHERE, indicating if the closure is a root or a node of a tree. It includes one bit. Another first kind of element is TYPE, which include an type code (par, seq, apply, list, unify etc). It includes three bits in the shown embodiment. These first kind of elements are adapted to be stored in the parts of the core registers 3 provided in planes LAZY, WHERE, and TYPE shown in FIG. 1 when a cell closure is transferred to the core cell for reduction. Therefore, they have been provided with the same denotations. However, the core cell is provided with an extra plane called CLOS/SIMPLE in which it is denoted if the information in the register is a closure or a simple value. The planes CLOS/SIMPLE, LAZY, WHERE and TYPE are called the ATTRIBUTE planes below. Depending on the application additional storage cell fields and core cell planes could be provided.

The Second Kind of Closure Elements

The second kind of elements describe identification, environment or value. These are IDENTIFIER, ENVIRONMENT, VALUE/DES. These second kind of elements are adapted to be stored in the parts of the core registers 3 provided in the planes HEAD and NUM shown in FIG. 1. Each of these elements includes an element word including 38 bits in the shown embodiment. The element word in turn is divided into a num word having preferably 32 bits to be stored in the planes NUM in the core cell and a tag word having preferably 6 bits to be stored in the planes HEAD when transferred into the core cell. Depending on the application additional planes could be provided.

The Tag Word

Each closure element of the second kind has a tag word indicating the feature of the num word. The tags are of two kinds, indirect tags, i.e. tags used for identifiers and environments, and direct tags, i.e. tags used for simple values or the like. Examples of indirect tags are cls, canon, and open. If the tag word is cls it means that the num word represents a closure which might be reduceable. If the tag word is canon it means that the num word represents a closure which can not be further reduced. If the tag word is open it means that the identifier field represents a closure being an inserted list. Examples of direct tags are discr, cont, unused and nothing. If the tag word is discr it means that the num word is an integer. If the tag word is cont it means that the num word is a floating-point value. If the tag word is unused it means that the num word in the field lacks meaning. If the tag word is nothing it means that the num word in the field represents nothing, i.e. a contradiction, e.g. a unification of a closure including a field marked nothing will always be nothing. Depending on the application additional indirect or direct tag words could be provided.

Identifiers

If the identifier field in a storage cell includes an identifier element the cell closure in that storage cell could be transferred to the core cell. Each of the storage cell fields VALUE/DES could contain an identifier denoting another cell closure, thereby providing a link to this other cell closure. The amount of stored closures could be seen as a directional graph or tree of cell closures held together by identifiers.

The Environment

The environment fields could include an identifier designating the root closure in a tree of closures providing the environment of the closure. In this way the whole structure is accessible from one closure in the tree, through the root, in one operation only. However, the environment field could also have other uses. The environments could be used to keep track of the creator of a structure by storing the identifier of the creator in the environments of all cell closures created. Another example is that all closure cells in a subtree, in which all symbols having the same name shall stand for the same thing, could be grouped by having the same environment.

Thus, if the environment of a closure is given, the root closure within this environment could be found. A root closure of an environment may be provided with a particular mark (for instance "1") in the field WHERE in its storage cell. A node closure of an environment may be provided with another mark (for instance "0") in the field WHERE.

The Type

The content in the storage cell field TYPE is the type of the cell closure. This TYPE component can for instance have the values: par, i.e. parallel values and/or designations, list, i.e. a sequence of values and/or designations, unify, i.e. a content of values and/or designations which are to be examined whether they represent the same values or not etc.

The Core Cell

The core cell as a whole is an arithmetic device for structural arithmetic containing several core registers 3 (see FIG. 1). The registers store a tree of lists. Each list includes words.

The core registers contain a definition derived from the object storage 1. The core registers 3 are connected to the object storage with a bus arrangement 8, including the buses type, id, env, $v_0$, $v_1$, $v_2$, $v_3$, wide enough to transfer the content in an object storage cell. However, the core cell may contain and include up to a three level object structure. There are four cases: a 0, 1, 2, or 3 level object structure can be stored in the core cell.

Registers in the Core Cell

Figure 4B:
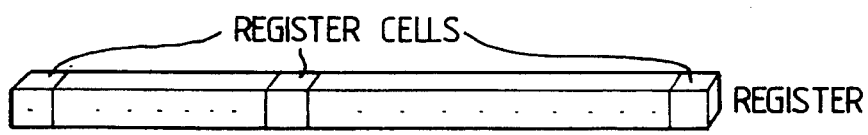
FIGS. 4B, 4C and 4D show core registers which could be used in an embodiment of a core cell.
Figure 4C:
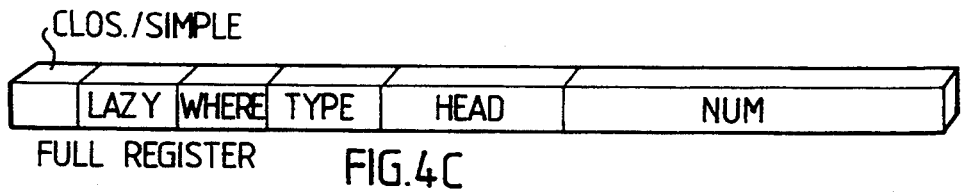
Figure 4D:
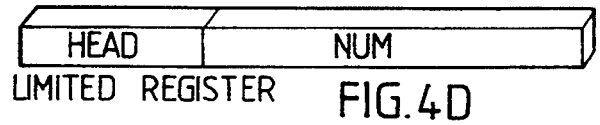
Figure 4E:
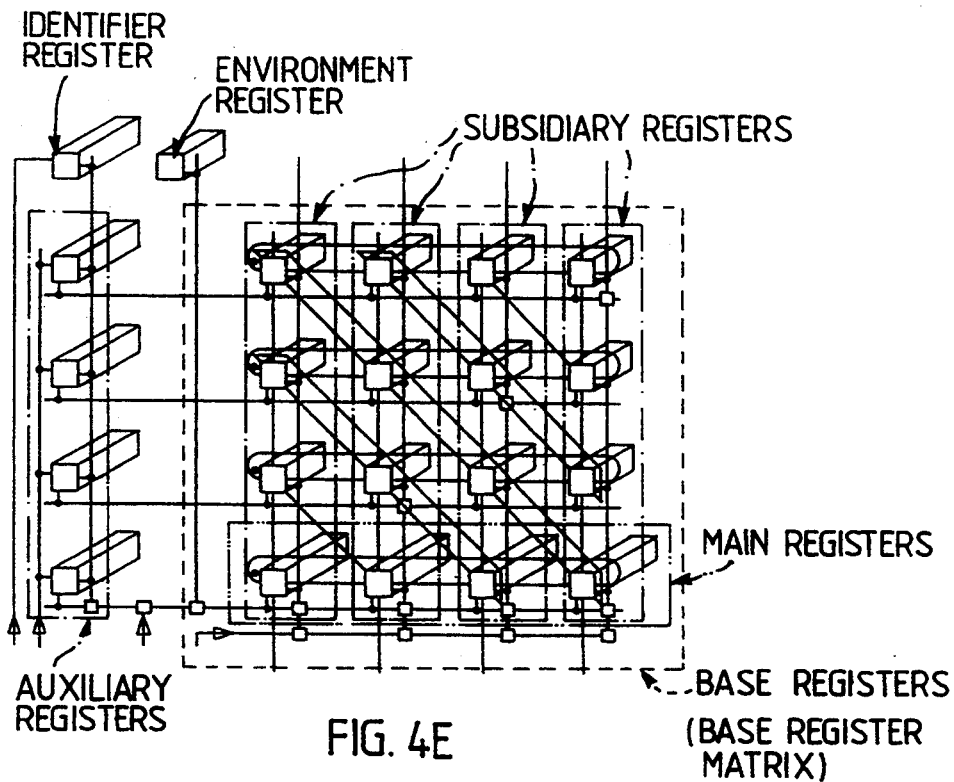
FIG. 4E shows a possible configuration of the core registers in an embodiment of a core cell.

The registers that could be used in an embodiment of the core cell is shown in FIGS. 4B to 4D, the configuration of the registers that could be used in an embodiment of the core cell is shown in FIG. 4E.

FIG. 4B is meant to illustrate that a register is built from register cells, each cell being able to store one bit of information. The way the register is drawn is meant to illustrate that a register extends through the different planes in the core cell, with each register cell situated in one plane.

FIG. 4C shows a register, which extends through all the planes in the core cell, i.e. a full register. This kind of register can hold an identifier or a value in the register cells situated in the NUM and HEAD planes. It can also hold a state, described above, in the register cells situated in the BOOL, TYPE, WHERE, LAZY and CLOS/SIMPLE planes.

FIG. 4D shows a register, which extends through only the NUM and HEAD planes of the core cell, i.e. a limited register.

FIG. 4E shows a possible configuration of registers in the core cell. The core cell has base registers preferably arranged in a square, called the base register matrix. The base registers have a main row along one of its sides, called the main registers. The columns of base registers, each having one main register at the bottom, are called the subsidiary registers. The core cell could also be provided with an identifier register and an environment register. A line of auxiliary registers is placed at the side of the base register matrix.

In an embodiment of the core cell all base registers except the main registers could be of the kind shown in FIG. 4D, i.e. limited registers, and the rest of the registers in FIG. 4E could be of the kind shown in FIG. 4C, i.e. full registers.

Before a more detailed description of the hardware structure of the core cell a brief description of different storage forms of data will be given with reference to FIGS. 5A to 5F and some examples of its operation will be given with reference to FIGS. 6A to 6H, 7A to 7G, and 8A to 8G.

Simple Value

Figure 5A:
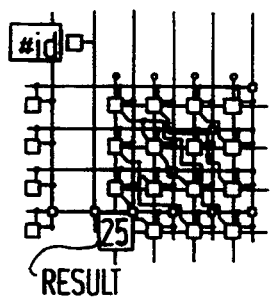
FIG. 5B, 5C, 5D, 5E, and 5F show different data storage forms in a core cell.

As shown in FIG. 5A, a simple value 25 being a result of a reduction is present in a particular register of the main registers.

One Level Structure

Figure 5B:
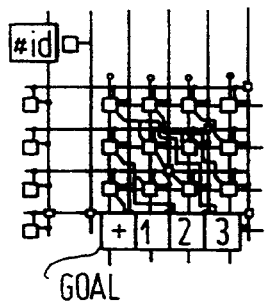

A goal is what is loaded into the core cell in order to be reduced. As shown in FIG. 5B a goal including only one level, typically being a closure without references to other cell closures, is stored in the main registers. The example shows a simple numeric operation, i.e. the addition of the values 1, 2 and 3. The numerical instruction (+) is stored in the first main register and the elements to be processed are stored in the other main registers.

Two Level Structure

Figure 5C:
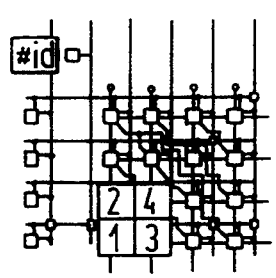

As shown in FIG. 5C a tree including a two level structure may have its root list, being a father, stored horizontally in the main registers and the lists, being sons, vertically in the base registers. In this example the structure having a list representation ((1 2) (3 4)) is stored in the base register matrix. The root list, i.e. 1 and 3, being the first elements in the sublists is stored in the main registers, and the son lists, i.e. (1 2) and (3 4), are stored vertically in the subsidiary registers. Further examples of this kind of storage will be given below, e.g. in relation to the FIGS. 6.

Three Level Structure

Figure 5D:
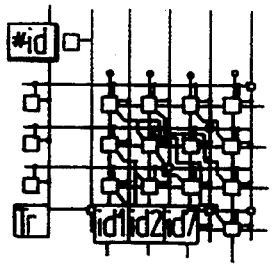
Figure 5E:
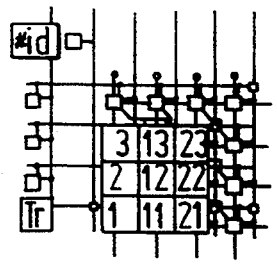

As shown in FIG. 5E, a goal tree including a three level structure has its root stored in one of the auxiliary registers and its single son is stored in the main registers. In FIG. 5D the root, which is the instruction Transpose (Tr), of the goal tree is stored in one of the auxiliary registers and its son, which is the list (id1, id2, id7), is stored in the main registers. Each element in this list is in turn an identifier denoting a son. In FIG. 5E these sons are vertically loaded in the base registers, where id1 is exchanged for the list it denotes, i.e. (1 2 3), and where id2 is exchanged for the list it denotes, i.e. (11 12 13), and where id7 is exchanged for the list it denotes, i.e. (21 22 23).

Pipe Line Mode

Figure 5F:
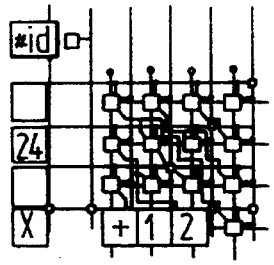

As shown in FIG. 5F, a tree stored in a pipe line mode is loaded with the goal list in the main registers and with the father of the goal in the auxiliary registers and has instructions and elements to be processed stored in both kinds of registers. The pipe line mode of operation is preferably used when reducing numeric expressions. One advantage is that intermediate results can be temporarily stored in the core cell instead of in the object storage.

EXAMPLE 1

The first example shown in FIG. 6A to 6H is a unification of parallel values given as the reduceable closure unify(par(1 par(1) 3) par(1 par(1) 2))

This reduceable closure is to be rewritten as a parallel structure of unifications.

Figure 6A:
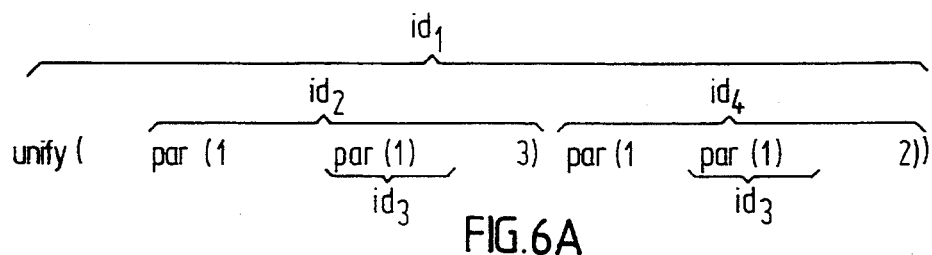
Figure 6B:
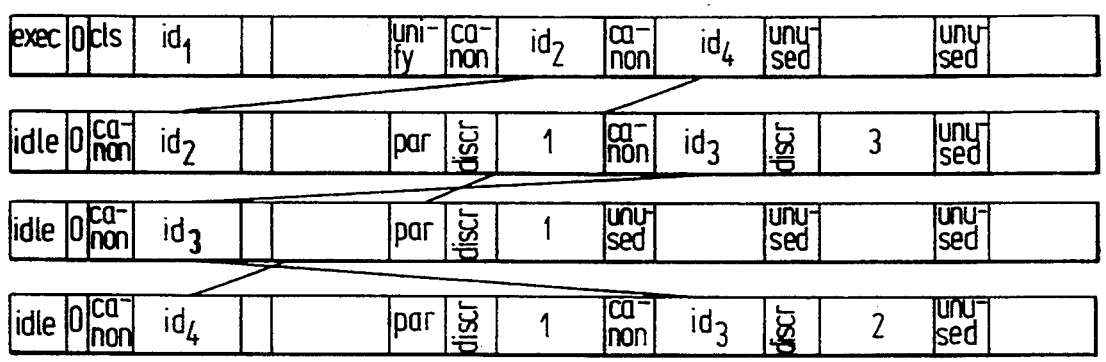

FIG. 6A shows the initial reduceable closure. FIG. 6B shows how this reduceable closure is stored in the object storage. The storage cells in which different parts of the reduceable closure are stored are marked out in FIG. 6A. The links between element closures and cell closures are marked out in FIG. 6B. The cell closure having the identifier $id_1$ has the tag cls and has the type code unify the type field and the cell closures having the identifiers $id_2$, $id_3$ and $id_4$ have the type code par in their type fields. The cell closure having the identifier $id_1$ includes as its first two value/designation closure elements designating the cell closures having the identifier $id_2$ and $id_4$. These cell closures are tagged canon. The cell closure having the identifier $id_2$ has its first and third value/designation closure elements provided with discrete values having the tag discr and its second value/designation closure element designating the cell closure having the identifier $id_3$ and thus is tagged canon. The cell closure having the identifier $id_3$ has its first value/designation closure element provided with an integer and thus tagged discr. The cell closure having the identifier $id_4$ has its first and third value/designation closure elements provided with discrete values having the tag discr and its second value/designation closure element designating the cell closure having the identifier $id_3$ and thus tagged canon.

Figures 6C, 6D:
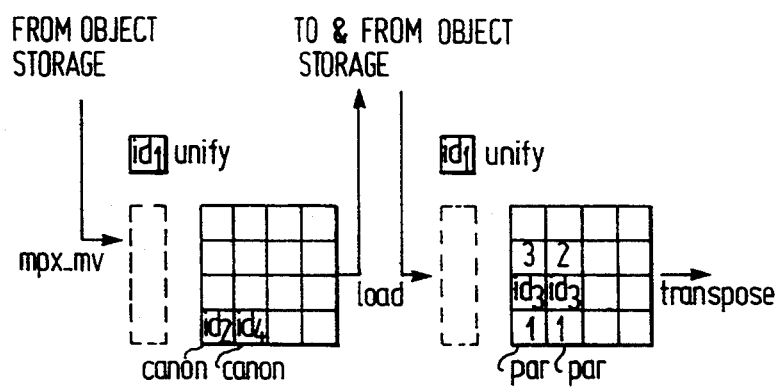
Figure 13:
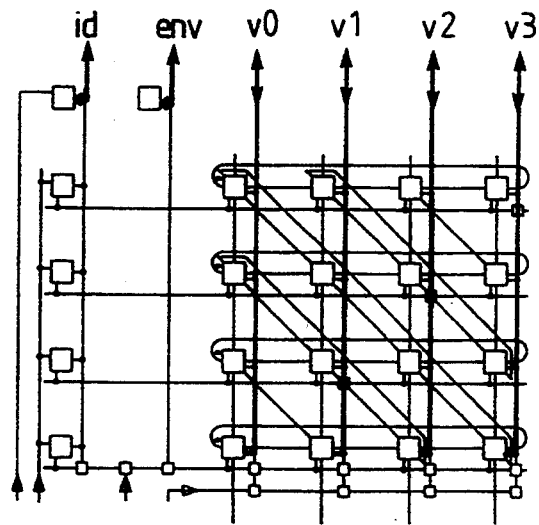
FIGS. 13, 14, 15, 16, 17, 18 and 19 show different examples of data transport within the core cell.

As shown in FIG. 6C, the content of the storage cell with the cell closure having the identifier $id_1$ is first loaded into the core cell placing its identifier in the identifier register as $id_1$ including the type code unify of the closure, and the value/designation elements as the goal in the main registers in a first operation step. How this is actually done is shown in FIG. 13 and described further below.

As shown in FIG. 6D, the sons having the identifiers $id_2$ and $id_4$ are loaded vertically in the base registers such that the content in their first value/identifier element is placed in the main register marked with its identifier and the rest of its value/identifier elements in registers in a vertical column thereabove. The type code par of each of these sons is also loaded in the main register. The type code is loaded into the register cells situated in the TYPE planes.

Figures 6E, 6F:
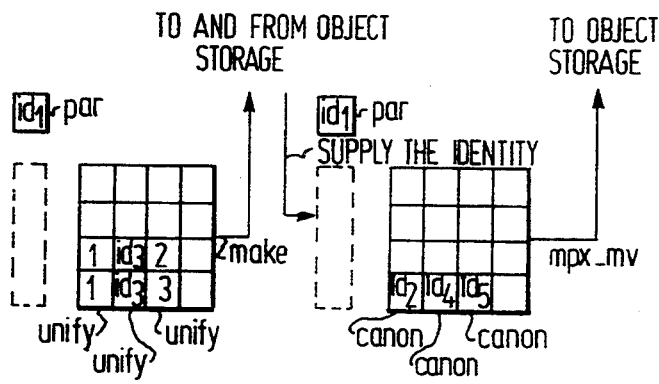
Figure 18:
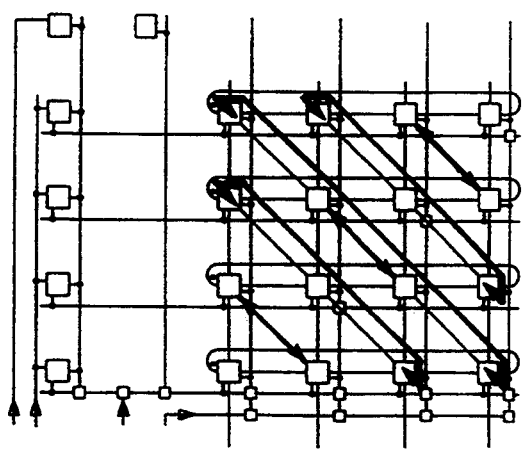

As shown in FIG. 6E, the contents of the base registers are transposed 90°, such that the contents of the first vertical column of the base registers are placed in the main registers and the second vertical column is placed in a row in the base registers parallel to the main registers. A transpose operation is shown in FIG. 18 and is described further below. The type codes par and unify provided in the identifier register and the main registers are exchanged, which is done automatically by the control unit. Now the base registers includes a father having three sons placed in columns. Each son is now loaded back into the object storage using the instruction make. As an answer from the object storage the identifiers for the stored sons are provided and stored in the main registers. It is to be observed that the control unit 6 is sensing the contents particulary in the registers in the planes CLOS/SIMPLE to TYPE and is providing the instructions, i.e. controls the switches and the gates, according to the information found there. The sons have been named in sequence order after $id_1$ and already occupied names are not used. However, the order of the names is of no importance, and could thus be arbitrary.

As shown in FIG. 6F, the first son gets the identifier $id_2$, the second son, containing the element closures occupying the identifier $id_3$, gets the identifier $id_4$, and the third son gets the identifier $id_5$. The father having the element closures linked to the cell closures having the identifiers $id_2$, $id_4$, $id_5$ has kept its identifier $id_1$ and is then stored in the object storage.

Figure 6G:
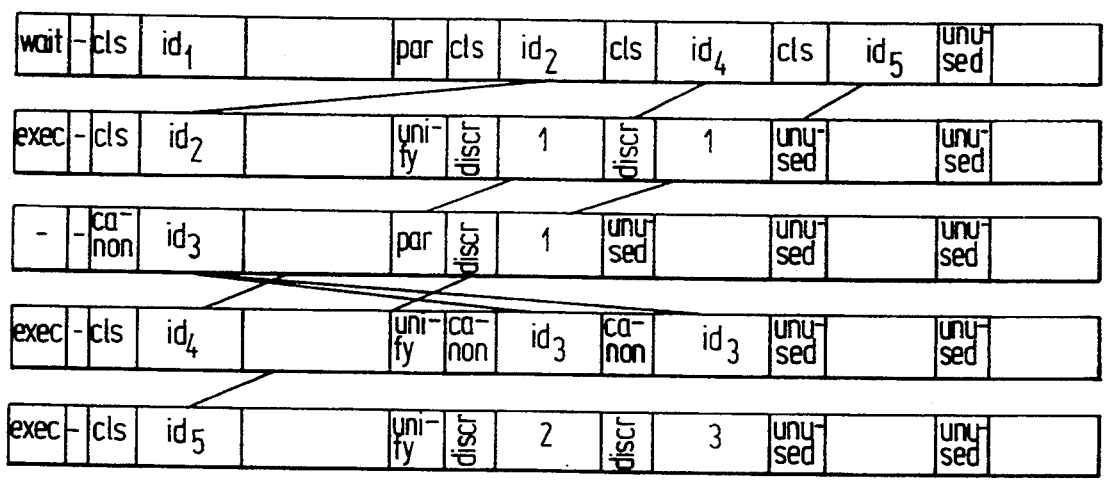

FIG. 6G shows the storage cells storing the reduceable closure par(unify(11) unify(par(1) par(1)) unify(2 3))

Figure 6H:
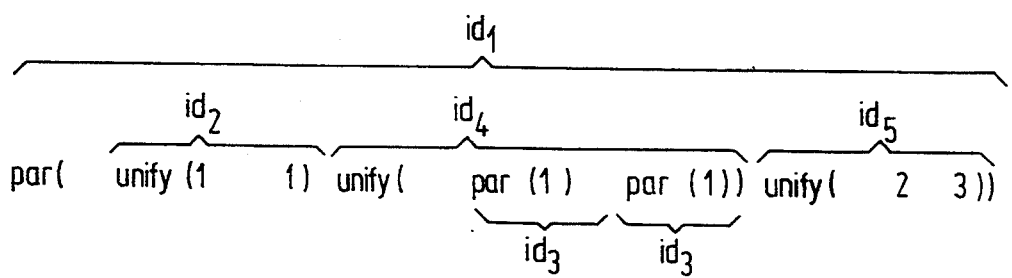

The reduceable closure itself is shown in FIG. 6H. FIGS. 6G and 6H are shown in the same way as FIGS. 6A and 6B and are therefore self explanatory.

In FIG. 6G it is also shown that the cell closures having the type code unify have been given the notation exec in the LAZY field and the cell closure having the identifier $id_1$ has been given the notation wait, which means that the cell closures being marked exec should be executed before the cell closure denoted by the identifier $id_1$ in order to reduce their contents into values. The closure in FIG. 6H could, at a later point in time, be loaded back into the core cell for further processing. For instance, the cell closure having the identifier $id_2$ will have the value 1, because the values 1 and 1 in its value/designation elements are the same, and the cell closure having the identifier $id_5$ will result in nothing, because the values 2 and 3 in its value/designation elements are not the same. Each unification will be made in the numeric ALU which compares the values in comparators and provides the result of the comparison to the control unit 6. The control unit then uses its boolean gate array to provide the information in the first main register in the core cell accordingly. When a reduction has resulted in a canonical designation or a simple value or nothing, it is globally distributed to all the storage fields in the object storage such that each indirect designation of the reduced closure is replaced with the result of the reduction. This is made by a unify_id operation further described below in relation to FIG. 16.

EXAMPLE 2

Figure 19:
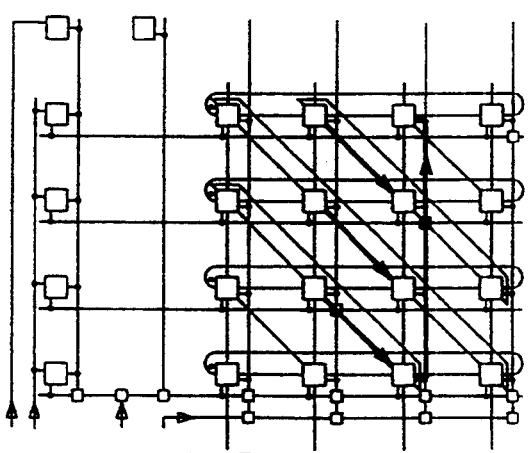

This example is a hardware instruction list expansion meaning that the cell closure includes a inserted list. This kind of instruction is an auxiliary step in other reductions. The hardware instruction list expansion is shown in FIG. 19 and is described further in relation to FIG. 19.

The machine performs a reduction of an exemplifying instruction, called ex.type, which could be any kind of instruction which includes values and lists having the form ex.type(1 list(2 3 list(4 5 6))7)

Figure 7A:
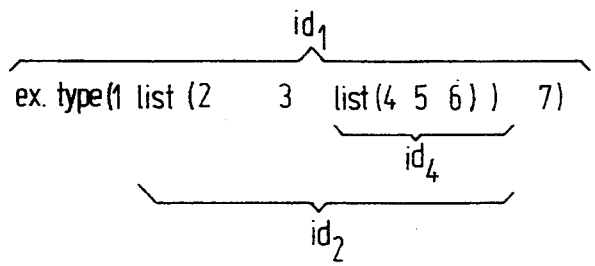
Figure 7B:
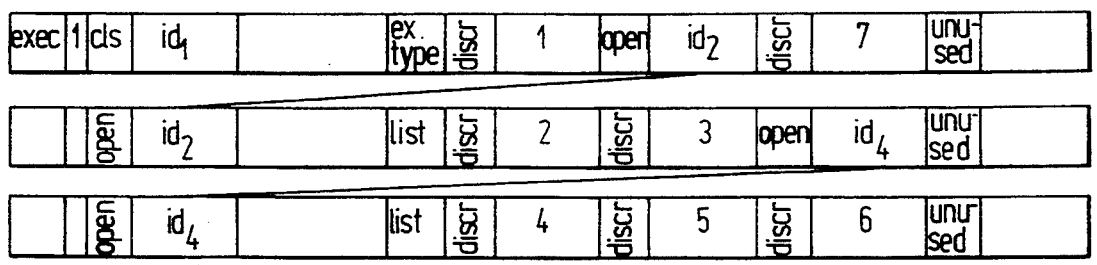

The form is shown in FIG. 7A and its cell closures in FIG. 7B. FIGS. 7A and 7B are marked out in the same way as FIGS. 6A and 6B and are therefore self explanatory.

Figures 7C, 7D:
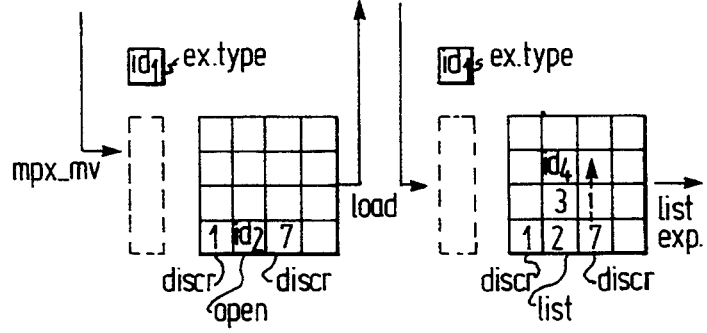
Figures 7E, 7F, 7G:
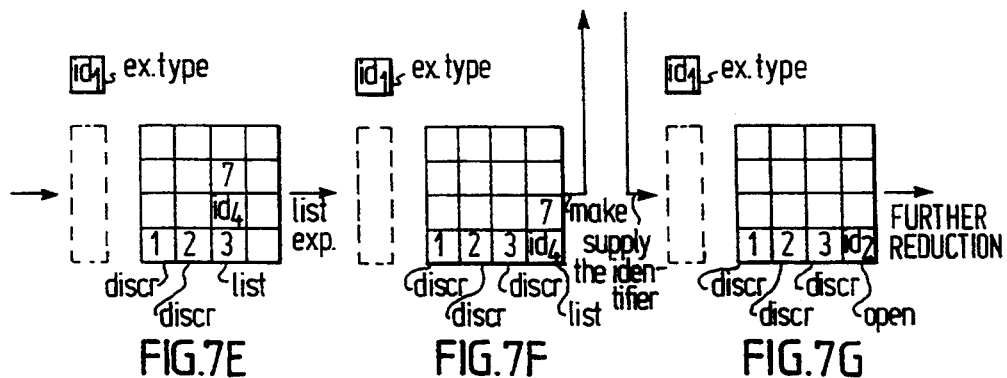

As shown in FIG. 7C, the cell closure having the identifier $id_1$ is loaded into the main registers of the core cell having its identifier and the type code in the identifier register. Since the content in the second main register is marked with an indirect element open, the cell closure to which it is linked is loaded vertically in the base registers as a son, as apparent from FIG. 7D.

The hardware instruction list expand, shown in further detail in FIG. 19, then moves the discrete value 7 in the third main register to the position beside $id_4$ in the third base column and moves the part of the list in the second column above the second main register to the third column placing its lowest element (the value 3) in the third main register and giving it the type code list. Since the content in the second main register is a discrete value it has the tag discr.

Then, a new list expansion is made placing the content in the third column above the main register in the fourth column typing it as a list. The content in the third main register being a discrete value is tagged discr, as apparent from FIG. 7F.

Then the list in the fourth column is stored in the object storage using the instruction make. It is stored in the storage cell having the identifier $id_2$, since it has become idle, and a supply of the identifier $id_2$ is sent back to the core cell to be stored in the fourth main register, as apparent from FIG. 7G.

Thereafter some other kind of reduction is made of ex.type before the result of the reduction is loaded back into the object storage.

EXAMPLE 3

A numeric instruction is to be executed. A numeric instruction can be +, −, *, /, mod, etc. After the instruction the arguments will follow. In this example an addition between the numbers in a list is to be made. The machine makes a reduction of an apply (application) having the function apply(+list(1 2))

The application is shown in FIG. 8A and its cell closures in FIG. 8B. FIGS. 8A and 8B are marked out in the same way as FIGS. 6A and 6B and are therefore self explanatory.

As shown in FIG. 8C, the cell closure having the identifier $id_1$ is loaded into the main registers of the core cell having its identifier and type code in the identifier register. The numeric instruction (+) is marked as an instruction. Since the content in the second main register is tagged as an indirect element open, the cell closure to which it is linked is loaded as a son vertically in the base registers, as apparent from FIG. 8D.

A list expansion is then made, tagging the discrete value in the second main register as discr, and marking the list expanded value 2 as list in the type code field. This is done because the machine makes the same operation whether the list having the identifier $id_2$ had two, three or four elements. Since there is only one element in the new list the machine replaces the mark list with an indication that the main register contains a value which is discr, as apparent from FIG. 8F.

Then the main register includes an instruction mark (+) and two discrete values, and this causes the control unit, directly, or for instance through information regarding the instruction stored in a non writeable part of the object storage, in which instructions are stored, to control the numeric ALU to perform the instruction (addition) and to deliver the result of the numeric operation as a canonical value to the first main register, as shown in FIG. 8G. It is to be noted that the notation apply in the type code field is a marking that an function application is to be made. The result value, in this case the simple value 3, is then distributed globally in order to exchange every occurence of the identifier $id_1$ for this value.

As illustrated above, a fixed number of registers in a register stack store a list. Unused registers are particularly marked as unused. The tree of lists is used to control and provide a calculation, and this is performed under control from the central control unit 6 and, if a numeric arithmetic operation shall be done, in cooperation with the numeric ALU 5. A calculation is made by rewriting the content in the tree of lists.

Lists having up to four elements could be placed in one cell closure. However, arbitrarily long lists may be handled but then each such list must be divided into several lists each having a length coinciding with or being shorter than the maximal length to be processed in a core cell. The core cell can only process a tree of a certain depth at a time. Trees having a greater depth may be handled, but only a part of the tree having a limited depth is stored in the core cell at a time, i.e. it is only possible to handle a part of the tree at a time.

Interface: Object Storage <-> Core Cell

The object storage 1 and the core cell 2 are interconnected through a transforming interface 7 making a signal adaptation and a closure wide bus arrangement 8, i.e. a bus arrangement which can transfer the whole content of a cell closure between the core cell 2 and the object storage 1. The bus arrangement 8 includes a partial bus arrangement OBJv, including buses id, env, $v_0$, $v_1$, $v_2$, $v_3$, connected to register planes NUM in the core registers 3, and the partial bus arrangement TAG connected to register planes HEAD in the core registers 3, and the bus arrangement ATTRIBUTE including buses from the planes LAZY, WHERE, and TYPE to the corresponding closure field in the storage cells. The interface 7 amplifies and transforms the signals from the core registers 3 through the cell closure wide bus arrangement 8 to signals suitable for the memory bit cells in the object storage. It also amplifies and transforms signals from the object storage 1 in reading operations to be adapted to the core cell registers. Even though the interface 7 is shown to be placed in the object storage 1 it could instead be situated in the core cell. An interface for a bit cell is shown in FIG. 20 and is described in detail below.

The Storage Cell Operation

Returning to FIG. 3, the storage cells are controlled by composed digital information from the central unit 6 distributed to all the storage cells through a control bus arrangement (not shown) connected to the core cell 2.

The bit cells 15 in each closure element can be controlled from its head 16 such that the bit cells can perform one of the following operations at a time:

| | |
|---|---|
| rest | in which each bit cell keeps a stored bit value stored, |
| read | in which stored bit values in the bit cells are read, |
| write | in which bit values are written in the bit cells, |
| compare | in which a data word composed by bit values stored in the bit cells is compared with another data word. |

The mark is settable in dependence on logical conditions each being a function of data on the second busses a and b, earlier mark, the result of the comparison in case of the comparison operation and an control signal to the memory from the control unit 6.

Since associative addressing is used, i.e. data is retrieved on basis of the stored content rather than through an address, there are no physical dependencies. The memory is associative. It is possible to use the cell identifier, the environment, the type, the information value or combinations of them as a search key.

The mark bit or bits in the elements of a storage cell having the value CHOSEN indicates that the element has been selected as a target for the access mechanism. Certain search operations set the marks, which are described below.

This type of access may involve one or several storage cells. As mentioned above, one of these multiple cell operations is a kind of store operation that may store an identifier in many selected elements.

A wire acc connected to the head 16 interconnects all the bit cells within an element. All the bit cells are controlled by signals on the wire acc. Other wires d and d* connected to the bit cells are connected to corresponding bit cells in the other storage cells in the object storage, as will be explained further below.

The Priority Decoder

The priority decoder 11 includes one section for each storage cell, each section having a first connection for REQUEST, on which a bit value 'true' represents NEED and a bit value 'false' NO NEED, and a second connection for GRANT, on which a bit value 'true' represents CHOSEN and 'false' not CHOSEN.

The priority decoder 11 sets maximally one GRANT equal to CHOSEN. This can be chosen such that the first section, measured in the structure, which has REQUEST equal to NEED will be CHOSEN. An embodiment of the priority decoder is described below in relation to FIG. 21.

In many cases the protocol on the memory bus communicates with all the storage cells. However, in some cases several storage cells, or closure elements within storage cells, should be ordered and read out. This is done by the priority decoder 11. From each cell there is a REQUEST signal and the priority decoder 11 returns a GRANT signal.

The memory is controlled with read, write and search operations. These operations can be combined to more complicated operations. Certain arithmetic can be made on several of the internal busses a and b and on the global busses.

A search is made by making a comparison, with the result FIT or DIFFERENT. The search can be made in one of the following ways:

(1). Search is made individually for each closure element and is independent of the composed information in other closure elements.

(2). Search can be made using a comparison to all closure elements in a storage cell. The result must be FIT in every element.

(3). Search can be made using a comparison to all closure elements in a storage cell. The result must be FIT in at least one of the closure elements.

A comparison can be made in one of the following ways:

(1). Two bit patterns are compared. A comparison results in FIT only when all corresponding bits are alike.

(2). The two bit patterns to be compared or only one of them are coded such that one of the bits states that the bit pattern information corresponds to an ARBITRARY or a SPECIFIC information value v. If, at a comparison, one of the information values corresponds to ARBITRARY then the result is FIT. Otherwise the result is FIT only when the two specific information values v are identical.

The bus function is performing the concept of reading or writing the object storage word. The bus is controlled by an access function. The access function depends on the mark and/or the value of the second busses a and b.

The WIRED OR function provided on the one bit bus a has a list of booleans. It evaluates a logical OR between all the closure elements in a storage cell. Physically it corresponds to a wire that is set by an array of transistors in the element heads 16.

The WIRED AND function provided on the one bit bus b has a list of booleans. It evaluates a logical AND between all the closure elements in a storage cell. Physically it corresponds to a wire that is set by an array of transistors in the element heads 16.

The priority function of the priority decoder 11 has a list of booleans as argument and results in a boolean list of the corresponding size. The argument has a first element which has the highest priority. After that bits with lower priority will follow. The first 'true' bit of the argument results in a corresponding true bit in the result. All other bits are 'false'.

The elements in the storage cells are generally used by first searching for values in the elements and then performing operations such as read and write in the found elements.

The Hardware Structre of the Core Cell

The planes NUM and HEAD have their core register cells connected to the wires in the bus OBJv, the id bus, i.e. an identifier bus, and the env bus, i.e. an environment bus, between the planes 2 and the interface 7. The OBJv bus includes the bus parts v0, v1, v2 and v3.

The array of core register cells are thus "sliced" perpendicularly to the registers into the planes, and the register cells belonging to the same NUM or HEAD plane, but to different core registers, are connected to each other in the way shown in FIG. 9.

In the structure of at least the NUM- and HEAD-planes, shown in FIG. 9, a square of register cells is placed in a matrix with $N \times N$ registers $S_{0,0}$ to $S_{N-1,N-1}$, the base registers.

The base registers are in most applications used for temporary storage of closure elements. The denotation of the registers have been strictly divided in such sense that one kind of denotation, such as base, main and auxiliary register, is used if the description is directed to the actual position of the register, and another kind of denotation, such as son, goal and father register, is used if the description is directed to the function of the register.

In the embodiment shown $N=4$, and this is to be preferred, but other matrix sizes could be chosen (not shown). The lowest row of base register cells $S_{0,0}$, $S_{1,0}$, $S_{2,0}$ and $S_{3,0}$, as shown in FIG. 9, are connected to bus line h0 and are the main register cells. The main register cells $S_{0,0}$, $S_{1,0}$, $S_{2,0}$ and $S_{3,0}$ are most often used as goal root registers and are connected to the numeric ALU 5 through a bus NU, which consists of the conductors NU0 to NU3.

An identifier register cell ID is connected to the line id and an environment register cell ENV is connected to the line env.

The bus line hi is connectable with the bus line vi by a switch $SW_{vi}$, where i is a number between 0 and 3. The bus including the bus lines h0, h1, h2, h3 is named OBJh, i.e. the horizontal object bus. The bus OBJh is, among other things, used for loading data vertically, i.e. in a column of registers, in the core cell, which data is provided by the object storage through the bus OBJv. This is described further in relation to FIG. 15.

The bus lines id, env, v0, v1, v2, v3 are connectable to the bus line h0 by the switches $SW_{id,h0}$, $SW_{env,h0}$, $SW_{v0}$, $SW_{v1,h0}$, $SW_{v2,h0}$, and $SW_{v3,h0}$, respectively. The bus res, including the bus lines $c_{id}$, $c_f$, $c_h$, and $c_v$, is connected to the control unit 6 and could be used for setting a register with a constant, such as zero. The bus line $c_{id}$ is connected to the identifier register cell and the bus line $c_f$ is connected to the register cells F0, F1, F2, and F3, and the bus line $c_h$ is connectable to the bus line h0 by a switch $SW_{ch,h0}$, and the bus line $c_v$ is connectable to the bus line vi by a switch $SW_{vi,cv}$, where i is a number between 0 and 3. The bus res with its switches may be omitted in some applications (not shown).

Auxiliary Registers

There is a top level in a data tree, called father. The father is some times stored in auxiliary register cells F0, F1, F2, F3 which are placed to the left in FIG. 9. Every auxiliary register can store a core word in the embodiment shown. Each auxiliary register cell is connected to the bus line id and to one of the lines h0, h1, h2, h3, respectively. The auxiliary register cells are to be used in a minority of the operations the core cell can provide. Therefore the auxiliary register may be omitted in some applications (not shown). It is also possible to provide a core cell having more than one column of auxiliary registers (not shown).

As apparent from the above each register is provided by register cells in several of the planes 2 having the same location in the planes. Therefore, the whole registers will be denominated by the references used in FIG. 9, even though FIG. 9 only shows one cell, i.e. one bit, of each register. As apparent from FIG. 9 the registers are arranged in rows and columns. The auxiliary register area F0, F1, F2, F3 is a column and the N base register areas $S_{0,0}$ to $S_{0,3}$ $S_{1,0}$ to $S_{1,3}$, $S_{2,0}$ to $S_{2,3}$, and $S_{3,0}$ to $S_{3,3}$, respectively, are each a column and able to store a son.

Connections Between Register Cells

A connection is provided between the adjacent base register cells in each plane, both vertically and horizontally. A connection having a fixedly programmed value, which in the embodiment shown is false f, is also provided to each of the outmost base register cells on the horizontal row turned to the object storage. It is connected to the N terminal (North) in the register cell (see FIG. 10) and is used when shifts in the North-South direction are made. A connection in the diagonal direction between base register cells is settable such that transposable positions are connectable. This means that a cell $S_{ij}$, where i is different from j, is connectable to a cell $S_{j,i}$. Each base register cell is connected to the base register cell situated nearest below to the right, where there is a base register cell in such location. Each auxiliary, identifier, environment and base register cell is connected to one of the planes BOOL by an output $ACC_{Fx}$, $ACC_{id}$, $ACC_{env}$, and $ACC_{Sx,y}$, respectively, where x and y are numbers between 0 and 3.

Figure 10:
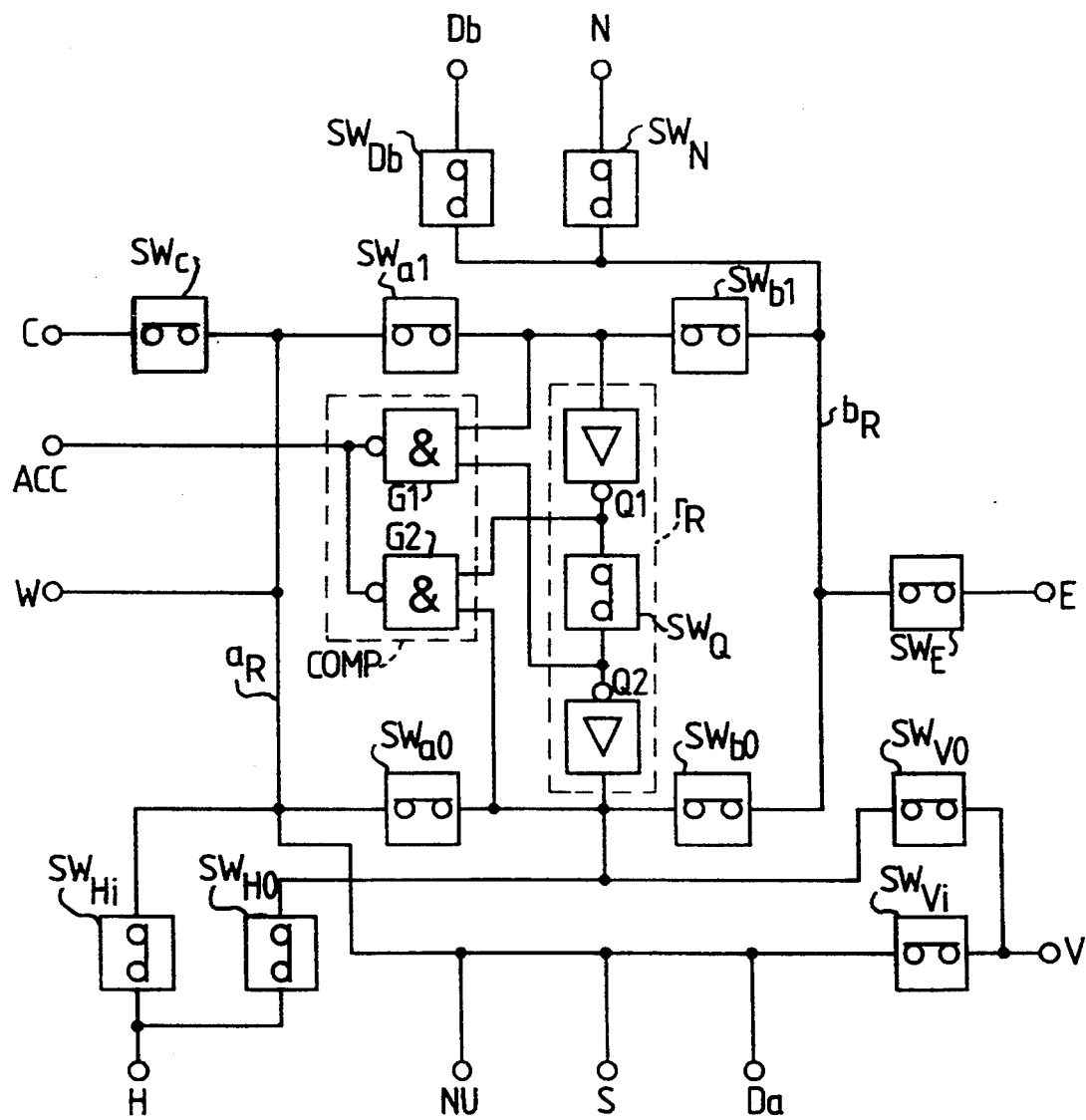
FIG. 10 shows schematically an embodiment of a design of a generic register cell in the core cell having all types of possible connections for the operating plane shown in FIG. 9, FIGS. 11 and 12 show schematically two examples of transfer between register cells in the core cell.

Below a generic register cell is described (FIG. 10). From the generic register cell, embodiments of the specific register cells, i.e. base, auxiliary, identifier, and environment register cells are derived (not shown). For further details concerning the specific structure of the different register cells we refer to our copending U.S. application Ser. No. 07/739,555.

The Generic Register Cell

Refering to FIG. 10, a preferable embodiment of a register cell includes two internal buses $a_R$ and $b_R$ and a central internal register $r_R$. The buses $a_R$ and $b_R$ are connected to several connections outside the register cell. The embodiment in FIG. 10 shows a generic register cell provided with every possible connection to the outside. Typically, a specific register cell is not provided with all the connections shown in FIG. 10; depending upon the placement of the register cell one or more are missing. All the wires between connected terminals are apparent from the wiring shown in FIG. 9.

It is also apparent from FIG. 9 that not all register cells have all the outer connections shown in FIG. 10. A detailed description of all the register cells and their connections is therefore not given.

The Bus $a_R$

The bus $a_R$ is connected to the vertical bus line vx, where x is a number between 0 and 3, through the switch $SW_{Vi}$ and a terminal V. Further, it is connected to the horizontal bus line hy, where y is a number between 0 and 3, through the switch $SW_{Hi}$ and a terminal H, to the register cell to the left through a terminal W (West) connected to a switch $SW_E$ (East) in the neighbouring register cell, and, if the register cell is a main register cell, also to the numeric arithmetic unit 1p directly by a terminal NU. The bus $a_R$ is also connected to the register cell down to the right through a terminal Da to the switch $SW_{Db}$ provided in that register cell and also to the register cell below through a terminal S (South) to the switch $SW_N$ (North) provided in that register cell. The register cell can be set or reset through the terminal C and switch $SW_C$, which is connected to the bus $a_R$. The bus $a_R$ is also, via a switch $SW_{a1}$, connected to an input of the central internal register $r_R$ and via a switch $SW_{a0}$ to an output of the same.

The Bus $b_R$

The bus $b_R$ is connected to the register cell to the right through a switch $SW_E$ and a terminal E, and also to a diagonal of register cells through a switch $SW_{Db}$ and a terminal Db and also to the register cell above through a switch $SW_N$ and a terminal N. The bus $b_R$ is also, via a switch $SW_{b1}$, connected to an input of the central internal register $r_R$ and via a switch $SW_{b0}$ to an output of the same.

The Central Internal Register

The central internal register $r_R$ includes two inverters Q1 and Q2, preferably CMOS inverters, and a controllable switch $SW_Q$ between them. A complete register cell includes also the buses $a_R$ and $b_r$ and the switches $SW_{a1}$, $SW_{a0}$, $SW_{b1}$, $SW_{b0}$ and switches connecting the cell to the outside. The output of the central internal register $r_R$ is connectable to the horizontal and the vertical buses, via the switch $SW_{Ho}$ and terminal H and the switch $SW_{Vo}$ and terminal V, respectively. The central internal register rR stores a dynamic state (explained below).

Switch Operation

All the controllable switches in all the register cells in the core cell are controlled through wires connected to the control unit 6, which includes a gate array, such as for instance a PAL (Programmable Array Logic). The gate array uses the information stored in the core cell to determine which switches to open and which to close next. The gate array operation is synchronized by a clock. The switches are bidirectional, but some are used in one direction only, for instance the input- and output-switches $SW_{Hi}$ and $SW_{Ho}$.

The Comparator Device COMP

A comparator device COMP includes a first NAND-gate G1. One input is connected to the non-inverted input of the inverter Q1 and the other to the input of the inverter Q2. The device COMP also includes a second NAND-gate G2. One input is connected to the output of the inverter Q1 and the other to the output of the inverter Q2. The outputs of the gates G1 and G2 are connected to a one-wire bus ACC leading to one of the planes BOOL. Both the NAND gates may be provided by two series coupled MOS-FET transistors having their series coupled source/drain paths connected between earth and a voltage source, their gates being the NAND gate inputs, and the drain of the topmost MOS-FET transistor being the output (not shown). This comparator device COMP is used during an associative search, i.e. when an element in the core cell shall be compared with an element in the object storage or in another part of the core cell. Then the element to be compared is applied to the inputs of the register cells containing the element to compare to, which will be described further below.

Inverters and Switches

The inverters Q1 and Q2 could be provided by either two MOS-FET transistors of enhancement type or one enhancement type and one depletion type MOS-FET transistor, or two complementary MOS-FET transistors (not shown). The controllable switches in the register cell could be provided by either a MOS-FET transistor or two complementary MOS-FET transistors (not shown). The control unit 6 controls the switches through a control signal. A switch could be controlled by both a control signal and its complement signal in order to achieve faster state transitions.

Associative Search & BOOL Plane(s)

During an associative search the comparison is performed on the access wired-and bus going to the BOOL plane(s). The two AND-gates G1 and G2 compare the key value, i.e. the value that the stored value is to be compared to, on the input of Q1 and the stored value on the input of Q2. During this comparison the key value is transferred through the internal bus $a_R$ or $b_R$ to Q1. The switch $SW_Q$ must then be off, i.e. open. If the value provided, i.e. the key value, does not match with the stored value the charged BOOL-plane will be discharged through the NAND-gates G1 and G2. If there is a match, the BOOL-plane will remain charged.

All the bus lines ACC in a register, one bus line ACC per register cell, could be parallel coupled and connected to the same bus line in the plane BOOL. As an alternative, the bus lines ACC of all the register cells provided in the planes NUM and HEAD could be connected to a bus line in a BOOL plane intended for these planes, and all the register cells provided in the ATTRIBUTE planes could be connected to a separate bus line provided either in the same BOOL plane or in a second BOOL plane intended for the ATTRIBUTE planes. If one or two BOOL planes and one or two bus lines are provided is a matter of choice and dependent upon the type of control instructions stored in the control unit 6. To have more then two BOOL planes is also within the scope of the invention. The number of BOOL planes provided dictate the granularity of the associative search, i.e. the number of different associative searches that can be performed and to which extent they are performed, i.e. which register parts that can be involved. Thus the comparison is made simultaneously for the part of the register being connected to the same bus line in the BOOL plane. If all the NAND-gates G1 and G2 have the same output (high) then the comparison results in a "match" otherwise it results in a no-"match", with "match" meaning that the both pieces of information are identical. The planes BOOL thus are planes for bus lines and could be regarded as virtual or "thought" planes, i.e. the bus lines need not necessarily be provided in a plane but could be connected directly to the control unit 6.

The Configuration of ATTRIBUTE Planes

The ATTRIBUTE planes could have another configuration than the planes NUM and HEAD, they could for instance be provided with only one row of base registers instead of a matrix of base register (not shown). Further, the ATTRIBUTE planes could have an extra bus line, which could be connected to all or some of the register cells in a plane, going to the control unit 6, which can use the information on this bus to decide what kind of reduction should be performed. Further, the ATTRIBUTE planes need not be provided with environment register cells. The bus lines v0, v1, v2, v3 could be drawn to other inputs of the interface 7 than the bus lines having the same denominations in the planes NUM and HEAD and could thus be coupled to other parts of the object storage 1, preferably the parts lazy, where and type (see FIG. 1). As an alternative, the bus lines v0, v1, v2 and v3 need not be coupled to the object storage 1. Instead the bus line id in the ATTRIBUTE planes could be used for the state information transfer (see FIG. 1) from the object storage, i.e. lazy, where and type in the object storage are coupled to the bus line id in the corresponding plane in the core cell.

The Standby Storage Mode

A standby storage mode loop is formed by one or both of the loops provided in the register cell. One loop is formed by the switch $SW_{b0}$, the bus bR, the switch $SW_{b1}$, the inverter Q1, the switch $SW_Q$ and the inverter Q2. Another loop is formed by the switch $SW_{a0}$, the bus $a_R$, the switch $SW_{a1}$, the inverter Q1, the switch $SW_Q$ and the inverter Q2. When the switches in one or both of the loops are closed the signal can propagate through the two inverters Q1 and Q2 and the signal level becomes stable on the input of inverter Q1 and on the output of inverter Q2—this is how data is stored in the register cell. The cell is storing a dynamic state.

The Output Mode

When in output mode, the output of Q2 can be transferred to one of the buses $a_R$ or $b_R$, and from there suitable switches can be controlled to transfer the output to one or more of the output terminals (N, S, E, W, etc). The other bus $b_R$ or $a_R$ may be used in an arbitrary mode. If the switch $SW_Q$ is off, i.e. open, the output of the inverter Q2 is stable, i.e. it can not be changed until the switch $SW_Q$ is closed. The output of the inverter can be transferred to the bus $b_R$ through the switch $SW_{b0}$ when closed, to the bus $a_R$ through the switch $SW_{a0}$ when closed. The information on the buses $b_R$ and $a_R$ can be transferred to each of the outside buses to which the register cell is connected by controlling the switch connected between the register cell and the outside bus in question, as will be illustrated by an example further below.

The Input Mode

During an input mode one of the switches $SW_{a1}$ or $SW_{b1}$ is on, i.e. closed. Thus the state of one of the terminals (N, S, E, W etc) is transferred to the local bus $a_R$ or $b_R$ and from there to the central internal register $r_R$.

Transfers

It is possible to transfer data from any register cell in the core cell through a terminal connection to another register cell in the core cell during a two-phase cycle. A swap of two base register cells in the vertical, horizontal or diagonal direction is possible during a three-phase cycle.

The switch $SW_Q$ is clocked directly by a main clock, and simultaneously for all the cells in the registers, such that the transfers between the inverters Q1 and Q2 are made simultaneously in the whole core cell. The rest of the switches are controlled by signals derived from the main clock but provided in different, adequate phase intervals in the main clock period. The main clock is used as a reference signal for all the operations of the core cell.

The clock cycle is divided into the clock phases 0, a and/or b. The phase 0 is the first stretchable phase, i.e. when the central internal register $r_R$ is in the standby storage mode—when the data is stable. The phase a is used during transport from the bus $a_R$, and the phase b is used during transport from the bus $b_R$.

A one way transfer, i.e. only from or to a register cell, takes place in a two phase clock cycle. The first phase 0 is stable. In a two phase clock cycle the phase a or the phase b is used for the transport.

A two way transfer, i.e. a transport between two register cells to exchange their respective contents, is performed in a three phase clock cycle. The phase 0 is stable. During the phases a and b transports are performed in different directions.

It should be noticed that clock cycles with more than three phases is within the scope of the invention, for instance with two b phases.

The switches $SW_{a1}$ and $SW_{b1}$ are normally closed. Both the local buses $a_R$ and $b_R$ are then holding the stored state of the register cell. When an internal bus $a_R$ or $b_R$ shall be used for input of a new value to be stored, the appropriate switch $SW_{a1}$ or $SW_{b1}$, respectively, is controlled to be open. A switch to one of the external buses, such as the vertical or horizontal bus, is closed during a short interval long enough for the information on that bus to be transferred to the internal bus.

It is also possible to use the shift network, i.e. the network between the different register cell including the switches connected to the terminals, to transfer the content in a register cell, north N or south S or west W or east E.

An Example of a One Way Transfer Operation

Figure 11A:
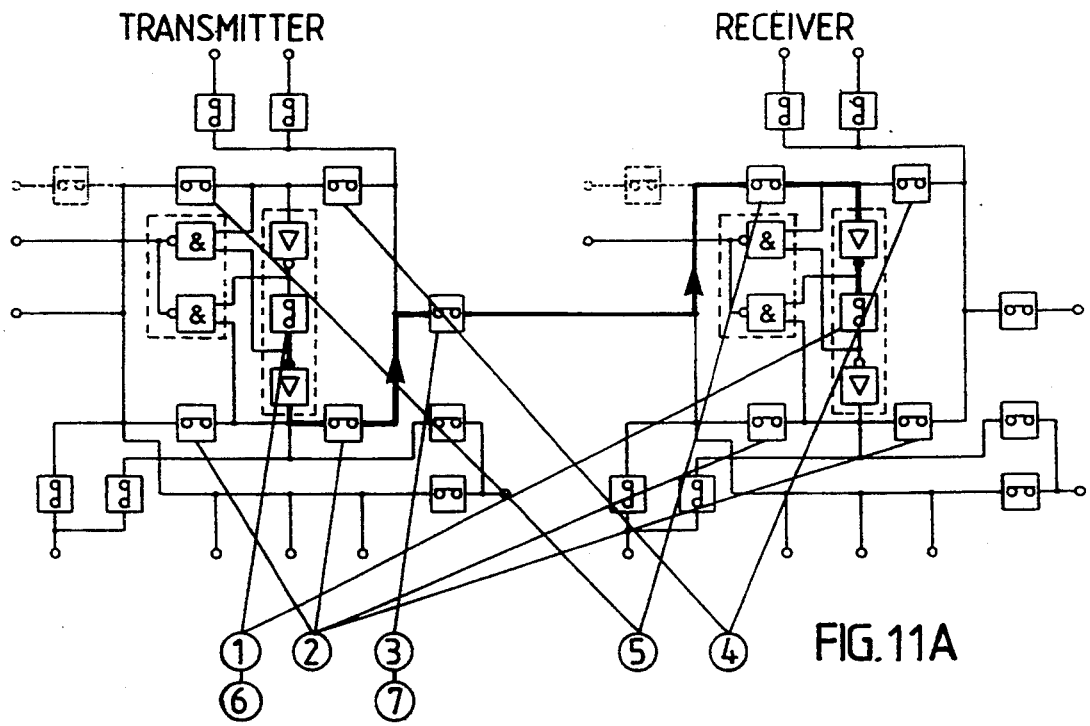
Figure 11B:
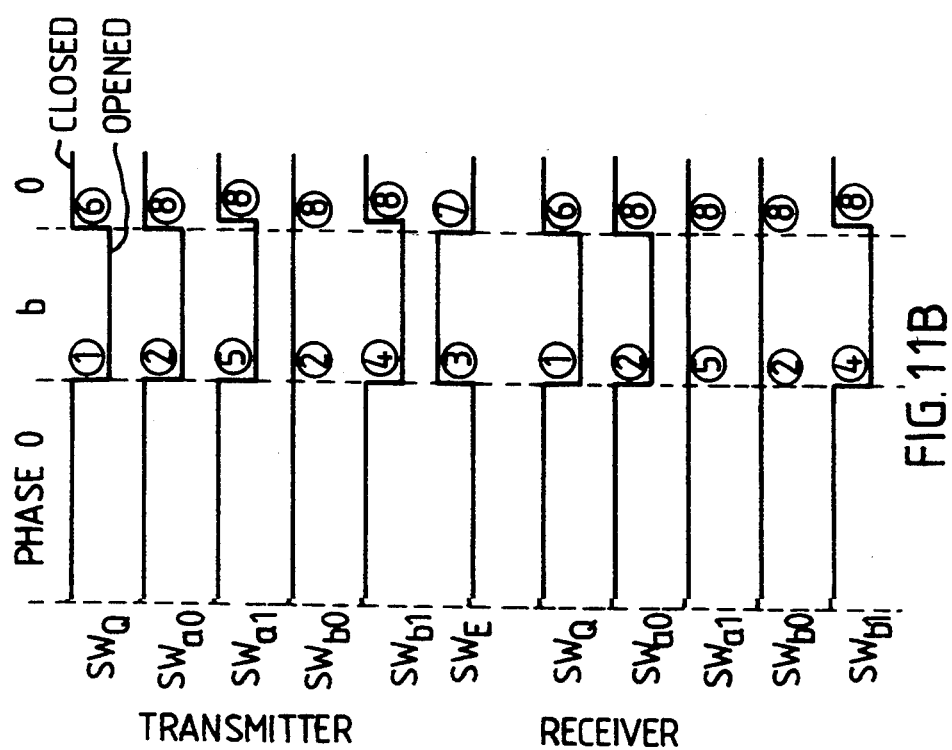

FIG. 11A shows two neighbouring base register cells and data shall be transferred from the left one, the transmitter, to the right one, the receiver. The control signals, from the control unit 6, are controlling the switches. FIG. 11B shows the state of every switch affected by the transfer during the different phases, the lower value represents an open switch and the higher value represents a closed switch. The actual transfer takes place in phase b. The transfer is made in the following way (the different steps below are marked with the same number in FIGS. 11A and B):

0. The circuit is stable, $SW_Q$, $SW_{a0}$, $SW_{a1}$, $SW_{b0}$, $SW_{b1}$ are closed, all the other switches are open in both the transmitter and the receiver (this step is not marked in FIG. 11A since it relates to all the switches). This stable mode corresponds to phase 0 in FIG. 11B,
1. During a first phase (phase b) of the clock interval, when the switch $SW_Q$ in both the transmitter and the receiver is opened,
2. the switch $SW_{a0}$ is opened and the switch $SW_{b0}$ is closed in both the transmitter and the receiver,
3. the switch $SW_E$ between the transmitter and the receiver is closed,
4. the switch $SW_{b1}$ in both the transmitter and the receiver is opened, and
5. the switch $SW_{a1}$ in the transmitter is opened and the switch $SW_{a1}$ in the receiver is closed. This enables the data to propagate from the transmitter internal register to the receiver internal register.
6. During a second phase (phase 0) of the clock interval, when the switch $SW_Q$ in both the transmitter and the receiver is closed,
7. the switch $SW_E$ between the transmitter and the receiver is opened,
8. the switches $SW_{b0}$ and $SW_{a0}$, are closed first and thereafter the switches $SW_{b1}$ and $SW_{a1}$ in both the receiver and the transmitter. This brings us back to the stable mode described in step 0 above, i.e. the phase 0.

An Example of a Two Way Transfer Operation

Figure 12A:
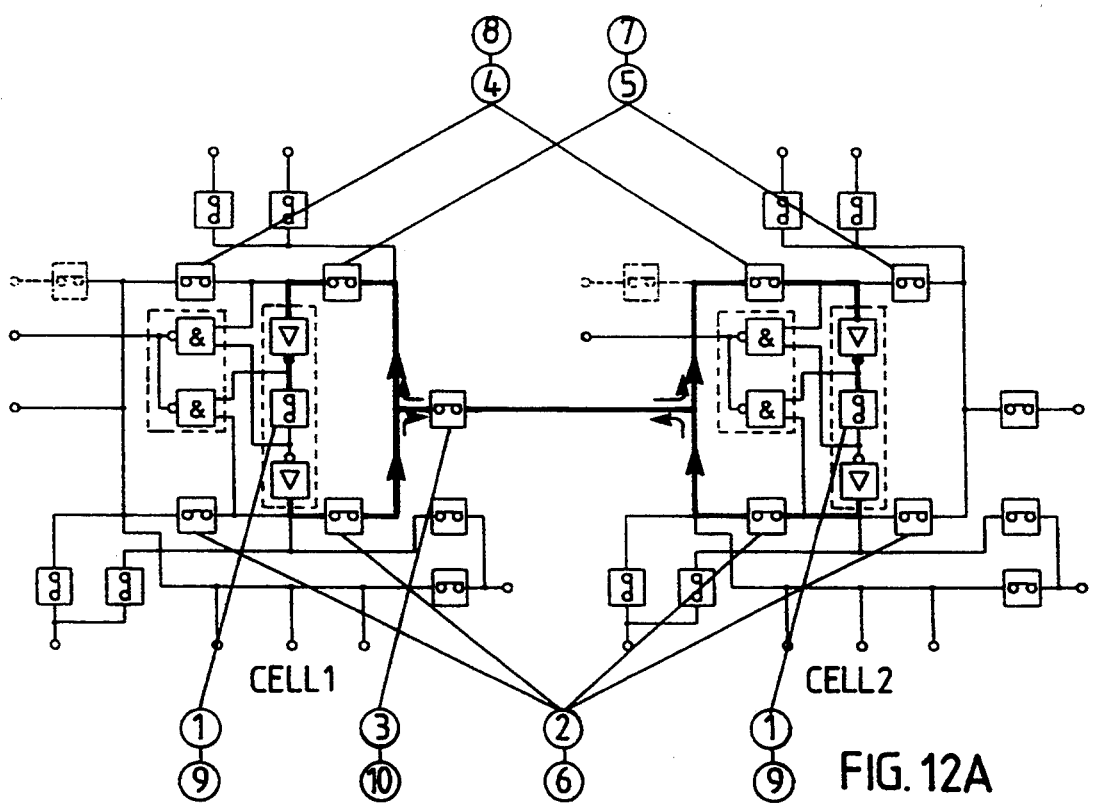
Figure 12B:
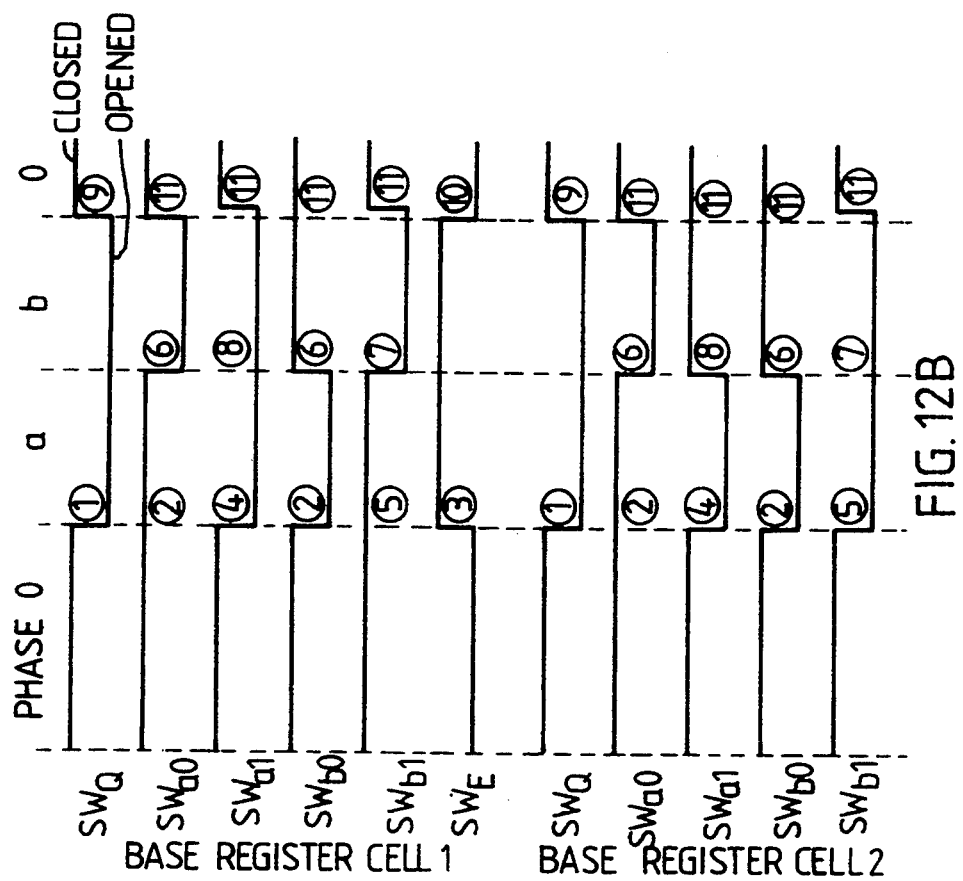

FIG. 12A shows two neighbouring base register cells and the data in the two different base register cells shall be swapped with a two way transfer operation. The control signals, from the control unit 6, are controlling the switches. FIG. 12B shows the state of every switch affected by the transfer during the different phases, the lower value represents an open switch and the higher value represents a closed switch. Both the register cells are serving as transmitter and receiver; therefore they will be called "cell 1" and "cell 2" below. One transfer, from cell 2 to cell 1, takes place in phase a and the transfer in the other direction, from cell 1 to cell 2, takes place in phase b. The different steps below are marked with the same number as in FIGS. 12A and B. The transfer is made in the following way:

0. The circuit is stable, $SW_Q$, $SW_{a0}$, $SW_{a1}$, $SW_{b0}$, $SW_{b1}$ are closed, all the other switches are open in both cells (this step is not marked in FIG. 12A since it relates to all the switches), This stable mode corresponds to phase 0 in FIG. 12B,
1. During a first phase (phase a) of the clock interval when the switch $SW_Q$ in the cells 1 and 2 is opened
2. the switch $SW_{a0}$ in the cells 1 and 2 is kept closed and the switch $SW_{b0}$ in the cells 1 and 2 is opened,
3. the switch $SW_E$ between the cells is closed,
4. the switch $SW_{a1}$ in the cells 1 and 2 is opened, and
5. the switch $SW_{a1}$ in the cell 1 is kept closed and the switch $SW_{b1}$ in the cell 2 is opened. This enables the data to propagate from the cell 2 to the cell 1.

During a second phase (phase b) of the clock interval when the switch $SW_Q$ is still open,
6. the switch $SW_{a0}$ in the cells 1 and 2 is opened and the switch $SW_{b0}$ in the cells 1 and 2 is closed,
7. the switch $SW_{b1}$ in the cells 1 and 2 is opened, and
8. the switch $SW_{a1}$ in the cell 1 is opened and the switch $SW_{a1}$ in the cell 2 is closed, this enables the data to propagate from the cell 1 to the cell 2.
9. During a third phase (phase 0) of the clock interval, when the switch $SW_Q$ in both the cells 1 and 2 is closed,
10. the switch SWE in the cell 1 is opened, and 11. the switches $SW_{b0}$ and $SW_{a0}$, are closed first and thereafter the switches $SW_{b1}$ and $SW_{a1}$, in both the cells. This brings us back to the stable mode described in step 0 above, i.e. the phase 0.

The Control Signals for the Switches $SW_{a0}$ and $SW_{b0}$

The signals are on, i.e. closed, by default during the phase 0. All local buses are then holding the stored state. A bus used for input is controlled by setting the control signal to off, i.e. open, for switch SWQ and switch SWx0, where x is a or b. During an input operation several buses may be short circuited by some terminals (E, V, D, H etc) during a short period. After a while the buses get the correct value.

There is a delay time from a falling portion of the control signal to the switch $SW_Q$ to a falling portion of the control signal to the switch $SW_{x0}$ (x is a or b). If it is short, no problem occurs. However, if the time gets up in ms region, the bus $x_R$ (x is a or b) may lose its dynamic state.

There is a delay time from a rising portion of the control signal to the switch $SW_{x0}$ to a rising portion of the control signal to the switch $SW_{x1}$ (x is a or b). If it becomes negative an erroneous value may be propagated to the local bus $x_R$ from the inverter Q2 to the inverter Q1. Thus a positive delay time is used.

The Control Signals for the Switches $SW_E$, $SW_V$, $SW_D$, $SW_H$ etc

The switches are normally off, i.e. open. All local buses are then isolated. A bus used for input or output is controlled by setting the control signal to the terminal switch connected to it to on, i.e. closing the switch. During this operation several buses may be short circuited by some switches ($SW_E$, $SW_V$, $SW_D$, $SW_H$ etc) during a short period. After a while the buses get the correct values.

There is a delay time from a falling portion of the control signal to the switch $SW_Q$ to a rising portion of the control signal to the switch $SW_z$ (Z being H, D, N, V, E etc, i.e. any of the terminals connected to the internal buses $a_R$ and $b_R$ provided with a switch). If it is negative the local bus $x_R$ (x being a or b) value may be altered. The register value may then be set. Thus this delay time should be positive.

There is a delay time from a rising portion of the control signal to the switch $SW_Z$ (Z being H, D, N, V, E etc, i.e. any of the terminals connected to the internal buses $a_R$ and $b_R$ provided with a switch) to a falling portion of the control signal to the switch $SW_{x1}$. If it becomes negative the value can not propagate to the input. Thus a positive delay time is used.

There is a delay time from a rising portion of the control signal to the switch $SW_{x1}$ to a falling portion of the control signal to the switch $SW_z$. If it becomes negative the local bus may be altered and the register might be set to an erroneous value. Thus a positive delay time is used.

The Control Signals for the Switches $SW_{a1}$ and $SW_{b1}$

The signals are on by default during the phase 0. There must, however, be a slight delay from the rising portion of the control signal to the switch $SW_Q$ to the rising portion of the control signals for the switches $SW_{a1}$ and $S_{b1}$.

If this delay becomes negative the value on the input of the inverter Q2 may not be able to propagate to the bus $x_R$ (x is a or b). Therefore a positive delay is used.

Core Cell Computation

Typical list instructions are performed in one machine cycle.

As mentioned above, the core cell performs structure arithmetic. All steps are performed by the core registers using the instructions in the lists that it contains. Examples of instructions are the following:

| | |
|---|---|
| length | the length of the goal is calculated, |
| map | a function is applied to the elements of a list. If the list contains inserted lists the instruction is also applied to the elements of these inserted lists. (The instruction map will be further explained below) |
| filter | a function is applied and filters the elements of a list. The filter is also applied to inserted lists, if any. |
| join | all elements are rewritten into inserted list elements. The instruction is also applied to inserted lists, if any. |
| transpose | a small matrix is transposed. If it contains list elements, they are swapped. Inserted lists are handled. (The instruction transpose will be further explained below). |
| etc | |

Core Cell Storage

The core cell stores
the goal to be reduced in several registers, preferably the base registers
in some cases, for instance when a three-level structure is reduced, the root of the goal, preferably in the auxiliary registers and the rest of the structure in the base register matrix.

The object storage 1 can only store a one level structure, but the core registers 3 may contain at most a three level object structure. There are four cases for temporary storage in the core cell, i.e. storing a 0, 1, 2 or 3 level object. If a three level object is stored, its root and only one of its branches are stored. In all the other cases all levels are stored.

A simple tree, i.e. a single value (0 level object), is stored in the first main register.

A tree including only one level is stored in the main registers.

A tree including a two levels may have its root list, being a father, stored horizontally in the main registers and the lists, being sons, vertically in the base registers. As an alternative the root could be stored in the auxiliary registers and one of its sons in the main registers. It is to be noted that the control unit 6 can choose one or the other of these alternatives dependent upon the operation to be performed.

A tree including three levels has its root list stored in one of the auxiliary registers, and one of its two level sons stored in the base register matrix.

Thus, the root list of a goal tree is preferably stored in different places in the registers in the core cell dependent on the level of the tree structure and the operation to be performed.

The root of the goal tree is a closure of reduceable kind, such as unify. In a function application (apply . . . ) the first element is an instruction or an identifier indirectly designating a closure structure used as a function definition and the rest of the elements are arguments to the instruction/function definition.

CORE CELL STORAGE CONTROL

The information stored in the core registers is derived from information in the object storage 1. The information in the core registers is stored in the following way:

The core registers in the planes HEAD and NUM are connected to the object storage bus OBJ, the access bus ACC, the res bus and the numeric ALU bus NU. The stored state consists of the stored state of two single registers ID and ENV, the auxiliary registers F0 to F3 and the base registers $S_{0,0}$ to $S_{3,3}$. The core registers in the ATTRIBUTE planes are connected to the object storage in a similar way but to different parts of the object storage 1, preferably the parts lazy, where and type.

The control word to the core registers consists of the control words to the switches $SW_{vi}$, $SW_{vi,cv}$, where i is a number between 0 and 3, $SW_{id,h0}$, $SW_{ch,b0}$, $SW_{v1,h0}$, $SW_{v2,h0}$, and $SW_{v3,h0}$, $SW_{vi0}$, $SW_{v1}$, $SW_{v2}$ and $SW_{v3}$, the single registers ID and ENV, the auxiliary registers F0 to F3 and the base registers $S_{0,0}$ to $S_{3,3}$.

The control words are transferred via several control wires connected to the control unit 6. The control wires could be biphase control pair wires or single phase control single wires, depending on what kind of switches used.

The control word to each base register cell includes one common part and parts individual for each base register. The common part controls the switches $SDW_{a0}$, $SW_{b0}$ and $SW_Q$ of the core cell (see FIG. 10). However, it is to be noted that what is described here is only to be regarded as an example and that several other embodiments are conceivable.

EXAMPLES OF CORE CELL OPERATIONS

FIGS. 13 to 19 are derived from FIG. 9. The references provided in FIG. 9 also applies to FIGS. 13 to 19. However most references are left out for readability. Also, in the description of FIGS. 13 to 19 the denotations of the register cells are intended to mean the whole register extending through the planes in the core cell.

1. Access to the object storage

The mpx_mv instruction:

The object storage 1 is read and some of the core registers are set by an object storage operation mpx_mv. The accessed object is transported through the buses v0, v1, v2, v3 to the main registers $S_{0,0}$, $S_{1,0}$, $S_{2,0}$, $S_{3,0}$, through the bus id to the register ID and through the bus env to the register ENV, as illustrated in FIG. 13 by the thick lines having arrows pointing to the register cells to which the transport is made. At the same time the old content in the main registers is stored in the object storage 1 as a closure. Thus, the mpx_mv instruction stores the present core cell closure in the object storage and loads the next object storage closure to be executed into the core cell.

Figure 14:
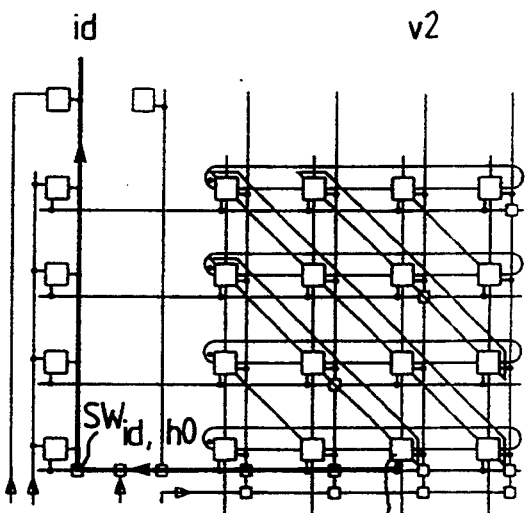
Figure 15:
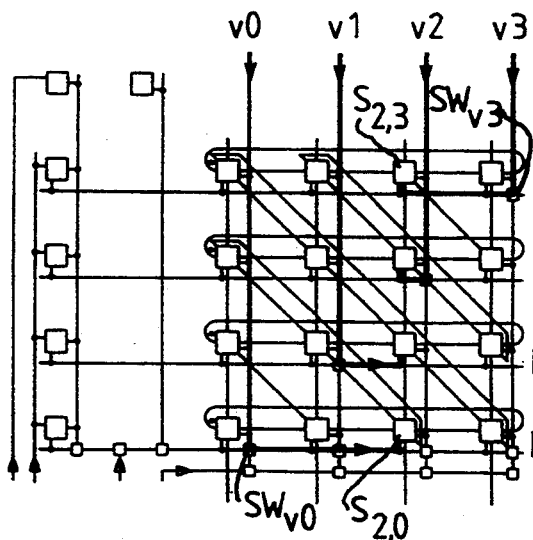

The fetch instruction: FIGS. 14 and 15 illustrate the situation when there is an identifier stored in one of the main registers and the identifier is to be exchanged for the information it denotes. The identifier, e.g. stored in $S_{2,0}$ (see FIG. 14), is supplied to the object storage 1, the object storage finds the identifier and the content it denotes, which content is put on the bus lines v0 to v3 and finally loaded into a vertical column in the base registers, e.g. $S_{2,0}$ to $S_{2,3}$ (see FIG. 15).

This operation is started by transferring the identifier in the base register $S_{2,0}$ to the vertical bus id through the bus h0 and the switch $id_{id,h0}$ (FIG. 14). A stored value may be transferred from any of the other registers in a similar way.

The operation continues (see FIG. 15) by loading the values supplied by the object storage 1 on the bus lines v0, v1, v2, v3 into the appropiate registers, which in the example are the registers $S_{2,0}$, $S_{2,1}$, $S_{2,2}$, $S_{2,3}$, by transferring the values through the switches $SW_{v0}$, $SW_{v1}$, $SW_{v2}$, $SW_{v3}$ and the buses h0, h1, h2, h3.

The object storage operations make and unify_id could be used when the content in the core cell is to be stored in the object storage 1.

The make instruction:

In the first step of the operation make, the content in the registers in question is transfered, as in FIG. 15 but in the opposite direction. The operation also transfers the environment register content. An associative search is carried out in the object storage in order to find an object with the same information stored as the information provided by the core cell. If an object is found, the identifier denoting the object is returned, otherwise, if no object is found, an unused identifier is returned. In both cases the identifier is transfered from the object storage to the identifier register in the core cell using the bus line id. As an alternative the identifier could be transfered to the main register in the affected column of registers. Thus, an association between the content of the core cell and an identifier is created.

Figure 16:
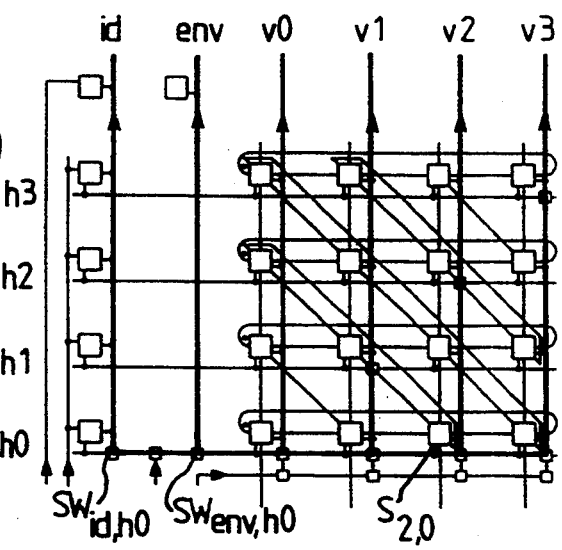

The unify_id instruction:

The operation unify_id is illustrated in FIG. 16 and distributes an identifier from one of the registers, for instance $S_{2,0}$ to all the vertical buses id, env, v0, v1, v2, v3 by connecting the register cell in question to the horizontal bus h0 and connecting all the vertical buses to the horizontal bus h0 through the switches $SW_{id,h0}$, $SW_{env,h0}$, $SW_{v0}$, $SW_{v1,h0}$. etc. This is an operation that can be used when performing an associative search & replace, which for instance could involve searching for occurences of an identifier and replacing the found occurences of this identifier with a new, reduced simple value.

An operation similar to unify_id could in its first step use make to get a unique identifier for the content of the core cell and in its second step put the content of the core cell on the bus lines connected to the object storage, in order for the object storage to store the identifier and the content it denotes.

An example of an unify operation is given in appendix 1, where the content of the core cell is shown and where the switch states for the phases a, b, and 0 are shown.

2. Numeric reductions

During a numeric reduction the object to reduce, i.e. the goal, is placed in the main registers. Generally the entire goal takes part in the reduction. Typically the main register $S_{0,0}$ holds the instruction code, which is a different bitpattern for different instructions. The registers $S_{1,0}$ and $S_{2,0}$ are used for dyadic operations, i.e. operations with two operands, and the register $S_{1,0}$ is used for monadic operations, i.e. operations with one operand. Generally, trailing registers are used in a list form, their content is therefore pushed to the left after a reduction.

The essential numeric arithmetic then takes place between the registers $S_{1,0}$ and $S_{2,0}$ of the goal. A main adder of the numeric ALU is connected to these two registers. The other registers can be used for supplementary purposes in instructions like mul, div and mod.

The following instruction types could be used:

monadic instructions
the register $S_{0,0}$ holds the instruction and the register $S_{1,0}$ holds the operand. The registers $S_{2,0}$ and $S_{3,0}$ are not used. The result of the numeric ALU is returned to all the main registers. In the non pipe-line case it is saved in register $S_{1,0}$. In the pipe-line case it is intermediately saved either in a auxiliary register or in a base register.

dyadic instructions
the register $S_{0,0}$ holds the instruction and the register $S_{1,0}$ and $S_{2,0}$ the operands. The register $S_{3,0}$ is not used. The result is returned to all main registers. In the non pipe-line case it is saved in register $S_{1,0}$. In the pipe-line case it is intermediately saved either in a auxiliary register or in a base register.

mul, div, mod instructions
the register $S_{0,0}$ holds the instruction and the register $S_{1,0}$, $S_{2,0}$ the operands. The final result is saved in the register $S_{1,0}$.

unify reductions
the unify reductions uses the numeric ALU to compare the content in register $S_{0,0}$ with the content in register $S_{1,0}$. The other main registers could also be used when performing the unification. The tag words stored in the HEAD planes of the registers are used together with the result of the comparison to evaluate the next action.

The instructions mul, div, and mod perform their innerloops entirely within the numeric arithmetic unit. The intermediate values computed could be stored dynamically on the wires between the numeric arithmetic unit and the main registers in the core cell, i.e. on the NU bus.

3. Structure reductions

During structure reduction the object to reduce, i.e. the goal, is placed in the main registers. Generally, some or all of the base registers take part in the reduction. Typically, the main register $S_{0,0}$ holds the instruction code, which is a different bitpattern for different instructions.

A map instruction has a function f and a list $(e_1, \ldots e_n)$ as arguments and applies the function to every element of the list. The instruction returns a list $(fe_1, \ldots fe_n)$ of the results of every function application, where $fe_1$ represents the result when applying f on $e_1$.

mapping instructions
Format: (map f list).

Figure 17A:
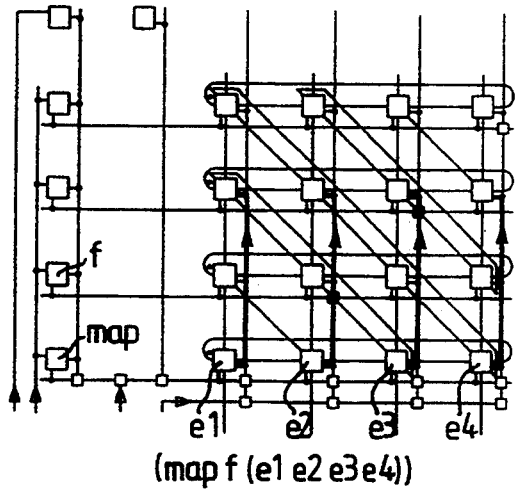
Figure 17B:
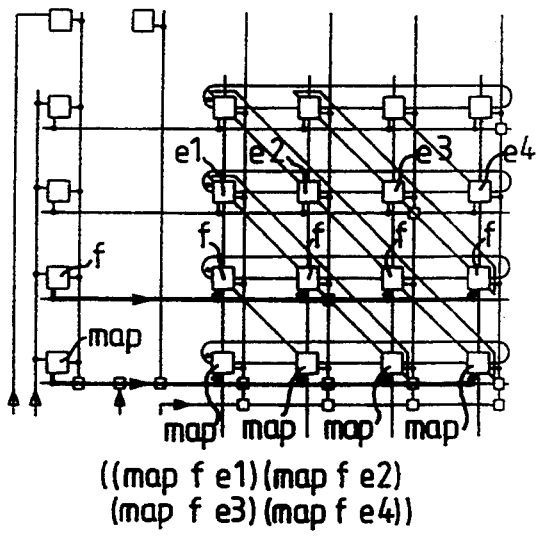
Figure 17C:
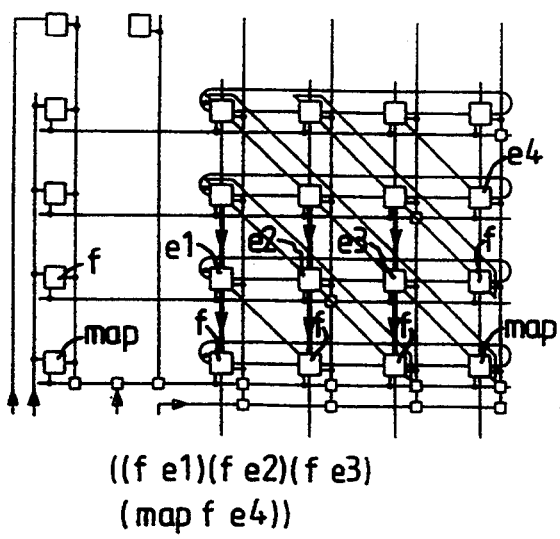
Figure 17D:
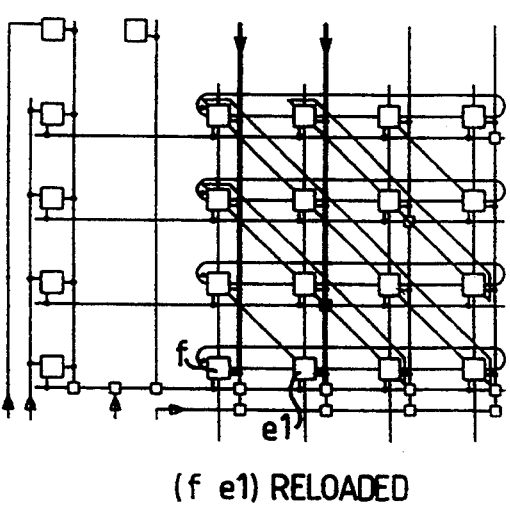

The instruction map is loaded into the auxiliary register F0. The function to use is loaded in the auxiliary register F1. The list is loaded in the main registers $S_{0,0}$ to $S_{3,0}$. As shown in FIG. 17a the elements stored in the main registers are transfered two steps up in the base register matrix, i.e. the content in register $S_{2,0}$ is transferred to the register $S_{x,2}$, where x is a number between 0 and 3. The transfer is made using the vertical bus lines v0 to v3. As shown in FIG. 17b the content in the auxiliary registers F0 and F1 are then broadcasted horizontally to the base registers, i.e. the content of F0 is copied to $S_{0,0}$ to $S_{3,0}$ and the content of F1 is copied to $S_{0,1}$ to $S_{3,1}$. If an element is a simple value (not a list) the content of the register it is situated in, e.g. $S_{1,2}$, and the content of the register below, e.g. $S_{1,1}$, is shifted one step downwards. The function to apply is now situated in a main register, e.g. $S_{1,0}$, and the element to apply the function on is now situated in the register above this main register, e.g. in $S_{1,1}$. If an element is a list no shifts are made in that column of registers. In FIG. 17c it is assumed that $e_1$, $e_2$ and $e_3$ represents simple values and that $e_4$ represents a list. Each column in the base register matrix is then stored as a closure in the object storage. Thereafter, each of these stored closures is loaded into the core cell for continued processing. If the stored closure contained a simple value, it is loaded into the core cell in the normal way, i.e. f is stored in $S_{0,0}$ and $e_1$ is stored in $S_{1,0}$ as shown in FIG. 17d. If, on the other hand, the stored closure contained a list, it is loaded as described above, as shown in FIG. 17a but with $e_1$ being the first element in the list represented by $e_4$, $e_2$ the second element in $e_4$ etc. This allows the map instruction to operate recursivly over inserted lists.

Thus, the instruction map having a two level structure $$(map, f, (e_1, \ldots, e_n))$$

is rewritten into $$((f, e_1), \ldots, (f, e_n)),$$

which after execution is rewritten to the one level structure $$(fe_1, \ldots, fe_n),$$

where $fe_1$ represents the result when applying f on $e_1$.

The instruction map having a three (or more) level structure $$(map, f, par(e_1, \ldots, (e_k, \ldots, e_m), \ldots, e_n)),$$

where $(e_k, \ldots, e_m)$ is an inserted list, is rewritten into $$par((f, e_1), \ldots, (map, f, (e_k, \ldots, e_m)), \ldots, (f, e_n))$$

as an intermediate step and thereafter to $$par((f, e_1), \ldots, ((f, e_k), \ldots, (f, e_m)), \ldots, (f, e_n)),$$

which after execution is rewritten to the two level structure $$par (fe_1, \ldots, (fe_k, \ldots, fe_m), \ldots, fe_n),$$

where $fe_1$ represents the result when applying f on $e_1$ and where $(fe_k, \ldots, fe_m)$ is an inserted list.

Thus, the function f is recursively applied on all elements in the argument list.

An illustrating example on how the core cell restructures and executes a map instruction is described below. The abbreviation reg is used instead of "register", ident instead of "identifier" and storage instead of "object storage" to keep the description short. The example instruction:

$$(map\ f\ (-1\ -2\ (-7\ -8))),$$

where f is defined as f(x)=abs (x)+1. The machine representation, using machine identifiers, could be:

id1: (map f id2)

id2: (−1 −2 id3)

id3: (−7 −8)

where the ident id1 denotes the closure containing the (map f id2) -structure etc.

Below, i is a number between 0 and 3. The following steps are carried out:

Step 1: map is stored in reg F0, f in reg F1 and ident id2 in reg $S_{0,0}$

Step 2: ident id2 is expanded, i.e. reg $S_{0,0}$ contains −1, reg $S_{1,0}$ contains −2 and reg $S_{2,0}$ contains ident id3

Step 3: The content of reg $S_{i,0}$ is transfered to reg $S_{i,2}$.

Registers marked unused are not affected

Step 4: map and f are broadcasted horizontally, i.e. reg $S_{i,1}$ contains f and reg $S_{i,0}$ contains map. Registers marked unused are not affected Step 5: Columns with a simple value in its reg $S_{i,2}$ are compacted one step downwards, i.e. reg $S_{0,1}$ contains −1 and reg $S_{0,0}$ contains f and reg $S_{1,1}$ contains −2 and reg $S_{1,0}$ contains f, the third column is untouched Step 6: Every column in the base register matrix is (re)stored in the storage as:

id1: (id6 id7 id8)
id6: (f −1)
id7: (f −2)
id8: (map f id3)

Step 7: The closure denoted by ident id6 is loaded in the main registers, f in reg $S_{0,0}$ and −1 in reg $S_{1,0}$ Step 8: The function, i.e. f(x)=abs(x)+1, is applied to the argument with the result 2, which is stored in reg $S_{0,0}$ Step 9: an associative search for ident id6 is performed in the storage and all occurences of ident id6 are replaced by 2:

id1: (2 id7 id8)
id7: (f −2)
id8: (map f id3)

Step 10: step 7 to 9 are done for the ident id7 and with the result 3. The storage:

id1: (2 3 id8)
id8: (map f id3)

Step 11: step 1 to 6 are done for the ident id8 with the result that two of the base matrix columns are stored in the storage:

id1: (2 3 id8)
id8: (id9 id10)
id9: (f −7)
id10: (f −8)

Step 12: step 7 to 9 are done for the idents id9 and id10 with the results 8 and 9 respectively. The storage:

id1: (2 3 id8)
id8: (8 9)

Which reads: (2 3 (8 9))—the function f has been applied on all elements in the argument list.

It is to be noticed that the steps described might be performed by the core cell in a different, more efficient way. For instance, instead of storing a intermediate result in the object storage further reduction/execution could be performed in the core cell when appropriate.

transpose

Format: (transpose list).

The transpose instruction is loaded in one of the auxiliary registers, e.g F0 and the list argument, e.g. a list of lists, is loaded in the base register matrix, see FIG. 18. The content of the base register matrix is transposed. Thus, the instruction transpose having the three level structure (transpose,
$((e_{l,l}, \ldots, e_{l,m}),$
$\ldots$
$(e_{n,l}, \ldots, e_{n,m})))$ is executed such that the result is rewritten into the two level structure $((e_{l,l}, \ldots, e_{n,l}),$
$\ldots$
$(e_{l,m}, \ldots, e_{n,m}))$ An illustrating example:
A list-structure ((1 2 3 4),
(5 6 7 8),
(9 10 11 12),
(13 14 15 16)), where the first list, i.e. (1 2 3 4), is stored in the first column of base registers, i.e. base registers S0,0 to S0,3, the second list, i.e. (5 6 7 8), is stored in the second column of base registers, i.e. base registers S1,0 to S1,3 etc, is transposed to ((1 5 9 13),
(2 6 10 14),
(3 7 11 15),
(4 8 12 16)), where the first list, i.e. (15 9 13), is stored in the first column of base registers, i.e. base registers S0,0 to S0,3 etc.

swap

Format: (swap m list).

A swap instruction is executed such that an instruction swap having a three level structure (swap m $((e_{l,l} \ldots ),$
$\ldots$
$(e_{m,l} \ldots ),$
$(e_{m+l,l} \ldots ),$
$\ldots$
$(e_{n,l} \ldots )))$ where the list of lists with elements $e_{ij}$, i and j being the denotation of the position of an element in the base register matrix, is rewritten into a two level structure $((e_{l,l} \ldots ),$
$\ldots$
$(e_{m+l,l} \ldots ),$
$(e_{m,l} \ldots ),$
$\ldots$
$(e_{n,l} \ldots ))$ such that the element $(e_{m,1}, \ldots)$ changes place with the element $(e_{m+1,1}, \ldots)$.

skip

Format: (skip m list)

A skip instruction is executed such that an instruction skip having a three level structure $$(\text{skip } m \; ((e_{l,b} \ldots),$$
$$\ldots$$
$$(e_{m-1,b} \ldots)$$
$$(e_{m,b} \ldots),$$
$$(e_{m+1,b} \ldots),$$
$$\ldots$$
$$(e_{n,b} \ldots)))$$

where the list of lists with elements $e_{ij}$, i and j being the denotation of the position of an element in the base register matrix, is rewritten into a two level structure $$((e_{l,b} \ldots),$$
$$\ldots$$
$$(e_{m-1,b} \ldots),$$
$$(e_{m+1,b} \ldots),$$
$$\ldots$$
$$(e_{n,b} \ldots))$$

such that the list $(e_{m,1}, \ldots)$ is deleted.

4. List extracting

A goal containing a list is placed in the main registers. If the list contains elements which are inserted lists, these lists are stored vertically in the subsidiary registers.

An expand_list operation could be performed in one cycle. The contents of the base registers are shifted diagonally down to the right one step, except for the content in the main register, which is transferred to the vertical bus and inserted at the uppermost base register in that column (see FIG. 19). A repeated expand_list could be used to "fill" the main registers with data.

The Bit Cell

The whole memory, as being a part of the reduction processor according to the invention, is intended to be implemented in the VLSI techniques (VLSI=Very Large Scale Integration). Each bit cell has thus a design adapted to be implemented in VLSI-technics. An embodiment of the bit cell circuit, together with drivers for the bit cell wires d, d* and acc, is shown in FIG. 20. The bit cell 15 is shown surrounded by dashed lines.

Each bit cell is connected to the control unit with two wires, such as the wires d and d* in the embodiment of a bit cell shown in FIG. 20. Thus, each part of an information bus going to an element for storing information being 38 bits long contains 76 wires. Each such bus part is connected to storage fields 151 placed in a column in the storage cell area.

As seen in FIG. 20 the bit cell has only four connections, i.e. a first connection $V_{cc}$ which is constantly provided with a supply voltage, and a second, a third and a fourth connection acc, d, d* each of which is settable in at least three different control states, as will be described in further detail later on.

The bit cell shown in FIG. 20 is a four transistor CMOS cell. It is static and has a load. The load is the source/drain path of a MOS FET I1 and I2, respectively, having inverted gates in this embodiment. It is also possible to have a resistive load instead (not shown).

The cell is a flip-flop controllable from each side. Between the access wire acc and the supply wire $V_{cc}$ two series connections, each including the source/drain path of a MOS FET and a load T1,I1 and T2,I2, respectively, are provided in parallel. The drain of the transistor T1 is connected to the gate of the transistor T1 and the drain of the transistor T2 is connected to the gate of the transistor T1. A diode D1 is connected between the wire d and the interconnection n1 between the drain of the transistor T1, the load I1 and the gate of the transistor T2. A diode D2 is connected between the wire d* and the interconnection n2 between the drain of the transistor T2, the load I2 and the gate of the transistor T1. Each of the diodes D1 and D2 are provided by a MOS FET having the drain and gate connected to each other and connected to the wire d or d* respectively.

The essential qualities of the circuit elements are that the diodes D1 and D2 are elements permitting current to flow only in one direction relative to the wires d and d*, and that the transistors T1, T2 are active elements in which the current can be controlled by variation of the potential of their gates. The interconnections n1 and n2 are nodes on which a potential related to a one bit information is storable. Each load I1, I2 is an element which behaves like a resistor.

In FIG. 20 the voltage $V_{cc}$ is shown to be a high potential. The diodes D1 and D2 are then directed such that current is flowing from the wire d or d* to the node n1 or n2, respectively. The resistance of the active elements T1 or T2 is lowered when the potential on the gate electrode is increasing and thus the nodes are then lowered. However, in other embodiments potentials and currents could be chosen to have the opposite directions to the ones shown in the embodiment according to FIG. 20.

The bit cell can store a value $v_{store}$, the value being either 'true' or 'false'. The bit cell has a structure such that it is settable in several different functional states by setting different potentials on the wires acc, d and d*.

The control states are high level, low level, current into the cell for all the wires and also current out of the cell for the wire acc. The wire acc is an access wire going from the head 16 and connected to all the bit cells 15 in a storage cell field. The third and fourth wires d and d* have signals inverted to each other when writing or reading of the cells is made and the access wire acc is LOW.

The Drive and Sense Amplifiers in the Element Head 16

The driver and sense amplifiers in the head 16 are illustrated schematically in a dashed square in FIG. 20. A first transistor T3 has its source connected to a voltage Vr, its drain to the access wire acc in all the bit cells 15 in a storage cell field 151 and its gate is fed with clock signals prech from a clock signal generator (not shown). A second transistor T4 has its source connected to a voltage 0 V, its drain to the access wire acc in all the bit cells 15 in a storage cell field 151 and its gate is fed with a voltage V3 which is high when the voltage 0 V shall be set on the access wire acc. As mentioned above the wire acc will be connected to all the bit cells in a closure element, thus to for instance 38 bit cells. It is provided in the head. Therefore, the head should be small. The voltage level of the wire acc is amplified in an amplifier AMP.

The Drive and Sense Circuits in the Interface 7

The driver and sense circuits in the interface 7 for the bit cell wires d and d* are illustrated schematically in another dashed square in FIG. 20. However, it is to be noted that the circuits only illustrate one possible way to drive and sense the wires d and d*. The input/output IN/OUT is connected to the core cell 2 shown in FIG. 1. Thus, the circuit is one of many similar circuits that could be provided in an interface 7 between the object storage 1 and the core cell 2.

The write circuit for the wire d includes a first pair of transistors T5 and T6, the first shown to be of n-type and the second of p-type in the embodiment, having their drains connected to the wire d, and providing a voltage divider. The transistor T5 has its source connected to a potential Vr, and its gate is fed with the precharge signal prech. The other transistor T6 has its source connected to a potential Vcc, and its gate is fed with a control signal V4 going low when the potential $V_{cc}$ shall be fed to the wire d. The write circuit for the wire d also includes a series connection of the source/drain paths of a p-type transistor T9 and a n-type transistor T10 connected between the voltage source Vcc and the drain of a n-type transistor T11 having its source connected to ground and its gate connected to an input write from the external control. The interconnection between the drains of the transistors T9 and T10 is connected to the gate of the transistor T6 and has the voltage V4. The gate of the transistor T9 is fed with the inverted precharge signal prech* connecting the gate of the transistor T6 to the source voltage Vcc through a conducting transistor T9 during the precharge phase.

The write circuit for the wire d* includes a second pair of series coupled transistors T7 and T8, the first shown to be of n-type and the second of p-type in the embodiment, having their drains connected to the wire d*, and also providing a voltage divider. The transistor T7 has its source connected to a potential Vr, and its gate is fed with the precharge signal prech. The other transistor T8 has its drain connected to a potential Vcc, and its gate is fed with a control signal V5 going low when the potential $V_{cc}$ shall be fed to the wire d*.

The write circuit for the wire d* also includes a series connection of the source/drain paths of a p-type transistor T12 and a n-type transistor T13 connected between the voltage source $V_{cc}$ and the drain of the transistor T11. The interconnection between the drains of the transistors T12 and T13 is connected to the gate of the transistor T8 and has the voltage V5. The gate of the transistor T12 is fed with the inverted precharge signal prech* connecting the gate of the transistor T8 to the source voltage Vcc through a conducting transistor T12 during the precharge phase.

The external wire IN/OUT for input and output is connected to two tristate inverters. One of the tristate inverters having its output connected to the wire IN/OUT includes a series connection of the source/drain paths of two n-type transistors T14, T15 and two p-type transistors T16, T17. The gate of the transistor T16 is connected to a control wire providing the signal bitin and the gate of the transistor T15 is fed with the inverted signal bitin*. The second of the tristate inverters having its input connected to the wire IN/OUT includes a series connection of the source/drain paths of two n-type transistors T18, T19 and two p-type transistors T20, T21. The gate of the transistor T19 is connected to the control wire providing the signal bitin and the gate of the transistor T20 is fed with the inverted signal bitin*. The output of the second tristate inverter is connected to the gate of the transistor T13 and through an inverter INV to the gate of the transistor T10.

A read amplifier including a n-type transistor T22 having its source connected to earth, its gate connected to a constant voltage Vbias which holds the transistor T22 constantly conducting and functioning as a current generator, and its drain connected to a parallel connection of two series connected source/drain paths of a n-type transistor and a p-type transistor, T23, T24 and T25, T26, respectively, having their other end connected to the source voltage Vcc. The gates of the p-type transistors T24 and T25 are interconnected and connected to the interconnection of the drains of the transistors T23 and T24. The gate of the transistor T23 is connected to the wire d, and the gate of the transistor T25 is connected to the wire d*.

Each clock period, the signals prech and prech*, is divided into a precharge phase, in which the signal prech is high, and a make phase, in which the signal prech is low and the other control signals determines the operation to be made. Thus, at the precharge phase the wires d, d* and acc are precharged to the voltage Vr, through the transistors T5, T7 and T3, respectively.

The signals bitin and bitin* control when data will be sent to and from the bit cell 15. When the signal bitin is low and the signal bitin* high, then data will be transferred from the bit cell to the wire IN/OUT by the first tristate inverter. When the signal bitin is high and the signal bitin* low, then data will be transferred to the bit cell from the wire IN/OUT by the second tristate inverter.

At the read operation in phase two, after the precharge of the wires d, d* and acc to Vr, the wires d and d* are left floating, and the wire acc is set to the voltage 0 V by a high voltage V3 making the transistor T4 conducting. This causes the node having the lowest potential, say n1, to be lowered to a potential between Vr and 0 V. Because of this a current is flowing from the wire d to the node n1 to the wire acc. This current discharges the the wire d, i.e. the voltage on the wire d is lowered. This voltage reduction is measured by the read amplifier T22 to T26. The result of the reading is provided on the interconnection between the drains of the transistors T25 and T26 and fed to the input of the first tristate inverter T14 to T17. The signal bitin being low and the signal bitin* being high provides a transfer of the read and amplified bit value to the input/output wire IN/OUT. It is important that the wires d and d* are not driven in an active way during the phase two, since then no voltage reduction should be obtained on one of the wires.

Thus, for the read operation both d and d* are initially provided on the potential Vr. Both d and d* are substantially kept on the potential Vr, but one of them falls somewhat because of "current in" into the cell which discharges one of the wires d, d*. Since Vr here is defined as "low", the low potential will be lower than "low". d and d* give the read values. d lower than d* gives FALSE, d higher than d* TRUE. For the don't write, write false, write true, don't write and don't comp. operations the information potentials on the wires d and d* don't give any information.

For a write operation in phase two, after the precharge of the wires d, d* and acc to Vr, the wire acc is set to the voltage 0 V by a high voltage V3 making the transistor T4 conducting. The value to be stored is provided on the input/output wire IN/OUT. The signals bitin high and bitin* low activate the second tristate inverter T18 to T21 to transfer the value on the wire IN/OUT to its output. The control signal write being high on the gate of the transistor T11 connects the sources of the transistors T10 and T13 to 0 V.

A high signal from the second tristate inverter T18 to T21, i.e. a "0" or false to be written, controls the transistor T13 to conducting state, setting the voltage V5 to low voltage, the transistor T8 is controlled to be conducting and the wire d* is set to the voltage Vcc, i.e. high. The inverted signal from the second tristate inverter fed to the gate of the transistor T10, being low, will keep it non-conducting, the voltage V4 being connected to the voltage source Vcc during the precharge phase will be kept on this voltage. The transistor T6 will be kept non-conducting, and the Voltage Vr connected to the wire d during the precharge interval through the transistor T5 will be kept.

A low signal from the second tristate inverter T18 to T21, i.e. a "1" or true to be written, will control the write circuit T5, T6, T9, T10 for the wire d to set it on the high voltage Vcc through the inverter INV while the write circuit T7, T8, T12, T13 will keep the wire d* on the voltage Vr it was set on during the precharge phase.

As apparent from the examples above, the storage nodes n1 and n2 are in the embodiment shown in FIG. 20 used in the following way of operation. One of the nodes n1, n2 or both are charged or discharged during the second phase of the operation cycle dependent upon which ones of the control signals V3, V4 and V5 to be used, i.e. if the wire acc is set on 0 V or if one of (or both) the wires d and d* is set on Vcc.

As mentioned above, every operation cycle is composed of a precharging period and an execution period. Thus, when it is mentioned below that the wire acc is set high it is meant that the signal V3 is not controlling the transistor T4 to set the voltage 0 V on the wire acc during the execution period. Likewise, when it is mentioned below that the wire d or d* is set low it is meant that the control signal V4 or V5 is not controlling the transistor T6 or T8 to be in a state coupling through the voltage Vcc, being higher than the voltage Vr, to the wire d or d* during the execution period. However, when the wire d or d* is set high then the transistor T6 or T8 will be controlled to connect through the voltage Vcc to the wire.

The storage cell area could be rather extensive, for instance including 256 storage cells, which means that each pair of transistors T5, T6 and T7, T8, respectively, is connected to a wire serving one bit cell in all the storage cells, such as 256 bit cells. Therefore, the transistor sizes must be adjusted to the total bus capacitances and the desired speed.

The voltage Vr could be created from a shorted inverter in order to keep a known relation between Vr and the sense amplifier inverter. The access circuits in the head shall control the bit cells and also capture the information from the bit cells.

The following functional states are settable by the control states:

| | |
|---|---|
| rest | the cell stores the value vstore, |
| read false | the value vstore = false can be read, |
| read true | the value vstore = true can be read, |

-continued

| | |
|---|---|
| don't read | the cell stores the value vstore, |
| write false | the stored value vstore is set to 'false', |
| write true | the stored value vstore is set to 'true', |
| don't write | the cell stores the value vstore, |
| comp. false | the stored value vstore is compared to a value 'false', |
| comp. true | the stored value vstore is compared to a value 'true', |
| don't comp. | the cell is just storing the value vstore. |

The following is an operation table for different operation modes of a bit cell:

| Op. mode | acc | d | d* |
|---|---|---|---|
| rest | low | low | low |
| read false | low | current in | high |
| read true | low | high | current in |
| don't read | high | arbitrary | arbitrary |
| write false | low | low | high |
| write true | low | high | low |
| don't write | high | arbitrary | arbitrary |
| comp. false | arbitrary | low | high |
| comp. true | arbitrary | high | low |
| don't comp. | arbitrary | low | low |

For comp. false and comp. true the wire acc should have the state current out if a comparison result is DIFFERENT.

For the comp. false or comp. true operations the wire acc (access wire) gives the result of the comparison. The wire acc is precharged to Vr and the input data is supplied on the wire d, and its inverse value on the wire d*. If the value stored in the bit cell is different than the input data, the wire acc will be charged through one of the diodes D1 or D2, and through the corresponding n-type transistor, T1 or T2. This is detected by the amplifier AMP in the head 16. When a compared FIT is detected the wire acc will be kept on the potential Vr.

The expressions current in and current out expresses that a charge is moved into and out of, respectively, the wire in question during a time sequence. This is usually made by initiating the wire to HIGH or LOW, respectively, in the operation mode REST and then change into the actual mode. A current will then discharge or charge, respectively, the wire in question. When there is no current no appreciable charge will be transported. Therefore, no voltage change will be provided during the time sequence.

THE OBJECT STORAGE CONTROL CIRCUITS

Figure 21A:
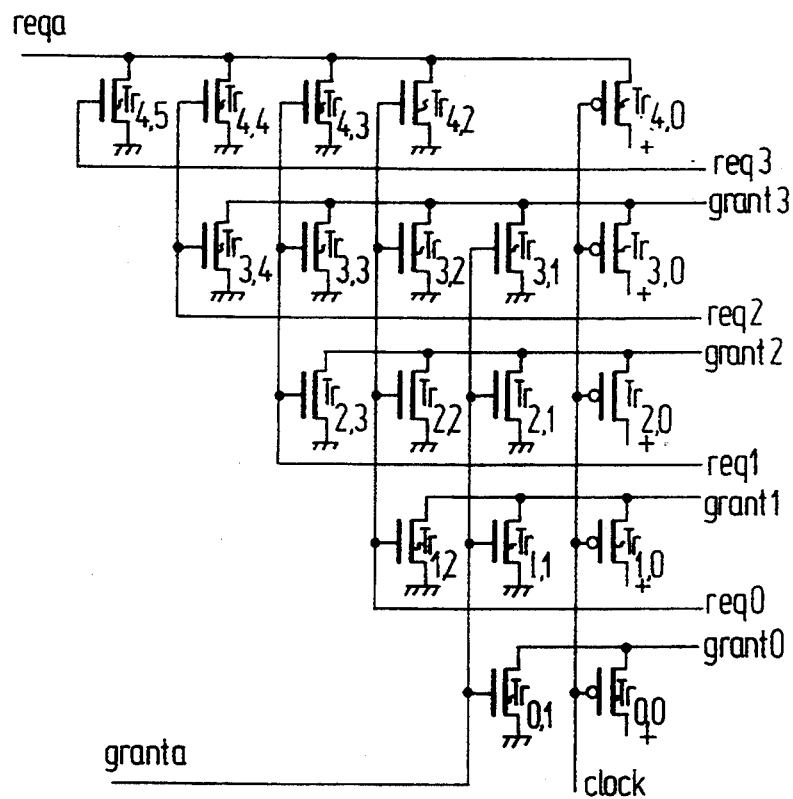
FIG. 21A shows a circuit diagram of a block included in a priority decoder in the memory.

The Priority Decoder (FIGS. 21A and B)

Figure 21B:
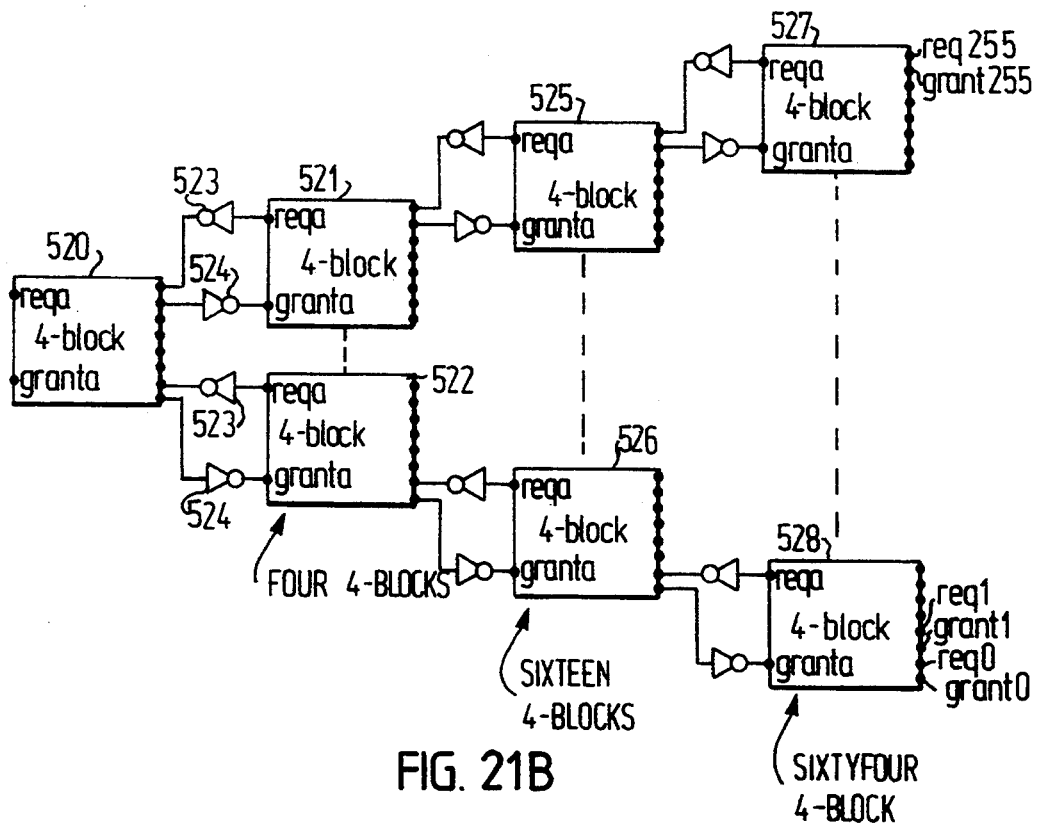
FIG. 21B illustrates connection of blocks shown in FIG. 21A.

The embodiment of the priority decoder 11 shown in FIGS. 21A and 21B is divided into 4-blocks. As shown in FIG. 21A, each 4-block has one pair of left hand side wires granta and reqa and four pair of right hand side wiress req0, grant0, . . . to . . . req3, grant3.

As shown in FIG. 21B, a first 4-block 520 has its four pairs of right hand side wires connected to each of the pair of left hand side wires of four 4-blocks, of which the outer ones 521 and 522 are shown. The blocks 520, 521, and the blocks 520, 522 are interconnected with inverting amplifiers 523 and 524, the amplifier 523 giving information to a block lower in the block chain that a priority require is needed for a block higher in the chain, and the amplifier 524 giving information to a block higher in the block chain that a grant is given. The number of blocks 521, ... 522 in the second 4-block column are thus four.

Each block in the second column is then connected to four 4-blocks in the third column of blocks in the same way as the blocks in the second column are connected to the 4-block 520. The number of 4-blocks in the third column will then be sixteen. Only the outermost 4-blocks 525 and 526 are shown.

Each block in the third column is then connected to four 4-blocks in the fourth column of blocks in the same way. The number of 4-blocks in the third column will then be sixtyfour. Only the outermost 4-blocks 527 and 528 are shown.

The right hand side wires of the 4-blocks in the fourth column are connected to the object storage. Each pair being adapted to serve as the buses 18 and 19 for a storage cell 10, as apparent from FIG. 21B.

Eightyfive blocks are provided to serve 256 closures. The lowest block 528 is serving the lowest storage cells, down to the storage cell number 0, and the highest block 527 is serving the highest, i.e. up to the storage cell number 255.

The configuration shown in FIGS. 21A and 21B uses a domino precharged logic, where the full priority decoder includes cascaded domino stages, corresponding to a transfer of a request signal from for instance req0 in the lowest block 528, through all priority decoder blocks and back to give a false grant signal to all storage cells, except the storage cell number 0.

As shown in FIG. 21A, each block includes 5 rows of MOS FET transistors, each row including one MOS FET more than the row below, except for the fifth row which has the same number of MOS FET as the fourth row.

Each of the MOS FETs $Tr_{0,0}$ to $Tr_{3,0}$ most to the right in the four lowest rows is shown to be of p-type having its gate connected to a clock signal source, its drain connected to a positive supply voltage and its source connected to the grant wire grant0, grant1, grant2 or grant3, respectively. The MOS FET $Tr_{4,0}$ in the highest row has its source, instead of being connected to a wire granti, i being a number between 0 and 3, connected to a wire reqa connected to the next lower block in the block cascade through an inverter 523.

The rest of the MOS FETs, shown to be of n-type, $Tr_{0,1}$ in the first row, $Tr_{1,1}$ and $Tr_{1,2}$ in the second row, $Tr_{2,1} Tr_{2,2}$ and $Tr_{2,3}$ in the third row, $Tr_{3,1}$ $Tr_{3,2}$, $Tr_{3,3}$ and $Tr_{3,4}$ in the fourth row, $Tr_{4,2}$, $Tr_{4,3}$, $Tr_{4,4}$ and $Tr_{4,5}$ in the fifth row, have their sources connected to earth and their drains connected to a grant wire grant0, grant1, grant2, or grant3, respectively, for the four lowest rows and to the wire reqa for the fifth row.

The wire granta is connected to the gate of each of the MOS FETs $Tr_{0,1}$, $Tr_{1,1}$, $Tr_{2,1}$, $Tr_{3,1}$. The wire req0 is connected to the gate of each of the MOS FETs $Tr_{1,2}$, $Tr_{2,2}$, $Tr_{3,2}$ and $Tr_{4,2}$. The wire req1 is connected to the gate of each of the MOS FETs $Tr_{2,3}$, $Tr_{3,3}$ and $Tr_{4,3}$. The wire req2 is connected to the gate of each of the MOS FETs $Tr_{3,4}$ and $Tr_{4,4}$. The wire req3 is connected to the gate of the MOS FET $Tr_{4,5}$.

The priority decoder operates in two phases. In the first phase, when the clock signal is low, all granti are precharged to be high (true). Then all the signals reqi will be low (no need). In the second phase the precharge is closed, i.e. the clock signal will be high. Then any or some of the outputs reqi will go high, which sets all the granti above to low (not chosen) and sets reqa to low. If a reqa goes low, then a reqi in a neighbouring 4-block to the left in FIG. 21 is set to high. The signals reqa and granta in the 4-block 520 are of no importance. However, grant a in the 4-block 520 is connected to earth. The signal reqa in the 4-block 520 provides the result "ANY" on the wire 14 in FIGS. 2 and 3, since it has to go low when any reqi connected to any of the cell closures goes high.

Figure 22:
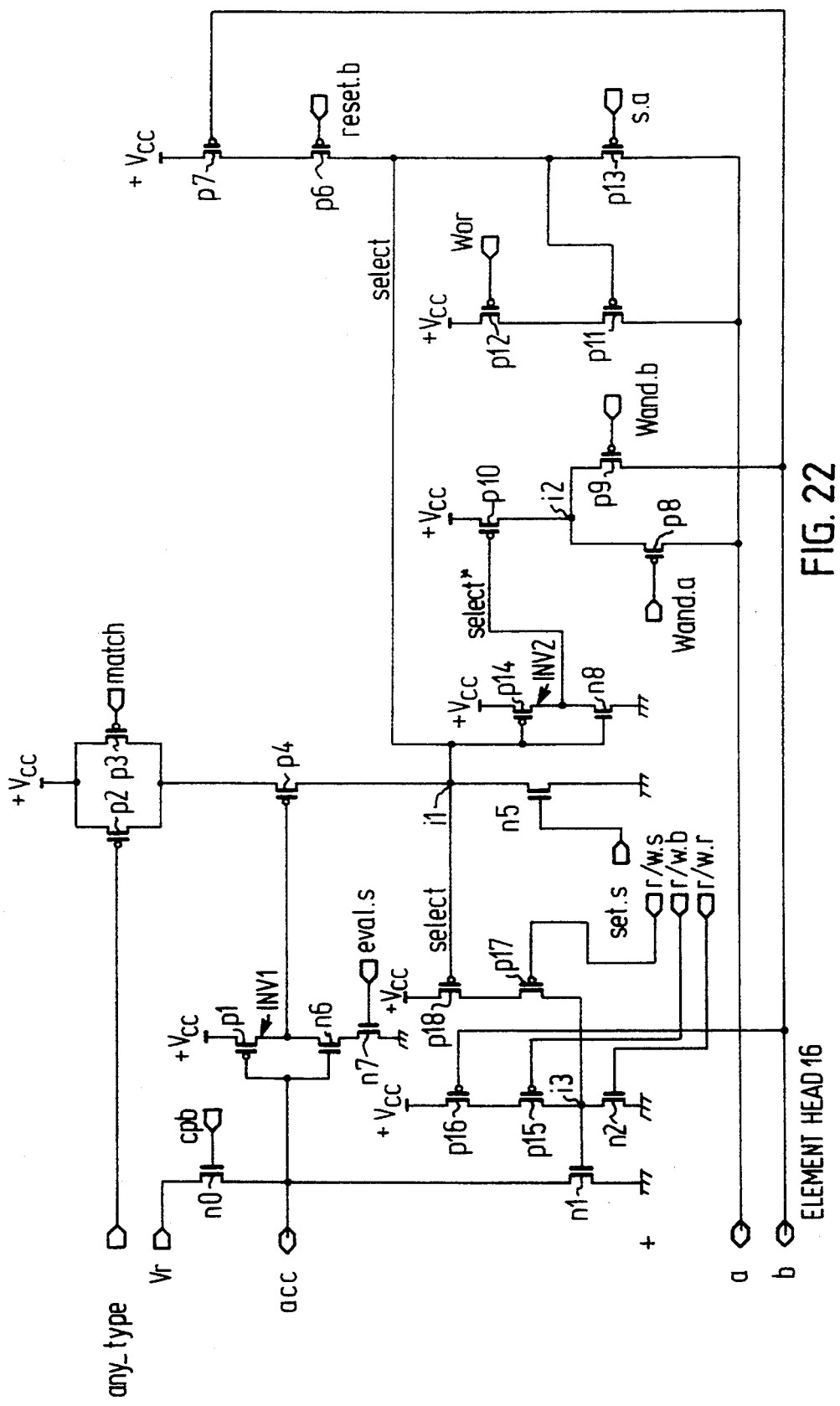
FIG. 22 shows a circuit diagram of an embodiment of an element head in the memory.

The Element Head (FIG. 22)

A detailed embodiment of the element head 16 is shown in FIG. 22. The element head 16 controls the access wire acc to the storage cells 10, it senses the access wire acc and wire ANY 14, here called any_type, it performs the operations wired_and and wired_nor on the buses a and b, and it also reads the buses a and b. Furthermore, it includes an internal dynamic memory bit.

A n-channel MOS FET n0 has its source/drain path connected between a voltage Vr, being the same as the voltage Vr in FIG. 20, and the access wire acc. A clock pulse cpb is fed to the gate of the MOS FET n0. A n-channel MOS FET n1 has its source/drain path connected between earth and the access wire acc.

A series connection of the parallel coupled source/drain paths of two p-channel MOS FETs p2 and p3, the source/drain path of a p-channel MOS FET p4, and the drain/source path of a n-channel MOS FET n5 is connected between a voltage source Vcc and earth.

A wire any_type directly connected to the nearest bit cell is connected to the gate of the MOS FET p2. A wire match from the central control unit is connected to the gate of the MOS FET p3. The access wire acc is via an inverter INV 1 including the series connected source/drain paths of a p-channel MOS FET p1 and a n-channel n6 having their gates connected to the access wire acc. connected to the gate of the MOS FET p4. A n-channel MOS FET n7 has its source/drain path connected between the inverter INV1 and earth. A wire eval.s, i.e. evaluate select, from the central control unit is connected to the gate of the MOS FET n7. A wire set.s, i.e. set select, from the central control unit is connected to the gate of the MOS FET n5.

The interconnection point i1, also called the select node, between the drains of the MOS FETs p4 and n5 is connected to the drain of a p-channel MOS FET p6, having its source connected via the drain/source path of a p-channel MOS FET p7 to the voltage source +Vcc. A wire reset.b from the central control unit is connected to the gate of the MOS FET p6. A wire b, which is the same as the wire b shown in FIG. 3, is connected to the gate of the MOS FET p7.

A p-channel MOS FET p8 has its drain connected to a wire a, which is the same as the wire a shown in FIG. 3, and its source to an interconnection point i2. A wire Wand.a, i.e. wired and a, from the central control unit is connected to its inverted gate. A p-channel MOS FET p9 has its drain connected to the wire b, and its source to the interconnection point i2. A wire Wand.b, i.e. wired_and b, from the central control unit is connected to its inverted gate. A p-channel MOS FET p10 has its drain connected to the interconnection point i2 and its source connected to the source voltage +Vcc. The interconnection point i1 is via an inverter INV2 connected to the inverted gate of the MOS FET p10. The inverter INV2 includes the series connected source/drain paths of a p-channel MOS FET p14 and a n-channel MOS FET n8 connected between the voltage source +Vcc and earth and having their gates connected to the interconnection point i1.

A series connection of the drain/source paths of two p-channel MOS FETs p11 and p12 is connected between the wire a and the voltage source +Vcc. A wire Wor, i.e. wired or, from the central control unit is connected to the gate of the MOS FET p12. The interconnection point i1 is connected to the gate of the MOS FET p11. A p-channel MOS FET p13 has its source/drain path connected between the wire a and the interconnection point i1. A wire s.a, i.e. select a, from the central control unit is connected to the gate of the MOS FET p13.

A series connection of the drain/source paths of a n-channel MOS FET n2, a p-channel MOS FET p15, a p-channel MOS FET p16 is connected between earth and the voltage source +Vcc. An interconnection point i3 between the sources of the MOS FETs n2 and p15 is connected to the gate of the MOS FET n1. A series connection of two p-channel MOS FETs p17 and p18 is connected between the interconnection point i3 and the voltage source +Vcc. The interconnection point i1 is connected to the gate of the MOS FET 18. A wire r/w.b, i.e. read/write b, from the central control unit is connected to the inverted gate of the MOS FET p15. A wire r/w.s, i.e. read/write select, from the central control unit is connected to the gate of the MOS FET p17. A wire r/w.r, i.e. read/write reset, which is used to reset the node i3 after a read or write operation, from the central control unit is connected to the gate of the MOS FET n2.

The function of the logic in the embodiment of the element head shown in FIG. 22 is the following. The MOS FET n0 precharges the access wire acc at each negative clock pulse, and the MOS FET n1 evaluates it low at read or write. The MOS FET n2 precharges i3 low to keep the MOS FET n1 off, i.e. non-conducting, at stand-by.

The MOS FETs p17 and p18 perform read/write controlled by the select node. This is used for instance in instructions of type instruction match, clearing the mark of a closure cell or reading the identity of the closure cell and if not setting a mark, where different actions shall take place depending on the information on the buses a and b.

A match function compares a value, for instance a so called goal value, in the core cell and in a storage cell and consider these values defining two sets. The match result is false if the sets do not intersect. This case is also assumed if parts of the closure are not fully evaluated.

The MOS FET n5 precharges the select node i1, and the MOS FETs p2 to p4 evaluate it at control from the control unit 6 on the gate of the MOS FET n7. The MOS FETs p8 to p10 perform wired-and on the bus a and/or on the bus b in dependence of the control signals from the central control unit. The MOS FETs p11 and p12 perform wired_or on the bus a at control from the central control unit.

The inverter INV2 inverts the select bit on the select node. This is necessary because both wired-or and wired-and are performed. The MOS FET p13 transfers the value on the bus a to the select node. Only a high state need be transferred, since it has been precharged to a low state. Finally, the MOS FETs p6 and p7 are used to select high when controlled. This is needed for an instruction for reading a marked storage cell and clearing the mark of that cell, because then the select node shall be reset at the same time as a reading is performed.

This feature could also be used for other types of instructions in which a logical AND operation must be performed in the element head.

The signal any_type is directly connected to the nearest bit cell. It contains the type of the stored value. During a match the MOS FET p3 is controlled to be off, so a high value on the wire having the signal any_type will generate a true match. Similarly, for a test of whether the storage cell is unused, a high state on the wire having the signal any_type while the MOS FET p3 is contolled to be off will cause the signal select on the select node to remain low. For a test regarding equality the MOS FET p3 is controlled to be on, i.e. conducting.

Figure 23:
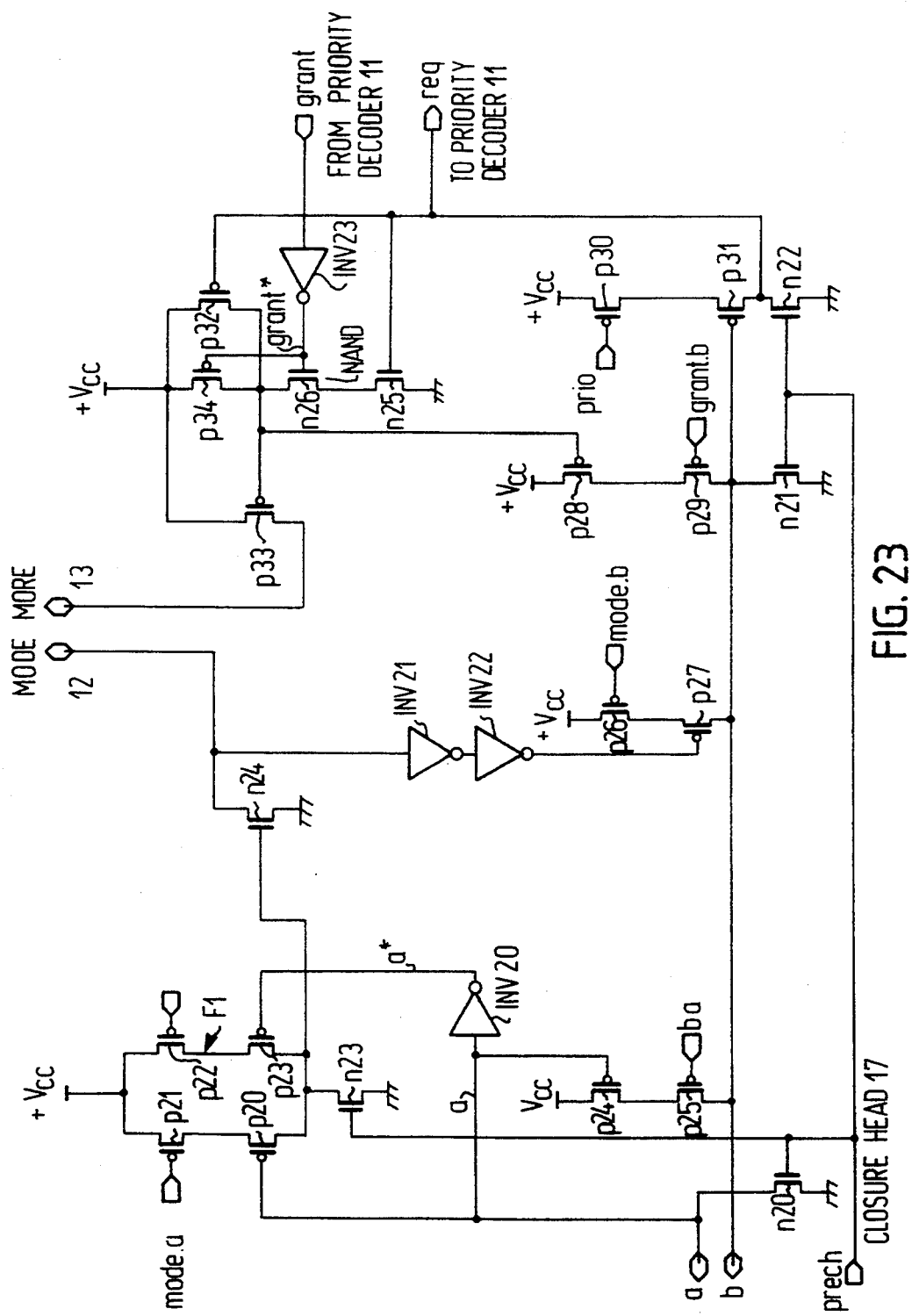
FIG. 23 shows a circuit diagram of an embodiment of a closure head in the memory.

The Closure Head (FIG. 23)

The embodiment of a closure head 17 shown in FIG. 23 is able to perform the priority operation and the MODE operation on either the bus a or the bus b. Both operations can be performed simultaneously on different buses. The MODE operation, i.e. the operation of the bus 12 (MODE) in the circuit shown in FIGS. 2 and 3, is sensitive to either high or low states on the bus a, while it is sensitive only to the low state on the bus b. The closure head can also reset the global signal MORE on the bus 13 (see FIG. 2), and read and write back old bus data to the buses a and b.

Both the circuit to perform the MODE operation and the circuit to perform the priority operation are designed according to a two stage domino principle. The first stage determines which bus should be the input and correct the polarity, and the second stage performs the actual operation. Thus, the closure head operates in two phases, having a first precharge phase, and a second operation phase. Therefore, a number of precharge n-channel MOS FETs n20, n21, n22 and n23 are provided having their gate controlled by a clock signal prech from the central control unit. n20 precharges the bus a, n21 the bus b, n22 the bus req to the priority decoder 11 and n23 a contact net F1 to "low".

A contact net F1 includes two parallel coupled series coupled pairs of source/drain paths of p-channel MOS FETs p20, p21 and p22, p23, respectively. The net F1 is on one hand connected to earth through the source/drain path of the MOS FET n23 and on the other hand to the voltage source +Vcc. The bus a is connected to the gate of the MOS FET p20 and through an inverter INV 20 to the gate of the MOS FET p23, which thus is fed with the signal a* being the inverted signal on the bus a. A signal mode.a from the central control unit is fed to the gate of the MOS FET p21 and its inverted signal mode.a* from the central control unit is fed to the gate of the MOS FET p22. The contact net F1 realizes the function a*mode.a versus a**mode.a*.

A series connection of the source/drain paths of two p-channel MOS FETs p24 and p25 are connected between the voltage source +Vcc and the bus b. The bus a is connected to the gate of the MOS FET p24 and a signal ba from the central control unit is fed to the gate of the MOS FET p25.

The node between the net F1 and the drain of the MOS FET n23 is connected to the gate of a n-channel MOS FET n24 having its source connected to earth and its drain to the bus 12 (MODE) shown in FIGS. 2 and 3 providing the mode-signal. A series connection of the source/drain paths of two p-channel MOS FETs p26 and p27 are connected between the voltage source +Vcc and the bus b. The mode-signal on the bus 12 is also through two inverters INV 21 and INV 22, amplifying the mode-signal, connected to the gate of the MOS FET p27. A signal mode.b is fed from the central control unit to the gate of the MOS FET p26. The signal mode.a makes the mode operation on the bus a. The signal mode.a* makes also the mode operation on the bus a but form an inverted value a* on the bus. The signal ba set the bus "high" if the bus a is set "low". The signal mode.b sets bus b to "high" if the bus mode is "low". The signal prech is used to precharge the buses a and b to "low".

Thus, the choice of if the MODE operation is to be made on the signal a or the signal a* is made by aid of the contact net F1. The bus MODE 12 may then be set to earth right through all the closure heads 17 in the object storage. A control signal mode.b on the gate of the transistor p26 will then draw the bus b to a high level. In this way it is possible to make two different tests, on the bus a as well as on the bus b. If the test on the bus a shows a result "high" conditioned in the actual operation, then the bus b may be set "high". For instance, WIRED OR may be made on one of the buses a and b and WIRED AND on the other, and a logical operation may be made in which the condition could be that if the result on the bus a is for instance "false" the the bus b could show "false". Another condition is to make another operation based on the result on the bus b.

A series connection of the source/drain paths of two p-channel MOS FETs p28 and p29 are connected between the voltage source +Vcc and the bus b. The signal grant from the priority decoder 11 is through an inverter INV 23 connected to one input of a NAND gate NAND1 and the signal req to its second input. The NAND gate includes two n-channel MOS FETs n25 and n26 having their source/drain paths series connected and two p-channel MOS FETs p32 and p34 having their source/drain paths parallel connected and connected between the drain of the MOS FET n26 and the source voltage Vcc. The source of the MOS FET n25 is connected to earth. The signal grant* is fed to the gates of the MOS FETs n26 and p34 and the signal req is fed to the gates of the MOS FETs n25 and p32. The output of the NAND gate is connected to the gate of the MOS FET p28 and to the gate of a p-channel MOS FET p33 having its source/drain path connected between the source voltage Vcc and the wire MORE 13. A signal grant.b from the central control unit is fed to the gate of the MOS FET p29.

A series connection of the source/drain paths of two p-channel MOS FETs p30 and p31 are connected between the voltage source Vcc and the bus req to the priority decoder 11. A signal prio from the central control unit is fed to the gate of the MOS FET p30, and the bus b is connected to the gate of the MOS FET p31.

The signal prio from the central control unit is used to send a request signal to the priority decoder 11, i.e. provide a high signal req, if the bus b is "low". The NAND-gate p32, p34, n25, n26 detects if the signal req is high and the signal grant is low, i.e. if a need for priority is demanded but not chosen. In such a case the NAND-gate goes low and sets the bus 13 (MORE) to "high" i.e. indicating that there is a need for priority. The signal grant.b is used in order to set the bus b "high" if the signal req is "high" and the signal grant is "low". After that first a signal prio has been provided from the central control unit and then a signal grant.b at the most one storage cell in the object storage will have a bus b being "low".

The Numeric ALU and the Value Representations

It is within the scope of the invention to provide the first order processor with a conventional type numeric ALU, which would be controlled by the control unit 6 and which would be connectable to the core cell. Still, an embodiment of a numeric ALU 5, which is specially suited for the first order processor according to the invention, will be described below. The numeric ALU described below:
* is able to reduce numerical expressions, without using a temporary storage
* is able to handle floating-point values as operands, having a varying partition between mantissa and exponent, which partition is coded in a code field
* uses arithmetic instructions given for its operands, on buses, in a code field of variable code length.
* has a co-variation between floating-point and integer representations
* has code dense value representations The numeric ALU can perform arithmetical, logical and related operations on numerical value elements, in the following way:
a) an input list is provided including the numerical value elements to be processed, and instruction information,
b) an operation is performed on the numerical value elements in the input list using the instruction information,
c) the calculation is performed by rewriting the elements in the input list,
d) the result is presented in an output list.

The maximum number of elements in the input and output lists are preferably four, which corresponds to the number of main registers in the core cell, which provides the input list and receives the output list. One list element could then be provided with an instruction word representation, two list elements could be provided with each one of two numerical value representations and one could be used to be provided with an intermediate calculation result during a calculation made by recycling the rewriting of the input elements several times.

The list preferably includes a function application in which one of its elements is an instruction code and the rest are arguments to the instruction. An instruction is performed by rewriting and recycling the instruction code from the result output list to the input list until, eventually, a result is reached. At each rewriting, the list could be rewritten to include a revised instruction code word, if appropriate for the actual calculation, followed by value words if appropriate.

It is appropriate to have the numerical value words provided in a coded form before actual processing. Preferably, the words representing numerical value words are provided with a coding providing the numerical values into a dense representation, i.e. every coded representation of a value corresponds to only one interpreted value. A first coding could be provided on a binary word representing an integer value. A second coding could be provided on a binary word representing a floating-point value. The codings are preferably such that after coding floating-point value representations are provided in the same order as integer value representations. In this way neither of the representations need be in binary digit form. A hardware could be provided to make computation on the transformed bit patterns just implicitly by following given rules, i.e. without knowing how the interpretation has been made.

An easy way to accomplish a floating-point value representation having a variable exponent width is to let the binary coded floating-point value representation include a code field, an exponent field and a mantissa field, the code field having an indication on a division position between the exponent field and the mantissa field, such that the exponent and mantissa fields have variable lengths. The dense representation could be provided by including a virtual "1", i.e. a "1" not provided physically in the representation, in front of a field of the word for the mantissa part of the floating-point value representation.

The Numeric ALU Hardware Structure

Figure 24A:
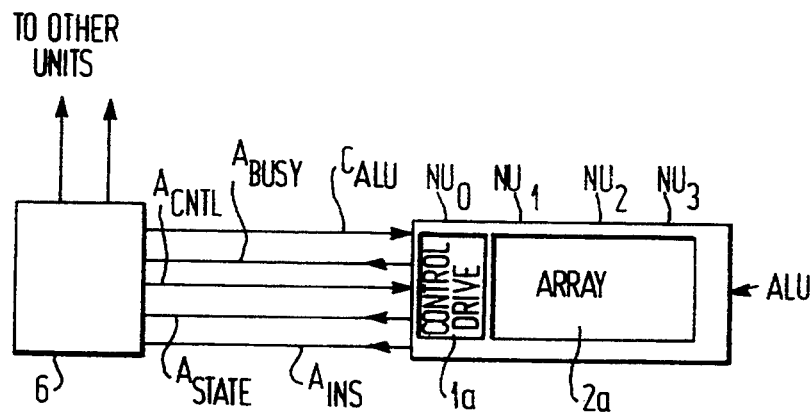
FIG. 24A shows a schematic diagram of a numeric ALU in the first order processor in FIG. 1.

The numerical arithmetic logic unit ALU, schematically shown in FIG. 24A, includes a control drive unit $1a$ and an arithmetic unit array $2a$ performing the arithmetic on particular in/outputs $NU_0$, $NU_1$, $NU_2$ and $NU_3$, each being a bus having multiple (M) transmission lines, transmitting a M bit value, M being for instance 32. The numeric ALU is controlled by a control unit 6. The numeric ALU communicates with the control unit 6 with the following signals: a clock signal input $C_{ALU}$, a busy output $A_{BUSY}$, a control input $A_{CNTL}$, a state output $A_{STATE}$, and a decoded instruction output $A_{INS}$.

Interface Numeric ALU <-> Core cell

The bus in/outputs $NU_0$, $NU_1$, $NU_2$ and $NU_3$ are connected to the main or goal registers in the core cell in the first order processor shown in FIG. 1, in which instructions of reduction type are processed.

The main register cells in the core cell, i.e. $S_{0,0}$, $S_{1,0}$, $S_{2,0}$, $S_{3,0}$ in FIG. 9, all have a NU terminal (see FIG. 10), which is connected to one of the in/output buses $NU_0$ to $NU_3$. Thus, the content in the main register $S_{x,0}$ can be transferred to numeric ALU using the in/output bus $NU_x$, which is how the input list is provided to the numeric ALU, where x is a number between 0 and 3. Further, the numeric ALU can provide the result, as an output list, to the main registers using the same bus. The content of the part of the main register situated in the NUM planes, i.e. the num word, is transferred to the numeric ALU.

The in/output buses $NU_0$ to $NU_3$ transport a list of num words, which could be a numerical value or an instruction. All buses might not be in use everytime. The input list on the in/outputs $NU_0$ to $NU_3$ includes information about the kind of computation to be provided, and the control drive $1a$ derives this information from the list while controlling the different components in the array $2a$. A computation is provided by rewriting the content in an input list in a bit or bit groupwise way, i.e. for the bits having the same position in a word separately or for groups of bits provided "slice" wise in a word, and to provide the result as an output list. It is to be noted that it is possible to have a recycling of the values several times through the internal circuits before a final output list is presented on the output. During recycling a momentary output list is presented at the output but only to be inserted as a momentary input list.

The list may include a function application together with values to be processed or other type of list, such as a list only including at least one integer value, or floating-point value. When it includes a function application the first list element provided on the in/output $NU_0$ includes the instruction code, i.e. information of the kind of processing that should be made, and the rest of the list elements are arguments to the instruction.

An instruction is performed by rewriting the instruction in one or several steps in order to eventually obtain the result. Microinstructions and state signals are used inside the numeric ALU. These are used by the separate control drive $1a$ inside the numeric ALU to control the array $2a$. When a rewriting directly to the result is made, the value is placed in the output list. When a stepwise rewriting is made, the list is rewritten to keep the same instruction code, or to have a new or slightly changed instruction code, and to have the instruction code in most cases followed by a value or values. It is to be noted that the best mode of making the rewriting operation in several cycles is to keep the instruction code intact during the whole operation, because the control unit 6 will be less complicated in such a case.

Interface Numeric ALU <-> Control Unit

Returning to FIG. 24A, the clock signal $C_{ALU}$ is used to give clock pulses to the numeric ALU, and the numeric ALU specifies when it is ready to accept clock pulses with a signal ready on the output $A_{BUSY}$.

The content of the parts of the main registers situated in the HEAD planes, i.e. the tag words, are fed to the control unit 6, which in turn controls the numeric ALU control drive unit $1a$.

However, it is within the scope of invention to have the tags included in the information provided on the in/output such that the tag information is fed directly to the control drive unit, below also called the numeric ALU control circuit.

The control input $A_{CNTL}$ is used to control the numerical operation of the numeric ALU. The operation may take several clock cycles.

An output $A_{STATE}$ returned to the control unit 6 after each operation. The instruction code on the output $A_{INS}$ is a compaction of the instruction code in the main register to which the bus $NU_0$ is connected.

Figure 24B:
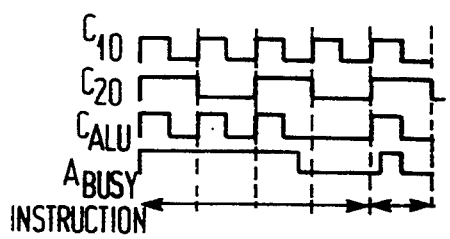
FIG. 24B shows a diagram of clock signals and some basic control signals for the numeric ALU shown in FIG. 24A.

Referring to FIG. 24B, the basic clock provided by the control unit 6 for the processor is $C_{10}$, for instance having a period of 10 ns. A numeric ALU operation is performed in one or several such clock cycles. The core processor that is connected to the numeric ALU could be controlled with a period which is longer than, for instance twice, the period for the numeric ALU, i.e. with the clock signal $C_{20}$ having a period 20 ns if $C_{10}$ has the period 10 ns. However, instead it is also possible to have it controlled with a period which is shorter. The basic control signal $C_{ALU}$ for the device having the shorter period (i.e. the numeric ALU in the embodiment shown, or otherwise the core processor) is therefore stretched at the end of an instruction in order to synchronise with the clock signal $C_{20}$ having the longer period. The numeric ALU returns a high signal $A_{BUSY}$ as long as it needs more clock cycles of the type $C_{10}$ to perform an instruction. The stretching is provided after that the signal $A_{BUSY}$ has become low, as apparent from FIG. 24B.

The Value Representations

The numeric ALU has a varying division between the exponent and the mantissa in a floating-point representation. Then, on the first hand it is possible to have many bits in the mantissa for small numbers, which gives the advantage of having a high precision. On the other hand extremely large numbers could be handled.

Figure 25:
FIG. 25 shows a schematic representation of the bit field partition in an arithmetic representation.

As shown schematically in FIG. 25, each bit pattern on a bus having a numerical value is therefore preferably provided with a short bitfield in the most significant bits of the bit string having an information of partly the sign of the value, partly the sign of the exponent and partly a code regarding the dividing position (see the right arrow in FIG. 25) between the exponent e and the mantissa m parts of the numerical value. It is to be noted that the length of the code part of the bitfield also could vary, and that the place of the dividing position between the code field and the exponent field is determined by the code field, as illustrated by the left arrow in FIG. 25.

The numeric ALU provides the floating-point representation of the number in the same order as the integer interpretation of the same number. Thus the floating-point value and the integer value of the same bit pattern are totally different.

However, this purpose could be fulfilled by having a first interpretation formula for the bitstring if the representation is to be interpreted as a floating-point value and a second interpretation formula for the bitstring if the representation is to be interpreted as an integer value. Thus neither of the representations need be in binary digit form, instead at least one of them, preferably both, is in a coded form. The bit pattern transformation is made automatically, and the hardware in the machine makes the computation on the transformed bit patterns just implicitly by following given rules, i.e. without knowing how the interpretation has been made.

An effort is made to provide a close representation of the floating-point values, i. e. there shall not be two bit patterns which could be interpreted as the same number.

The Graphical Integer Representation

Figure 26A:
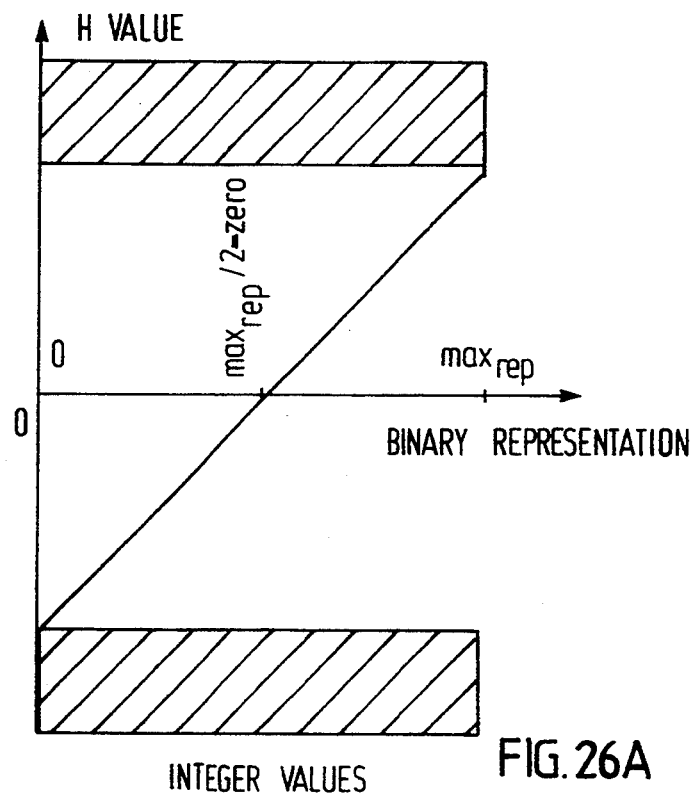
FIG. 26A shows a graphical representation of a code for integers.

FIG. 26A shows a graphical representation of the code for integer values according to the invention, called integer H values. The binary representation is provided along the horizontal axis, and the H values along the vertical axis. The most significant bit represents the sign of the value, whether it is negative or positive. As apparent from FIG. 26A the H value has its largest negative value when the binary representation is all "0", has its zero at the middle of the binary representation, i.e. when the most significant bit changes from "0" to "1", and has its largest positive value when the binary representation is all "1", i.e. has its maximum binary value $max_{rep}$.

The Graphical Floating-point Representation

Figure 26B:
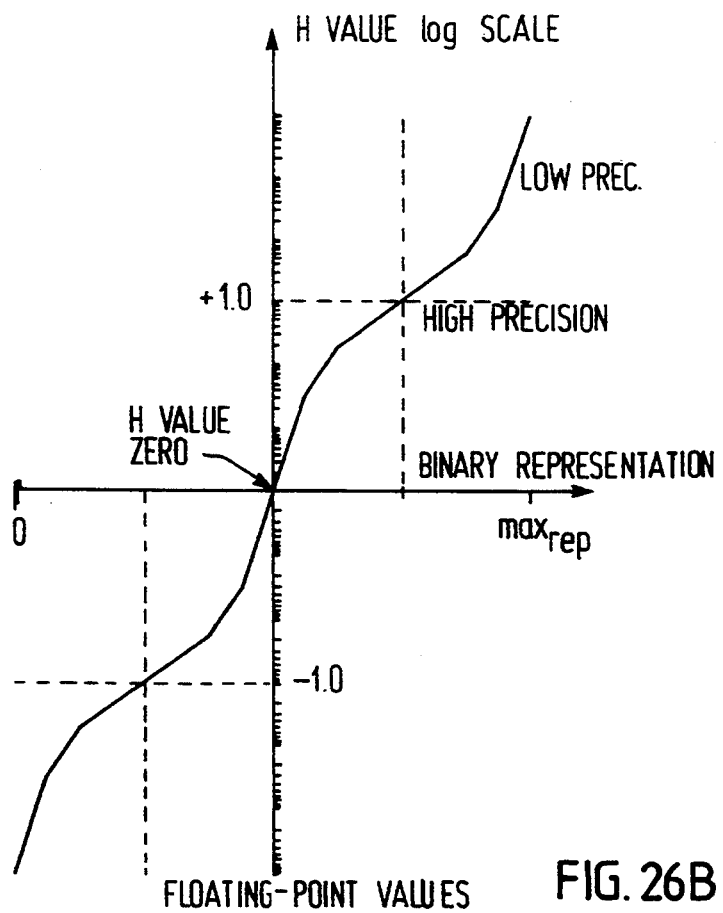
FIG. 26B shows a graphical representation of a code for floating-point values.

FIG. 26B shows a graphical representation of the code for floating-point values according to the invention, called floating-point H values. The binary representation is provided along the horizontal axis, and the H values along the vertical axis, which here is drawn through the point in which the floating-point H values are changing their sign. Also in this representation the most significant bit represents the sign of the value. The floating-point value representation must fulfill the requirement to be universal. For a certain precision the magnitude of the value must be arbitrary variable. Thus extremely small and large values should be representable. The floating-point H value scale is logarithmic. The logarithmic H value could be simplified by using straight line approximations between each facor of 2. The result is a typical floating point code. As seen in FIG. 26B the binary representation for representing H values between −1 and +1 is provided in the middle of the binary representation field and includes half the field.

The relative precision of a value is constant over the entire range of values. The logarithmic values have a certain precision and range. If the magnitude shoud be arbitrary large it must be possible to adjust the range of the logarithm.

The logarithmic value could be applied to the logarithm function another time or even further times. Thus, it is possible to represent very large values. Hovever, the precision decreases at large magnitudes, but the precision at small levels could be kept or even slightly increased.

Since the two bit patterns of the two representations appear in the same manner, an integer size comparator could be used also for floating-point value representations. This means that a particular floating-point value comparator could be avoided. This in turn means that the integer size comparator, which makes the comparing operation in only one cycle, can be used for the floating-point values, which is a great advantage. A floating-point value comparator of conventional type must use many cycles for its operation.

In conventional arithmetical logic units several bit patterns could be interpreted as the same number and a normalization is made such that one of these bit patterns is chosen. According to the invention no normalisation need be made, at least not at the actual calculation. Normalization could be made before and after a calculation operation. By having a close representation similarity between floating-point values, a floating-point value calculation, such as comparison, can be determined in one cycle only. An advantage of having a close representation is also that a maximum number of floating-point values are available, i.e. no rejected and unusable values are provided in a sequence of values.

The reason why there are several bit patterns which could be interpreted as the same number in conventional applications is that the exponent part and the mantissa part of a value are multiplied with each other in order to create the value. For instance the value 1.0 could be $2^1 * \frac{1}{2}$, i.e. having the exponent bit pattern 01 and the mantissa bit pattern 100, or $2^2 * \frac{1}{4}$, i.e. having the exponent bit pattern 10 and the mantissa bit pattern 010, the exponent bit pattern and the mantissa bit pattern following after each other.

The close representation is created by providing a "1" implicitly, i.e. without actually being there, before the mantissa bit pattern for possitive values and a "0" implicitly for negative values. Classically, the mantissa is specified as a value between −1 and +1. The binary coded mantissa is specified as a value in the range (1.0 to 2.0) or (−2.0 to −1) depending on the sign.

The Representation Coding

The integer patterns are exactly determined, and the floating-point representations shall have the same consecutive order as the integer interpretation, which is a very hard constraint.

Figure 26C:
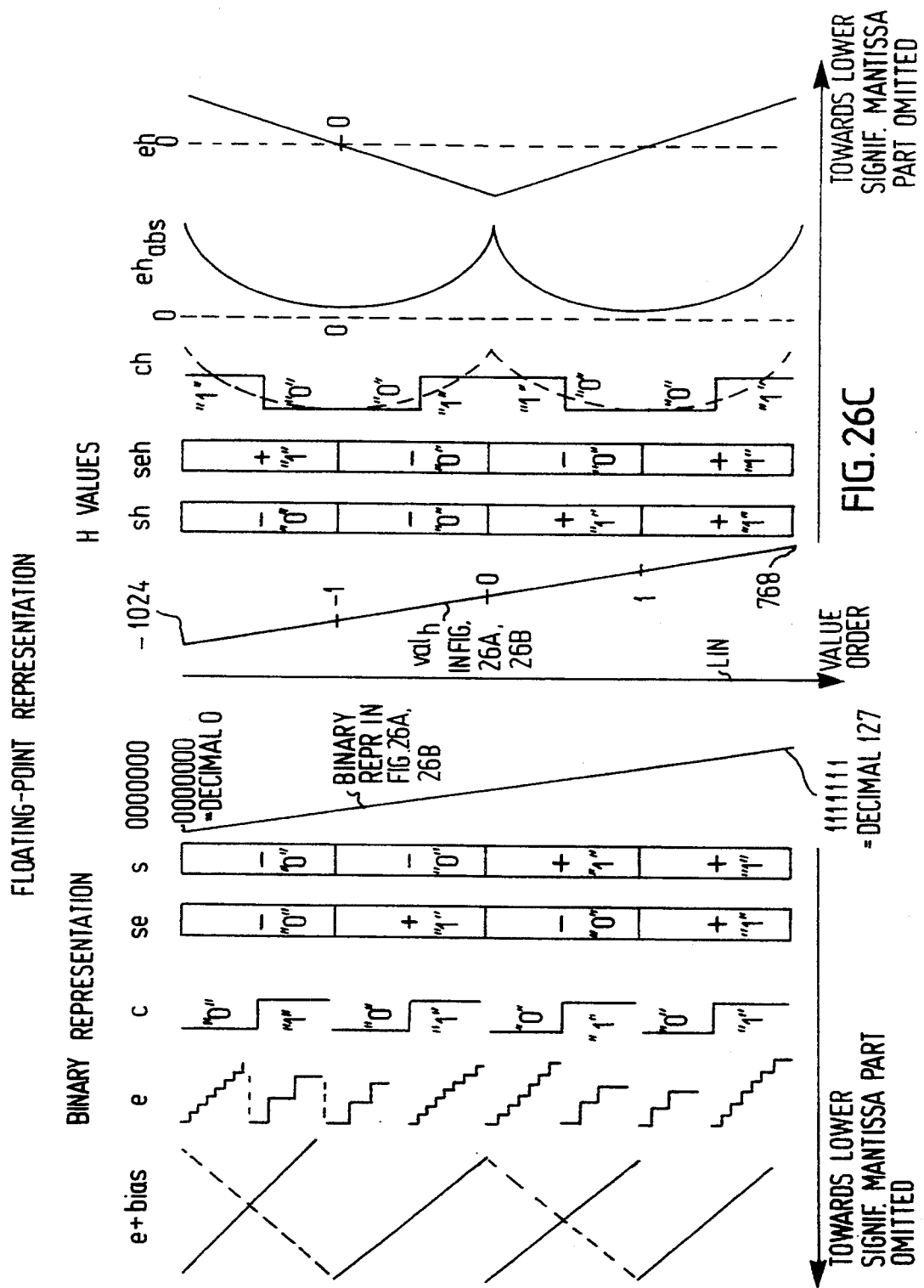
FIG. 26C shows a schematic representation for explaining the set up of an arithmetic representation provided on a 7 bit bus.

An advantageous solution to this problem is shown schematically in FIG. 26C. FIGS. 27A and 27B show a data list of words provided according to the principles shown in FIG. 26C. FIG. 26C shows a schematical graphical exposition of the floating-point code, the binary representation is illustrated on the left side of a vertical dividing line LIN, and the floating-point H-values are illustrated on the right side of the line LIN. The line LIN is illustrated as an axis pointing toward higher values. This is due both for the binary representation and for the H value representation. The representations and the H-values are illustrated to propagate outwardly at the side from the line LIN on both sides of it. Nearest to the line LIN is an illustration of the axes in the diagram in FIG. 26B. The H-value axis to the right and the binary representaion axis to the left. The first field outside the axis representation, sh to the right and s to the left, represents the most significant bit. It is "0" for negative values, "1" for positive. The second field, seh and se, respectively, represents the next most significant bit. It is the exponent sign bit. The third field includes at least one bit having lower significance than the next most significant bit, one bit if the binary field is low, as in the illustrated case having only seven bits, and more than one bit if the binary field is high, as will be explained below for a case having 32 bits.

In the example shown in FIGS. 26C, 27A and 27B the coding for seven bit words is shown instead of for the 32 bit words that probably will be more frequently used in practice. The binary representation immediately to the left of the center line will be interpreted to have the H-values −1024 to +768. It is to be noted that the H-values −1 and +1 are placed halfways between the value 0 and the extreme values −1024 and 768, respectively. The first binary bit s and sh, respectively, both for the representation and for the H-values is the sign of the value, whether it is a positive or a negative value.

The second binary bit is the sign of the exponent, i.e. whether the absolute value is above or below the number 1. The H-bit exponent sign seh is thus positive between −1024 and −1, negative between −1 and +1, and then positive between +1 and +768. As apparent from the left side of FIG. 26C the representation exponent sign se instead is negative in the first quarter of the binary sequence, positive in the second, negative in the third, and positive in the fourth. The bit seh could be described such as if s=1 then seh=se otherwise seh=1−se.

Thus, in the representation the most significant bit, representing the character sign, has the slowest variation, the next most significant bit, representing the exponent sign, has the next slowest variation, i.e. twice that of the character sign bit. The bit in the next place has twice the variation of the exponent bit and is the code bit c. The code includes only one bit in the example according to FIGS. 26C and 27A, 27B. In other examples the code field may include more than one bit. The code controls the exponent length and is to be regarded in view of the preceding sign bits.

The floating-point H-value, which is the goal to be provided, i.e. the floating-point notation, provides the code field ch in a more particular way. As apparent from the section eh, which gives the exponent H-values directly, the value eh goes from a large positive value down to a value 0, where the H-value is −1, from there to a large negative value, where the H-value is 0, from there to a value 0, where the H-value is +1, and from there to a large positive value, where the H-value is 768. The section $eh_{abs}$ shows the absolute exponent H-values and is represented by two curved lines, provided side by side each having both ends at a large positive value and its middle point placed at 0. The code field for the H-values is constructed to reflect the H-values $eh_{abs}$ and thus is shown to have the same form in dashed lines and the form it will have if the code field includes only one bit in continuous lines. Thus the code ch=c if se=1, and otherwise ch=1−c, when the code ch only includes 1 bit.

It is easy to follow the disposition of the list provided in FIGS. 27A and 27B, because each one of the bit fields s, sh, se, seh, c and ch includes only one bit, and therefore the comparison between the representations in FIG. 26 and in FIGS. 7A and 27B is obvious. The first column in FIGS. 27A and 27B is a sequential binary list from 0000000 to 1111111 and its straightforward counterpart in the decimal numeration system is provided in the second column. To the right of the arrow column the transformed numbers for the representation and the H-values are shown. The list is provided with continuous horizontal lines for each switch of the representation code field in order to make it easy to make the comparison to the illustration in FIG. 26C.

The column to the right of ch includes a decimal representation of the exponent value e of the representation, and thereafter the decimal representation of the exponent value eh of the H-value. The next two columns show the binary representation of the values e and eh, respectively. The following next two columns show the decimal and the binary, respectively, representation of the mantissa value m for the representation. Thereafter the decimal representation of the mantissa value mh of the H-value is shown. It is to be noted that the mantissa varies between −1 and −2 in FIG. 27A, in which the value sh is "0", and between +1 and +2 in FIG. 27B, in which the value sh is "1". The column most to the right shows the decimal H-value provided by the binary combination in the column most to the left, when transformed.

As apparent from the upper part of FIG. 27B the representation having a "1" as its most significant bit followed by "0"'s represents the particular floating-point value "0".

As apparent from the sequence of binary numbers in FIG. 26C, next to the left of the center line, the seven binary bits have their four least significant bits left to be shared by the exponent and the mantissa, since the three most significant bits are reserved to the sign bits and the code bit. From the digital columns e and m it is apparent that in the uppermost section, where the exponent sign se is negative, i.e. "0", and the code value c is "1", the value e includes three bits, and thus the value m one bit (the first two "0"'s in the column may be omitted). This is illustrated in FIG. 26C by having an e-representation in many steps in this section. In the next section, in which the exponent sign se still is negative but the code value c is "0", the value e does only include one bit (the first two "0"'s in the column may be omitted), and the mantissa value may include three bits. This is illustrated in FIG. 26 by having an e-representation in few steps in this section. In the next section, the value e includes only one bit and the mantissa three bits, etc.

As shown in the representation part, the exponent e has many steps in the sections having c=0 and se=0 and few steps in the sections having c=1 and se=1. In the section e+bias to the left of the section e it is illustrated with continuous lines the values e provided in a line after each other within each quarter of a full section and with dashed lines how the values $eh_{abs}$ are constructed by inverting every second quarter of a section in e+bias. (eh represents the value of e with the exponent sign.)

Thus the code bit or bits is dependent upon the preceding exponent sign bits, and therefore one could say that the code in fact is including the sign bits and therefore could have a very limited length, i.e. be shorter than if the length of the exponent should be dependent on what is provided only in the code field.

The mantissa length is dependent upon the exponent value in such a way that when the exponent is long then the mantissa is short and vice versa. Therefore, the mantissa is not shown in FIG. 26 but is apparent from the column m,m of the list in FIGS. 27A and 27B, where the first m illustrates the decimal numeration value and the second m illustrates its digital counterpart. If s=1 then mh=1.0+m otherwise mh=−2+m as mentioned above.

The example above was described for a seven bit word length for the purpose of readability. As mentioned, the word length could be chosen to be quite long, for instance 32 bits. Then, it is practical to have a varying code length. It is also practical, in order to make the circuitry less complicated, to change the division point between exponent and mantissa in steps of several bits, e.g. four bits. An advantage with is that it is not necessary to have as many codes as must be had when the division change is made bit wise. An example of such a precision decoder will be described further below.

AN EMBODIMENT OF A NUMERIC ALU

Figure 28:
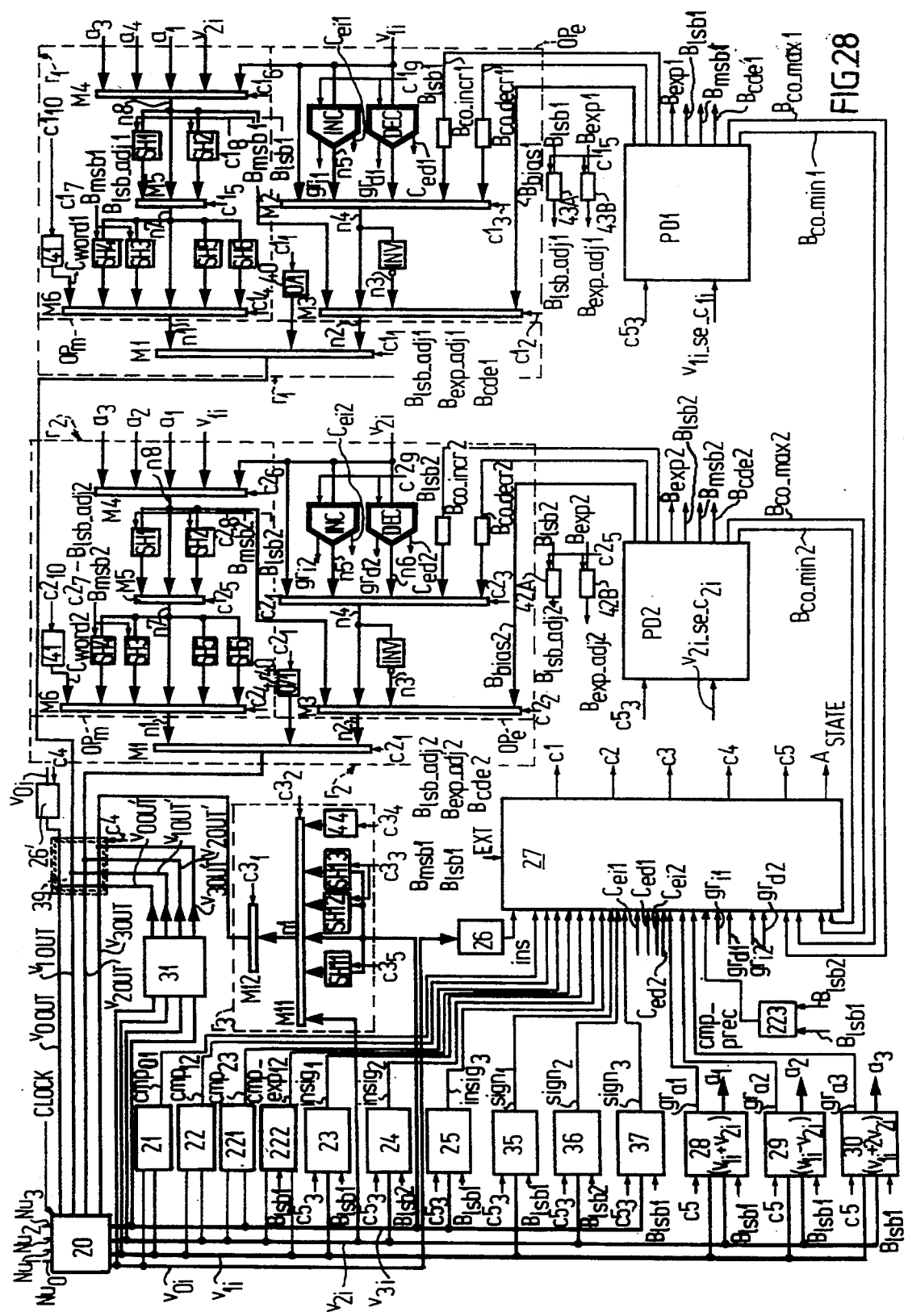
FIG. 28 shows a circuit diagram of an embodiment of the numeric ALU in the first order processor according to the invention.

FIG. 28 shows a detailed embodiment of the numeric ALU, which could be included in the first order processor according to the invention. The in/output buses $NU_0$ to $NU_3$ are connected to an input/output buffer 20, which transmits the information on the input to the internal wires $v_{0i}$ to $v_{3i}$, for each inverted clocking interval of the external clock signal CLOCK provided on a clock control input of the buffer, and the output on the internal output wires $v_{0out}$ to $v_{3out}$ to the in/output buses $NU_0$ to $NU_3$ for each clock interval.

Figure 29A:
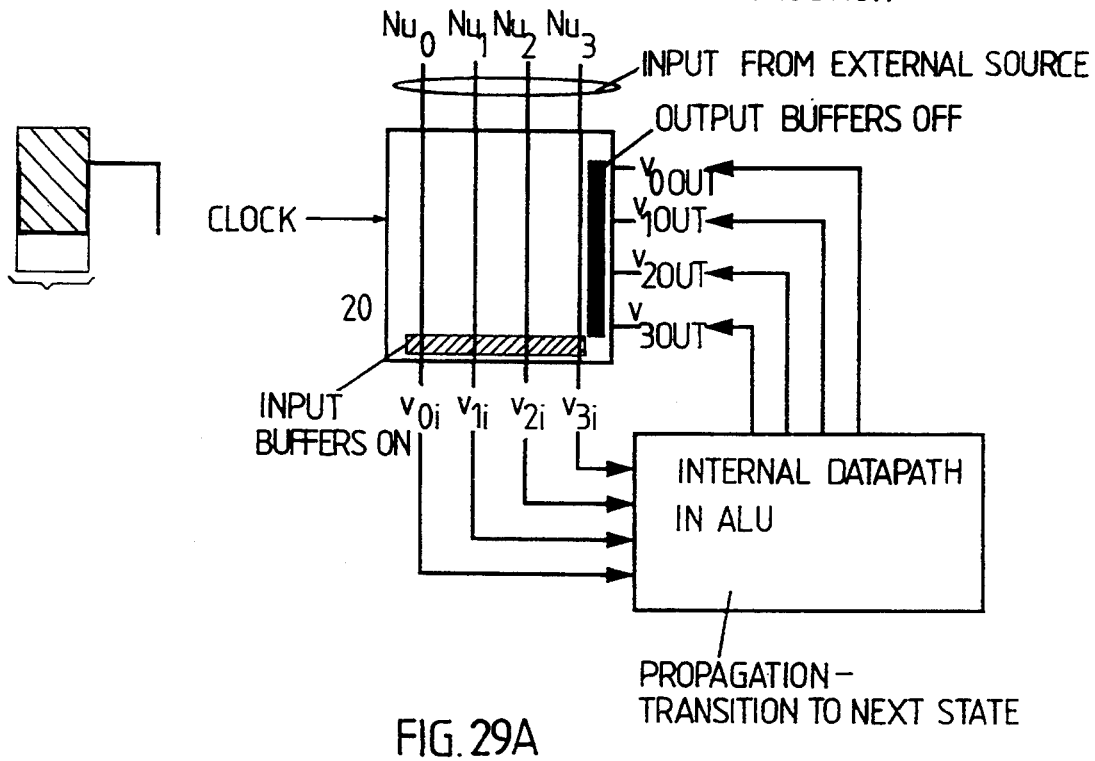
FIGS. 29A, 29B and 29C show an embodiment of an input/output buffer of the numeric ALU in different clocking sequences
Figure 29B:
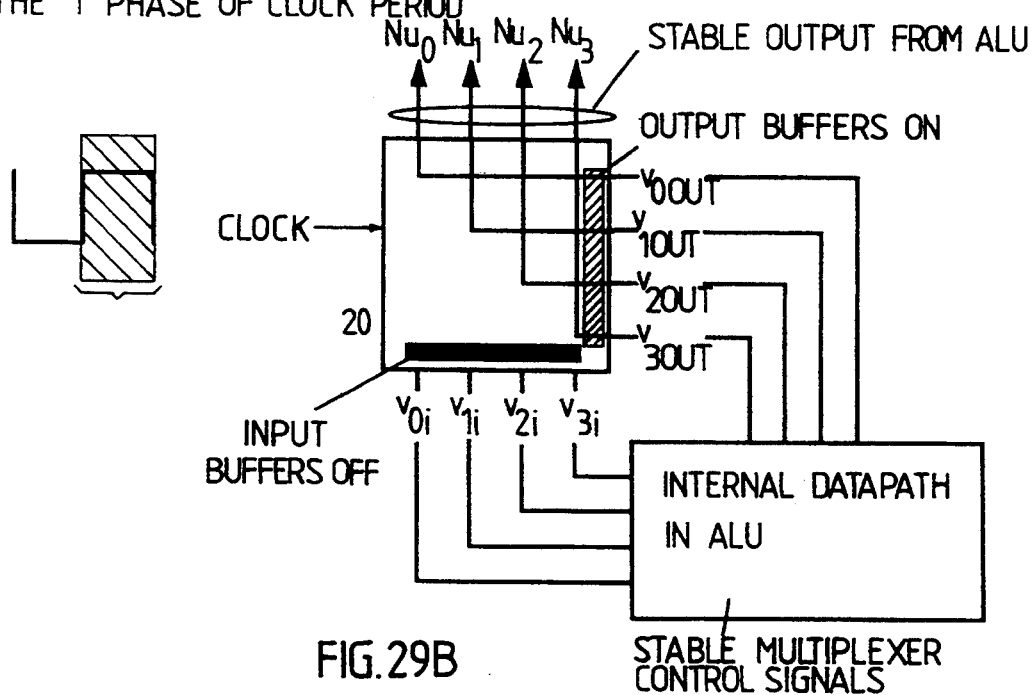
Figure 29C:
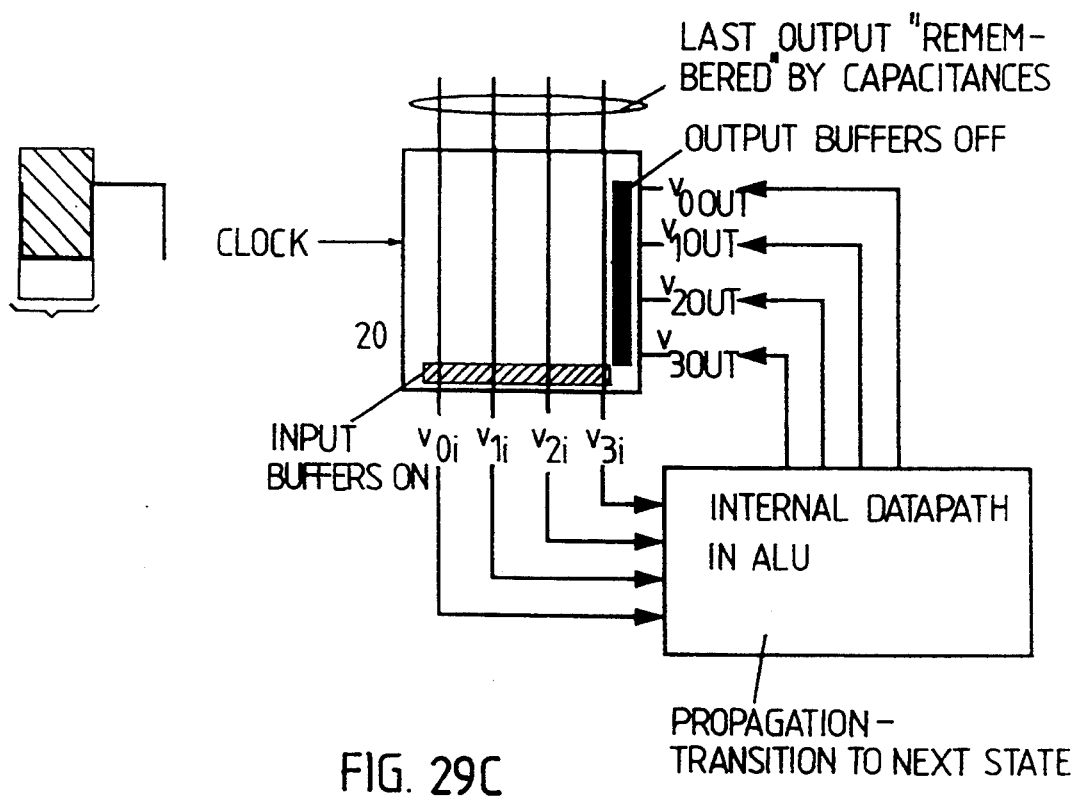

An embodiment of the circuit 20 and the clocking of it is shown in FIGS. 29A, 29B and 29C. The input/output buffer 20 includes in turn input buffers, one for each input/output bus $NU_0$ to $NU_3$, and the same number of output buffers. In order to avoid race problems the clock signals must not overlap. This is arranged by slightly cutting their leading edges.

During the first phase of the clock signal CLOCK shown in FIG. 29A, and being inversed as marked at the left with a bracket, the input from the main registers in the core cell, is provided to the internal datapath in the numeric ALU through the input buffers being controlled to a transmitting state. The data is propagated through the internal datapath in the numeric ALU while being transitioned to next state provided on the output buses. The output buffers are controlled to a blocking state.

As shown in FIG. 29B, during the phase 1 of the clock period of the clock signal CLOCK, marked with a bracket to the left in the Figure the input buffers in the circuit 20 are controlled to a blocking state and the internal circuits in the numeric ALU function as a stable multiplexor to control the signals to be provided on the input/output buses $NU_0$ to $NU_3$. The output buffers in the circuit 20 are controlled to a transmitting state.

The condition at a multiple cycle instruction at the phase 0 is shown in FIG. 29C. The content at the input/output buses $NU_0$ to $NU_3$ fed to them from the numeric ALU during the preceding phase 1 is kept on them during the phase 0 because of capacitance effects and is thus able to be transmitted through the input buffers, which are controlled to a transmitting state while the output buffers are controlled to a blocking state, to the input buses $v_{0i}$, $v_{1i}$, $v_{2i}$, $v_{3i}$, and from there propagated through the internal datapath in the numeric ALU while being transitioned to the next state. The input list is used to control and perform a computation, which is made by rewriting the content in the input list and to feed the result to the output. The first element in the list is an instruction code and the rest of the elements arguments to the instruction which requires that a functional hardware dependent upon the input data is provided. However, the information regarding the kind of information present on the buses $v_{1i}$, $v_{2i}$, $v_{3i}$ is preferably given on an input EXT from the control unit 6.

The control unit 6 preferably has the information of whether the words on the input buses $v_{0i}$, $v_{1i}$, $v_{2i}$, $v_{3i}$ represent instructions and/or numbers, and if the numbers are floating-point values or integers, and gives this information to the numeric ALU control ciruit 27 through the bus EXT.

The following processing units are provided in the embodiment shown in FIG. 28 to perform the different instructions:

The Comparators

A first comparator 21 is connected to the wires $v_{0i}$ and $v_{1i}$ comparing the whole information of those wires, i.e. $v_{p1} > v_{1i}$, $v_{0i} = v_{1i}$, and provides the comparing results, i.e. a two bit value, on its output cmp$_{01}$ connected to a numeric ALU control circuit 27. A second comparator 22 is connected to the wires $v_{1i}$ and $v_{2i}$ comparing the whole information of those wires, i.e. $v_{1i} > v_{2i}$, $v_{1i} = v_{2i}$ and provides the comparing results on its output cmp$_{12}$ connected to the control circuit 27. A third comparator 221 is connected to the wires $v_{2i}$ and $v_{3i}$ comparing the whole information of those wires, i.e. $v_{2i} > v_{3i}$, $v_{2i} = v_{3i}$ and provides the comparing results on its output cmp$_{23}$ connected to the control circuit 27. A fourth exponent comparator 222 is connected to the wires $v_{1i}$ and $v_{2i}$, each being a 32-bit bus, and compares the most significant parts of the word on those wires, i.e. the parts se, c, e, i.e. all the information except the mantissa and the sign, on these wires. The comparator takes notice of the coding of the parts se, c, e, described above. Therefore, the signal $B_{lsb1}$, from a precision decoder PD, is fed to a separate input of the comparator 222.

A fifth comparator 223 compares the signals $B_{lsb2}$ and $B_{lsb2}$ from the precision decoders. The resulting signal cmp_prec indicates if the signals $B_{lsb1}$ and $B_{lsb2}$ are identical.

The control circuit 27 feeds the result of the comparisons from the comparators to its output $A_{STATE}$ connected to the control unit 6 (see FIG. 24A). The result could also be used for control of some of the units to be described below such that prechosen words are provided on the output buses $v_{1out}$, $v_{2out}$ and $v_{3out}$ if appropriate.

Insignificance Decoders

An insignificance decoder 23 is connected to the wire $v_{1i}$ and is testing if the bits on $v_{1i}$ are all "0" or "1", if the word on the bus $v_{1i}$ represents and integer, and, if the word on the bus $v_{1i}$ represents a floating-point value, testing separately if the bits in the exponent part and in the mantissa part are all "0" or "1". A signal $B_{lsb1}$ indicating the least significant bit group of the input $v_{1i}$ provides information whether the word on the input bus represents an integer or a floating-point value, and in the case of a floating-point value the division between the exponent and mantissa part. The result of these tests is provided on the output $insig_1$ connected to an input of the control circuit 27. An insignificance decoder 24 is connected to the wire $v_{2i}$ and is testing if the bits on $v_{2i}$ are all "0" or "1", if the word on the bus $v_{2i}$ represents an integer, and, if the word on the bus $v_{2i}$ represents a floating-point value, testing separately if the bits in the exponent part and in the mantissa part alr all "0" or "1". A signal $B_{lsb2}$ indicates the least significant bit group of the input $v_{2i}$ and provides the same type of information as the signal $B_{lsb1}$. The result of these tests is provided on the output $insig_2$ connected to an input of the control circuit 27. An insignificance decoder 25 is connected to the wire $v_{3i}$ and is testing if the word on $v_{3i}$ is all "0" or "1", represents an integer, and, if the word on the bus $v_{3i}$ represents a floating-point value, testing separately if the bits in the exponent part and in the mantissa part are all "0" or "1". The information regarding this is derived from the signal $B_{lsb1}$. The result of these tests is provided on the output $insig_3$ connected to an input of the control circuit 27. Each insignificant decoder is also controlled by a control signal $c5_3$ to be described further below from the control circuit 27.

The purpose of having the insignificance decoders is to detect if the information on one of the inputs to take part in a calculation to be made should be insignificant. This information is also provided on the bus $A_{STATE}$ to the control unit 6. A final condition that at least one input from one of the insignificant units for instance indicate all zeros could be used by the control circuit 27 for some types of operations.

Instruction Decoder

An instruction decoder 26 is connected to the wire $v_{0i}$. The bus $v_{0i}$ bears the instruction when the numeric ALU is to perform an arithmetic operation. The result of the decoding of $v_{0i}$ is transmitted to the control circuit 27 through the output ins, if $v_{0i}$ bears the instruction or data value. The units 23 to 26 are also controlled by other signals $B_{lsb1}$, $B_{lsb2}$ and $c5$ generated in the circuits PD1, PD2 and 27, respectively, and further described below.

Adders and Subtracter

A first adder 28 connected to the wires $v_{1i}$ and $v_{2i}$ makes the addition $v_{1i}+v_{2i}$ and feeds the result to a separate output $a_1$. A possible carry signal of the result will be fed to an output $gr_{a1}$ connected to the control circuit 27. A subtracter 29 connected to the wires $v_{1i}$ and $v_{2i}$ makes the subtraction $v_{1i}-v_{2i}$ and feeds the result to a separate output $a_2$. A possible carry signal of the result will be fed to an output $gr_{a2}$ connected to the numeric ALU control circuit. A second adder 30 connected to the wires $v_{1i}$ and $v_{2i}$ makes the addition $v_{1i}+2*v_{2i}$ and feeds the result to a separate output $a_3$. A possible carry signal of the result will be fed to an output $gr_{a3}$ connected to the control circuit 27. Each adder is also controlled by a control signal $c5$ from the control circuit 27 and by the signal $B_{lsb1}$. This signal provides information whether the words on the input buses represent integers or floating-point values, and in the case of floating-point values and aligned values on the buses $v_{1i}$ and $v_{2i}$ the division between the exponent and mantissa part. These informations are essential because discrete values, i.e. integers, are completely evaluated, but for continuous values, i.e. floating-point values, the mantissa and the exponent parts are evaluated separately.

Sign Circuits

A first sign and exponent sign circuit 35 is sorting out the sign, exponent sign, most significant mantissa bit and the two least significant mantissa bits of the word on the bus $v_{1i}$ and feeds its output $sign_1$ to an input of the control circuit 27. A second sign and exponent sign circuit 36 is sorting out the sign, exponent sign, most significant mantissa bit and the two least significant mantissa bits part of the word on the bus $v_{2i}$ and feeds its output $sign_2$ to an input of the control circuit 27. Also, a third sign and exponent sign circuit 37 could be connected to the bus $v_{3i}$ and feeds its output $sign_3$ to an input of the control circuit 27. It is to be noted that the circuits 35 and 36 are absolutely needed when the sign, the exponent sign and the mantissa bits are provided as a part of the word provided on the buses $v_{1i}$ and $v_{2i}$. They are used by the numeric ALU control circuit in case of floating-point value words on the input buses. The circuit 37 may be omitted in some applications of the numeric ALU. A sign and exponent sign circuit (not shown) could also in some applications of the numeric ALU be provided for the bus $v_{0i}$.

The Numeric ALU Control Circuit

The control circuit 27 provides digital output signals on output buses c1, c2, c3, c4, c5 by processing its input signals. The control circuit 27 is preferably a boolean gate array. Examples of the control provided by the output signals will be described further below.

The Operand Units

Two operand units r1 and r2, one for each of the operands on the wires $v_{1i}$ and $v_{2i}$, contain all arithmetic unique to one element. Each operand unit has several information inputs.

Three of them are connected to the separate outputs $a_1$, $a_2$, and $a_3$ of the three units 28, 29 and 30, respectively, two of them to the input buses $v_{1i}$ and $v_{2i}$, respectively, and three of them are connected to some outputs of an individual precision decoder PD1 or PD2, respectively, to be described further below. In principle each information input is a bus including the same number of wires as each input bus $v_{0i}$, $v_{1i}$, $v_{2i}$, $v_{3i}$.

The output of the operand unit r1 is the output bus $v_{1out}$ and the output of the operand unit r2 is the output bus $v_{2out}$.

One of the outputs c1 of the control circuit 27 is a composite control signal to control internal elements in the operand unit r1. Other control signals for the unit r1 are provided by the precision decoder PD1. A second of the outputs c2 of the control circuit 27 is a composite control signal to control internal elements in the operand unit r2. Other control signals for the unit r2 are provided by the precision decoder PD2. A third output c3 is a composite signal provided to a third operand unit r3, a fourth output c4 is provided to control a polynome giving circuit 31 to be described further below, a fifth output c5 is provided to control the precision decoders PD1 and PD2 and also the insignificant circuits 23 to 25, the adders 28, 30 and the subtractor 29, and the sign and exponent sign circuits 35 to 37.

Each operand units r1 or r2 have essentially the same configuration, and therefore only one of them r2 will be described in detail. Same elements in the units r1 and r2 have been provided with the same references. The operand unit is divided into two groups, the exponent part $OP_c$ and the mantissa part $OP_m$. The mantissa part $OP_m$ has an output n1 and the exponent part has an output n2. The outputs n1 and n2 are connected to inputs of an output bus selector, also called bit group individual selector M1. A 0/1 generator 40 providing a precision group of four "0" or four "1" at choice, controlled by a control signal $c2_{11}$ to the generator, is also connected to an extra input of the selector M1.

The exponent part $OP_c$ has as inputs four of the inputs of the operand unit, i.e. $v_{2i}$, and $B_{bias2}$, $B_{co\_incr2}$, $B_{co\_decr2}$ from the precision decoder PD2, and has also an input n8 from the mantissa part $OP_m$. The input $v_{2i}$ is connected to the input of an incrementer INC, the input of a decrementer DEC and to one of five inputs of a word selector M2. The outputs n5 and n6 of the components INC and DEC, respectively, are connected to two inputs of the word selector M2. $B_{co\_incr2}$, $B_{co\_decr2}$ are connected to the other two inputs of the word selector M2.

The component INC in the operand unit r2 also has carry outputs $gr_{i2}$ and $Ce_{i2}$, while the component DEC has carry outputs $gr_{d2}$ and $Ce_{d2}$ connected to the control circuit 27. Also, the operand unit r1 has an increment component carry output signals $gr_{i1}$ and $Ce_{i1}$ as well as decrement component carry output signals $gr_{d1}$ and $Ce_{d1}$ connected to the control circuit 27. The carry outputs are provided early during the first half of the clock cycle. The selectors are controlled late during the first half of the clock cycle, and then this selector control is provided in taking care of the fact if there was a carry in some of the increment or decrement circuits or not.

The normal maximum propagation delay to the first selector is more than a half cycle. Thus, there are no extra delays caused by this arrangement. However, the typical propagation delay is generally less than a half cycle. All signals are evaluated at the transition to the last half cycle. No unnecessary transitions occur in the selectors.

The output n4 of the word selector M2 in the operand unit is connected directly to a first input of a word selector M3 having four inputs and to a second input of it through an inverter INV. The output n2 is the output of the exponent part $OP_c$. The input $B_{bias2}$ is connected to a third input of the word selector M3.

The mantissa part $OP_m$ has five inputs, i.e. $v_{2i}$, $v_{1i}$, $a_1$, $a_2$ and $a_3$. All the inputs are connected to an input each of a word selector M4 having five inputs and an output n8. The output n8 is connected to the fourth input of the word selector M3 in the exponent part $OP_c$. The output n8 is also directly connected to one of three inputs of a word selector M5, to a second of the inputs of the word selector M5 through a negative shifter SH1, which is shifting the binary information on its input four steps towards the lower significant direction, i.e. dividing the binary information with 16, and to a third of the inputs through a positive shifter SH2, which is shifting the binary information on its input four steps towards the higher significant direction, i.e. multiplying the binary information on its input with 16.

The output n7 of the word selector M5 is directly connected to a first one of six inputs of a word selector M6; through a negative shifter SH3, shifting the binary information on its input one step to the lower significant direction, to a second input; through a second negative shifter SH4, shifting the binary information on its input one step to the lower significant direction, to a third input; through a positive shifter SH5, shifting the binary information on its input one step to the higher significant direction, to a fourth input; and through a second positive shifter SH6, shifting the binary information on its input one step to the higher significant direction, to a fifth input. An internal constant word generator 41 generates a constant word $c_{word2}$ at control on its control input $c2_{10}$ and has its output connected to an individual input of the word selector M6. The constant word generator 41 can provide a group of predetermined combinations of zeros or ones, for instance all "0" or all "1" or a word indicating some particular information, controlled by a control signal $c2_{10}$ to the generator. The generator can store only a limited number of word combinations among which to chose with the control signal $c2_{10}$. The output of the word selector M6 is the output n1 of the mantissa part $OP_m$.

The mantissa part $OP_m$ implements the following function. The basic mantissa value on n8 is selected by the word selector M4 resulting in either $v_2$, $v_1$, $a_1$, $a_2$, or $a_3$. It could be used as it is or be shifted 1, 2, 3, 4, 5, 6 bits to the left (positive shifts) or 1, 2, 3, 4, 5, 6 bits to the right (negative shifts) or could be substitued by the word $c_{word2}$ provided by the constant word generator 41.

The exponent part $OP_c$ implements the following function. Its output could be either the unshifted mantissa value on n8, $v_2+1$, inverted $v_2+1$, $v_2-1$, inverted $v_2-1$, $B_{co\_incr2}$, inverted $B_{co\_incr2}$, $B_{co\_decr2}$, inverted $B_{co\_decr2}$, or $B_{bias2}$.

In the operand unit r2, the word selectors M2 to M6 are controlled individually by the control word on the output c2 of the control circuit 27. Thus, the word selector M2 is controlled by the part control word $c2_3$, the word selector M3 by the part control word $c2_2$, the word selector M4 by the part control word $c2_6$, the word selector M5 by the part control word $c2_5$, and the word selector M6 by the part control word $c2_4$. Also, the shifters SH1 and SH2 connected to the output n8 of the selector M4 are controlled by a part signal $c2_8$, the shifters SH3 to SH6 by a part signal $c2_7$, the incrementer INC and the decrementor DEC by a part signal $c2_9$, the constant word generator 41 providing the output $c_{word2}$ by a part signal $c2_{10}$, and the 0/1 generator 40 by a part signal $c2_{11}$.

The bit group individual selector M1 is controlled by a combined multi bit signal including a part control word $c2_1$, an output code signal $B_{cde2}$ from a precision decoder PD2, an output least significant bit signal $B_{lsb\ adj2}$, and an output exponent signal $B_{exp\ adj2}$, the two last-mentioned signals are derived in processing circuits 42A and 42B from outputs $B_{lsb2}$ and $B_{exp2}$, respectively, coming from the precision decoder PD2. The signals will be described and illustrated further below. The processing circuits 42A and 42B are controlled by the signal $c2_5$ being a part of the output c2 from the control circuit 27.

The precision decoder PD2 has the exp sign and code part of the information on the bus $v_{2i}$ as an input together with a binary control signal $c5_3$ from the control circuit 27, indicating if the word on the bus $v_{2i}$ represents an integer or a floating-point value. The control signal $c5_3$ is a part of the output c5 from the ALU control circuit 27.

The same is valid for the precision decoder PD1 for the operand unit r1. The signals $B_{lsb1}$, $B_{exp1}$ from the precision decoder PD1 are processed in processing circuits 43A and 43B providing the outputs $B_{lsb\ adj1}$ and $B_{exp\ adj1}$, respectively. The processing circuits 42A, 42B and 43A, 43B are mostly providing the same outputs as its inputs from the decoder to which it belongs. However, in some occations, when a carry has been provided from the incrementer INC or the decrementer DEC the output signals will be shifted, as will be described further below. This shift will be controlled by a part signal $c2_5$ or $c1_5$, respectively, of the output c2 or c1, respectively, from the numeric ALU control circuit 27.

The precision decoder PD2 (or PD1) provides outputs which are all insignificant which for example is indicated by having the outputs to the processing circuits 42A, 42B (or 43A, 43B) provided with all zeros, if the word $v_{2i}$ represents an integer, and outputs of the kind described below as $B_{exp2}$, $B_{lsb2}$ and $B_{cde2}$ (or $B_{exp1}$, and $B_{lsb1}$ and $B_{cde2}$, if the word $v_{2i}$ (or $v_{1i}$) represents a floating-point value.

The precision decoder PD1 provides the output signals $B_{co\_decr1}$, $B_{co\_incr1}$, $B_{bias1}$, $B_{exp1}$, $B_{lsb1}$, $B_{msb1}$, and $B_{cde1}$ to the operand unit r1 and a signal $B_{co\ max1}$ indicating if the code represents a maximum length of the exponent, and a signal $B_{co\ min1}$ indicating if the code represents a minimum length of the exponent to the ALU control circuit 27. The precision decoder PD2 provides the output signals $B_{co\_decr2}$, $B_{co\_incr2}$, $B_{bias2}$, $B_{exp2}$, $B_{lsb2}$, $B_{msb2}$, and $B_{cde2}$ to the operand unit r2, and a signal $B_{co\_max1}$ indicating if the code represents a maximum length of the exponent, and a signal $B_{co\ min1}$ indicating if the code represents a minimum length of the exponent to the ALU control circuit 27. The outputs $B_{lsb}$, $B_{exp}$ from the precision decoder PD1 or PD2, respectively, must be shifted in the same way as the mantissa is shifted in order to let the new precision be reflected on the outputs and during the normal shifts, which is made by the control of the circuits 42A and 42B or 43A and 43B under control of a part of the signal $c2_5$ or $c1_5$, respectively, as described above.

Each precision decoder is fed with a signal $c5_3$ on its input indicating if the word on the input bus $v_{1i}$ or $v_{2i}$, respectively, represents an integer or a floating-point value. The signal $c5_3$ is a part of the signal from the output c5 of the ALU control circuit 27 controlling the circuits 23 to 30.

The output signals from the precision decoder will be described in further detail below.

Multiplication and Division, Operand Unit r3

The third operand unit r3, the multiplicand/quotient function unit, is of another kind than the units r1 and r2 and is provided mostly for multiplication and division operations. The unit r3 performs the shift and setting necessary during the multiply and divide functions. It is controlled by a control word provided on the output c3 of the ALU control unit 27.

The multiplicand/quotient unit r3 has several inputs, of which a first is provided with the information on the bus $v_{2i}$, a second with the information on the bus $v_{3i}$ and a third with an output from a constant word generator 44, providing a chosed bit combination among several stored in the generator at control of a part signal $c3_4$ of the output c3 from the circuit 27.

The unit r3 is used to evaluate one argument during complex numerical instructions. Its output is connected to the bus $v_{3out}$.

The input $v_{2i}$ is fed to a first input of a word selector M11. The input $v_{3i}$ is fed directly to a second input of the word selector M11, to a third input therof through a positive one bit shifter SH11 controlled by a signal part $c3_5$, to a fourth input thereof through a first negative one bit shifter SH12, and to a fifth input thereof through a second negative one bit shifter SH13 the two last mentioned bit shifters being controlled by the signals $c3_3$, $B_{msb1}$, $N_{lsb1}$. The output of the generator 44 is connected to a sixth input of the word selector M11. The output of the word selector M11, to be provided to an input of a second word selector M12, is chosen by a control word part $c3_2$ of the control word c3 from the ALU control unit 27.

M12 is a bus connection providing the output of the selector M11 to the output bus $v_{3out}$ but which is able to be controlled to a switched off condition by a control word part $c3_1$.

Regarding examples of the operation of the numeric ALU we refer to our copending application Ser. No. 07/739,535.

The Precision Decoder

Figure 30:
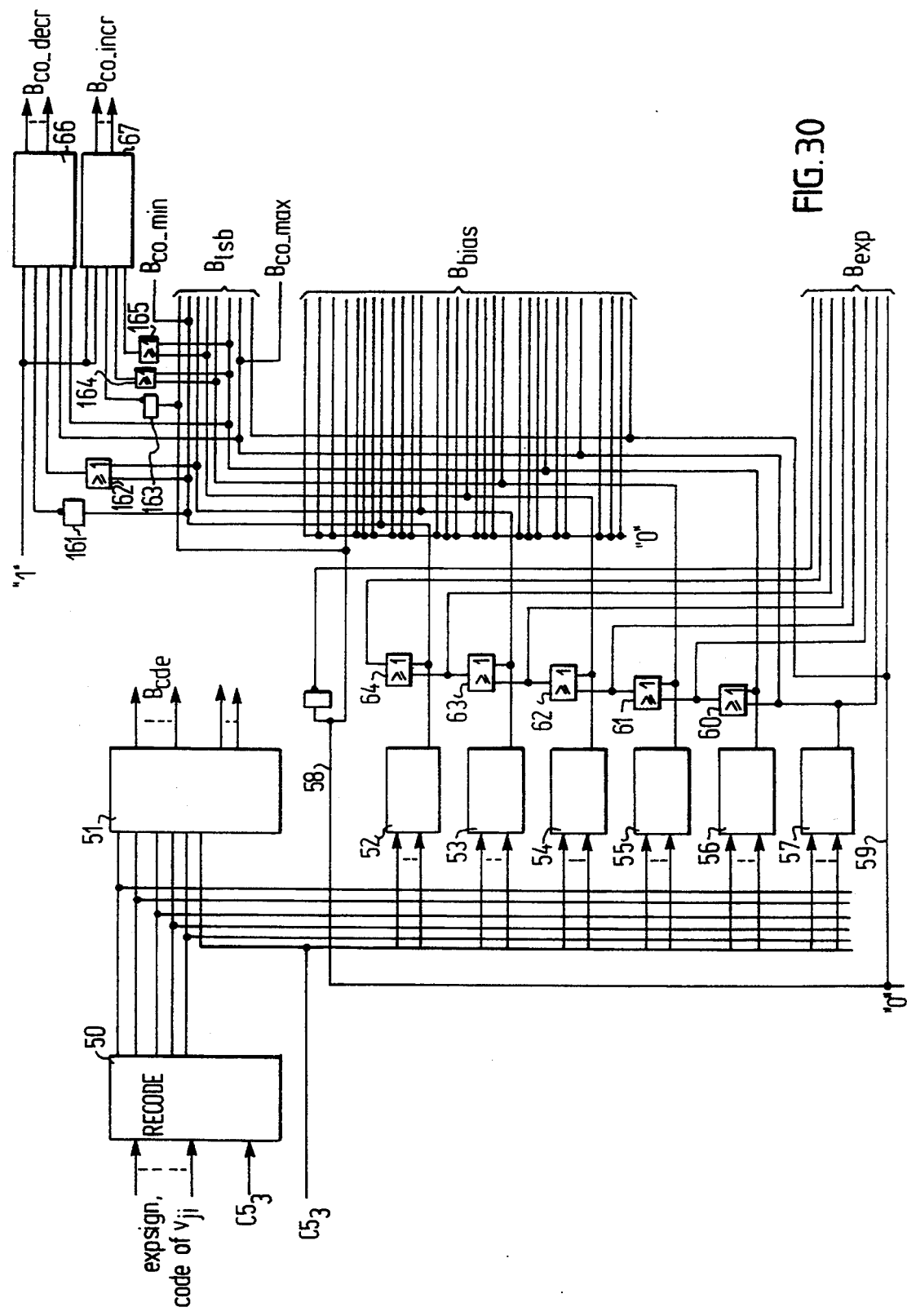
FIG. 30 shows a circuit diagram of an embodiment of a precision decoder included in the circuit shown in FIG. 28.

The principle structure of a precision decoder is shown in FIG. 30. It is to be noted that modifications could be made in the shown structure, for instance in order to speed up the calculation rate. These are just construction features and are apparent for a person skilled in the art and will therefore not be described here. This means that the actual circuit could have quite another configuration than that shown in FIG. 30, but that it will have the principle function as apparent from FIG. 30.

The exponent sign and code part of the input signal $v_{ji}$, where j is either 1 or 2, is fed to a recode circuit 50, which in this embodiment at its output provides one of the variants of the code including the leading exponent sign shown in the table above, for instance the left one, whatever of the variants is provided on its input. Alternatively, both variants could be provided on the output of the recode circuit 50, but always in the same order, for instance the left variant in the table above on lines alotted to it, and the right one on lines alotted to it. The output is fed to a bit sequence comparator circuit 51, which monitors the bit combination on its input and provides the digital signal $B_{msb}$ indicating the bit length of the code. It also provides the signal $B_{cde}$.

Six bit sequence comparator circuits 52 to 57 are also connected to the output of the recode circuit 50 each adapted to react to its particular coding to provide a "1" in the output if the bit pattern on the output wires from the recode circuit 50 is the same what it is adapted to react upon to provide an output "1" instead of its normal output "0". Only one of the circuits 52 to 57 at the time is providing a "1", i.e. a true-signal, the others are providing the output "0", i.e. a false-signal. The first and the last bit in the signal $B_{lsb}$ are always a "0". Therefore, two wires 58 and 59 are connected directly to a wire having the bit "0".

The wire 58, the outputs from the circuits 52 to 57 and the wire 59 are providing the bus $B_{lsb}$, which has one bit per precision group. The bus $B_{bias}$ has four bits per precision group. Each group includes three bits "0" and the bit of the signal $B_{lsb}$ for that particular group. Thus three of the wires of each group is connected to "0" and the fourth to the appropriate wire of the output $B_{lsb}$. The output $B_{co\_min}$ is connected to the output of the circuit 52, and the output $B_{co\_max}$ is connected to the output of the circuit 57.

The bit pattern of the output $B_{exp}$ includes "0's in the least significant positions up till the position where the output $B_{lsb}$ has a "1", and thereafter all bits are "1"'s, The least significant bit on the wire 59 will always be a "0", but from the next least position there is a possibility for a bit "1". Therefore, an OR-gate 60 has one input connected to the output of the circuit 57 and the other to the output of the circuit 56. The output of the circuit 57 is connected to the next least position wire of the signal $B_{exp}$. The output of the OR-gate 60 is connected to the second next least position wire of the output $B_{exp}$. Thus, if the output of the circuit 57 should happen to be a "1", then this will provide an output bit "1" from the OR-gate 60 as well. The output from the OR-gate 60 will be "0" only if the outputs from both the circuits 57 and 56 are "0". The output of the OR-gate 60 is connected to a first input of another OR-gate 61 having its other input connected to the output of the circuit 55. The output of the OR-gate 61 is connected to the third least position wire of the output $B_{exp}$ and to a first input of an OR-gate 62 having its other input connected to the output of the circuit 54, etc. This kind of cascade coupling of OR-gates provides "1"'s in all positions having the same or higher significance than the position giving a "1" in the output $B_{lsb}$.

The sign, exp sign and code part of the word $B_{co\_decr}$ has its first wire connected to a unit providing a "1", its second to an inverter 161 connected to the sixth wire of $B_{lsb}$, its third to an OR-gate 162 having its inputs connected to the fifth and sixth wires of $B_{lsb}$, and its fourth and fith wires connected directly to the second and third, respectively, wires of $B_{lsb}$. These wires for the sign, exp sign and code part of the word $B_{co\_decr}$ are connected to the input of a bit completing circuit 66 adding "0"'s to the incoming word in order to provide a 32-bits word on its output.

The sign, exp sign and code part of the word $B_{co\_incr}$ has its first and second wires connected to a unit providing a "1", its third to an inverter 163 connected to the seventh wire of $B_{lsb}$, its fourth to an OR-gate 164 having its inputs connected to the third and fourth wires of $B_{lsb}$, and its fifth wire connected directly to an OR-gate 165 having its inputs connected to the third and fifth wires of $B_{lsb}$. These wires for the sign, exp sign and code part of the word $B_{co\_incr}$ are connected to the input of a bit completing circuit 67 adding "0"'s to the incoming word in order to provide a 32-bits word on its output.

The Adder

An embodiment of an adder, such as one of the circuits 28 to 30 in FIG. 28 is shown in FIGS. 31A to 31C. The adder has two arguments a and b. The argument a is provided on the bus $v_{1i}$ and the argument b on the bus $v_{2i}$. These arguments are coded either as floating-point values or as integers. The signal $c5_1$, being "0" for integer and "1" for floating-point value, of the output c5 from the circuit 27 in FIG. 28 and the buses $B_{lsb1}$ and $B_{lsb2}$, having all bits "0" for integer and having one of the bits "1" for floating-point value, indicate this fact. As shown in FIG. 31A the adder is a binary adder built in 8 cascade coupled sections G0, G1, ..., Gi, ..., G7, i.e. one section for each precision group.

As apparent from the description above of an addition operation it is essential to align the arguments a and b before they can be added in case of a and b being floating-point values. This means that $B_{lsb1}$ and $B_{lsb2}$ must be equal. $B_{lsb1}$ is fed as the signal $B_{lsb}$ to control the adder. The signal $B_{lsb}$ is displaced one step in the direction toward the mantissa when it is connected to the adders, incrementers, decrementers etc, because then it could influence the carry propagation (block it) at the most significant mantissa group. Therefore, the least significant bit in the signal $B_{lsb}$ is not used in these cases.

The arguments a and b, each including 32 bits, are divided into eight groups each including 4 bits. Each group of four bits of a and b is provided as a separate input of an individual section Gi, i being an integer between 0 and 7. Each wire of the bus $B_{lsb}$ is connected to an individual of the sections Gi, except to G0. A wire $c_{in}$ to the section G7 indicates if the adder shall make an addition or a subtraction. $c_{in}$ is "0" for addition and "1" for subtraction. Each section provides a carry signal $c_{out\ i}$ to be fed to the next section and is fed with a carry signal $c_{in\ i}$ coming from the next preceding section, as will be described more in detail below.

The addition of the arguments a and b is made individually in each section G0 to G7 providing carry signals to the next section in the order G7 to G0, if necessary. For a floating-point value a mantissa carry out bus $c_m$ is provided to which a mantissa carry out is provided if necessary. This bus together with the wires $c_s$ having the sign bit and $c_{sc}$ having the exponent sign bit form the input $gr_{a1}$ (or $gr_{a2}$ or $gr_{a3}$) to the circuit 27 in FIG. 28. The circuit 27 provides this information to the control unit 6 on the bus $A_{STATE}$.

The signal $c5_1$ indicates if the arguments a and b are integers or a floating-point values, the signal $c5_2$ indicates if the code is normal or altered for the argument a, and the signal $c5_3$ indicates if the code is normal or altered for the argument b. These signals are fed to the section G0, which corresponds to the most significant precision group including the most significant bit slice (the sign slice). This is in particular dependent upon the format of the operands a and b (whether they both are integers or floating point values).

A tristate gate 70 is provided to set the bus $c_m$ to a defined value, for instance all "0" when the operands are integers, since then no mantissa carry is activated on the bus. The tristate driver 70 is controlled by the signal $c5_3$.

An embodiment of a configuration of a section G1 is shown in FIG. 31B. It is "sliced" into four adder slices AS1 to AS4. It also contains a carry generator for the section which evaluates the carry $c_{out\ i}$ for the next section. Each bit group $a_i$ and $b_i$ for the section Gi in question, has an individual of the bits $a_{ik}$ and $b_{ik}$, respectively connected to each individual adder slice ASk, k being an integer between 1 and 4. Each adder slice provides one bit $sum_{ik}$ of the sum output.

As will be described more in detail in describing FIG. 31C the carry generator is provided with a generate bit Gen indicating that the sum of the section is greater than or equal to 16, a propagate bit Pr indicating that the sum of the section is greater than or equal to 15, the carry bit from the next preceding section $c_{in-i}$, a carry in bit $C_{in\_i4}$ from the adder slice AS4, and the bit $B_{lsb\_i+1}$. The bit $B_{lsb\_i+1}$ is fed through an inverter 75 to an inverted input of a tristate gate, and directly to the control input of the tristate gate 76. The bit $c_{in\_i4}$ is connected to a second inverted input of the tristate gate 76. Thus, when the bit $B_{lsb\_i+1}$ is "0" then the tristate gate 76 is controlled to transmit the bit $B_{lsb\_i+1}$. However, when the bit $B_{lsb\_i+1}$ is "1" then the tristate gate 76 is controlled to transmit the bit $c_{in\_i4}$ indicating that the mantissa has a carry out if it is a "1".

It is only necessary to provide a mantissa carry out for the precision group next to the exponent part of the argument, and it is only this group having the bit $B_{lsb\_i+1}$, "1".

The carry propagation from section to section is blocked for the precision group next to the exponent part. Thus the bit $B_{lsb\ i+1}$ is connected to an inverted input of an AND gate 77 having the inverted signal Gen on its other inverted input and thus transmitting the signal Gen only when $BL_{lsb\_i+1}$ is "0". The bit $B_{lsb\ i+1}$ is also connected to an inverted input of an AND gate 78 having the inverted signal Pr on a second inverted input and the bit $c_{in\_i}$ on a third inverted input and thus transmitting the signal Pr only when $B_{lsb\_i+1}$ is "0" and $c_{in\_i}$ is "0". An OR gate 79 has its inputs connected to the outputs of the AND gates 77 and 78 and is providing an output "1" when one of the AND gates has an output "1".

An embodiment of each adder slice ASk is shown in FIG. 31C. The inputs $a_{ik}$ and $b_{ik}$ are fed to an input each of an EXCLUSIVE OR gate 80 providing a "1" if the inputs are different from each other, otherwise a "0". The output of the EXCLUSIVE OR gate 80 is fed to a first input of a second EXCLUSIVE OR gate 81 and the bit $c_{in\_ik}$ to it other input. The output of the EXCLUSIVE OR gate 81 is a "1" only if its inputs are different, and provides the output sum$_{ik}$ taking care of the carry bit from the next preceding adder slice, or if the adder slice is first in the section, the carry bit from the next preceding section.

The bits $a_{ik}$ and $b_{ik}$ are fed to the inputs of an OR gate 82 having an inverted output, which in turn is connected to a first inverted input of each of three AND gates 83, 84, 85. The inverted bit $c_{in\_ik}{}^*$ is fed to a second inverted input of the AND gate 83 transmitting the bit $c_{in\_ik}$ if any of the bits $a_{ik}$ and $b_{ik}$ is a "1". The inverted bit $P_{in\_ik}{}^*$ from the next preceding adder slice is fed to a second inverted input of the AND gate 84 providing the bit $P_{out\_ik}$ being $P_{in\_ik}$ if any of the bits $a_{ik}$ and $b_{ik}$ is a "1". The inverted bit $G_{in\_ik}{}^*$ is fed to a second inverted input of the AND gate 85 transmitting the bit $G_{in\_ik}$ if any of the bits $a_{ik}$ and $b_{ik}$ is a "1". The bit $P_{in\_ik}$ and the bit $G_{in\_ik}$ are "1" and "0", respectively for each first adder slice AS1 in each precision section, as apparent from FIG. 31B.

The bits Pr and Gen are needed in order to realize ripple carry, i.e. make the adder faster. By the fact that there are discrete values on the inputs of the carry chains all the precision groups are computed in parallel, i.e. simultaneously for all precision groups. The last carry $c_s$ from the addition will have only 4+8 gate delays to be compared to 32 gate delays without ripple carry.

The bits $a_{ik}$ and $b_{ik}$ are also fed to the inputs of an AND gate 88 having an inverted output, which in turn is connected to a first inverted input of each of thwo OR gates 86, 87. The output of the AND gate 83 is connected to a second input of the OR gate 86 providing the output $c_{out\_ik}$. The output of the AND gate 85 is connected to a second input of the OR gate 87 providing the output $G_{out\_ik}$.

In order to provide very fast carry chains it is possible to have only one delay in them if a bit slice is inverting the polarity of the rippling generate and propagation bits are inverted. Thus, in such a case every second precision group section has inverted inputs (not shown).

As apparent from the left side in FIG. 31A the most significant precision section G0 is slightly different from the other sections. It does not use an input argument $B_{lsb\_0}$. It is assumed being "0" within the group. Instead it has the mantissa carry input $C_{in\_m}$. It is used to generate the carry input to the sign bit. The output has one extra bit indicating the carry out from the exponent. The normal carry out is generated as in the normal groups except that $B_{lsb\_0}$ is assumed to be a "0", i.e. false.

The one bit signals $c5_1$, $c5_2$, $c5_3$ could have the following bit patterns: $(c5_1,c5_2,c5_3)$=(false,false,false) means integer: $(c5_1,c5_2,c5_3)$=(false,false,true) means both a and b having normal code; $(c5_1,c5_2,c5_3)$=(true,false,false) means a having altered, be normal code; $(c5_1,c5_2,c5_3)$=(true,true,true) means a having normal, b altered code;

The Incrementer

Figure 32:
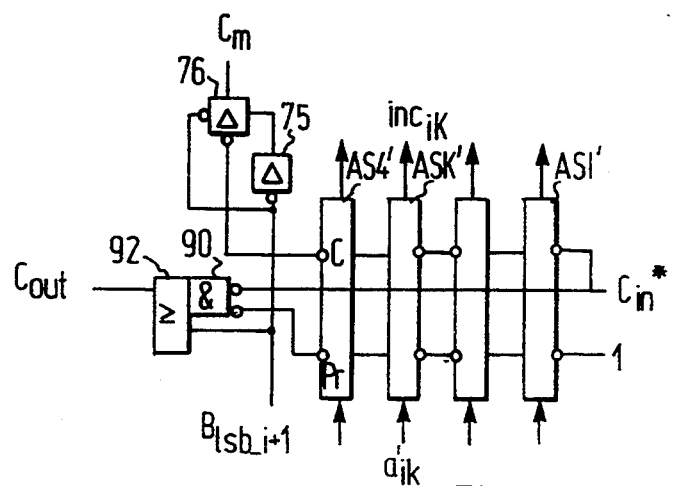
FIG. 32 shows an embodiment of a precision slice in an incrementer in the circuit shown in FIG. 28.

The configuration of the incrementer is very similar to the configuration of the adder. FIG. 32 shows an embodiment of a precision section in an incrementer. The incrementer has only one input a' (not shown). The increment bit slices AS1' to AS4' differs from the adder bit slices in that they have no generator bit Gen transferred from one to the other. The inverted output Pr from the slice AS4' and the inverted carry $c_{in}{}^*$ from the next preceding section are fed to each one of two inverted inputs of an AND gate 90 with two inverted inputs. The carry in $c_{in}$ to the first section G7 on the line being an "1" is indicating that an increment is to be made. The output of the AND gate 90 and the bit $B_{lsb\_i+i}$ are fed to an input each of an OR gate 92 providing the output carry $c_{out}$ to the next section. The carry output of the incrementer is provided in the same way as for the adder. The ripple carry chain $c_{in}/c_{out}$ indicates if the sum is more than or equal to two. The ripple carry chain Pe' indicates if the sum is more than or equal to one.

As the adder the incrementer has a mantissa-carry-out bus $c_{in}$ controlled by the signal $B_{lsb\_i+i}$. The control bit c1g or c2g is indicating if the representation is an integer or a floating-point value. The control bits c1g and c2g control a tristate gate which sets the mantissa-carry-out bus to a defined value when not used (not shown).

A decrementer has the same configuration as the incrementer, but the decrementer has an inverted input $a'_{in}{}^*$ to its decrementer slices, corresponding to the incrementer slices AS1' to AS4'.

The Selectors

Figure 33:
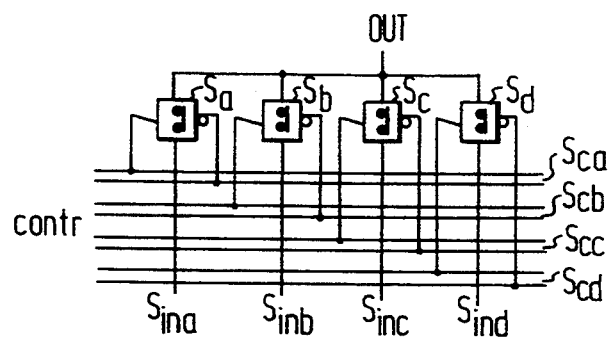
FIG. 33 shows a circuit diagram of an embodiment of a basic selector bit slice included in the selectors in the operand circuits in the circuit shown in FIG. 28.

The selectors in the operand units are generally built by a row of transmission gates. The selector has always a defined output. It has a list of control words and value inputs as arguments. All except one are off. The control of each input is a complementary signal. The entire selector is controlled by a list of such elements. They are controlled in the different state to take the input from a prescribed port. An embodiment of a basic selector bit slice is shown in FIG. 33. One of the bits of each input port to the selector $S_{ina}$, $S_{inb}$, $S_{inc}$ and $S_{ind}$ is connected to the input of a controllable switch $S_a$, $S_b$, $S_c$ and $S_d$, respectively. A pair of control wires $S_{ca}$, $S_{cb}$, $S_{cc}$, and $S_{cd}$, respectively, is provided for each switch. The control pair providing a transmit of the input to its belonging switch has the information "1,0", the others have the information "0,1".

It is to be noted that the majority of the circuits in the numeric ALU are built in accordance with the principles described above in relation to the adder and that it therefore is believed that a person skilled in the art easily can construct the rest of the circuits using these principles. Therefore, it has not been deemed to be necessary to describe every single circuit in detail.

DESCRIPTION OF THE NUMERIC ALU CONTROL CIRCUIT 27

The numeric ALU control circuit 27, shown in FIG. 28, is a boolean gate array of quite a complicated configuration. An embodiment of it can not be shown, because its configuration is calculated in a computer provided with all the algorithms regarding the configuration of the control signals in relation to the informative signals. The boolean gate array is provided directly as chip mask patterns from the computer adapted to the configuration of the chip mask patterns for the whole numeric ALU according to the invention. Thus this circuit is impossible to show in detail. A list on the relation between inputs to and outputs from the control circuit 27 is given in the appendix 2 for the case integer multiplication.

Appendix 2 shown the relation between inputs to and outputs from the ALU drive circuit 27 when multiplication of integers is being executed.

The appendix is divided into different "control cases". Each control case corresponds to one output, i.e. one micro instruction.

The outputs of the ALU drive circuit 27 which are listed under the heading "micro instruction wires" are the signal levels on the buses C1-C5. The buses C1, C2 and C3 are divided into smaller buses $C1_1$, $C1_2$, $C1_3$ etc. Thus, the inputs listed under the heading "control case 1" as "state, sense wires—condition 4" cause the outputs under the heading "micro instruction wires" below. The inputs listed above as condition 1, 2 and 3 cause the same outputs as condition 4.

Each condition is defined by a certain combination of signal levels (0/1) on some state wires, while other state wires may have undefined values (X=don't care).

All the input signals listed in the appendix are also marked in FIG. 28, except for signals co_limit1 and co_limit2.

In FIG. 28 the signal co_limit1 is divided into its two components $B_{co\_max1}$ and $B_{co\_min1}$.

The signal co_limit2 is also divided into its two components $B_{co\_max2}$ and $B_{co\_min2}$.

The output $A_{STATE}$ is simply a copy of all the inputs to the circuit 27. The output $A_{STATE}$ is connected to the control unit 6.

A value could be supplied by the main registers in the core cell in the first order processor or some of the numeric ALU internal units as instructions operand/mul_quotient or polynome. The information regarding the kind of representation in the rest of the bit string on the bus could be given by the information in the instruction bus or could be given in the code field.

The Port

A reduction processor could be provided with one or several ports for input/output of data to and from the processor. Each port is a unit providing the communication to the external environment of the processor. The port is preferably connected to the transforming interface 7 in the object storage 1 (See FIG. 1). However, if slightly modified it could instead be connected to the data transfer means 4. The port can be seen as an prolongation of the object storage since it contains preferably four storage cells similar in function and compatible with the object storage cells 10 (see FIG. 2). The port performs input/output-operations through unification.

Internal Behaviour

The object storage provides an internal behaviour of the processor, one behaviour for each port provided. A behaviour is the semantic meaning of a time structure, which could be represented by a closure structure. The time structure may be considered as the state of a process composed by an endless time sequence of values.

External Behaviour

Input signals to the port(s) could be provided by sensors or devices outside the processor, i.e. in the real-world environment. The port transforms the incoming signals into a digital form adapted to the object storage format, i.e. to a closure representation. This closure representation is a time structure, i.e. a behaviour, comparable to the internal behaviours in the processor. Thus, from the viewpoint of the processor this time structure can be seen as an external behaviour.

The input and output through a port is made by a unification of processes provided on each side of it, i.e. of internal behaviours in the processor and of external behaviours in its surrounding. Both the internal behaviours and the external behaviours are modelled in the same way, which provides a very elegant way of operation making the processor quite suitable to perform real-time operations.

Figure 34:
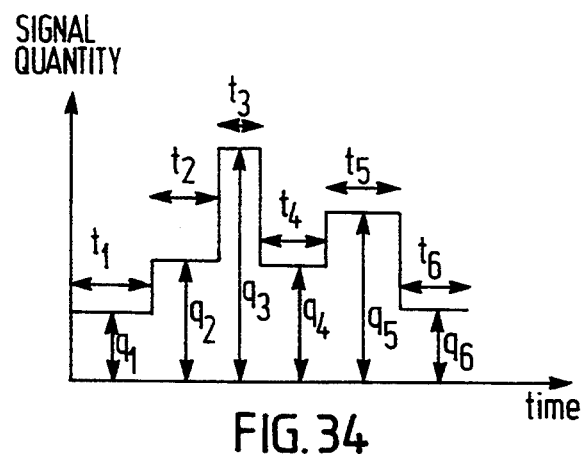
FIG. 34 is a diagram of a signal sequence at a port included in the processor according to the invention.

An example of an external behaviour, i.e. a time sequence, is shown in FIG. 34. The sequence of sampled signals could be changing with time, i.e. the sampling periods can be different, as apparent from FIG. 34. The signal sequence is here provided as a list of pairs of elements. Each pair includes a duration time and a signal quantity during that time. The signal quantities are marked $q_i$ and the time durations are marked $t_i$, where i is a number between 1 and 6.

The Interface

A preferable interface should have the following qualities:
1. A signal is measured at certain times. The measured signal is regarded to be constant until the next measuring.
2. The time could be given either with a fixed cycle determined by the port, or a fixed cycle determined by the program in the machine, or at certain intervals determined by the program or by external clock signals.
3. The measured signal is provided in digital form to the machine.
4. The digitized signal is either boolean or is coded into a digital form which could indicate an integer or a floating-point value.

The processor according to the invention does not insert or output values like conventional processors. In the inventive processor the port is regarded as an interface between a program in the processor and a surrounding to the processor. The program is stored in the active object storage and creates the internal behaviours.

The program execution is based upon that both the program in the processor and the surrounding sees the same real time course of events in the interface.

The input and output to and from the processor is made by unification. This means that the duration time and the value within each interval are made alike at both sides of the port.

The program could specify a specific duration time or it could leave the duration time unspecified by using a particular symbol, for instance $, denoting all possible values.

The program could specify a specific signal quantity value or it could leave the signal quantity value unspecified by using a particular symbol, for instance $, denoting all possible values.

A correct program should have only one of the alternative behaviours left after the unifying operation, and this behaviour must coincide with the behaviour at the port in question. If none of the alternative internal behaviours should correspond to the real-world environment at the port in question, the unifying operation will give nothing as its result, which is considered as a programming error since nothing represents contradiction. Having more than one alternative behaviour left after the unifying operation is also considered as a programming error.

Input & Output

An interval is described in a program by the form during t v, where t is the duration time and v the signal quantity.

When the internal behaviour specifies a specific signal value, also called signal quantity, this specific signal value is output to the surrounding. If the internal behaviour leaves the signal value unspecified a specific signal value is input from the surrounding.

When the internal behaviour specifies a specific duration time in an interval, then the surrounding admits an arbitrary duration time length. If the internal behaviour leaves the duration time unspecified the surrounding determines the duration time.

An Embodiment of a Port

Figure 35:
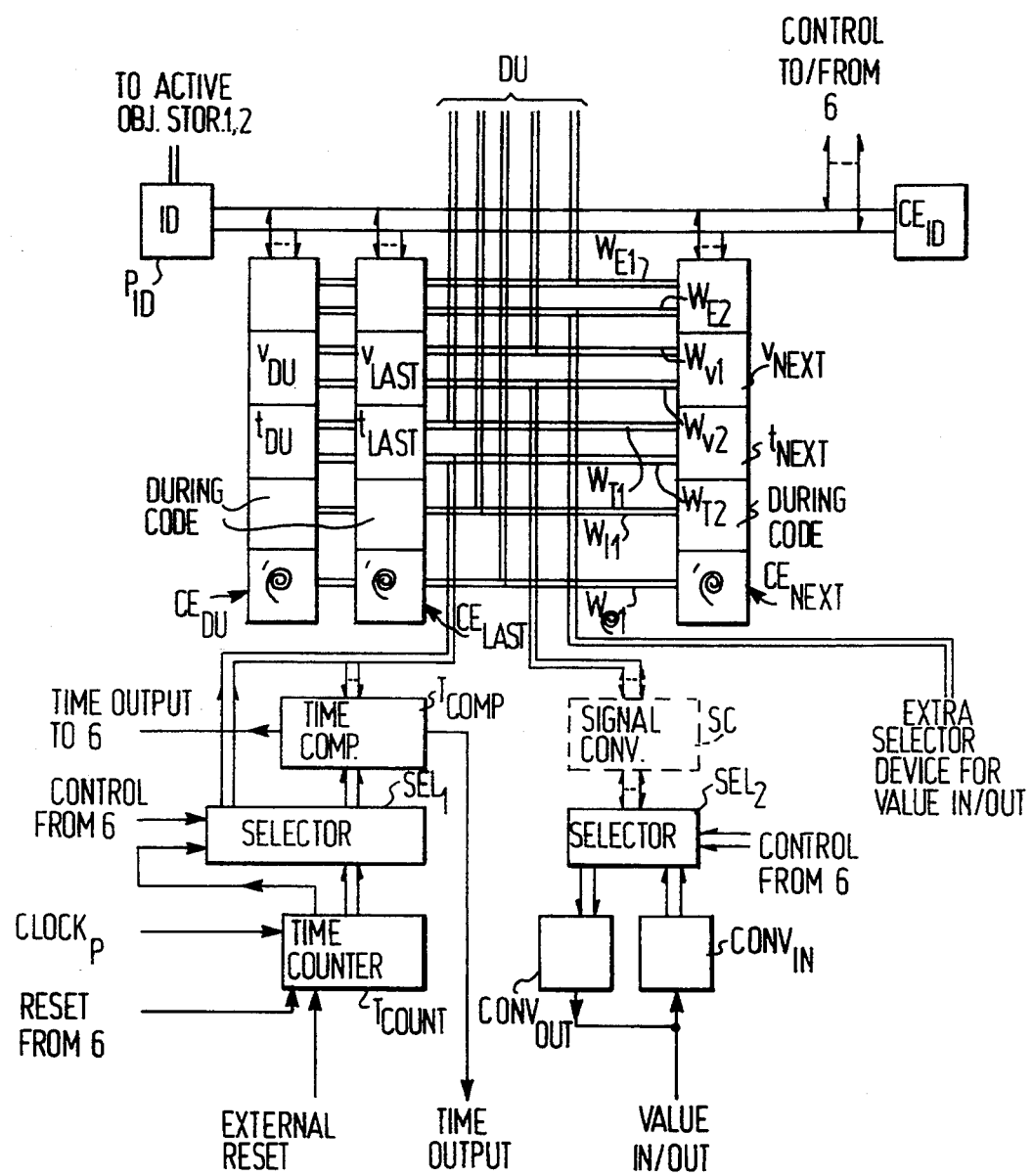
FIG. 35 shows an embodiment of a port for input to and/or output from the processor according to the invention

An embodiment of a port for input and/or output is shown in FIG. 35. The port is connected to the transforming interface 7 with a bus arrangement DU. The port is connected to the control unit 6 of the first order processor to which it is connected, and is controlled by it. The port includes an identifier register $P_{ID}$, which denotes the port. The identifier stored in the register $P_{ID}$ can be used as an identifier in the object storage 1, i.e. it can be used to link the port to cell closures in the object storage. This identifier is only used internally within the processor. The port also includes an identifier register $CE_{ID}$, which can be used in a similar way as the register $P_{ID}$. The port also includes a number of storage cells $CE_{DU}$, $CD_{LAST}$, $CE_{NEXT}$, each acting like the storage cells in the object storage.

Each storage cell could store a closure having at least three storage fields for storing at least three closure elements, for instance during, duration time, and signal quantity.

At least the two last mentioned closure elements could be stored in storage fields of the value/designation kind. The expression during may be provided in a TYPE field. Since the port is always providing a during operation this TYPE field could be omitted.

However, in the embodiment shown in FIG. 35 during is in form of a type 'apply ('@) placed in a type field together with a predefined function name (during code). The function name is stored in the first value/designation field of the port storage cells, as for all function names (such as +−*/) belonging to the type 'apply. The during code could be an identifier denoting a function definition, which is stored in the object storage.

An identifier id can also be stored in a value/designation field. This identifier links the port structure with a during structure in the object storage.

If a field including an identifier is not needed, then only three value/designation fields are actually needed. However, a fourth value/designation field marked unused could be provided in order to make the port registers compatible with the other storage cells in the processor. It is, however, also possible to connect an extra device for VALUE IN/OUT to the fourth value/designation register. This will link the port to a port for a group of values, i.e. for duration time and two kinds of signal quantities.

Each storage cell in the port could thus also have the attribute fields. The storage cells $CE_{DU}$, $CE_{LAST}$, $CE_{NEXT}$ be interconnected with buses $W_{@1}$, $W_{J1}$, $W_{T1}$, $W_{v1}$, $W_{E1}$, $W_{T2}$, $W_{v2}$, $W_{E2}$, each bus having for instance 38 wires and connected in a bit wise manner to the bitcells in each register. The index I denotes a bus connectable to the during code fields of the registers, the index T denotes a bus connectable to the duration time value/designation fields of the registers, the index V denotes a bus connectable to the signal quantity value/designation fields of the registers, the index E denotes a bus connectable to the extra value/designation fields of the registers. The index 2 denotes a bus connected towards the surrounding, and the index 1 a bus connected to the transforming interface 7.

The storage cells in the shown embodiment of the port stores the next preceding closure, the actual closure, the next closure, and an identifier to future closures. The storage cells could have prescribed places and then the whole content in them could be transferred between them. A suitable structure for each register cell in the registers can have the same structure as the register cells in the core cell 2 (see FIG. 10).

However, it is also possible to arrange the three first mentioned storage cells such that they could change place with each other by changing their name, which is made by control from the central control unit 6.

The exact wiring between the storage cells is not shown in detail because it is believed that a person skilled in the art easily could provide the same using the principles described in relation to the description of the core cell. The control from the control unit 6 is schematically shown up to the right to a schematically illustrated connection between the storage cells, but is naturally drawn to each switch in the register cells as in the core cell registers.

The port could be provided with a different number of storage cells, e.g. one storage cell.

The Time Counter and the Time Comparator

The port includes a time counter $T_{COUNT}$. It is controlled by a clock signal $CLOCK_P$ from the central control unit 6 and measures the time. It can be reset by either an external reset signal or a reset signal from the control unit 6. The time counter $T_{COUNT}$ is connected to a first selector $SEL_1$ which is controlled from the central control unit 6 to either connect the output from the time counter $T_{COUNT}$ directly to the bus $W_{T2}$ connectable to the time storage fields in the storage cells or to a first input of a time comparator $T_{COMP}$. The second input of the time comparator $T_{COMP}$ is connected to the bus $W_{T2}$. The output of the time comparator is an external time output. The output of the time comparator is also transferred to the control unit 6.

The port also includes an external value input and output port pin VALUE IN/OUT. It is connected to a converter $CONV_{OUT}$ for the output signal, for instance a analog/digital converter. It is also connected to a converter $CONV_{IN}$ for the input signal, for instance an analogue/digital converter handling the sampling of the input signal. The sampling times could be given by the output of the time comparator $T_{COMP}$ or the reset signals to the time counter $T_{COUNT}$. A selector $SEL_2$ connected to the bus $W_{v2}$ controllably connectable to the signal quantity registers of the storage cells $CE_{DU}$, $CE_{LAST}$, $CE_{NEXT}$ selects, at control from the central control unit 6, if a signal quantity shall be fed out from or in to the port. The control unit 6 first reads the content of the registers in the storage cell including the registers to be connected to the surrounding to see if it includes the particular symbol $. If it does an input from the surrounding is to be performed. If, instead, a specific value is found an output to the surrounding is to be performed. Then, the control unit 6 controls the port selector coupled to the register accordingly.

It is also possible to make a more complicated port. For instance the signal quantities for VALUE IN/OUT can be converted by a formula stored in a signal converter SC connected between the selector $SEL_2$ and the bus $W_{v2}$. The converting function could for instance be a number of integrals, each for a different class of signal quantity signal values.

Output of a Signal Quantity

The information to be fed out is provided in the storage cell $CE_{DU}$. Thus the cell has the information during t v, where t is the duration time and v the signal quantity. The signal quantity in this register is known and shall be fed out. The signal quantity is fetched from the signal quantity register in the storage cell and is fed out through the selector $SEL_2$, acting as a driving stage, and the converter $CONV_{OUT}$.

Input of a Signal Quantity

The information in the storage cell $CE_{DU}$ is during t $, where t is the duration time and $ represents any of all possible signal quantities, i.e this expression will unify with any provided signal quantity. The signal quantity in this register is thus unknown and the register is prepared to receive a signal quantity. The signal quantity is fetched from the port signal quantity in/output, is digitized in the A/D converter $CONV_{IN}$, and is fed into the signal quantity register of the storage cell $CE_{DU}$.

The Duration Time is set by the Processor Program

The information in the storage cell $CE_{DU}$ is during t v, where t is the duration time and v the signal quantity. Thus, the duration time is known. The time counter $T_{COUNT}$ is reset by the central control unit 6 at the start of the duration time. The continually stepped up time in the counter $T_{COUNT}$ is compared to the time in the time register in the storage cell $CE_{DU}$ by the time counter $T_{COMP}$. The duration time ends when these times are the same.

The storage cell $CE_{LAST}$ has been emptied and the storage cell $CE_{NEXT}$ filled during this duration time. At the transition to the next period the content in the storage cell $CE_{DU}$ is moved into the storage cell $CE_{LAST}$, and the signal quantity in the storage cell $CE_{NEXT}$ is moved into the storage cell $CE_{DU}$.

The Duration Time is set by the Surrounding

The information in the storage cell $CE_{DU}$ is during $ v, where v is the signal quantity and $ represents any of all possible duration time, i.e this expression will unify with any provided duration time. Thus, the duration time is unknown and the surrounding will determine it. The time counter $T_{COUNT}$ is reset by the external control at the start of the duration time. The continually stepped up time in the time counter $T_{COUNT}$ is fed to the time register of the storage cell $CE_{DU}$. When the surrounding gives the next external reset the duration time is over. Thus, the external reset signal is controlling the selector $SEL_1$ to disconnect the connection to the time counter either directly or by a zero signal from the time counter.

During this duration time the storage cell $CE_{LAST}$ has been emptied and the storage cell $CE_{NEXT}$ filled. At the transistion to the next period the content in the storage cell $CE_{DU}$ is moved to the storage cell $CE_{LAST}$, and the content in the storage cell $CE_{NEXT}$ is moved into the storage cell $CE_{DU}$.

A Simple Example

In order to illustrate the operation of the port a small example will be given below. Say that we want to detect one of two different sequences, the first sequence having every second signal quantity determined, e.g. with the value 17, and all the time durations determined, e.g. 1 second, and the second sequence having all signal quantities determined, e.g. 1, 2, 3, 4, etc, but no time durations determined. The port to use is called $port_1$. The closure representation:

unify($port_1$ "internal behaviour"), where "internal behaviour" is an alt operation which denotes all alternative sequences, i.e. a large data structure of the following kind:

alt(seq(during)1s 17)during(1s $)during(1s 17) ... )
    seq(during($ 1)during($ 2)during($ 3) ... ))

Now, if the input signal sequence can be unified with the above structure the input is accepted and the appropiate action can be taken. One example of an accepted sequence is ((1s 17)(1s 0)(1s 17)(1s 99)(1s 17)), which is a sequence that can be unified with the first sequence of the internal behaviour given above. Another sequence that will be accepted is ((2s 1)(4s 2)(1s 3)), which will unify with the second sequence of the internal behaviour. An example of an unaccepted sequence is ((1s 2) ... ), because the signal quantity, i.e. 2, can not be unified with the signal quantities given in the two sequences of the internal behaviour.

Communication with the Outside World

The ingenuity in constructing the port such that the values can be transferred in to or out from the processor dependent upon if the signal is defined or not or if the internal value is defined or not (having the value $) is that the processor is not limited to the simple input port and output port system described above. Thus, it is possible to write a program in which a port is alternately written into and read out from the processor. An example is the following program:

unify (port "internal behaviour")

having the internal behaviour:

```
alt(seq(during 1s 1)(during 1s 1)(during 1s 2)(during 1s 4)
    (seq(during 1s 1)(during 1s 1)(during 1s 3)(during 1s 9)
    (seq(during 1s 2)(during 1s 4)(during 1s 1)(during 1s 1)
    (seq(during 1s 3)(during 1s 9)(during 1s 2)(during 1s 4)
    etc
``` i.e. (seq(during input) (during output) (during input) (during output)

In this internal behaviour the surrounding provides a value and the processor answers by feeding out the square of it during the next interval. This method gives full control over how the data shall flow in a simple way.

As soon as an input value does not unify with, i.e. it cannot be made the same as the corresponding value in the processor, the result is nothing. This will propagate all the way up to the alt operation and the whole branch is deleted from the alt expression.

The internal behaviour representation above is of the same length as the input sequence. A piece of a shorter, more expressive, way to represent the internal behaviour using the full power of a functional language is given here:

```
seq(during(1s X)
    during(1s apply((lambda (arg) (* arg arg)) X))),
``` where during(1s X) handles the input of a signal quantity X and where the other during-structure including the lambda expression handles the output of the squared input value. Thus, the above structure could be a part of a more general structure which is able to handle more than one input/output pair by use of recursion. The lambda expression is here used to define the square function.

The H Port

The description of the input/output port above could be generalized to be able to handle input and output of other data structures than during-structures. In this case, instead of unifying an internal behaviour with an external behaviour by unifying time durations and signal quantities, a unification of bit patterns could be performed. The incoming signal could be digital. Further, the incoming signal could represent data structures or program structures, such as H language programs. For instance, a storage cell field in a storage cell in a port could be unified with bitpatterns on the input of the port.

An example: an internal structure apply(X1 X2) could be unified with bitpatterns on the input so that the final unified internal structure reads: apply(+list(1 2)), which is the structure shown in FIG. 8A and B. Here X1 and X2 represent "any bitpattern". X1 is unified with the bitpattern representing the instruction code for "+" and X2 is unified with the bitpattern representing "list(1 2)".

Through the H port, which accept H language code, a program could be loaded into the object storage. The H port could also be used between processors, which would allow them to transfer programs or data or both. Transfered program code could initially be marked as data to prevent immediate execution of it.

The First Order Reduction Processor (FOP)

Briefly recapitulated, the reduction processor is controlled by a program having a particular, not sequential structure and reduces said structure in a number of reduction steps including different kinds of reductions of tree structures. The object storage 1 in the first order processor includes a plurality of storage cells 10, each able to store information, which could give rise to a reduction. A communication net, the memory bus arrangement together with the closure head controlled by the central control unit 6, communicate the result of each reduction to all storage cells.

The communication net is a bus arrangement having control lines and data lines, all lines being connected to each of said storage cells. The central control unit 6 is common for all the storage cells. It is the information in the storage cells 10 that gives the information to the central control unit 6 of what reduction to perform and thereby also which control words it should issue. Since the central control unit 6 preferably is a boolean gate array the information in the storage cells is in form of high and low voltages provided to inputs of AND and OR gates in a complex configuration providing a complex output composed of high and low voltages to be provided to a lot of control points in the control circuits in the storage cells.

Thus, each storage cell in the object storage and the core cell is able to store all information necessary to perform a reduction operation. The reduction information could also include reference to some other storage cells. When the execution is finished, i.e. the structure is reduced as far as possible, the result is a canonical expression. If a canonical expression is larger than what can be stored in one storage cell, there are references to other storage cells where the rest of the expression is stored. An example, for the embodiment described, is a list with five elements, which requires two storage cells in order to be stored in the object storage 1.

The core cell is able to perform all kinds of reductions. It is to be noted that the number of core cells is not restricted to one, and thus that several core cells could be provided, even if this is not shown in an embodiment. The storage cells in the object storage are able to perform only limited parts of some of all kinds of reductions.

Several core cells could be provided to work in parallel with complete structures, in the form of complete closure trees, or parts of structures, in the form of parts of closure trees. Since the result of a number of reductions is unrelated to the reduction order, different core cells are allowed to work within overlapping contexts. Generally, no extra provision has to be made to ensure data integrity—it is ensured automatically by the way the inventive reduction processor(s) operate. For example, when two core cells reduce two identical closure tree parts, the only consequence is that one unnecessary reduction has been made—the result is the same.

The communication net is adapted to also transmit information from the object storage cell chosen among the object storage cells to one of the core cells chosen by the communication net and from the chosen core cell to one or several object storage cells chosen by the communication net.

The communication net performs a transfer operation between the core cell and any of the storage cells by replacing the content in the receiver with the content in the transmitter. A two way transfer is performed by swapping the content of the concerned cells. Each cell closure stored in a storage cell includes a denotation of executability, of position in a tree structure, of an identifier, of an environment, and of a tree of values or designations to other storage cells.

The tree of values included in a multi level closure includes leaf elements, i.e. end elements, and composed element, each composed element including a type and a list of values. The denotation of executability in the closure has at least two states, of which the first state is idle state and the second state is execute state. The denotation of position in the closure has at least two states, of which the first state is node position and the second state is root position.

At least some of the closure denotations are presented in different states, each state being composed of several bits representing a binary code.

Each value/designation element in the cell closure is composed of a tag word and a num word, which is a bit pattern composed by a number of bits being either true or false. The tags are divided into an indirect class and a direct class. The num word could for example be an integer or a floating-point value. An integer is stored in the element in a format, also called representation, binary coded such that all values are represented from the lowest to the highest representable value in a series of numbers, each number including several bit values, and in which zero is represented in the middle of the series of numbers as a binary number having the binary value true in its most significant bit and having the binary value false in the rest of its bits. A floating-point number is stored in the element in a format, also called representation, binary coded such that it includes a sign, exponent sign and code field, an exponent field and a mantissa field, said sign, exponent sign and code field having an indication on a division position between said exponent field and said mantissa field, such that the exponent and mantissa fields have variable lengths.

Thus, the processor according to the invention uses codings arranging said numerical values into a dense representation, i.e. every coded representation of a value corresponds to only one interpreted value. A first kind of coding is used on a binary word representing an integer representation. A second kind of coding is used on a binary word representing a floating-point representation. The codings being such that after coding floating-point representations are provided in the same order as integer representations. The dense representation is provided by including a virtual "1", i.e. a "1" not provided physically in the representation, in front of a field of the word for the mantissa part of the floating-point value. The representations of numerical values are divided into bit groups, called precision groups, each having a predetermined number of bits, a partition between an exponent part and a mantissa part of the representation, when the representation is representing a floating-point value, being made between two precision groups.

The Second Order Reduction Processor (SOP)

Figure 36:
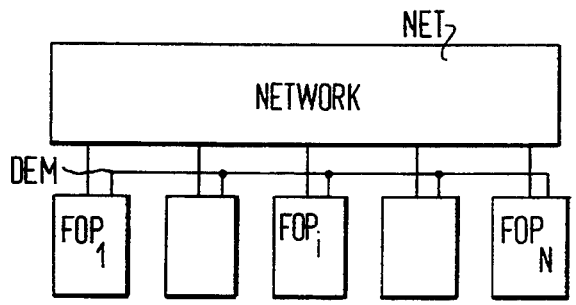
FIG. 36 shows a very general second order reduction processor (SOP) according to the invention.

As shown in FIG. 36, a number of first order processors FOP1 to FOPN could be connected to each other by a network NET, the joined first order processors represent a second order reduction processor.

The connection to the network NET could be provided as a data transfer means, as the means 4 in FIG. 1, in each of the first order processors FOPi, i being an integer between 1 and N. The data transfer means 4 in FIG. 1 includes a row of registers $R_{id}$, $R_{env}$, $R_{v0}$, $R_{v1}$, $R_{v2}$, $R_{v3}$. Each network register is connected to the vertical bus line denoted with its index. The network registers are used when there are several object storages including core cells connected to execute in parallel. The communication to and from all these object storages is made through the network registers.

Theoretically, all the first order reduction processors are sharing the same information M being the entire domain of the system. It is necessary that the union of all the first order reduction processors equals the system domain M. However, every first order processor is processing the information stored in its own object storage. This means that a single closure could be found in more than one processor. Each processor is able to keep track of in which first order processor(s) a closure is stored. A single closure found in several object storages is identical—this is ensured by the reduction mechanism.

A closure net includes a closure and its fathers. It is possible to move closure nets by moving closures among the processors. Though, in order to minimize communication it is desirable to keep semantically related closures gathered in one or a few processor(s). The communication protocol may be such as to provide moves of closures during times when no other communication between the processors is demanded. Closure trees may be reduced in parallel in the different processors. No synchronization is necessary for these operations. Thus, the reduction of the closure tree parts may be performed at different times. No error will occur because the result of the reductions is the same regardless of when they are executed.

Naturally, a reduction of a closure having identical copies in other processors could take place in only one $FOP_i$ (i being an integer between 1 and N) of the parallel processors FOP1 to FOPN, and with the result of the reduction distributed to all the other processors connected to the network NET as soon as possible in order not to waste processor resources. However, it will usually be more suitable and also more time economizing to perform parallel reductions in different first order processors. For instance, the network NET could be temporarily occupied by serving some of the first order processors connected to it and meanwhile the parallel reductions could take place.

The actual kind of network NET to be provided is not to be regarded as a part of the actual invention and will therefore not be described in detail. Though, some examples of different kinds of networks will be given below. There are many types of communication networks having different kinds of routing and connection strategies which could be used. The network NET could be in form of a ring network having single or double links, a star network, a fully connected network or the like.

In order to avoid too bulky wiring between the first order processors FOP1 to FOPN the data transfer between them could be done serially on a serial bus. The transfer of data is preferably done with distributed control. Thus, not by using a central control device controlling all the first order processors, below called FOPs. One of the FOPs is demanding access to the network NET on a particular bus DEM and then the other FOPs are set in position to receive. However, the transfer of the signal for demanding access may be provided in some other way than via a separate bus, for instance as an idling signal transferred on the bus arrangement described in our co-pending application Ser. No. 07/739,539. The data between the first order processors can be transferred and stored in the registers in a data transfer means in a FOP while a reduction operation takes place in the FOP. Because of the serial transfer of data the register cells in the data transfer means are controlled sequentially by the central control unit of the FOP.

Synchronization between the FOPs is made by synchronizing the clock signals in every FOP i relation to each other. Such synchronization is common in the art and will therefore not be further described.

However, as an alternative a second order central control unit (not shown) could be provided to control the communication among the FOPs. This control unit could be a boolean gate array communicating with the central control units in all the first order processors. However, having such a second control unit is not to be preferred.

FIG. 36 shows a very general second order reduction processor according to the invention in which the data tranfer between the FOPs could be of any kind.

A First Embodiment of a Second Order Reduction Processor (SOP)

Figure 37A:
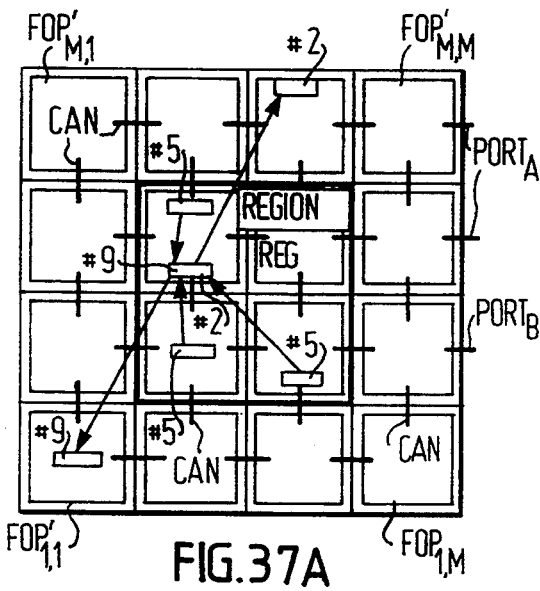
FIG. 37A shows an embodiment of a SOP where the first order processors (FOPs) are arranged in a square field.
Figure 37B:
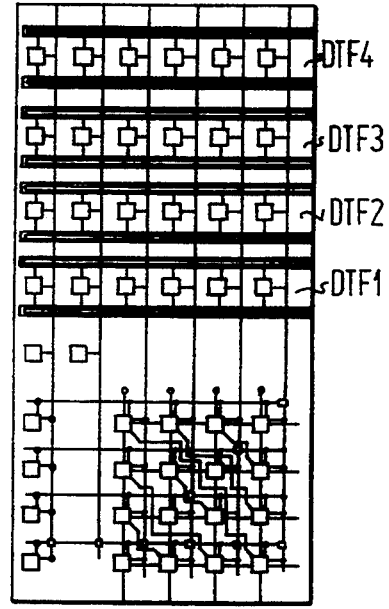
FIG. 37B shows an operating plane in the core cell provided with four separate data transfer means for possible use in the square field SOP in FIG. 37A.

According to a particular embodiment of a second order processor, shown in FIG. 37A, particulary suited for distributed data transfer control among the FOPs, several FOPs, $FOP'_{1,1}$ to $FOP'_{M,M}$, could be joined into a square field. Each FOP in said square field includes a data transfer channel CAN going to each neighbouring first order reduction processor in the square field. As shown in FIG. 37B a separate data transfer means DTF1 to DTF4 could be provided for each transfer channel CAN, and also for each port connected to a FOP. This will make it possible to transfer data from a FOP to several other FOPs simultaneously.

In the kind of structure shown in FIG. 37A each FOP is only communicating with at most four neighbouring FOPs and preferably on a separate channel to each. Only a simple control path is needed between each pair of data transfer means placed in communication with each other on which a flag is set when communication is demanded setting the other FOP prepared to receive transferred data in its data transfer means DTFn.

Closure Nets and FOP Regions

Closures are allocated to different FOPs. As described above, a cell closure is denoted by a machine identifier, for instance #5. A cell closure may contain indirect elements, identifiers, linking it to other cell closure. All cell closures containing identifiers refering to a certain closure and this certain closure form a closure net, i.e. it contains a closure and its fathers. The closure net is placed in a defined region of FOPs. A region is typically a square of FOPs, such as the region REG surrounded by a continuous line in FIG. 37A. This region thus includes all closures having the identifier #5. However, the cell closure with identifier #5, to which the closures having the identifier elements #5 are linked, could in turn include identifier elements, such as #2 and #9, provided in FOPs outside the region for the identifier #5. More about regions will be explained in relation to FIG. 37C below.

One reason to have regions is that the associative search and replace can be restricted, restricted in the sense that just a few of all object storages of the FOPs need to be searched in order to perform the update of the fathers of a reduced closure—only the object storages belonging to the FOPs in the region need to be searched.

Communication with the Outside World

A number of ports PORT for input/output of data to and from the second order processor are provided preferably along at least one of the edges of the square field of FOPs. Each port is a unit providing the communication to the external environment of the processor. The port used could be of the kind described above, performing input/output-operations through unification.

Through another port, the H port, which accept H language code, a program could be loaded into the object storages in the FOPs.

The H port could also be used between processors, which would allow them to transfer programs or data or both.

Yet another kind of port could be provided for input of ASCII-text, which would allow the inventive reduction processor to communicate with devices capable of transmitting and/or receiving ASCII-text, e.g. conventional computers. This kind of port is not part of the actual invention and will therefore not be described in further detail.

Soft and Hard Rings

A hard ring is a "hardwired" communication path, i.e. a path established in hardware. A soft ring is a "soft-wired" communication path, i.e. a path established on an abstract level and which can change with time. Naturally, the soft ring uses the hardware for the actual communication. A path including every processor which contains a specific closure net, e.g. with identifier by #5, is called a soft ring.

A region for a closure net is a subset of all the processors. The closure net, i.e. the closure and its fathers, is to be found in its region. A goal is to make the region for each closure net as small as possible in order to limit the amount of communication between the processors.

Exact Soft Rings

Figure 37C:
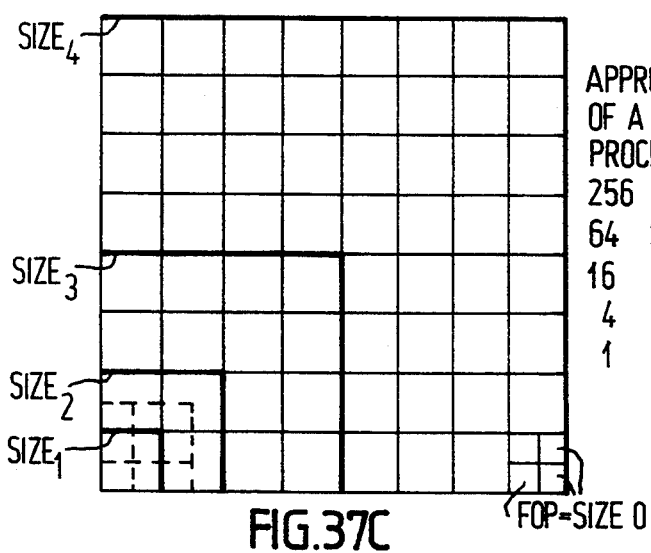
FIG. 37C shows a square field SOP including 256 FOPs divided into square regions.
Figure 37D:
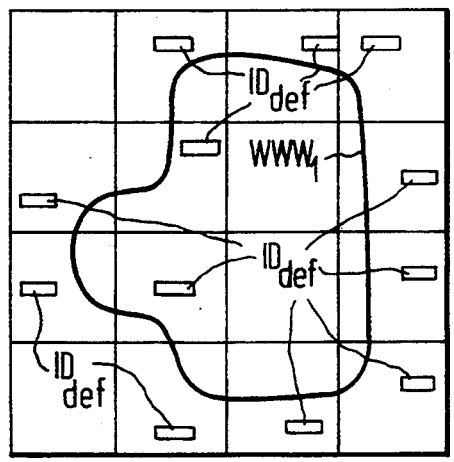
FIGS. 37D and 37E illustrate different soft rings in a square field SOP.

A region could be composed as shown in FIG. 37D, by several FOPs in FIG. 37A having the closure identifier $ID_{def}$ stored in different places in their object storage, marked with a small horizontal line in FIG. 37D. If this closure is to be replaced then all the FOPs having this closure identifier (the fathers) must be updated through a soft ring $www_1$ containing the FOPs having the identifier $ID_{def}$. The size of the soft ring $www_1$ depends on the implementation. In the embodiment shown in FIG. 37D the soft ring connecting the FOPs containing the actual closure net is serpentine formed. Exact soft rings are different for different closure nets.

Region Soft Rings

Figure 37E:
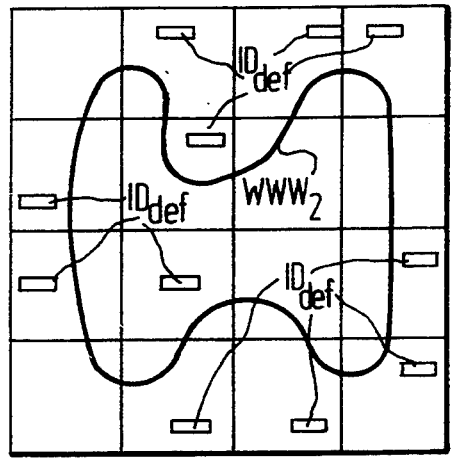

An alternative to the exact soft rings described above, where a closure net and its soft ring covers the same FOPs, is to have soft rings including FOPs which not necessarily have to correspond exactly to the closure nets they contain. Instead a soft ring could include every FOP in the region. FIG. 37E shows a region and illustrates that the update message is sent to every FOP in the region of the closure net formed by the identifier $ID_{def}$, i.e. the soft ring $www_2$ includes every FOP in the region. Region soft rings ($www_2$) are prefered since the amount of bookkeeping (overhead) is less than when using exact soft rings ($www_1$). The region soft ring for a specific region is the same for every closure net within the region.

The basic form of region networks are rings and buses. A ring may transport a value one turn in the loop. During such an operation it performs the same semantics as a bus in one cycle.

On a ring, several reductions of a closure may be sent at the same time. When the message has passed one round on the ring it may be dropped.

A Second Embodiment of a Second Order Reduction Processor

Figure 38:
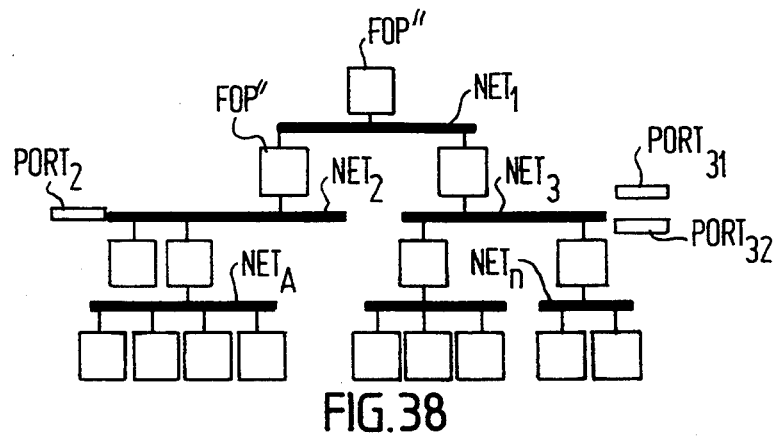
FIG. 38 shows a second embodiment of a SOP where the FOPs are arranged in a hierarchy of networks, each network being a bus.

According to a second embodiment, shown in FIG. 38, several FOPs are connected in a hierarchy of networks, each network being a bus $NET_1$ to $NET_N$. The main difference to the embodiment shown in FIG. 37A is that in FIG. 37A a FOP is connected to, through data transfer channels, at the most four other FOPs as opposed to in FIG. 38, where several FOPs are connectable to each other through a bus communication arrangement. However, distributed control could be obtained by providing a simple priority decoder (not shown) to each bus in order to set the priority among the FOPs in case more than one have demanded data transfer to someone or some of the others. This priority decoder could have practically the same configuration as the one shown in FIGS. 21A and 21B, which is the priority decoder 11 in FIGS. 2 and 3.

When a reduction has taken place in one of the FOPs, the fathers of the reduced closure need to be updated. The FOP that performed the reduction puts an update message on the buses, i.e. a subset of the buses $NET_1$ to $NET_A$, belonging to the region of the closure net in question. All the FOPs connected to a bus with this update message check if it contains a part of the closure net in which case the part is updated/rewritten. When a reduction is issued to the bus it is also noted in the local FOP as a unification. Since several FOPs perform reductions simultaneously the update messages may be multiplexed according to a communication protocol. Since the result is unrelated to the reduction order a bus communication order is not needed. Bus communication protocols common in the art could be used in order to ensure that a bus only has one transmitting FOP at a time.

Ports $PORT_2$, $PORT_{31}$, $PORT_{32}$ could be connected to chosen $NET_2$, and $NET_3$, respectively, among the buses. As shown It is possible to connect several ports to the same bus $PORT_{31}$, $PORT_{32}$.

A Third Embodiment of a Second Order Reduction Processor

Figure 39:
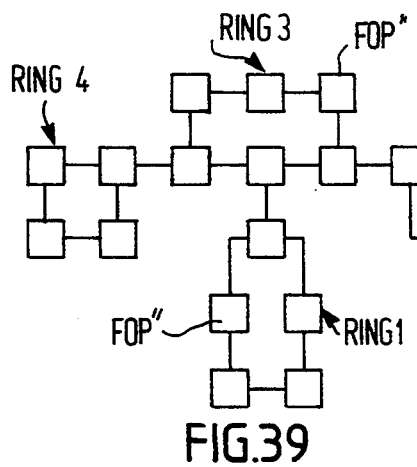
FIG. 39 shows a third embodiment of a SOP where the FOPs are arranged in a hierarchy of networks, each network being a hard ring.

According to a third embodiment, shown in FIG. 39, several FOPs FOP" are connected in a hierarchy of networks, each network being a hard ring RING1 to RING4, i.e. a ring where the participating FOPs are fixedly connected to each other. A region could cover one or several rings. Preferably, the soft rings coincide with the hard rings.

Combinations of Different Kinds of SOPs

Figure 40:
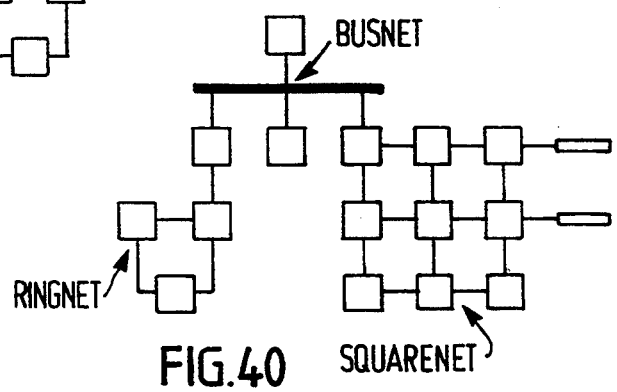
FIG. 40 shows an embodiment of a combination SOP including the SOPs in FIGS. 37A, 38 and 39.

It is also possible, as shown in FIG. 40, to combine the embodiments shown in FIGS. 37A, 38 and 39 to connect several second order reduction processors in a hierarchy of networks having at least two kinds of network, a first kind being a bus network BUSNET, a second kind being a ring network RINGNET and a third kind being a square network SQUARENET.

Thus, a machine of the second order according to the invention could have networks provided as rings and/or buses. In the machine, when a closure subtree has been reduced, the fathers of the reduced son must be informed that the son has been reduced. If it happens to be so well-arranged that the son and its fathers are placed in a ring of FOPs or in FOPs connected to a bus, then the information regarding the reduction of the son need only to be sent through that ring or that bus, respectively. The protocol of the machine is therefore preferably such that closures representing fathers are moved between the FOPs in such a way as to place them well accessible from their son or sons, i.e. all parts of a closure net should preferably be gathered in a small region.

A Machine Protocol

A preferable protocol has a configure part which establishes a list of the ports and their allocated purposes. The ports to a processor according to the invention, whether it is a first order processor, a second order processor or some higher order processor, shall all be allocated to a certain part of the application for the processor.

A protocol to be prefered includes one part configuring the ports, one part allocating goals to FOPs, one part implementing the reduction arithmetic, one part implementing arbitrary long lists, and one part implementing arbitrary long bit field values. Parts of the protocol may be provided in hardware. It is the protocol which initiates a synchronization of the clocks in the FOPs. This is preferably done at certain time intervals short enough to have the clocks synchronized.

A behaviour is represented as a closure. The allocation procedure is controlled by a certain part of the protocol. The allocation or reallocation of a closure may take place frequently among other normal reduction sessions. Any FOP may issue a directive to move a closure asking some other FOP to store the closure to be transferred.

When a closure is to be moved, e.g. when the object storage in a FOP is full, the FOP containing the closure issues a message on the bus or to the ring requesting a reply from the other FOPs connected to the bus/ring concerning if the closure can be moved to any one of these other FOPs. If all these FOPs give a negative reply, meaning that none of them can receive the closure, the closure is kept at the original FOP. If one of the replying FOPs gives a positive reply, the closure is transferred to this FOP. If several of the replying FOPs gives a positive reply, a priority order selects one FOP as the receiver of the transferred closure. The priority order could for instance be a geometrical order, such as the-nearest-neighbour order.

Regions

FIG. 37C shows an embodiment of a an enlarged square field second order processor including 256 FOPs. The channels between the FOPs and possible ports to the second order processor are not shown. Each FOP represents a region of the size zero. FIG. 37C illustrates that the square field second order processor could be logically (not physically) divided into square regions of different sizes placed at the side of each other in a regular pattern. Thus each region has a size of $2^n*2^n$ FOPs. The regions are placed disjunctly, i.e. not overlapping. However, the protocol could be such that a region also could be defined to be displaced half a region in a row or in a column or both in a row and in a column.

The protocol is such that it keeps track of the regions and uses the knowledge in which region or regions the father or fathers are positioned when performing a search and replace on a reduced closure. This is made by letting the bit pattern for the indirect elements, i.e. the identifiers, placed in value/designation fields include a bit pattern part indicating the size of the region it belongs to and having a bit pattern part indicating if the region should be displaced in some direction. The displacement direction bits could for instance be two, one, when being "1", indicating displacement to the right and the other, when being "1", indicating displacement upwards. When both are "1", then the displacement will be half a step to the right and half a step upwards.

When a reduction of a son is made the information is sent through its region(s), where the fathers are positioned, in a soft ring including all the FOPs in the region(s). This means that if the region is very large the soft ring will be large and the distribution of the information of the reduced son will take time and machine resources. Therefore, the protocol is such as to shrink the closure net regions, such as to make them as small as possible. Therefore, if the distance between a son and a father is great the machine protocol is such as to set a higher priority for moving such closures rather than closures where the distance between a father and a son is short. It is to be noted that a region shrinking operation could not be made in an unlimited way. Some object storages could for instance be totally filled up with data. Some of the fathers could have other sons placed far away from the son to which a region shrinking operation is to be made.

The protocol of the square field second order processor will preferably be such as to concentrate semantically related data into a small region. It is also desirable to move data in order to allocate certain regions to particular kinds of processing activities and to move data having relation to these activities towards the regions allocated for them. An example of an activity could be a particular kind of calculation. Another example of an activity is activities related to the input/output at a port, which could have its internal behaviours covered by a region.

The Third Order Reduction Processor (TOR)

Figure 41:
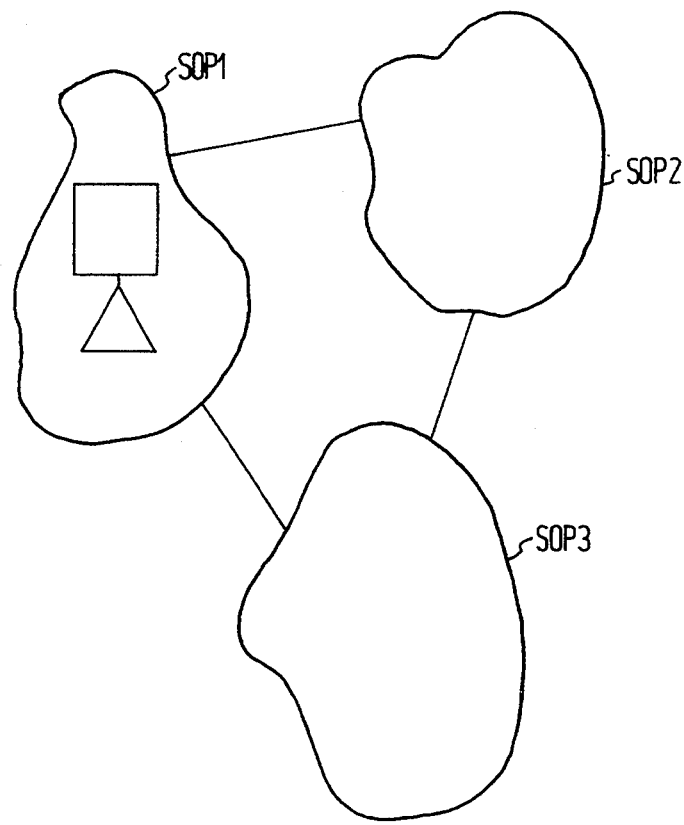
FIG. 41 shows a third order reduction processor which includes several SOPs.

The closures are thus moved around in a second order reduction processor according to the invention. However, a reduction processor does not have to be provided in only one geographical location. The same processor could for instance have one part in Sweden and another part in Australia. Therefore, a third order reduction processor shown in FIG. 41 could be provided, which includes several second order processors. Three SOPs SOP1, SOP2, SOP3 are shown in FIG. 41. SOP1 is illustrated to include a combination of a square field SOP and a bus oriented SOP.

Associative Adressing vs Physical Adressing

It is desirable to minimize the amount of communication between the different geographical locations since the cost and speed of data transmission will increase with the distance between locations. An associative search would require too much long distance communication, since every node in the system has to participate in the search. It is advantageous to adopt physical adressing in this case, in order to keep long distance communication to a minimum. Physical adressing in this case meaning that we adress the physical location, i.e. the receiver is known beforehand. In conclusion, it would be beneficial to adopt associative adressing within a SOP or a group of geographically gathered SOPs and to adopt physical adressing between such SOPs or groups of SOPs. Notice that the associative adressing within a SOP could be restricted by the use of regions.

We still have the situation where the reduction of a son shall be reported to all its fathers. In the second order processor this is done using regions, with each closure net being situated within the smallest region possible. In the third order processor there is one additional critical aspect to consider—the global adressing aspect.

Global Adressing

Object storage locations are "adressed" through content rather than physical adress, i.e. associative adressing is used. This approach is not preferable on the global level because of the amount of long distance communication it would require. Thus, global adressing is handled in a more conventional manner. Instead of performing a global associative search & replace when a son has been reduced, a local, i.e. within the second order processor in which the son is situated, associative search & replace is performed. Further, a global adressing is performed when necessary, e.g. when the father of a reduced son is situated in another SOP at another geographical location. The global adressing is not associative, instead a physical adress is used. The physical adress identifies a SOP, which could include a variety of different SOPs. The information transfered includes the global adress to the son-closure $id_g$, i.e. the identifier $id_g$ is unique among all processors in the system. The information also includes the reduced son. In every geographically separated SOP there is a data structure including information about sons having fathers outside the SOP, each son has a list of non-local fathers. This data structure will below be called the global closure $C_g$. The global closure $C_g$ could include additional information.

There are several ways to perform the global update, global update meaning that at least one father is situated in another SOP than the son.

Global Update Without Adress Translation

When a closure is reduced, a search for the identifier denoting the reduced closure is performed in the global closure $C_g$. If the identifier is found there the reduced closure (the son) have at least one non-local father outside the SOP—a global update is needed. A global update is not needed if the identifier is not found. In both cases, an associative search & replace is performed within the SOP. If a global update is needed the list of non-local fathers in the global closure $C_g$ is traversed. For every father in the list a message is sent out to the SOP containing the father. The message includes a global adress to the reduced closure and information about the reduction itself. The receiving SOP performs an associative search & replace, exchanging every occurence of the global identifier with the result of the reduction. This protocol requires that every identifier be unique, i.e. the bit pattern for a identifier is unique throughout the collection of processors in the system.

In an embodiment of this protocol each SOP is assigned a unique number and every identifier has the SOP number coded into the bit pattern, which means that the physical adress identifying a SOP is implicit in the bit pattern of the identifier. Each SOP "owns" a range of identifiers and when a new SOP is to be incorporated into the system it is assigned a new range, within which there are no identifiers.

Figure 42A:
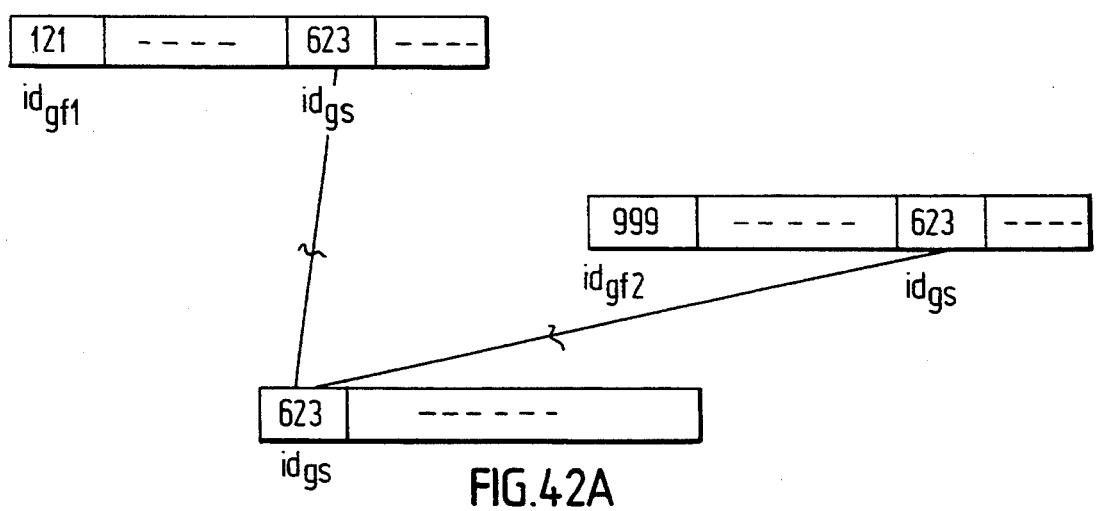
FIGS. 42A, 42B and 42C show different parts of a third order reduction processor and illustrates one way to handle global addressing.
Figure 42B:
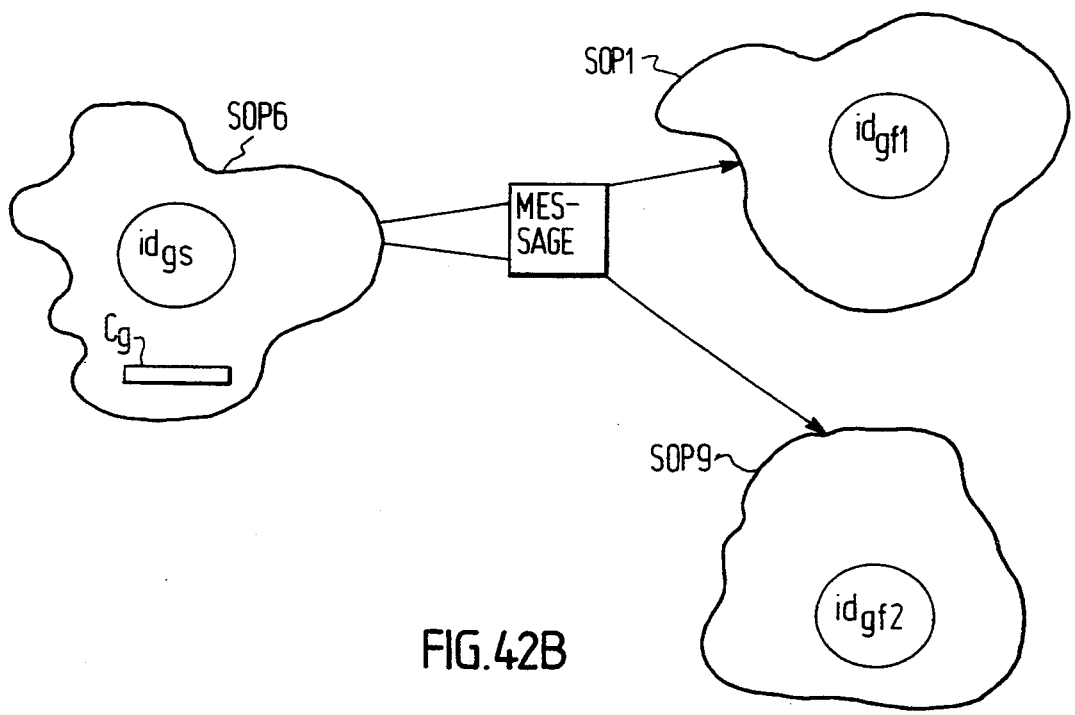
Figure 42C:
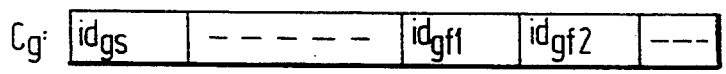

An example: SOP1 owns the identifier range 100–199, SOP2 owns the identifier range 200–299, ..., SOP8 owns the identifier range 800–899. A new SOP is to be incorporated into the system—it is assigned the SOP number 9 and is given the identifier range 900–999. In FIG. 42A parts of a example structure is shown. In FIG. 42B parts of a third order processor is shown, with SOP1, SOP6, and SOP9. In FIG. 42C parts of a global closure $C_g$ is shown. A son denoted by the identifier 623 is to be reduced. A local associative search & replace is to be performed exchanging the identifier 623 with the result it denotes. In the global closure $C_g$ in SOP6 the son can be found with the non-local fathers denoted by 121 and 999 as list elements (see FIG. 42C). A message is sent to SOP1 and SOP9 with information about the reduction, i.e. the reduced identifier, the result of the reduction etc. SOP1 and SOP9 performs a search & replace exchanging the identifier 623 with the result it denotes. The data structure in the global closure $C_g$ can now be modified by deleting the list of global fathers for the son in question.

Instead of storing the non-local father list, a list of SOP numbers which contain a father could be used.

Global Update with Adress Translation

In this case we distinguish between global and local adresses, a local adress being unique within a SOP and a global adress being unique among all SOPs in the system. The main difference between this approach and the approach above is that a translation of adresses is needed in this approach.

The adress translation could be handled by the global closure $C_g$. The closure $C_g$ could include information about the range of identifiers the SOP owns. Further, it could use this information to translate global adresses into local adresses.

The actual data transfer and the communication protocol for the third order processor could be designed using principles already established in the data communication field.

Naturally, other higher level reduction processors could be formed by using conventional technology in addition to the description above, using the first, second and/or the third order processor as building blocks.

While the invention has been described with reference to specific embodiments, it will be understood by those skilled in the art that various changes may be made and equivalents may be substituted for elements thereof without departing from the true spirit and scope of the invention. In addition, modifications may be made without departing from the essential teachings of the invention.

APPENDIX I

EXAMPLE OF AN OPERATION OF CENTERAL CONTROL UNIT 6

```
Operation: unify_structure_full, 2 used sons with 3 elements in each son

H-expression, where "x" = anything except unused
===============================================================

: (par (x x x) par (x x x))

Contents of the core cell expressed in keywords
===============================================

Pos    Attribute                       Head          Num
---    ---------                       ----          ---
ID:    clos exec node val unify        indirect cls  x
ENV:                                   indirect      x F0:    simple unused                   unused
F1:    simple unused                   unused
F2:    simple unused                   unused
F3:    simple unused                   unused S0,0:  clos idle node val par          x             x
S0,1:                                  x             x
```

```
S0,2:                                    x            x
S0,3:                        -           unused
S1,0: clos idle node val par             x            x
S1,1:                                    x            x
S1,2:                                    x            x
S1,3:                                    unused
S2,0: simple unused                      unused
S2,1:                                    unused
S2,2:                                    unused
S2,3:                                    unused
S3,0: simple unused                      unused
S3,1:                                    unused
S3,2:                                    unused
S3,3:                                    unused Contents of the core cell expressed in codes
============================================

Pos     Attribute            Head      Num
---     ---------            ----      ---
ID:     1 11 0 0 0111        101010    xxxxxxxxxxxxxxxxxxxxxxxxxxxxxxxx
ENV:                         1xxxxx    xxxxxxxxxxxxxxxxxxxxxxxxxxxxxxxx F0:     0 00 0 0 0000        000000    00000000000000000000000000000000
F1:     0 00 0 0 0000        000000    00000000000000000000000000000000
F2:     0 00 0 0 0000        000000    00000000000000000000000000000000
F3:     0 00 0 0 0000        000000    00000000000000000000000000000000

S0,0:   1 00 0 0 0001        xxxxxx    xxxxxxxxxxxxxxxxxxxxxxxxxxxxxxxx
S0,1:                        xxxxxx    xxxxxxxxxxxxxxxxxxxxxxxxxxxxxxxx
S0,2:                        xxxxxx    xxxxxxxxxxxxxxxxxxxxxxxxxxxxxxxx
S0,3:                        000000    00000000000000000000000000000000
S1,0:   1 00 0 0 0001        xxxxxx    xxxxxxxxxxxxxxxxxxxxxxxxxxxxxxxx
S1,1:                        xxxxxx    xxxxxxxxxxxxxxxxxxxxxxxxxxxxxxxx
S1,2:                        xxxxxx    xxxxxxxxxxxxxxxxxxxxxxxxxxxxxxxx
S1,3:                        000000    00000000000000000000000000000000
S2,0:   0 00 0 0 0000        000000    00000000000000000000000000000000
S2,1:                        000000    00000000000000000000000000000000
S2,3:                        000000    00000000000000000000000000000000
S2,3:                        000000    00000000000000000000000000000000
S3,0:   0 00 0 0 0000        000000    00000000000000000000000000000000
S3,1:                        000000    00000000000000000000000000000000
S3,3:                        000000    00000000000000000000000000000000
S3,3:                        000000    00000000000000000000000000000000
```

Operation: unify_structure_full, 2 used sons with 3 elements in each son
Phase:     a

| Pos | Plane | swa1 | swb1 | swQ | swa0 | swb0 | swN | swE | swVO | swVI | swC | swHO | swHI | swD | swCON |
|-----|-------|------|------|-----|------|------|-----|-----|------|------|-----|------|------|-----|-------|
| ID  | Tcs   | off  | ---  | off | on   | ---  | --- | --- | off  | off  | off | ---  | ---  | --- | on    |
| ID  | Tl    | off  | ---  | off | on   | ---  | --- | --- | off  | off  | off | ---  | ---  | --- | on    |
| ID  | Tw    | off  | ---  | off | on   | ---  | --- | --- | off  | off  | off | ---  | ---  | --- | on    |
| ID  | Tt    | off  | ---  | off | on   | ---  | --- | --- | off  | off  | off | ---  | ---  | --- | on    |
| ID  | Eh    | off  | ---  | off | on   | ---  | --- | --- | off  | off  | off | ---  | ---  | --- | ---   |
| ID  | En    | off  | ---  | off | on   | ---  | --- | --- | off  | off  | off | ---  | ---  | --- | ---   |
| ENV | Eh    | off  | ---  | off | on   | ---  | --- | --- | off  | off  | --- | ---  | ---  | --- | ---   |
| ENV | En    | off  | ---  | off | on   | ---  | --- | --- | off  | off  | --- | ---  | ---  | --- | ---   |
| F0  | Tcs   | off  | ---  | off | on   | ---  | --- | --- | off  | off  | off | off  | off  | --- | off   |
| F0  | Tl    | off  | ---  | off | on   | ---  | --- | --- | off  | off  | off | off  | off  | --- | off   |
| F0  | Tw    | off  | ---  | off | on   | ---  | --- | --- | off  | off  | off | off  | off  | --- | off   |

| Pos | Plane | swa1 | swb1 | swQ | swa0 | swb0 | swN | swE | swVO | swVI | swC | swHO | swHI | swD | swCON |
|---|---|---|---|---|---|---|---|---|---|---|---|---|---|---|---|
| F0 | Tt | off | --- | off | on | --- | --- | --- | off | off | off | off | off | --- | off |
| F0 | Eh | off | --- | off | on | --- | --- | --- | off | off | off | off | off | --- | --- |
| F0 | En | off | --- | off | on | --- | --- | --- | off | off | off | off | off | --- | --- |
| F1 | Tcs | off | --- | off | on | --- | --- | --- | off | off | off | off | off | --- | off |
| F1 | Tl | off | --- | off | on | --- | --- | --- | off | off | off | off | off | --- | off |
| F1 | Tw | off | --- | off | on | --- | --- | --- | off | off | off | off | off | --- | off |
| F1 | Tt | off | --- | off | on | --- | --- | --- | off | off | off | off | off | --- | off |
| F1 | Eh | off | --- | off | on | --- | --- | --- | off | off | off | off | off | --- | --- |
| F1 | En | off | --- | off | on | --- | --- | --- | off | off | off | off | off | --- | --- |
| F2 | Tcs | off | --- | off | on | --- | --- | --- | off | off | off | off | off | --- | off |
| F2 | Tl | off | --- | off | on | --- | --- | --- | off | off | off | off | off | --- | off |
| F2 | Tw | off | --- | off | on | --- | --- | --- | off | off | off | off | off | --- | off |
| F2 | Tt | off | --- | off | on | --- | --- | --- | off | off | off | off | off | --- | off |
| F2 | Eh | off | --- | off | on | --- | --- | --- | off | off | off | off | off | --- | --- |
| F2 | En | off | --- | off | on | --- | --- | --- | off | off | off | off | off | --- | --- |
| F3 | Tcs | off | --- | off | on | --- | --- | --- | off | off | off | off | off | --- | off |
| F3 | Tl | off | --- | off | on | --- | --- | --- | off | off | off | off | off | --- | off |
| F3 | Tw | off | --- | off | on | --- | --- | --- | off | off | off | off | off | --- | off |
| F3 | Tt | off | --- | off | on | --- | --- | --- | off | off | off | off | off | --- | off |
| F3 | Eh | off | --- | off | on | --- | --- | --- | off | off | off | off | off | --- | --- |
| F3 | En | off | --- | off | on | --- | --- | --- | off | off | off | off | off | --- | --- |
| | | | | | | | | | | | | | | | |
| S0,0 | Tcs | off | off | off | on | off | --- | off | off | off | --- | off | off | --- | --- |
| S0,0 | Tl | off | off | off | on | off | --- | off | off | off | --- | off | off | --- | --- |
| S0,0 | Tw | off | off | off | on | off | --- | off | off | off | --- | off | off | --- | --- |
| S0,0 | Tt | off | off | off | on | off | --- | off | off | off | --- | off | off | --- | --- |
| S0,0 | Eh | off | off | off | on | off | off | off | off | off | --- | off | off | --- | --- |
| S0,0 | En | off | on | off | on | off | off | off | off | off | --- | off | off | --- | --- |
| S0,1 | Eh | off | on | off | on | off | off | off | off | off | --- | off | off | --- | --- |
| S0,1 | En | off | on | off | on | off | off | off | off | off | --- | off | off | --- | --- |
| S0,2 | Eh | off | on | off | on | off | off | off | off | off | --- | off | off | on | --- |
| S0,2 | En | off | on | off | on | off | off | off | off | off | --- | off | off | on | --- |
| S0,3 | Eh | off | on | off | on | off | off | off | off | off | --- | off | off | on | --- |
| S0,3 | En | off | on | off | on | off | off | off | off | off | --- | off | off | on | --- |
| | | | | | | | | | | | | | | | |
| S1,0 | Tcs | off | off | off | on | off | --- | off | off | off | --- | off | off | --- | --- |
| S1,0 | Tl | off | off | off | on | off | --- | off | off | off | --- | off | off | --- | --- |
| S1,0 | Tw | off | off | off | on | off | --- | off | off | off | --- | off | off | --- | --- |
| S1,0 | Tt | off | off | off | on | off | --- | off | off | off | --- | off | off | --- | --- |
| S1,0 | Eh | off | on | off | on | off | off | off | off | off | --- | off | off | on | --- |
| S1,0 | En | off | on | off | on | off | off | off | off | off | --- | off | off | on | --- |
| S1,1 | Eh | off | off | off | on | off | off | off | off | off | --- | off | off | off | --- |
| S1,1 | En | off | off | off | on | off | off | off | off | off | --- | off | off | off | --- |
| S1,2 | Eh | off | on | off | on | off | off | off | off | off | --- | off | off | on | --- |
| S1,2 | En | off | on | off | on | off | off | off | off | off | --- | off | off | on | --- |
| S1,3 | Eh | off | on | off | on | off | off | off | off | off | --- | off | off | on | --- |
| S1,3 | En | off | on | off | on | off | off | off | off | off | --- | off | off | on | --- |
| | | | | | | | | | | | | | | | |
| S2,0 | Tcs | off | off | off | on | off | --- | off | off | off | --- | off | off | --- | --- |
| S2,0 | Tl | off | off | off | on | off | --- | off | off | off | --- | off | off | --- | --- |
| S2,0 | Tw | off | off | off | on | off | --- | off | off | off | --- | off | off | --- | --- |
| S2,0 | Tt | off | off | off | on | off | --- | off | off | off | --- | off | off | --- | --- |
| S2,0 | Eh | off | on | off | on | off | off | off | off | off | --- | off | off | on | --- |
| S2,0 | En | off | on | off | on | off | off | off | off | off | --- | off | off | on | --- |
| S2,1 | Eh | off | on | off | on | off | off | off | off | off | --- | off | off | on | --- |
| S2,1 | En | off | on | off | on | off | off | off | off | off | --- | off | off | on | --- |
| S2,2 | Eh | off | off | off | on | off | off | off | off | off | --- | off | off | on | --- |
| S2,2 | En | off | off | off | on | off | off | off | off | off | --- | off | off | on | --- |
| S2,3 | Eh | off | on | off | on | off | off | off | off | off | --- | off | off | --- | --- |
| S2,3 | En | off | on | off | on | off | off | off | off | off | --- | off | off | --- | --- |
| | | | | | | | | | | | | | | | |
| S3,0 | Tcs | off | off | off | on | off | --- | off | off | off | --- | off | off | --- | --- |
| S3,0 | Tl | off | off | off | on | off | --- | off | off | off | --- | off | off | --- | --- |
| S3,0 | Tw | off | off | off | on | off | --- | off | off | off | --- | off | off | --- | --- |

| Pos | Plane | swa1 | swb1 | swQ | swa0 | swb0 | swN | swE | swVO | swVI | swC | swHO | swHI | swD | swCON |
|---|---|---|---|---|---|---|---|---|---|---|---|---|---|---|---|
| S3,0 | Tt | off | off | off | on | off | --- | off | off | off | --- | off | off | --- | --- |
| S3,0 | Eh | off | on | off | on | off | off | off | off | off | --- | off | off | on | --- |
| S3,0 | En | off | on | off | on | off | off | off | off | off | --- | off | off | on | --- |
| S3,1 | Eh | off | on | off | on | off | off | off | off | off | --- | off | off | off | --- |
| S3,1 | En | off | on | off | on | off | off | off | off | off | --- | off | off | off | --- |
| S3,2 | Eh | off | on | off | on | off | off | off | off | off | --- | off | off | on | --- |
| S3,2 | En | off | on | off | on | off | off | off | off | off | --- | off | off | on | --- |
| S3,3 | Eh | off | on | off | on | off | off | off | off | off | --- | off | off | --- | --- |
| S3,3 | En | off | on | off | on | off | off | off | off | off | --- | off | off | --- | --- |

| Pos | Plane | State |
|---|---|---|
| SWv0,cv | Tcs | off |
| SWv0,cv | Tl | off |
| SWv0,cv | Tw | off |
| SWv0,cv | Tt | off |
| SWv0,cv | Eh | off |
| SWv0,cv | En | off |
| SWv1,cv | Tcs | off |
| SWv1,cv | Tl | off |
| SWv1,cv | Tw | off |
| SWv1,cv | Tt | off |
| SWv1,cv | Eh | off |
| SWv1,cv | En | off |
| SWv2,cv | Tcs | off |
| SWv2,cv | Tl | off |
| SWv2,cv | Tw | off |
| SWv2,cv | Tt | off |
| SWv2,cv | Eh | off |
| SWv2,cv | En | off |
| SWv3,cv | Tcs | off |
| SWv3,cv | Tl | off |
| SWv3,cv | Tw | off |
| SWv3,cv | Tt | off |
| SWv3,cv | Eh | off |
| SWv3,cv | En | off |
| SWch,h0 | Tcs | off |
| SWch,h0 | Tl | off |
| SWch,h0 | Tw | off |
| SWch,h0 | Tt | off |
| SWch,h0 | Eh | off |
| SWch,h0 | En | off |
| SWid,h0 | Tcs | off |
| SWid,h0 | Tl | off |
| SWid,h0 | Tw | off |
| SWid,h0 | Tt | off |
| SWid,h0 | Eh | off |
| SWid,h0 | En | off |
| SWenv,h0 | Eh | off |
| SWenv,h0 | En | off |

| Pos | Plane | State |
|---|---|---|
| SWv0 | Tcs | off |
| SWv0 | Tl | off |
| SWv0 | Tw | off |
| SWv0 | Tt | off |
| SWv0 | Eh | off |
| SWv0 | En | off |
| SWv1,h0 | Tcs | off |
| SWv1,h0 | Tl | off |
| SWv1,h0 | Tw | off |
| SWv1,h0 | Tt | off |
| SWv1,h0 | Eh | off |
| SWv1,h0 | En | off |
| SWv2,h0 | Tcs | off |
| SWv2,h0 | Tl | off |
| SWv2,h0 | Tw | off |
| SWv2,h0 | Tt | off |
| SWv2,h0 | Eh | off |
| SWv2,h0 | En | off |
| SWv3,h0 | Tcs | off |
| SWv3,h0 | Tl | off |
| SWv3,h0 | Tw | off |
| SWv3,h0 | Tt | off |
| SWv3,h0 | Eh | off |
| SWv3,h0 | En | off |
| SWv1 | Tcs | off |
| SWv1 | Tl | off |
| SWv1 | Tw | off |
| SWv1 | Tt | off |
| SWv1 | Eh | off |
| SWv1 | En | off |
| SWv2 | Tcs | off |
| SWv2 | Tl | off |
| SWv2 | Tw | off |
| SWv2 | Tt | off |
| SWv2 | Eh | off |
| SWv2 | En | off |
| SWv3 | Tcs | off |
| SWv3 | Tl | off |
| SWv3 | Tw | off |
| SWv3 | Tt | off |
| SWv3 | Eh | off |
| SWv3 | En | off |

Operation: unify_structure_full, 2 used sons with 3 elements in each son
Phase:     b

| Pos | Plane | swa1 | swb1 | swQ | swa0 | swb0 | swN | swE | swVO | swVI | swC | swHO | swHI | swD | swCON |
|---|---|---|---|---|---|---|---|---|---|---|---|---|---|---|---|
| ID | Tcs | on | --- | off | off | --- | --- | --- | off | on | off | --- | --- | --- | on |
| ID | Tl | on | --- | off | off | --- | --- | --- | off | off | on | --- | --- | --- | on |

| Pos | Plane | swa1 | swb1 | swQ | swa0 | swb0 | swN | swE | swVO | swVI | swC | swHO | swHI | swD | swCON |
|---|---|---|---|---|---|---|---|---|---|---|---|---|---|---|---|
| ID | Tw | on | --- | off | off | --- | --- | --- | off | off | on | --- | --- | --- | on |
| ID | Tt | on | --- | off | off | --- | --- | --- | off | on | off | --- | --- | --- | on |
| ID | Eh | off | --- | off | off | --- | --- | --- | off | on | off | --- | --- | --- | --- |
| ID | En | off | --- | off | off | --- | --- | --- | off | on | off | --- | --- | --- | --- |
| ENV | Eh | off | --- | off | off | --- | --- | --- | off | off | --- | --- | --- | --- | --- |
| ENV | En | off | --- | off | off | --- | --- | --- | off | off | --- | --- | --- | --- | --- |
| F0 | Tcs | off | --- | off | off | --- | --- | --- | off | off | off | off | off | --- | off |
| F0 | Tl | off | --- | off | off | --- | --- | --- | off | off | off | off | off | --- | off |
| F0 | Tw | off | --- | off | off | --- | --- | --- | off | off | off | off | off | --- | off |
| F0 | Tt | off | --- | off | off | --- | --- | --- | off | off | off | off | off | --- | off |
| F0 | Eh | off | --- | off | off | --- | --- | --- | off | off | off | off | off | --- | --- |
| F0 | En | off | --- | off | off | --- | --- | --- | off | off | off | off | off | --- | --- |
| F1 | Tcs | off | --- | off | off | --- | --- | --- | off | off | off | off | off | --- | off |
| F1 | Tl | off | --- | off | off | --- | --- | --- | off | off | off | off | off | --- | off |
| F1 | Tw | off | --- | off | off | --- | --- | --- | off | off | off | off | off | --- | off |
| F1 | Tt | off | --- | off | off | --- | --- | --- | off | off | off | off | off | --- | off |
| F1 | Eh | off | --- | off | off | --- | --- | --- | off | off | off | off | off | --- | --- |
| F1 | En | off | --- | off | off | --- | --- | --- | off | off | off | off | off | --- | --- |
| F2 | Tcs | off | --- | off | off | --- | --- | --- | off | off | off | off | off | --- | off |
| F2 | Tl | off | --- | off | off | --- | --- | --- | off | off | off | off | off | --- | off |
| F2 | Tw | off | --- | off | off | --- | --- | --- | off | off | off | off | off | --- | off |
| F2 | Tt | off | --- | off | off | --- | --- | --- | off | off | off | off | off | --- | off |
| F2 | Eh | off | --- | off | off | --- | --- | --- | off | off | off | off | off | --- | --- |
| F2 | En | off | --- | off | off | --- | --- | --- | off | off | off | off | off | --- | --- |
| F3 | Tcs | off | --- | off | off | --- | --- | --- | off | off | off | off | off | --- | off |
| F3 | Tl | off | --- | off | off | --- | --- | --- | off | off | off | off | off | --- | off |
| F3 | Tw | off | --- | off | off | --- | --- | --- | off | off | off | off | off | --- | off |
| F3 | Tt | off | --- | off | off | --- | --- | --- | off | off | off | off | off | --- | off |
| F3 | Eh | off | --- | off | off | --- | --- | --- | off | off | off | off | off | --- | --- |
| F3 | En | off | --- | off | off | --- | --- | --- | off | off | off | off | off | --- | --- |

| Pos | Plane | swa1 | swb1 | swQ | swa0 | swb0 | swN | swE | swVO | swVI | swC | swHO | swHI | swD | swCON |
|---|---|---|---|---|---|---|---|---|---|---|---|---|---|---|---|
| S0,0 | Tcs | on | off | off | off | on | --- | off | off | on | --- | on | off | --- | --- |
| S0,0 | Tl | on | off | off | off | on | --- | off | off | on | --- | on | off | --- | --- |
| S0,0 | Tw | on | off | off | off | on | --- | off | off | on | --- | on | off | --- | --- |
| S0,0 | Tt | on | off | off | off | on | --- | off | off | on | --- | on | off | --- | --- |
| S0,0 | Eh | off | off | off | off | on | off | off | off | off | --- | on | off | --- | --- |
| S0,0 | En | off | off | off | off | on | off | off | off | off | --- | on | off | --- | --- |
| S0,1 | Eh | on | off | off | off | on | off | off | off | off | --- | on | off | --- | --- |
| S0,1 | En | on | off | off | off | on | off | off | off | off | --- | on | off | --- | --- |
| S0,2 | Eh | off | off | off | off | on | off | off | off | off | --- | on | off | on | --- |
| S0,2 | En | off | off | off | off | on | off | off | off | off | --- | on | off | on | --- |
| S0,3 | Eh | off | off | off | off | on | off | off | off | off | --- | on | off | on | --- |
| S0,3 | En | off | off | off | off | on | off | off | off | off | --- | on | off | on | --- |
| S1,0 | Tcs | on | off | off | off | on | --- | off | off | on | --- | off | off | --- | --- |
| S1,0 | Tl | on | off | off | off | on | --- | off | off | on | --- | off | off | --- | --- |
| S1,0 | Tw | on | off | off | off | on | --- | off | off | on | --- | off | off | --- | --- |
| S1,0 | Tt | on | off | off | off | on | --- | off | off | on | --- | off | off | --- | --- |
| S1,0 | Eh | off | off | off | off | on | off | off | off | off | --- | off | off | on | --- |
| S1,0 | En | off | off | off | off | on | off | off | off | off | --- | off | off | on | --- |
| S1,1 | Eh | off | off | off | off | on | off | off | off | off | --- | off | off | off | --- |
| S1,1 | En | off | off | off | off | on | off | off | off | off | --- | off | off | off | --- |
| S1,2 | Eh | on | off | off | off | on | off | off | off | off | --- | off | off | on | --- |
| S1,2 | En | on | off | off | off | on | off | off | off | off | --- | off | off | on | --- |
| S1,3 | Eh | off | off | off | off | on | off | off | off | off | --- | off | off | on | --- |
| S1,3 | En | off | off | off | off | on | off | off | off | off | --- | off | off | on | --- |
| S2,0 | Tcs | on | off | off | off | on | --- | off | off | on | --- | off | off | --- | --- |
| S2,0 | Tl | on | off | off | off | on | --- | off | off | on | --- | off | off | --- | --- |
| S2,0 | Tw | on | off | off | off | on | --- | off | off | on | --- | off | off | --- | --- |

| Pos | Plane | | | | | | | | | | | | | | |
|---|---|---|---|---|---|---|---|---|---|---|---|---|---|---|---|
| S2,0 | Tt | on | off | off | off | on | --- | off | off | on | --- | off | off | --- | --- |
| S2,0 | Eh | on | off | off | off | on | off | off | off | off | --- | off | off | on | --- |
| S2,0 | En | on | off | off | off | on | off | off | off | off | --- | off | off | on | --- |
| S2,1 | Eh | off | off | off | off | on | off | off | off | off | --- | off | off | on | --- |
| S2,1 | En | off | off | off | off | on | off | off | off | off | --- | off | off | on | --- |
| S2,2 | Eh | off | off | off | off | on | off | off | off | off | --- | off | off | on | --- |
| S2,2 | En | off | off | off | off | on | off | off | off | off | --- | off | off | on | --- |
| S2,3 | Eh | on | off | off | off | on | off | off | off | off | --- | off | off | --- | --- |
| S2,3 | En | on | off | off | off | on | off | off | off | off | --- | off | off | --- | --- |
| S3,0 | Tcs | off | off | off | off | on | --- | off | off | off | --- | off | off | --- | --- |
| S3,0 | Tl | off | off | off | off | on | --- | off | off | off | --- | off | off | --- | --- |
| S3,0 | Tw | off | off | off | off | on | --- | off | off | off | --- | off | off | --- | --- |
| S3,0 | Tt | off | off | off | off | on | --- | off | off | off | --- | off | off | --- | --- |
| S3,0 | Eh | on | off | off | off | on | off | off | off | off | --- | off | off | on | --- |
| S3,0 | En | on | off | off | off | on | off | off | off | off | --- | off | off | on | --- |
| S3,1 | Eh | on | off | off | off | on | off | off | off | off | --- | off | off | off | --- |
| S3,1 | En | on | off | off | off | on | off | off | off | off | --- | off | off | off | --- |
| S3,2 | Eh | off | off | off | off | on | off | off | off | off | --- | off | off | on | --- |
| S3,2 | En | off | off | off | off | on | off | off | off | off | --- | off | off | on | --- |
| S3,3 | Eh | off | off | off | off | on | off | off | off | off | --- | off | off | --- | --- |
| S3,3 | En | off | off | off | off | on | off | off | off | off | --- | off | off | --- | --- |

| Pos | Plane | State |
|---|---|---|
| SWv0,cv | Tcs | on |
| SWv0,cv | Tl | on |
| SWv0,cv | Tw | on |
| SWv0,cv | Tt | on |
| SWv0,cv | Eh | off |
| SWv0,cv | En | off |
| SWv1,cv | Tcs | on |
| SWv1,cv | Tl | on |
| SWv1,cv | Tw | on |
| SWv1,cv | Tt | on |
| SWv1,cv | Eh | off |
| SWv1,cv | En | off |
| SWv2,cv | Tcs | on |
| SWv2,cv | Tl | on |
| SWv2,cv | Tw | on |
| SWv2,cv | Tt | on |
| SWv2,cv | Eh | off |
| SWv2,cv | En | off |
| SWv3,cv | Tcs | on |
| SWv3,cv | Tl | on |
| SWv3,cv | Tw | on |
| SWv3,cv | Tt | on |
| SWv3,cv | Eh | off |
| SWv3,cv | En | off |
| SWch,h0 | Tcs | off |
| SWch,h0 | Tl | off |
| SWch,h0 | Tw | off |
| SWch,h0 | Tt | off |
| SWch,h0 | Eh | off |
| SWch,h0 | En | off |
| SWid,h0 | Tcs | on |
| SWid,h0 | Tl | on |
| SWid,h0 | Tw | on |
| SWid,h0 | Tt | on |
| SWid,h0 | Eh | off |
| SWid,h0 | En | off |
| SWenv,h0 | Eh | off |
| SWenv,h0 | En | off |
| SWv0 | Tcs | off |
| SWv0 | Tl | off |
| SWv0 | Tw | off |
| SWv0 | Tt | off |
| SWv0 | Eh | off |
| SWv0 | En | off |
| SWv1,h0 | Tcs | off |
| SWv1,h0 | Tl | off |
| SWv1,h0 | Tw | off |
| SWv1,h0 | Tt | off |
| SWv1,h0 | Eh | off |
| SWv1,h0 | En | off |
| SWv2,h0 | Tcs | off |
| SWv2,h0 | Tl | off |
| SWv2,h0 | Tw | off |
| SWv2,h0 | Tt | off |
| SWv2,h0 | Eh | off |
| SWv2,h0 | En | off |
| SWv3,h0 | Tcs | off |
| SWv3,h0 | Tl | off |
| SWv3,h0 | Tw | off |
| SWv3,h0 | Tt | off |
| SWv3,h0 | Eh | off |
| SWv3,h0 | En | off |
| SWv1 | Tcs | off |
| SWv1 | Tl | off |
| SWv1 | Tw | off |
| SWv1 | Tt | off |
| SWv1 | Eh | off |
| SWv1 | En | off |
| SWv2 | Tcs | off |
| SWv2 | Tl | off |
| SWv2 | Tw | off |
| SWv2 | Tt | off |
| SWv2 | Eh | off |
| SWv2 | En | off |
| SWv3 | Tcs | off |
| SWv3 | Tl | off |
| SWv3 | Tw | off |
| SWv3 | Tt | off |
| SWv3 | Eh | off |
| SWv3 | En | off |

Operation: unify_structure_full, 2 used sons with 3 elements in each son
Phase:    0

| Pos | Plane | swa1 | swb1 | swQ | swa0 | swb0 | swN | swE | swVO | swVI | swC | swHO | swHI | swD | swCON |
|-----|-------|------|------|-----|------|------|-----|-----|------|------|-----|------|------|-----|-------|
| ID  | Tcs   | on   | ---  | on  | on   | ---  | --- | --- | off  | off  | off | ---  | ---  | --- | on    |
| ID  | Tl    | on   | ---  | on  | on   | ---  | --- | --- | off  | off  | off | ---  | ---  | --- | on    |
| ID  | Tw    | on   | ---  | on  | on   | ---  | --- | --- | off  | off  | off | ---  | ---  | --- | on    |
| ID  | Tt    | on   | ---  | on  | on   | ---  | --- | --- | off  | off  | off | ---  | ---  | --- | on    |
| ID  | Eh    | on   | ---  | on  | on   | ---  | --- | --- | off  | off  | off | ---  | ---  | --- | ---   |
| ID  | En    | on   | ---  | on  | on   | ---  | --- | --- | off  | off  | off | ---  | ---  | --- | ---   |
| ENV | Eh    | on   | ---  | on  | on   | ---  | --- | --- | off  | off  | --- | ---  | ---  | --- | ---   |
| ENV | En    | on   | ---  | on  | on   | ---  | --- | --- | off  | off  | --- | ---  | ---  | --- | ---   |
| F0  | Tcs   | on   | ---  | on  | on   | ---  | --- | --- | off  | off  | off | off  | off  | --- | off   |
| F0  | Tl    | on   | ---  | on  | on   | ---  | --- | --- | off  | off  | off | off  | off  | --- | off   |
| F0  | Tw    | on   | ---  | on  | on   | ---  | --- | --- | off  | off  | off | off  | off  | --- | off   |
| F0  | Tt    | on   | ---  | on  | on   | ---  | --- | --- | off  | off  | off | off  | off  | --- | off   |
| F0  | Eh    | on   | ---  | on  | on   | ---  | --- | --- | off  | off  | off | off  | off  | --- | ---   |
| F0  | En    | on   | ---  | on  | on   | ---  | --- | --- | off  | off  | off | off  | off  | --- | ---   |
| F1  | Tcs   | on   | ---  | on  | on   | ---  | --- | --- | off  | off  | off | off  | off  | --- | off   |
| F1  | Tl    | on   | ---  | on  | on   | ---  | --- | --- | off  | off  | off | off  | off  | --- | off   |
| F1  | Tw    | on   | ---  | on  | on   | ---  | --- | --- | off  | off  | off | off  | off  | --- | off   |
| F1  | Tt    | on   | ---  | on  | on   | ---  | --- | --- | off  | off  | off | off  | off  | --- | off   |
| F1  | Eh    | on   | ---  | on  | on   | ---  | --- | --- | off  | off  | off | off  | off  | --- | ---   |
| F1  | En    | on   | ---  | on  | on   | ---  | --- | --- | off  | off  | off | off  | off  | --- | ---   |
| F2  | Tcs   | on   | ---  | on  | on   | ---  | --- | --- | off  | off  | off | off  | off  | --- | off   |
| F2  | Tl    | on   | ---  | on  | on   | ---  | --- | --- | off  | off  | off | off  | off  | --- | off   |
| F2  | Tw    | on   | ---  | on  | on   | ---  | --- | --- | off  | off  | off | off  | off  | --- | off   |
| F2  | Tt    | on   | ---  | on  | on   | ---  | --- | --- | off  | off  | off | off  | off  | --- | off   |
| F2  | Eh    | on   | ---  | on  | on   | ---  | --- | --- | off  | off  | off | off  | off  | --- | ---   |
| F2  | En    | on   | ---  | on  | on   | ---  | --- | --- | off  | off  | off | off  | off  | --- | ---   |
| F3  | Tcs   | on   | ---  | on  | on   | ---  | --- | --- | off  | off  | off | off  | off  | --- | off   |
| F3  | Tl    | on   | ---  | on  | on   | ---  | --- | --- | off  | off  | off | off  | off  | --- | off   |
| F3  | Tw    | on   | ---  | on  | on   | ---  | --- | --- | off  | off  | off | off  | off  | --- | off   |
| F3  | Tt    | on   | ---  | on  | on   | ---  | --- | --- | off  | off  | off | off  | off  | --- | off   |
| F3  | Eh    | on   | ---  | on  | on   | ---  | --- | --- | off  | off  | off | off  | off  | --- | ---   |
| F3  | En    | on   | ---  | on  | on   | ---  | --- | --- | off  | off  | off | off  | off  | --- | ---   |

| Pos  | Plane | swa1 | swb1 | swQ | swa0 | swb0 | swN | swE | swVO | swVI | swC | swHO | swHI | swD | swCON |
|------|-------|------|------|-----|------|------|-----|-----|------|------|-----|------|------|-----|-------|
| S0,0 | Tcs   | on   | on   | on  | on   | on   | --- | off | off  | off  | --- | off  | off  | --- | ---   |
| S0,0 | Tl    | on   | on   | on  | on   | on   | --- | off | off  | off  | --- | off  | off  | --- | ---   |
| S0,0 | Tw    | on   | on   | on  | on   | on   | --- | off | off  | off  | --- | off  | off  | --- | ---   |
| S0,0 | Tt    | on   | on   | on  | on   | on   | --- | off | off  | off  | --- | off  | off  | --- | ---   |
| S0,0 | Eh    | on   | on   | on  | on   | on   | off | off | off  | off  | --- | off  | off  | --- | ---   |
| S0,0 | En    | on   | on   | on  | on   | on   | off | off | off  | off  | --- | off  | off  | --- | ---   |
| S0,1 | Eh    | on   | on   | on  | on   | on   | off | off | off  | off  | --- | off  | off  | --- | ---   |
| S0,1 | En    | on   | on   | on  | on   | on   | off | off | off  | off  | --- | off  | off  | --- | ---   |
| S0,2 | Eh    | on   | on   | on  | on   | on   | off | off | off  | off  | --- | off  | off  | off | ---   |
| S0,2 | En    | on   | on   | on  | on   | on   | off | off | off  | off  | --- | off  | off  | off | ---   |
| S0,3 | Eh    | on   | on   | on  | on   | on   | off | off | off  | off  | --- | off  | off  | off | ---   |
| S0,3 | En    | on   | on   | on  | on   | on   | off | off | off  | off  | --- | off  | off  | off | ---   |
| S1,0 | Tcs   | on   | on   | on  | on   | on   | --- | off | off  | off  | --- | off  | off  | --- | ---   |
| S1,0 | Tl    | on   | on   | on  | on   | on   | --- | off | off  | off  | --- | off  | off  | --- | ---   |
| S1,0 | Tw    | on   | on   | on  | on   | on   | --- | off | off  | off  | --- | off  | off  | --- | ---   |
| S1,0 | Tt    | on   | on   | on  | on   | on   | --- | off | off  | off  | --- | off  | off  | --- | ---   |
| S1,0 | Eh    | on   | on   | on  | on   | on   | off | off | off  | off  | --- | off  | off  | off | ---   |
| S1,0 | En    | on   | on   | on  | on   | on   | off | off | off  | off  | --- | off  | off  | off | ---   |
| S1,1 | Eh    | on   | on   | on  | on   | on   | off | off | off  | off  | --- | off  | off  | off | ---   |
| S1,1 | En    | on   | on   | on  | on   | on   | off | off | off  | off  | --- | off  | off  | off | ---   |
| S1,2 | Eh    | on   | on   | on  | on   | on   | off | off | off  | off  | --- | off  | off  | off | ---   |

| Pos | Plane | | | | | | | | | | | | | |
|---|---|---|---|---|---|---|---|---|---|---|---|---|---|---|
| S1,2 | En | on | on | on | on | on | off | off | off | off | --- | off | off | off | --- |
| S1,3 | Eh | on | on | on | on | on | off | off | off | off | --- | off | off | off | --- |
| S1,3 | En | on | on | on | on | on | off | off | off | off | --- | off | off | off | --- |
| S2,0 | Tcs | on | on | on | on | on | --- | off | off | off | --- | off | off | --- | --- |
| S2,0 | Tl | on | on | on | on | on | --- | off | off | off | --- | off | off | --- | --- |
| S2,0 | Tw | on | on | on | on | on | --- | off | off | off | --- | off | off | --- | --- |
| S2,0 | Tt | on | on | on | on | on | --- | off | off | off | --- | off | off | --- | --- |
| S2,0 | Eh | on | on | on | on | on | off | off | off | off | --- | off | off | off | --- |
| S2,0 | En | on | on | on | on | on | off | off | off | off | --- | off | off | off | --- |
| S2,1 | Eh | on | on | on | on | on | off | off | off | off | --- | off | off | off | --- |
| S2,1 | En | on | on | on | on | on | off | off | off | off | --- | off | off | off | --- |
| S2,2 | Eh | on | on | on | on | on | off | off | off | off | --- | off | off | off | --- |
| S2,2 | En | on | on | on | on | on | off | off | off | off | --- | off | off | off | --- |
| S2,3 | Eh | on | on | on | on | on | off | off | off | off | --- | off | off | --- | --- |
| S2,3 | En | on | on | on | on | on | off | off | off | off | --- | off | off | --- | --- |
| S3,0 | Tcs | on | on | on | on | on | --- | off | off | off | --- | off | off | --- | --- |
| S3,0 | Tl | on | on | on | on | on | --- | off | off | off | --- | off | off | --- | --- |
| S3,0 | Tw | on | on | on | on | on | --- | off | off | off | --- | off | off | --- | --- |
| S3,0 | Tt | on | on | on | on | on | --- | off | off | off | --- | off | off | --- | --- |
| S3,0 | Eh | on | on | on | on | on | off | off | off | off | --- | off | off | off | --- |
| S3,0 | En | on | on | on | on | on | off | off | off | off | --- | off | off | off | --- |
| S3,1 | Eh | on | on | on | on | on | off | off | off | off | --- | off | off | off | --- |
| S3,1 | En | on | on | on | on | on | off | off | off | off | --- | off | off | off | --- |
| S3,2 | Eh | on | on | on | on | on | off | off | off | off | --- | off | off | off | --- |
| S3,2 | En | on | on | on | on | on | off | off | off | off | --- | off | off | off | --- |
| S3,3 | Eh | on | on | on | on | on | off | off | off | off | --- | off | off | --- | --- |
| S3,3 | En | on | on | on | on | on | off | off | off | off | --- | off | off | --- | --- |

| Pos | Plane | State |
|---|---|---|
| SWv0,cv | Tcs | off |
| SWv0,cv | Tl | off |
| SWv0,cv | Tw | off |
| SWv0,cv | Tt | off |
| SWv0,cv | Eh | off |
| SWv0,cv | En | off |
| SWv1,cv | Tcs | off |
| SWv1,cv | Tl | off |
| SWv1,cv | Tw | off |
| SWv1,cv | Tt | off |
| SWv1,cv | Eh | off |
| SWv1,cv | En | off |
| SWv2,cv | Tcs | off |
| SWv2,cv | Tl | off |
| SWv2,cv | Tw | off |
| SWv2,cv | Tt | off |
| SWv2,cv | Eh | off |
| SWv2,cv | En | off |
| SWv3,cv | Tcs | off |
| SWv3,cv | Tl | off |
| SWv3,cv | Tw | off |
| SWv3,cv | Tt | off |
| SWv3,cv | Eh | off |
| SWv3,cv | En | off |
| SWch,h0 | Tcs | off |
| SWch,h0 | Tl | off |
| SWch,h0 | Tw | off |
| SWch,h0 | Tt | off |
| SWch,h0 | Eh | off |
| SWch,h0 | En | off |
| SWid,h0 | Tcs | off |

| Pos | Plane | State |
|---|---|---|
| SWv0 | Tcs | off |
| SWv0 | Tl | off |
| SWv0 | Tw | off |
| SWv0 | Tt | off |
| SWv0 | Eh | off |
| SWv0 | En | off |
| SWv1,h0 | Tcs | off |
| SWv1,h0 | Tl | off |
| SWv1,h0 | Tw | off |
| SWv1,h0 | Tt | off |
| SWv1,h0 | Eh | off |
| SWv1,h0 | En | off |
| SWv2,h0 | Tcs | off |
| SWv2,h0 | Tl | off |
| SWv2,h0 | Tw | off |
| SWv2,h0 | Tt | off |
| SWv2,h0 | Eh | off |
| SWv2,h0 | En | off |
| SWv3,h0 | Tcs | off |
| SWv3,h0 | Tl | off |
| SWv3,h0 | Tw | off |
| SWv3,h0 | Tt | off |
| SWv3,h0 | Eh | off |
| SWv3,h0 | En | off |
| SWv1 | Tcs | off |
| SWv1 | Tl | off |
| SWv1 | Tw | off |
| SWv1 | Tt | off |
| SWv1 | Eh | off |
| SWv1 | En | off |
| SWv2 | Tcs | off |
| SWv2 | Tl | off |

| | | | | | |
|---|---|---|---|---|---|
| SWid,h0 | Tl | off | SWv2 | Tw | off |
| SWid,h0 | Tw | off | SWv2 | Tt | off |
| SWid,h0 | Tt | off | SWv2 | Eh | off |
| SWid,h0 | Eh | off | SWv2 | En | off |
| SWid,h0 | En | off | SWv3 | Tcs | off |
| SWenv,h0 | Eh | off | SWv3 | Tl | off |
| SWenv,h0 | En | off | SWv3 | Tw | off |
| | | | SWv3 | Tt | off |
| | | | SWv3 | Eh | off |
| | | | SWv3 | En | off |

Plane abbreviations
==========================

| Abbr | Name | Number of bits |
|---|---|---|
| Tcs | clos/simple | 1 |
| Tl | lazy | 2 |
| Tw | where | 1 |
| Tt | type (form+tag) | 5 |
| Eh | head | 6 |
| En | num | 32 |

APPENDIX 2

Integer multiplication control case 1
---------------- state, sense wires - condition 1

```
cmp_prec        X
cmp01           (X, X)
cmp12           (X, X)
cmp23           (X, X)
cmp_exp12       (X, X)
insig1          ((X, X), (1, X), (X, X))
insig2          ((X, X), (X, X), (X, X))
insig3          ((X, X), (X, X), (X, X))
sign1           (1, X, X, X)
sign2           (X, X, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 0; 0; 0; 0; 0; 0; 1]
``` state, sense wires - condition 2

| | |
|---|---|
| cmp_prec | X |
| cmp01 | (X, X) |
| cmp12 | (X, X) |
| cmp23 | (X, X) |
| cmp_exp12 | (X, X) |
| insig1 | ((X, X), (X, X), (X, X)) |
| insig2 | ((X, X), (1, X), (X, X)) |
| insig3 | ((X, X), (X, X), (X, X)) |
| sign1 | (X, X, X, X) |
| sign2 | (1, X, X, X) |
| sign3 | (X, X, X, X) |
| gr_i1 | (X, X, X) |
| c_ei1 | X |
| gr_d1 | (X, X, X) |
| c_ed1 | X |
| co_limit1 | (X, X) |
| gr_i2 | (X, X, X) |
| c_ei2 | X |
| gr_d2 | (X, X, X) |
| c_ed2 | X |
| co_limit2 | (X, X) |
| gr_a1 | (X, X, X) |
| gr_a2 | (X, X, X) |
| gr_a3 | (X, X, X) |
| | |
| ins | [1; 0; 0; 0; 0; 0; 0; 0; 1] | micro instruction wires

| | |
|---|---|
| c1 | |
| c1_1 | (0, 0, 0, 0, 1, 0) |
| c1_2 | [(0, 1); (0, 1); (1, 0); (0, 1)] |
| c1_3 | [(0, 1); (0, 1); (0, 1); (0, 1); (1, 0)] |
| c1_4 | [(0, 1); (0, 1); (0, 1); (0, 1); (0, 1); (1, 0)] |
| c1_5 | [(0, 1); (1, 0); (0, 1)] |
| c1_6 | [(1, 0); (0, 1); (0, 1); (0, 1); (0, 1)] |
| c1_7 | (0, [(0, 1); (1, 0)], [0; 0]) |
| c1_8 | (0, [(0, 1); (1, 0)], [0; 0; 0; 0]) |
| c1_10 | [0; 0; 0; 0; 1] |
| | |
| c2 | |
| c2_1 | (0, 0, 0, 1, 0, 0) |
| c2_2 | [(0, 1); (0, 1); (1, 0); (0, 1)] |
| c2_3 | [(0, 1); (0, 1); (0, 1); (0, 1); (1, 0)] |
| c2_4 | [(0, 1); (0, 1); (1, 0); (0, 1); (0, 1); (0, 1)] |
| c2_5 | [(0, 1); (1, 0); (0, 1)] |
| c2_6 | [(1, 0); (0, 1); (0, 1); (0, 1); (0, 1)] |
| c2_7 | (0, [(0, 1); (1, 0)], [0; 0]) |
| c2_8 | (0, [(0, 1); (1, 0)], [0; 0; 0; 0]) |
| c2_10 | [0; 0; 0; 0; 1] |
| | |
| c3 | |
| c3_1 | (1, 0) |
| c3_2 | [(0, 1); (0, 1); (1, 0); (0, 1); (0, 1); (0, 1)] |
| c3_3 | (0, [(0, 1); (1, 0)], [0; 0]) |
| c3_4 | [0; 0; 0; 0; 1] |
| c3_5 | ([(1, 0); (0, 1)], 0) |
| | |
| c4 | (0, 1) |
| | |
| c5 | (0, 0, 0) |

```
control case 2
--------------- state, sense wires - condition 1 cmp_prec          X
cmp01             (X, X)
cmp12             (X, X)
cmp23             (X, X)
cmp_exp12         (X, X)
insig1            ((X, X), (X, X), (X, X))
insig2            ((X, X), (X, X), (X, X))
insig3            ((X, X), (X, X), (X, X))
sign1             (0, X, X, X)
sign2             (0, X, X, X)
sign3             (X, X, X, X)
gr_i1             (X, X, X)
c_ei1             X
gr_d1             (X, X, X)
c_ed1             X
co_limit1         (X, X)
gr_i2             (X, X, X)
c_ei2             X
gr_d2             (X, X, X)
c_ed2             X
co_limit2         (X, X)
gr_a1             (X, X, X)
gr_a2             (X, X, X)
gr_a3             (X, X, X)

ins               [1; 0; 0; 0; 0; 0; 0; 0; 1]

state, sense wires - condition 2 cmp_prec          X
cmp01             (X, X)
cmp12             (X, X)
cmp23             (X, X)
cmp_exp12         (X, X)
insig1            ((X, X), (X, X), (X, X))
insig2            ((X, X), (0, X), (X, X))
insig3            ((X, X), (X, X), (X, X))
sign1             (0, X, X, X)
sign2             (X, X, X, X)
sign3             (X, X, X, X)
gr_i1             (X, X, X)
c_ei1             X
gr_d1             (X, X, X)
c_ed1             X
co_limit1         (X, X)
gr_i2             (X, X, X)
c_ei2             X
gr_d2             (X, X, X)
c_ed2             X
co_limit2         (X, X)
gr_a1             (X, X, X)
gr_a2             (X, X, X)
gr_a3             (X, X, X)

ins               [1; 0; 0; 0; 0; 0; 0; 0; 1]

state, sense wires - condition 3 cmp_prec          X
cmp01             (X, X)
cmp12             (X, X)
cmp23             (X, X)
```

```
cmp23           (X, X)
cmp_exp12       (X, X)
insig1          ((X, X), (0, X), (X, X))
insig2          ((X, X), (X, X), (X, X))
insig3          ((X, X), (X, X), (X, X))
sign1           (X, X, X, X)
sign2           (0, X, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 0; 0; 0; 0; 0; 0; 0; 1]

state, sense wires - condition 4 cmp_prec        X
cmp01           (X, X)
cmp12           (X, X)
cmp23           (X, X)
cmp_exp12       (X, X)
insig1          ((X, X), (0, X), (X, X))
insig2          ((X, X), (0, X), (X, X))
insig3          ((X, X), (X, X), (X, X))
sign1           (X, X, X, X)
sign2           (X, X, X, X)
sign3           (X, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 0; 0; 0; 0; 0; 0; 0; 1]

micro instruction wires c1
c1_1            (0, 0, 0, 0, 1, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (0, 1); (0, 1); (0, 1); (1, 0)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]
c2
c2_1            (0, 0, 0, 0, 1, 0)
```

```
c2_2           [(0, 1); (0, 1); (1, 0); (0, 1)]
c2_3           [(0, 1); (0, 1); (0, 1); (0, 1); (1, 0)]
c2_4           [(0, 1); (0, 1); (1, 0); (0, 1); (0, 1); (0, 1)]
c2_5           [(0, 1); (1, 0); (0, 1)]
c2_6           [(0, 1); (1, 0); (0, 1); (0, 1); (0, 1)]
c2_7           (0, [(0, 1); (1, 0)], [0; 0])
c2_8           (0, [(0, 1); (1, 0)], [0; 0; 0; 0])
c2_10          [0; 0; 0; 0; 1]

c3
c3_1           (1, 0)
c3_2           [(1, 0); (0, 1); (0, 1); (0, 1); (0, 1); (0, 1)]
c3_3           (0, [(0, 1); (1, 0)], [0; 0])
c3_4           [0; 0; 0; 0; 1]
c3_5           ([(1, 0); (0, 1)], 0)

c4             (0, 1)

c5             (0, 0, 0)

control case 3
--------------- state, sense wires - condition 1 cmp_prec       X
cmp01          (X, X)
cmp12          (X, X)
cmp23          (X, X)
cmp_exp12      (X, X)
insig1         ((X, X), (X, X), (X, X))
insig2         ((X, X), (X, X), (X, X))
insig3         ((X, X), (1, X), (X, X))
sign1          (X, X, X, X)
sign2          (X, X, X, X)
sign3          (1, X, X, X)
gr_i1          (X, X, X)
c_ei1          X
gr_d1          (X, X, X)
c_ed1          X
co_limit1      (X, X)
gr_i2          (X, X, X)
c_ei2          X
gr_d2          (X, X, X)
c_ed2          X
co_limit2      (X, X)
gr_a1          (X, X, X)
gr_a2          (X, X, X)
gr_a3          (X, X, X)

ins            [1; 1; 0; 0; 0; 0; 0; 0; 1]

state, sense wires - condition 2 cmp_prec       X
cmp01          (X, X)
cmp12          (X, X)
cmp23          (X, X)
cmp_exp12      (X, X)
insig1         ((X, X), (X, X), (X, X))
insig2         ((X, X), (X, X), (X, X))
insig3         ((X, X), (1, X), (X, X))
sign1          (X, X, X, X)
sign2          (X, X, X, X)
sign3          (1, X, X, X)
gr_i1          (X, X, X)
```

```
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 0; 1; 0; 0; 0; 0; 0; 1]

micro instruction wires c1
c1_1            (0, 0, 0, 1, 0, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 0)

control case 4
--------------- state, sense wires cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (0, X), (X, X))
sign1           (X, X, X, X)
sign2           (X, X, X, X)
sign3           (1, X, X, 0)
```

```
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 1; 0; 0; 0; 0; 0; 0; 1]

micro instruction wires c1
c1_1            (0, 0, 0, 1, 0, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 0, 1, 0)
c2_2            [(0, 1); (0, 1); (1, 0); (0, 1)]
c2_3            [(0, 1); (0, 1); (0, 1); (0, 1); (1, 0)]
c2_4            [(0, 1); (1, 0); (0, 1); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (0, 1); (1, 0); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 0)

control case 5
--------------- state, sense wires - condition 1 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (0, X), (X, X))
sign1           (X, X, X, X)
sign2           (1, X, X, X)
```

```
sign3         (1, X, X, 1)
gr_i1         (X, X, X)
c_ei1         X
gr_d1         (X, X, X)
c_ed1         X
co_limit1     (X, X)
gr_i2         (X, X, X)
c_ei2         X
gr_d2         (X, X, X)
c_ed2         X
co_limit2     (X, X)
gr_a1         (X, 1, X)
gr_a2         (X, X, X)
gr_a3         (X, X, X)

ins           [1; 1; 0; 0; 0; 0; 0; 0; 1]

state, sense wires - condition 2 cmp_prec      X
cmp01         (X, X)
cmp12         (X, X)
cmp23         (X, X)
cmp_exp12     (X, X)
insig1        ((X, X), (X, X), (X, X))
insig2        ((X, X), (X, X), (X, X))
insig3        ((X, X), (X, 1), (X, X))
sign1         (X, X, X, X)
sign2         (0, X, X, X)
sign3         (0, X, X, X)
gr_i1         (X, X, X)
c_ei1         X
gr_d1         (X, X, X)
c_ed1         X
co_limit1     (X, X)
gr_i2         (X, X, X)
c_ei2         X
gr_d2         (X, X, X)
c_ed2         X
co_limit2     (X, X)
gr_a1         (X, X, X)
gr_a2         (X, 1, X)
gr_a3         (X, X, X)

ins           [1; 1; 0; 0; 0; 0; 0; 0; 1]

state, sense wires - condition 3 cmp_prec      X
cmp01         (X, X)
cmp12         (X, X)
cmp23         (X, X)
cmp_exp12     (X, X)
insig1        ((X, X), (X, X), (X, X))
insig2        ((X, X), (X, X), (X, X))
insig3        ((X, X), (X, 0), (X, X))
sign1         (X, X, X, X)
sign2         (0, X, X, X)
sign3         (0, X, X, 0)
gr_i1         (X, X, X)
c_ei1         X
gr_d1         (X, X, X)
c_ed1         X
co_limit1     (X, X)
gr_i2         (X, X, X)
c_ei2         X
gr_d2         (X, X, X)
```

```
c_ed2              X
co_limit2          (X, X)
gr_a1              (X, X, X)
gr_a2              (X, 1, X)
gr_a3              (X, X, X)

ins                [1; 1; 0; 0; 0; 0; 0; 0; 1]

state, sense wires - condition 4 cmp_prec           X
cmp01              (X, X)
cmp12              (X, X)
cmp23              (X, X)
cmp_exp12          (X, X)
insig1             ((X, X), (X, X), (X, X))
insig2             ((X, X), (X, X), (X, X))
insig3             ((X, X), (0, X), (X, X))
sign1              (X, X, X, X)
sign2              (1, X, X, X)
sign3              (1, X, X, X)
gr_i1              (X, X, X)
c_ei1              X
gr_d1              (X, X, X)
c_ed1              X
co_limit1          (X, X)
gr_i2              (X, X, X)
c_ei2              X
gr_d2              (X, X, X)
c_ed2              X
co_limit2          (X, X)
gr_a1              (X, X, X)
gr_a2              (X, X, X)
gr_a3              (X, X, X)

ins                [1; 0; 1; 0; 0; 0; 0; 0; 1]

state, sense wires - condition 5 cmp_prec           X
cmp01              (X, X)
cmp12              (X, X)
cmp23              (X, X)
cmp_exp12          (X, X)
insig1             ((X, X), (X, X), (X, X))
insig2             ((X, X), (X, X), (X, X))
insig3             ((X, X), (X, X), (X, X))
sign1              (X, X, X, X)
sign2              (0, X, X, X)
sign3              (0, X, X, X)
gr_i1              (X, X, X)
c_ei1              X
gr_d1              (X, X, X)
c_ed1              X
co_limit1          (X, X)
gr_i2              (X, X, X)
c_ei2              X
gr_d2              (X, X, X)
c_ed2              X
co_limit2          (X, X)
gr_a1              (X, X, X)
gr_a2              (X, X, X)
gr_a3              (X, X, X)

ins                [1; 0; 1; 0; 0; 0; 0; 0; 1]

micro instruction wires
```

```
c1
c1_1         (0, 0, 0, 0, 1, 0)
c1_2         [(0, 1); (0, 1); (1, 0); (0, 1)]
c1_3         [(0, 1); (0, 1); (0, 1); (0, 1); (1, 0)]
c1_4         [(0, 1); (0, 1); (0, 1); (0, 1); (0, 1); (1, 0)]
c1_5         [(0, 1); (1, 0); (0, 1)]
c1_6         [(1, 0); (0, 1); (0, 1); (0, 1); (0, 1)]
c1_7         (0, [(0, 1); (1, 0)], [0; 0])
c1_8         (0, [(0, 1); (1, 0)], [0; 0; 0; 0])
c1_10        [1; 1; 1; 1; 1]

c2
c2_1         (0, 0, 0, 1, 0, 0)
c2_2         [(0, 1); (0, 1); (1, 0); (0, 1)]
c2_3         [(0, 1); (0, 1); (0, 1); (0, 1); (1, 0)]
c2_4         [(0, 1); (0, 1); (1, 0); (0, 1); (0, 1); (0, 1)]
c2_5         [(0, 1); (1, 0); (0, 1)]
c2_6         [(1, 0); (0, 1); (0, 1); (0, 1); (0, 1)]
c2_7         (0, [(0, 1); (1, 0)], [0; 0])
c2_8         (0, [(0, 1); (1, 0)], [0; 0; 0; 0])
c2_10        [0; 0; 0; 0; 1]

c3
c3_1         (1, 0)
c3_2         [(0, 1); (0, 1); (1, 0); (0, 1); (0, 1); (0, 1)]
c3_3         (0, [(0, 1); (1, 0)], [0; 0])
c3_4         [0; 0; 0; 0; 1]
c3_5         ([(1, 0); (0, 1)], 0)

c4           (0, 1)

c5           (0, 0, 0)

control case 6
--------------- state, sense wires - condition 1 cmp_prec     X
cmp01        (X, X)
cmp12        (X, X)
cmp23        (X, X)
cmp_exp12    (X, X)
insig1       ((X, X), (X, X), (X, X))
insig2       ((X, X), (X, X), (X, X))
insig3       ((X, X), (0, X), (X, X))
sign1        (X, X, X, X)
sign2        (0, X, X, X)
sign3        (1, X, X, 1)
gr_i1        (X, X, X)
c_ei1        X
gr_d1        (X, X, X)
c_ed1        X
co_limit1    (X, X)
gr_i2        (X, X, X)
c_ei2        X
gr_d2        (X, X, X)
c_ed2        X
co_limit2    (X, X)
gr_a1        (X, 0, X)
gr_a2        (X, X, X)
gr_a3        (X, X, X)

ins          [1; 1; 0; 0; 0; 0; 0; 0; 1]
``` state, sense wires - condition 2

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 1), (X, X))
sign1           (X, X, X, X)
sign2           (1, X, X, X)
sign3           (0, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 0, X)
gr_a3           (X, X, X)

ins             [1; 1; 0; 0; 0; 0; 0; 0; 1]
``` state, sense wires - condition 3

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 0), (X, X))
sign1           (X, X, X, X)
sign2           (1, X, X, X)
sign3           (0, X, X, 0)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 0, X)
gr_a3           (X, X, X)

ins             [1; 1; 0; 0; 0; 0; 0; 0; 1]
``` state, sense wires - condition 4

```
cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
```

```
insig3        ((X, X), (0, X), (X, X))
sign1         (X, X, X, X)
sign2         (0, X, X, X)
sign3         (1, X, X, X)
gr_i1         (X, X, X)
c_ei1         X
gr_d1         (X, X, X)
c_ed1         X
co_limit1     (X, X)
gr_i2         (X, X, X)
c_ei2         X
gr_d2         (X, X, X)
c_ed2         X
co_limit2     (X, X)
gr_a1         (X, X, X)
gr_a2         (X, X, X)
gr_a3         (X, X, X)

ins           [1; 0; 1; 0; 0; 0; 0; 0; 1]

state, sense wires - condition 5 cmp_prec      X
cmp01         (X, X)
cmp12         (X, X)
cmp23         (X, X)
cmp_exp12     (X, X)
insig1        ((X, X), (X, X), (X, X))
insig2        ((X, X), (X, X), (X, X))
insig3        ((X, X), (X, X), (X, X))
sign1         (X, X, X, X)
sign2         (1, X, X, X)
sign3         (0, X, X, X)
gr_i1         (X, X, X)
c_ei1         X
gr_d1         (X, X, X)
c_ed1         X
co_limit1     (X, X)
gr_i2         (X, X, X)
c_ei2         X
gr_d2         (X, X, X)
c_ed2         X
co_limit2     (X, X)
gr_a1         (X, X, X)
gr_a2         (X, X, X)
gr_a3         (X, X, X)

ins           [1; 0; 1; 0; 0; 0; 0; 0; 1]

micro instruction wires c1
c1_1          (0, 0, 0, 0, 1, 0)
c1_2          [(0, 1); (0, 1); (1, 0); (0, 1)]
c1_3          [(0, 1); (0, 1); (0, 1); (0, 1); (1, 0)]
c1_4          [(0, 1); (0, 1); (0, 1); (0, 1); (0, 1); (1, 0)]
c1_5          [(0, 1); (1, 0); (0, 1)]
c1_6          [(1, 0); (0, 1); (0, 1); (0, 1); (0, 1)]
c1_7          (0, [(0, 1); (1, 0)], [0; 0])
c1_8          (0, [(0, 1); (1, 0)], [0; 0; 0; 0])
c1_10         [0; 0; 0; 0; 0]

c2
c2_1          (0, 0, 0, 1, 0, 0)
c2_2          [(0, 1); (0, 1); (1, 0); (0, 1)]
c2_3          [(0, 1); (0, 1); (0, 1); (0, 1); (1, 0)]
c2_4          [(0, 1); (0, 1); (1, 0); (0, 1); (0, 1); (0, 1)]
```

```
c2_5         [(0, 1); (1, 0); (0, 1)]
c2_6         [(1, 0); (0, 1); (0, 1); (0, 1); (0, 1)]
c2_7         (0, [(0, 1); (1, 0)], [0; 0])
c2_8         (0, [(0, 1); (1, 0)], [0; 0; 0; 0])
c2_10        [0; 0; 0; 0; 1]

c3
c3_1         (1, 0)
c3_2         [(0, 1); (0, 1); (1, 0); (0, 1); (0, 1); (0, 1)]
c3_3         (0, [(0, 1); (1, 0)], [0; 0])
c3_4         [0; 0; 0; 0; 1]
c3_5         ([(1, 0); (0, 1)], 0)

c4           (0, 1)

c5           (0, 0, 0)

control case 7
---------------- state, sense wires - condition 1 cmp_prec     X
cmp01        (X, X)
cmp12        (X, X)
cmp23        (X, X)
cmp_exp12    (X, X)
insig1       ((X, X), (X, X), (X, X))
insig2       ((X, X), (X, X), (X, X))
insig3       ((X, X), (0, X), (X, X))
sign1        (X, X, X, X)
sign2        (0, X, X, X)
sign3        (1, X, X, 1)
gr_i1        (X, X, X)
c_ei1        X
gr_d1        (X, X, X)
c_ed1        X
co_limit1    (X, X)
gr_i2        (X, X, X)
c_ei2        X
gr_d2        (X, X, X)
c_ed2        X
co_limit2    (X, X)
gr_a1        (X, 1, X)
gr_a2        (X, X, X)
gr_a3        (X, X, X)

ins          [1; 1; 0; 0; 0; 0; 0; 0; 1]

state, sense wires - condition 2 cmp_prec     X
cmp01        (X, X)
cmp12        (X, X)
cmp23        (X, X)
cmp_exp12    (X, X)
insig1       ((X, X), (X, X), (X, X))
insig2       ((X, X), (X, X), (X, X))
insig3       ((X, X), (0, X), (X, X))
sign1        (X, X, X, X)
sign2        (1, X, X, X)
sign3        (1, X, X, 1)
gr_i1        (X, X, X)
c_ei1        X
gr_d1        (X, X, X)
c_ed1        X
```

```
co_limit1       (X, X)
gr_i2           (X, X, X)
c_ei2           X
gr_d2           (X, X, X)
c_ed2           X
co_limit2       (X, X)
gr_a1           (X, 0, X)
gr_a2           (X, X, X)
gr_a3           (X, X, X)

ins             [1; 1; 0; 0; 0; 0; 0; 0; 1]

micro instruction wires c1
c1_1            (0, 0, 0, 0, 1, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(0, 1); (0, 1); (1, 0); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 0, 1, 0)
c2_2            [(0, 1); (0, 1); (1, 0); (0, 1)]
c2_3            [(0, 1); (0, 1); (0, 1); (0, 1); (1, 0)]
c2_4            [(0, 1); (1, 0); (0, 1); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
c3_2            [(0, 1); (0, 1); (0, 1); (1, 0); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 0)

control case 8
--------------- state, sense wires - condition 1 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 1), (X, X))
sign1           (X, X, X, X)
sign2           (0, X, X, X)
sign3           (0, X, X, X)
gr_i1           (X, X, X)
c_ei1           X
gr_d1           (X, X, X)
c_ed1           X
```

```
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 0, X)
gr_a3           (X, X, X)

ins             [1; 1; 0; 0; 0; 0; 0; 0; 1]

state, sense wires - condition 2 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 1), (X, X))
sign1           (X, X, X, X)
sign2           (1, X, X, X)
sign3           (0, X, X, X)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 1, X)
gr_a3           (X, X, X)

ins             [1; 1; 0; 0; 0; 0; 0; 0; 1]

micro instruction wires c1
c1_1            (0, 0, 0, 0, 1, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(0, 1); (0, 1); (0, 1); (1, 0); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 1, 0, 0)
c2_2            [(0, 1); (0, 1); (1, 0); (0, 1)]
c2_3            [(0, 1); (0, 1); (0, 1); (0, 1); (1, 0)]
c2_4            [(0, 1); (0, 1); (1, 0); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
```

```
c3_2            [(0, 1); (0, 1); (1, 0); (0, 1); (0, 1); (0, 1)]
c3_3            (0, [(0, 1); (1, 0)], [0; 0])
c3_4            [0; 0; 0; 0; 1]
c3_5            ([(1, 0); (0, 1)], 0)

c4              (0, 1)

c5              (0, 0, 0)

control case 9
--------------- state, sense wires cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 0), (X, X))
sign1           (X, X, X, X)
sign2           (X, X, X, X)
sign3           (0, X, X, 1)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, X, X)
gr_a3           (X, X, X)

ins             [1; 1; 0; 0; 0; 0; 0; 0; 1]

micro instruction wires c1
c1_1            (0, 0, 0, 1, 0, 0)
c1_2            [(0, 1); (0, 1); (1, 0); (0, 1)]
c1_3            [(0, 1); (0, 1); (0, 1); (0, 1); (1, 0)]
c1_4            [(0, 1); (0, 1); (1, 0); (0, 1); (0, 1); (0, 1)]
c1_5            [(0, 1); (1, 0); (0, 1)]
c1_6            [(1, 0); (0, 1); (0, 1); (0, 1); (0, 1)]
c1_7            (0, [(0, 1); (1, 0)], [0; 0])
c1_8            (0, [(0, 1); (1, 0)], [0; 0; 0; 0])
c1_10           [0; 0; 0; 0; 1]

c2
c2_1            (0, 0, 0, 0, 1, 0)
c2_2            [(0, 1); (0, 1); (1, 0); (0, 1)]
c2_3            [(0, 1); (0, 1); (0, 1); (0, 1); (1, 0)]
c2_4            [(0, 1); (1, 0); (0, 1); (0, 1); (0, 1); (0, 1)]
c2_5            [(0, 1); (1, 0); (0, 1)]
c2_6            [(1, 0); (0, 1); (0, 1); (0, 1); (0, 1)]
c2_7            (0, [(0, 1); (1, 0)], [0; 0])
c2_8            (0, [(0, 1); (1, 0)], [0; 0; 0; 0])
c2_10           [0; 0; 0; 0; 1]

c3
c3_1            (1, 0)
```

```
c3_2            [(0, 1); (0, 1); (0, 1); (1, 0); (0, 1); (0, 1)]
c3_3            (0, [(0, 1); (1, 0)], [1; 1])
c3_4            [0; 0; 0; 0; 1]
c3_5            ([(1, 0); (0, 1)], 0)

c4              (0, 1)

c5              (0, 0, 0)

control case 10
--------------- state, sense wires - condition 1 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 0), (X, X))
sign1           (X, X, X, X)
sign2           (0, X, X, X)
sign3           (0, X, X, 0)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 0, X)
gr_a3           (X, X, X)

ins             [1; 1; 0; 0; 0; 0; 0; 0; 1]

state, sense wires - condition 2 cmp_prec        X
cmp01           (X, X)
cmp12           (X, X)
cmp23           (X, X)
cmp_exp12       (X, X)
insig1          ((X, X), (X, X), (X, X))
insig2          ((X, X), (X, X), (X, X))
insig3          ((X, X), (X, 0), (X, X))
sign1           (X, X, X, X)
sign2           (1, X, X, X)
sign3           (0, X, X, 0)
gr_i1           (X, X, X)
c_ei1           X
gr_d1           (X, X, X)
c_ed1           X
co_limit1       (X, X)
gr_i2           (X, X, X)
c_ei2           X
gr_d2           (X, X, X)
c_ed2           X
co_limit2       (X, X)
gr_a1           (X, X, X)
gr_a2           (X, 1, X)
gr_a3           (X, X, X)
```

```
ins                 [1; 1; 0; 0; 0; 0; 0; 0; 1]

micro instruction wires c1
c1_1                (0, 0, 0, 0, 1, 0)
c1_2                [(0, 1); (0, 1); (1, 0); (0, 1)]
c1_3                [(0, 1); (0, 1); (0, 1); (0, 1); (1, 0)]
c1_4                [(0, 1); (0, 1); (1, 0); (0, 1); (0, 1); (0, 1)]
c1_5                [(0, 1); (1, 0); (0, 1)]
c1_6                [(0, 1); (0, 1); (0, 1); (1, 0); (0, 1)]
c1_7                (0, [(0, 1); (1, 0)], [0; 0])
c1_8                (0, [(0, 1); (1, 0)], [0; 0; 0; 0])
c1_10               [0; 0; 0; 0; 1]

c2
c2_1                (0, 0, 0, 0, 1, 0)
c2_2                [(0, 1); (0, 1); (1, 0); (0, 1)]
c2_3                [(0, 1); (0, 1); (0, 1); (0, 1); (1, 0)]
c2_4                [(0, 1); (1, 0); (0, 1); (0, 1); (0, 1); (0, 1)]
c2_5                [(0, 1); (1, 0); (0, 1)]
c2_6                [(1, 0); (0, 1); (0, 1); (0, 1); (0, 1)]
c2_7                (0, [(0, 1); (1, 0)], [0; 0])
c2_8                (0, [(0, 1); (1, 0)], [0; 0; 0; 0])
c2_10               [0; 0; 0; 0; 1]

c3
c3_1                (1, 0)
c3_2                [(0, 1); (0, 1); (0, 1); (1, 0); (0, 1); (0, 1)]
c3_3                (0, [(0, 1); (1, 0)], [1; 1])
c3_4                [0; 0; 0; 0; 1]
c3_5                ([(1, 0); (0, 1)], 0)

c4                  (0, 1)

c5                  (0, 0, 0)
```

I claim:

1. A reduction processor controlled by a program having a structure, said reduction processor comprising a control means (6) for controlling a reduction of said structure in a number of reduction steps including different kinds of reductions, a first order processor of this type comprising an active associative storage (1, 2) in turn comprising
   a) a plurality of active storage cells (10, 2), each having means for performing a reduction operation, and
   b) a communication net (t1, t2, id, env, v0, v1, v2, v3, 12, 13, 14, 6, 7, 11, 16, 17) connected to said active storage cells and associatively communicating a result of each reduction operation to all cells among said storage cells whose content matches said result.

2. A reduction processor according to claim 1, wherein a plurality of first order processors are connected to each other by a network, said first order processors connected to each other representing a second order reduction processor.

3. A reduction processor according to claim 2, wherein at least one of said storage cells in each first order reduction processor stores a closure, within which is a denotation of executability, of position in a tree in a tree structure, of an identifier, of an environment, and of a tree of values, said identifier, environment, and each individual value being an element in said closure, each element in said closure being composed by a tag word and a num word, said num word being composed by a number of bits, each being either true or false, and said tag words are divided into an indirect class and a direct class, and wherein a bit pattern of said indirect class element is divided into a region part and an address part.

4. A reduction processor according to claim 3, wherein several first order reduction processors ($FOP_{1,1}$ to $FOP_{M,M'}$) are joined into a square field representing a second order reduction processor, wherein each second order processor in said square field comprises a channel (CAN) going to each neighboring first order reduction processor in said square field (FIGS. 37A, 37C and 37D).

5. A reduction processor according to claim 4, wherein said second order reduction processor in turn is divided into logical regions (FIG. 37C), each having a size of $2^n$ times $2^n$ first order reduction processors, said logical regions being provided at a side of each other in a regular pattern such as to cover said square field of said second order reduction processor.

6. A reduction processor according to claim 5, wherein said first order processors are connected to each other in said second order processor in such a manner that each said region within said second order processor is displaceable half a region in every direction by a protocol which internally redefines a placement of said region within said second order processor.

7. A reduction processor according to claim 5, wherein at least one referable indirect element with an address is stored in each region, said element being only referable from storage cells within the region to which it belongs.

8. A reduction processor according to claim 3, wherein several of said first order reduction processors are connected in a hierarchy of at least two networks, a first kind being a bus, a second kind being a ring, and a third kind being a square field (FIG. 40).

9. A reduction processor according to claim 8, wherein a plurality of geographically separated second order reduction processors (GSOPs) connected to each other form a third order reduction processor.

10. A reduction processor according to claim 9, wherein a by regions limited associative adressing is adopted for second order reduction processors (SOPs) and physical adressing is adopted for third order reduction processors.

11. A reduction processor according to claim 3, wherein several of said first order reduction processors are connected in a hierarchy of networks ($NET_1$ to $NET_n$), each network being a bus.

12. A reduction processor according to claim 3, wherein several of said first order reduction processors are connected in a hierarchy of networks, each network being a ring (FIG. 39).

13. A reduction processor according to claim 1, wherein each storage cell (2; 10; FIG. 4A, FIG. 4E) comprises means for storing all information necessary to perform a reduction operation.

14. A reduction processor according to claim 13, wherein at least one of said storage cells (2, 10) comprises means for storing a closure, said closure having a denotation of executability, of position in a tree structure, of an identifier, of an environment, and of a tree of values, said identifier, environment, and each individual value being elements in said closure.

15. A reduction processor according to claim 14, wherein said reduction processor interprets numerical value elements as either integer or floating point depending upon which one of two codings is detected, a first coding of a binary word representing an integer representation and a second coding of a binary word representing a floating-point representation, said codings being such that said floating-point representation is provided in a same order as said integer representation.

16. A reduction processor according to claim 15, wherein a binary coded floating-point value representation includes a sign field, exponent sign field, code field, an exponent field and a mantissa field, said exponent sign field and code field having an indication of a division position between said exponent field and said mantissa field, such that said exponent and mantissa fields have variable lengths.

17. A reduction processor according to claim 16, wherein said words representing numerical value words are provided with a coding providing said numerical values in a dense representation wherein every coded representation of a value corresponds to only one interpreted value.

18. A reduction processor according to claim 15, wherein an integer is stored in said closure in a binary coded format such that all values are represented from a smallest to a largest representable value in a series of numbers, each number including several bit values, and in which zero is represented in a middle of said series of numbers and with a binary number having a binary value true in its most significant bit and having a binary value false in all remaining bits.

19. A reduction processor according to claim 14, wherein each element in said closure is composed of a tag word and a num word, said num word being composed of a number of bits, each being either true or false.

20. A reduction processor according to claim 19, wherein said tag words are divided into an indirect class and a direct class.

21. A reduction processor according to claim 14, wherein said tree of values included in said closure includes leaf elements, i.e. end elements, and composed elements, each composed element including a state and a list of values.

22. A reduction processor according to claim 14, wherein said denotation of executability in said closure has at least two states, of which a first state is an idle state and a second state is an execute state.

23. A reduction processor according to claim 14, wherein said denotation of position in said closure has at least two states, of which a first state is a node position and a second state is a root position.

24. A reduction processor according to claim 14, wherein at least some of said closure denotations are presented in different states, each state being composed of several bits representing a binary code.

25. A reduction processor according to claim 13, wherein said information necessary to perform a reduction operation also includes at least one reference (VALUE/DES) to at least one of said other storage cells, a content of said storage cells being linked by said reference in a tree structure (FIGS. 6B, 6G, 7B, 8B; FIGS. 5A to 5F).

26. A reduction processor according to claim 1, wherein at least one of said storage cells, called core cell (2), comprises means for performing a number of reduction operations, and wherein a remainder of said cells, called object storage cells (10; FIG. 4A), comprise means for performing a lesser number of reduction operations than said core cell is able to perform.

27. A reduction processor according to claim 26, wherein said core cell is an arithmetic unit for structural arithmetic processing, comprising:
 a) at least one input/output means ($v_0$, $v_1$, $v_2$, $v_3$, id, env) for input and output of data lists to and from said object storage cells,
 b) several registers ($S_{0,0}$ to $S_{3,3}$, F0 to F3, ID, ENV) each comprising means for storing a data word, each data word having a tag part called a tag word, and an information part called a num word, said tag part including a tag indicating if a register storing said tag part is in use or not, each of said lists being stored in a predetermined number of said registers, said tag part of each said register among said registers being tagged in use indicating that one of said lists has at least a part stored in said register, said list having a part stored in said register including a list instruction denoting what kind of list it is, the relation between said lists being apparent from an arrangement of said lists in said registers,
 said control means (6) controlling said registers and rearranging said lists among said registers according to said list instructions belonging to lists stored in said registers and inputting and outputting of register content in accordance with said list instructions.

28. A reduction processor according to claim 27, further comprising a matrix of registers ($S_{0,0}$ to $S_{3,3}$), having a peripheral row ($S_{0,0}$ to $S_{3,0}$) providing main registers, columns of said matrix providing base registers.

29. A reduction processor according to claim 28, further comprising a number of auxiliary registers (F0 to F3) provided outside said matrix.

30. A reduction processor according to claim 27, wherein said lists stored in said registers are arranged as a tree of lists, of which one of said lists is a root list.

31. A reduction processor according to claim 27, wherein at least one extra register (ID) is provided, in which an identifier of said tree of lists is stored.

32. A reduction processor according to claim 27, wherein at least one extra register (ENV) is provided, in which an environment of said tree of lists is stored.

33. A reduction processor according to claim 27, wherein said root list of said tree of lists is stored in different registers dependent upon a level of said tree to be stored.

34. A reduction processor according to claim 27, wherein information denoting what kind of reduction to perform can be derived from a type of said root list and wherein said type, if it does not represent a function application, includes an instruction code representing an instruction to execute and if said type does represent a function application, a first element of said root list includes an instruction code or a root of a tree of lists representing a function definition, said control means (6) deriving said information denoting what kind of reduction to perform from said root list.

35. A reduction processor according to claim 27, wherein said registers are logically arranged in a sliced manner in planes in said core cell, each plane comprising at most one register cell from each register, and wherein each register cell comprises means to store one bit of information and wherein register cells within a plane are connected to each other.

36. A reduction processor according to claim 26, wherein said object storage cells are included in an associative memory having a first bus arrangement (any_type, Vr, cpb, set.s, match, r/w.s, r/w.b, r/w.r, Wand.a, Wand.b, Wor, s.a, reset.b, mode.a, mode.a*, prech, ba, mode.b, grant.b, prio etc) for external control, and a second memory bus arrangement ($t_1$, $t_2$, id, env, $v_0$, $v_1$, $v_2$, $v_3$) for data comprising:

several said object storage cells (10) for storing a composed information, means (16, 17) in each of said object storage cells for storing at least one mark, said marks indicating at least select state(s) or non select state(s) for said object storage cell, means for making search operations among said object storage cells to set said marks, and a priority decoder (11) to which all said object storage cells are coupled and which selects one out of several of said object storage cells.

37. A reduction processor according to claim 36, wherein at least one global bus (12, 13, 14) is provided for making logical operations of the type AND and OR between said storage cells, and means (17) in each storage cell for communicating with said buses and to control said storage cell to take part in a logical operation.

38. A reduction processor according to claim 36, wherein each object storage cell comprises a number of data object storage fields (IDENTIFIER, ENVIRONMENT, VALUE/DES.$_0$, VALUE/DES.$_1$, VALUE/DES.$_2$, VALUE/DES.$_3$), each data object storage field comprising storage locations which store a data word, called num word, and a tag being in a form of a tag word.

39. A reduction processor according to claim 36, wherein each storage cell comprises at least one attribute storage field (LAZY, WHERE, TYPE) indicating a state or states of said content in said storage cell.

40. A reduction processor according to claim 26, wherein said communication net transmits information from said object storage cell in charge among said object storage cells to registers (ID, ENV, $S_{0,0}$ to $S_{3,3}$, F0 to F3) in said core cell (2) chosen by said communication net (6) and information from said registers to at least one of said object storage cells chosen by said communication net.

41. A reduction processor according to claim 26, wherein said communication net (6) comprises means for performing a transfer operation between registers in said core cells and one of said object storage cells by swapping a content of said registers and said storage cell.

42. A reduction processor according to claim 1, comprising at least one port means connected to said active storage means, and at least one environment means connected to said at least one port means.

43. A reduction processor according to claim 42, comprising means for comparing a signal sequence (FIGS. 34 and 35) provided on a port means with another sequence stored in at least one storage cell in said active storage means, said stored sequence having possible undefined sequence elements ($), and means (CU, 3) for rewriting a compared sequence into nothing, i.e. something representing contradiction, if a comparison gives a difference, or else to rewrite said compared sequence into a specified sequence.

44. A reduction processor according to claim 43, comprising means (3, during; 7, 8, 9) for representing said signal sequence as a sampled signal (FIG. 34) changing with time and having individual sampling periods, said signal sequence being a list of groups of elements, each group including a duration time and at least one signal quantity during that time.

45. A reduction processor according to claim 44, wherein a number of list elements in each group is two provided in a pair, each pair including a combination of time and signal quantity.

46. A reduction processor according to claim 43, wherein said means for comparing make comparisons on groups of a predetermined number of list elements.

47. A reduction processor according to claim 42, comprising a means for comparing a signal sequence provided on one of said at least one port means with at least one sequence stored on at least one of the other port means, and means for rewriting said stored sequence into nothing, i.e. something representing contradiction, if a comparison gives a difference, or else to rewrite said stored sequence into a specified sequence which is a unification of said signal sequence and said stored sequence.

48. A reduction processor according to claim 42, wherein said object storage means comprise means for storing a computer program as an explicit or implicit encoding of an abstract syntax, said syntax describing a number of different abstract objects by aid of expressions, each object storage cell means storing at least a part of one of said syntax expression at a time in a form of data and alternatively in a form of a program structure.

49. A reduction processor according to claim 1, wherein said reduction processor has at least one numerical arithmetic unit to perform arithmetical, logical and related operations on numerical value elements, said numerical arithmetic unit comprising:
- a) an input comprising a set of buses, each bus having a sufficient number of conductors to accommodate a list element in a list, said list comprising instruction information regarding words in said list,
- b) processing means to which said set of buses are connected for performing an operation on said words in said list using said instruction information by rewriting said words in accordance with said instruction, and
- c) an output means for presenting a rewritten result, said output means comprising a set of buses having a same number of conductors and a same configuration as said input set of buses.

50. A reduction processor according to claim 49, wherein several circuits, each performing a specific operation on said numerical value representations provided on said input buses, present results of said operations in parallel, and wherein control drive means provided with said instruction information choose at least one performed result among all said performed results according to said instruction information.

51. A reduction processor according to claim 50, wherein when said list includes a function application in which one of its elements is an instruction code and all remaining elements are arguments to said instruction, said processing means performs an instruction by rewriting and recycling said instruction code from said output to said input until an eventual result is reached, wherein at each rewriting said processing means rewrites said list to include a revised instruction code word, if appropriate for said instruction, followed by value words if appropriate.

52. A reduction processor according to claim 49, wherein at least one list element in said list includes a representation of an instruction information and is provided on a particular of said input set of buses, and wherein numerical value representations to be calculated are provided on other buses of said input set of buses, and wherein said processing means performs calculations by rewriting numerical value representations in said input list.

53. A reduction processor according to claim 1, wherein said communication net comprises a bus arrangement having control lines connecting said net to said control means (6) and data lines ($t_1$, $t_2$, id, env, $v_0$, $v_1$, $v_2$, $v_3$), all lines being connected to each of said storage cells, said control means (6) being connected to all said storage cells.

* * * * *